(12) United States Patent
Schwab

(10) Patent No.: US 10,656,400 B2
(45) Date of Patent: May 19, 2020

(54) IMAGING OPTICAL UNIT AND PROJECTION EXPOSURE UNIT INCLUDING SAME

(71) Applicant: Carl Zeiss SMT GmbH, Oberkochen (DE)

(72) Inventor: Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 200 days.

(21) Appl. No.: 15/728,812

(22) Filed: Oct. 10, 2017

(65) Prior Publication Data

US 2018/0074303 A1    Mar. 15, 2018

Related U.S. Application Data

(63) Continuation of application No. PCT/EP2016/057966, filed on Apr. 12, 2016.

(30) Foreign Application Priority Data

Apr. 14, 2015   (DE) .......................... 10 2015 206 635
Dec. 22, 2015   (DE) .......................... 10 2015 226 531

(51) Int. Cl.
*G02B 5/08*    (2006.01)
*G02B 7/182*   (2006.01)
(Continued)

(52) U.S. Cl.
CPC ......... *G02B 17/0663* (2013.01); *G02B 27/18* (2013.01); *G03F 7/70233* (2013.01)

(58) Field of Classification Search
CPC .......... G02B 5/003; G02B 5/005; G02B 5/09; G02B 5/0891; G02B 13/143; G02B 17/06;
(Continued)

(56) References Cited

U.S. PATENT DOCUMENTS 5,891,806 A       4/1999   Shibuya et al.
2006/0232867 A1*  10/2006  Mann ................... G02B 13/143
                                                          359/858
(Continued)

FOREIGN PATENT DOCUMENTS

DE          101 55 711 A      5/2003
DE    10 2009 045 096 A1    10/2010
(Continued)

OTHER PUBLICATIONS

German Office Action, with translation thereof, for corresponding Appl No. 10 2015 226 531.5, dated Jun. 16, 2017.
(Continued)

*Primary Examiner* — Mustak Choudhury
(74) *Attorney, Agent, or Firm* — Fish & Richardson P.C.

(57) ABSTRACT

An imaging optical unit for projection lithography has a plurality of mirrors for guiding imaging light from an object field into an image field. The object field is spanned by two object field coordinates, with a normal coordinate being perpendicular thereto. Imaging light propagates in a first imaging light plane through at least one first plane intermediate image of the imaging optical unit. In a second imaging light plane, the imaging light propagates through at least one second plane intermediate image of the imaging optical unit. The number of first plane intermediate images and the number of second plane intermediate images differ from one another. An imaging optical unit with reduced production costs emerges.

20 Claims, 35 Drawing Sheets

(51) Int. Cl.
*G02B 17/06* (2006.01)
*G03F 7/20* (2006.01)
*G02B 27/18* (2006.01)

(58) Field of Classification Search
CPC .. G02B 17/08; G02B 17/061; G02B 17/0621;
G02B 17/0647; G02B 17/0652; G02B
17/0657; G02B 17/0663; G02B 17/0694;
G02B 13/08; G02B 17/0816; G02B
27/0018; G02B 27/18; G03F 7/701; G03F
7/702; G03F 7/7025; G03F 7/7015; G03F
7/70216; G03F 7/70233; G03F 7/70275;
G03F 7/70308; G03F 7/70316; G03F
7/70958; G03F 7/70191; G03F 7/70058;
G03B 21/147; G03B 21/2066; G03B
26/0833
USPC ........ 359/364–366, 649, 731, 850, 857–861,
359/900; 355/67, 77; 378/34, 35
See application file for complete search history.

(56) References Cited

U.S. PATENT DOCUMENTS

| | | |
|---|---|---|
| 2007/0047069 A1 | 3/2007 | Mann et al. |
| 2007/0058269 A1 | 3/2007 | Mann et al. |
| 2010/0195075 A1* | 8/2010 | Chan .................. B82Y 10/00 |
| | | 355/67 |
| 2013/0128251 A1* | 5/2013 | Mann .................. G02B 13/08 |
| | | 355/67 |
| 2014/0368801 A1 | 12/2014 | Rostalski et al. |

FOREIGN PATENT DOCUMENTS

| | | |
|---|---|---|
| DE | 10 2012 202675 A1 | 1/2013 |
| DE | 10 2012 212753 A1 | 1/2014 |
| DE | 10 2010 029 050 A1 | 3/2014 |
| JP | 2002/048977 A | 2/2002 |
| WO | WO 2008/141686 A1 | 11/2008 |
| WO | WO 2011/131289 A1 | 10/2011 |
| WO | WO 2012/126867 A | 9/2012 |
| WO | WO 2015/014753 A1 | 2/2015 |

OTHER PUBLICATIONS

German Office Action, with translation thereof, for corresponding Appl No. 10 2015 206 635.5, dated Dec. 12, 2015.
Translation of International Search Report for corresponding Appl No. PCT/EP2016/057966, dated Jun. 20, 2016.

* cited by examiner

IMAGING OPTICAL UNIT AND PROJECTION EXPOSURE UNIT INCLUDING SAME

CROSS-REFERENCE TO RELATED APPLICATIONS

The present application is a continuation of, and claims benefit under 35 USC 120 to, international application PCT/EP2016/057966, filed Apr. 12, 2016, which claims benefit under 35 USC 119 of German Application No. DE 10 2015 206 635.5, filed Apr. 14, 2015, and DE 10 2015 226 531.5, filed Dec. 22, 2015. The entire disclosure of these applications is incorporated by reference herein.

FIELD

The disclosure relates to an imaging optical unit or projection optical unit for imaging an object field into an image field. Further, the disclosure relates to an optical system including such a projection optical unit, a projection exposure apparatus including such an optical system, a method for producing a microstructured or nanostructured component using such a projection exposure apparatus and a microstructured or nanostructured component produced by this method. Furthermore, the disclosure relates to a mirror as a constituent of such an imaging optical unit.

BACKGROUND

Projection optical units of the type set forth at the outset are known from JP 2002/048977 A, U.S. Pat. No. 5,891,806, which describes a "proximity type" projection exposure apparatus, and from WO 2008/141 686 A1 and WO 2015/014 753 A1.

SUMMARY

The present disclosure seeks to develop an imaging optical unit with relatively low production costs.

In one aspect, the disclosure provides an imaging optical unit for projection lithography. The imaging optical unit includes a plurality of mirrors for guiding imaging light from an object field in an object plane into an image field in an image plane along an imaging light beam path. The object field is spanned by a first Cartesian object field coordinate and a second Cartesian object field coordinate. A third Cartesian normal coordinate is perpendicular to both object field co-ordinates. The imaging optical unit is embodied in such a way that the imaging light propagates in a first imaging light plane, in which an imaging light main propagation direction lies. The imaging light propagates in the second imaging light plane, in which the imaging light main propagation direction lies and which is perpendicular to the first imaging light plane. The number of first plane intermediate images of the imaging light which propagates in the first imaging light plane, and the number of second plane intermediate images of imaging light which propagates in the second imaging light plane differ from one another.

The imaging optical unit is designed for use in projection lithography, in particular for use in EUV projection lithography.

The imaging optical unit is embodied as a choristikonal-type optical unit with a different number of intermediate images in the two imaging light planes. This number difference can be exactly 1, but it may also be greater, for example 2 or even greater.

The first imaging light plane ($xz_{HR}$) is spanned by the respective imaging light main propagation direction ($z_{HR}$) and the first Cartesian object field coordinate (x). The imaging light main propagation direction ($z_{HR}$) results by tilting the normal coordinate z in the plane that is spanned by the second Cartesian object field coordinate (x) and the normal coordinate (z), until the current propagation coordinate $z_{HR}$, originally extending in the z-direction, extends in the direction of the imaging light main propagation direction. Thus, a position of the first imaging light plane changes with each directional change of the imaging light main propagation direction.

The different number of intermediate images in the two imaging light planes can be used as an additional design degree of freedom in order to narrow the entire imaging light beam where this is desired for beam guiding reasons, for example in the region of mirrors for grazing incidence, to ensure their extent does not become too large, and/or in the region of constrictions that are involved for installation space reasons. It was recognized that, particularly if an object field with an aspect ratio that is clearly different from 1 is intended to be imaged, the desired properties on the extent of the imaging light beam in the two cross-sectional dimensions thereof are by all means different in the two imaging light planes, and so these desired properties can be taken into account with the aid of a choristikonal-type design. The greater number of intermediate images in one of the two imaging light planes can be 2, can be 3 or can be greater. The smaller number of the number of intermediate images in the two imaging light planes can be 0, can be 1, can be 2 or can be even greater. The number of mirrors can be 6, 7, 8, 9 or 10. The number of mirrors can also be smaller or greater.

A position of the intermediate images can be, in principle, at any location between the object field and the image field along the imaging light main propagation direction. A respective first plane intermediate image or second plane intermediate image can lie between two mirrors or at the location of the reflection at one mirror. In each case, at least one mirror can lie between a field plane and one of the intermediate images.

All mirrors of the imaging optical unit can be embodied as NI mirrors, i.e. as mirrors on which the imaging light impinges with an angle of incidence that is less than 45°. This leads to the option of embodying the imaging optical unit in a compact manner. The small angles of incidence on all mirrors moreover facilitate a high overall transmission of the imaging optical unit, i.e. a high used light throughput.

An object-image offset, measured in a plane parallel to the image plane of the imaging optical unit, can be less than 1000 mm, can be less than 800 mm, can be less than 600 mm, can be less than 400 mm, can be less than 300 mm, can be less than 200 mm, can be less than 180 mm, and can, in particular, be 177.89 mm.

The object plane can be tilted relative to the image plane by a finite angle.

The imaging optical unit can have an aperture stop, arranged in the imaging light beam path, between two of the mirrors of the imaging optical unit, wherein the aperture stop delimits a whole external cross section of a beam of the imaging light. Such an aperture stop can be designed as accessible from the outside from all sides. With the aid of such an aperture stop, it is possible to provide a defined prescription of a pupil form of the imaging optical unit.

The aperture stop can lie in a partial beam path of the imaging light between two of the mirrors, wherein the aperture stop lies spatially adjacent to one of the second plane intermediate beams, which is arranged in a further partial beam path of the imaging light between two of the mirrors. Such an arrangement of the aperture stop leads to the option of embodying the imaging optical unit with small folding angles, even in the region of the aperture stop.

A pupil obscuration of the imaging optical unit can be 15% at most. Such a pupil obscuration, which is defined as a surface portion of an obscured pupil surface, i.e. a pupil surface that cannot be used for imaging, in relation to the entire pupil surface, has few effects on the imaging. The pupil obscuration can be less than 15%, can be less than 12%, can be less than 10% and can be e.g. 9%.

A maximum angle of incidence of the imaging light on all mirrors of the imaging optical unit can be less than 25°. Such a maximum angle of incidence of the imaging light facilitates the configuration of the mirror with a high reflectivity, even if EUV light is used as used light. The maximum angle of incidence can be less than 22°.

A maximum angle of incidence of the imaging light on the first four mirrors of the imaging optical unit in the imaging light beam path downstream of the object field can be less than 20°. Such maximum angles of incidence of the imaging light on the first four mirrors have corresponding advantages. The maximum angle of incidence can be less than 19°, can be less than 18°, can be at most 17.5° and can also be at most 16.6°.

The object plane of the imaging optical unit can be tilted relative to the image plane by an angle that is greater than 0°. Such a tilt of the object plane in relation to the image plane has been found to be suitable, in particular for achieving small maximum angles of incidence on all mirrors. The tilt angle can be greater than 1°, can be greater than 2°, can be greater than 4°, can be greater than 5°, can be greater than 7°, can be greater than 8°, and can be e.g. 10°.

One of the first plane intermediate images and one of the second plane intermediate images of the imaging optical unit can lie in the region of a passage opening of one of the mirrors of the imaging optical unit for the passage of the imaging light. Such an intermediate image arrangement leads to an advantageous constriction of both cross-sectional dimensions of the whole imaging light beam.

At least one of the mirrors can be embodied as a GI mirror (mirror with angle of incidence greater than 45°). In such a configuration of the imaging optical unit the advantages of the choristikonal-type embodiment come to bear particularly well.

A used reflection surface of the GI mirror can have an aspect ratio of its surface dimensions of at most 3. Such an aspect ratio condition for the GI mirror leads to a manageably large GI mirror, the production cost of which can be justified accordingly. When calculating the aspect ratio, the largest extent of the reflection surface of the GI mirror is measured first and the associated dimensional value is then divided by the extent of the reflection surface perpendicular to this direction of largest extent. The aspect ratio of the used reflection surface of the GI mirror can be at most 2.5, can be at most 2, can be at most 1.95, can be at most 1.9, can be at most 1.75, can be at most 1.5, can be at most 1.25, can be at most 1.2, can be at most 1.1, and can also be at most 1.05.

The imaging light plane in which the greater number of intermediate images is present can coincide with a folding plane of the at least one GI mirror. Such a number distribution of the intermediate images leads to the imaging light beam in the GI mirror folding plane, i.e. in the incidence plane of a chief ray of a central field point on the GI mirror, advantageously being able to be constricted.

One of the intermediate images can be embodied in the imaging light plane coinciding with the folding plane in the beam path upstream of the GI mirror between the latter and a mirror disposed directly upstream thereof in the beam path, and a further one of the intermediate images can be embodied in the imaging light plane coinciding with the folding plane in the beam path downstream of the GI mirror between the latter and a mirror disposed directly downstream thereof in the beam path. Such a distribution of intermediate images has been found to be particularly advantageous for the compact design of GI mirrors. There can also be a plurality of GI mirror pairs with an intermediate image lying therebetween within the same imaging optical unit.

At least two mirrors that follow one another in the beam path of the imaging light can be embodied as GI mirrors with the same folding plane, wherein an intermediate image in the imaging light plane coinciding with the folding plane is in the beam path between these two GI mirrors. Such a distribution of intermediate images has been found to be particularly advantageous for the compact design of GI mirrors. There can also be a plurality of GI mirror pairs with an intermediate image lying therebetween within the same imaging optical unit.

At least one of the mirrors can have a passage opening for the passage of the imaging light, the at least one of the mirrors being embodied around the passage opening to reflect the imaging light, wherein at least one intermediate image lies in the region of the passage opening. Such an intermediate image arrangement leads to an advantageous constriction of the imaging light beam in the region of the mirror passage opening. The intermediate image can lie in the imaging light plane with a spanning coordinate along the greater object field dimension in the case of an object field with an aspect ratio of greater than 1. Such an intermediate image ensures that the entire imaging light beam is constricted more strongly along the coordinate in which the beam tends to have a larger diameter on account of the larger field dimension. Then, the intermediate image lies in the region of the passage opening for as long as a distance between the passage opening and the image field is more than three times larger than a distance between the passage opening and the intermediate image. The ratio between these distances can be greater than 3.5, can be greater than 4, can be greater than 5, can be greater than 7, can be greater than 10 or can be even greater. The passage opening can be the one which has both one of the first plane intermediate images and one of the second plane intermediate images lying in the region thereof.

At least one of the mirrors can be embodied as an NI mirror (mirror with an angle of incidence close to perpendicular incidence; angle of incidence less than 45°). The choristikonal-type design of the imaging optical unit has also been found to be advantageous in the case of an embodiment with at least one such NI mirror. Here, a corresponding distribution of the intermediate images among the various imaging light planes can simplify, for example, a placement of field stops or field-side auxiliary devices. Then, it is also possible to simplify the position prescription for an aperture stop. A mixed embodiment of an imaging optical unit with at least one GI mirror and at least one NI mirror is possible. Alternatively, the imaging optical unit can have only NI mirrors.

An odd number of mirrors can be in the imaging beam path between the object field and the image field. In such an imaging optical unit, a difference in the number of the intermediate images in the two imaging light planes of exactly 1 can lead to a compensation of an image flip caused on account of the odd number of mirrors.

At least one of the mirrors of the imaging optical unit can have a reflection surface that is embodied as a free-form surface. Examples of such free-form surfaces will still be described in detail below.

An optical system can include an imaging optical unit described herein and an auxiliary device in an intermediate image plane of one of the intermediate images. Such an optical system exploits the option of the design degree of freedom about the different numbers of intermediate images in the various imaging light planes. The auxiliary device can be a field stop, or else an intensity prescription device in the style of a UNICOM.

An optical system can include an imaging optical unit described herein and an illumination optical unit for illuminating the object field with illumination light from a light source. The advantages of such an optical system correspond to those which have already been explained above with reference to the imaging optical unit and the optical system with the auxiliary device. Such an optical system can also have an auxiliary device in an intermediate image plane of one of the intermediate images.

The light source can be an EUV light source. Alternatively, use can also be made of a DUV light source, that is to say, for example, a light source with a wavelength of 193 nm.

A projection exposure apparatus can include an optical system as described herein and a light source for producing the illumination light. A method for producing a structured component, can include providing a reticle and a wafer, projecting a structure on the reticle onto a light-sensitive layer of the wafer with the aid of such a projection exposure apparatus, and producing a microstructure or nanostructure on the wafer. The advantages of such a projection exposure apparatus, of such a production method, and of a microstructured or nanostructured component produced by such a method correspond to those which have already been explained above with reference to the imaging optical unit and the optical system. In particular, a semiconductor component, for example a memory chip, may be produced using the projection exposure apparatus.

The disclosure also seeks to provide a mirror that can be manufactured with justifiable outlay as a component of an imaging optical unit for guiding imaging light from an object field in an object plane into an image field in an image plane along an imaging light beam path.

In one aspect, the disclosure provides a mirror as constituent of an imaging optical unit for guiding imaging light from an object field in an object plane into an image field in an image plane along an imaging light beam path. The mirror includes a reflection surface that is usable for reflection. The reflection surface has a boundary con-tour having a basic form. The basic form corresponds to a basic form of the object field. At least two contour bulges are arranged along a side edge of this boundary contour.

According to the disclosure, it has been recognized that a boundary contour of a whole imaging light beam need not necessarily have a convex profile. The reflection surface boundary contour of the mirror including at least two contour bulges according to the disclosure ensures that a boundary contour, formed with a corresponding bulge, of a whole imaging light beam can be reflected. Moreover, the mirror for such reflection objects does not have an unnecessarily large design, reducing the production costs thereof.

In particular, the mirror can be used in an imaging optical unit including the features specified above. The mirror can be embodied as an EUV mirror and carry a corresponding highly reflecting coating. This coating can be embodied as a multi-ply coating. The mirror according to the disclosure can be combined with the features relating to the superordinate "imaging optical unit", "optical system", "projection exposure apparatus" components.

The imaging optical unit may have a plurality of such mirrors with contour bulges. The mirror having the contour bulges can be arranged, in particular, in the region of an intermediate image of the imaging optical unit. The mirror having the contour bulges can be an NI (normal incidence) mirror or a GI (grazing incidence) mirror.

The mirror can have a reflection surface with a curved basic form or with a rectangular basic form.

BRIEF DESCRIPTION OF THE DRAWINGS

Exemplary embodiments of the disclosure are explained in greater detail below with reference to the drawings, in which.

DETAILED DESCRIPTION

Figure 1:
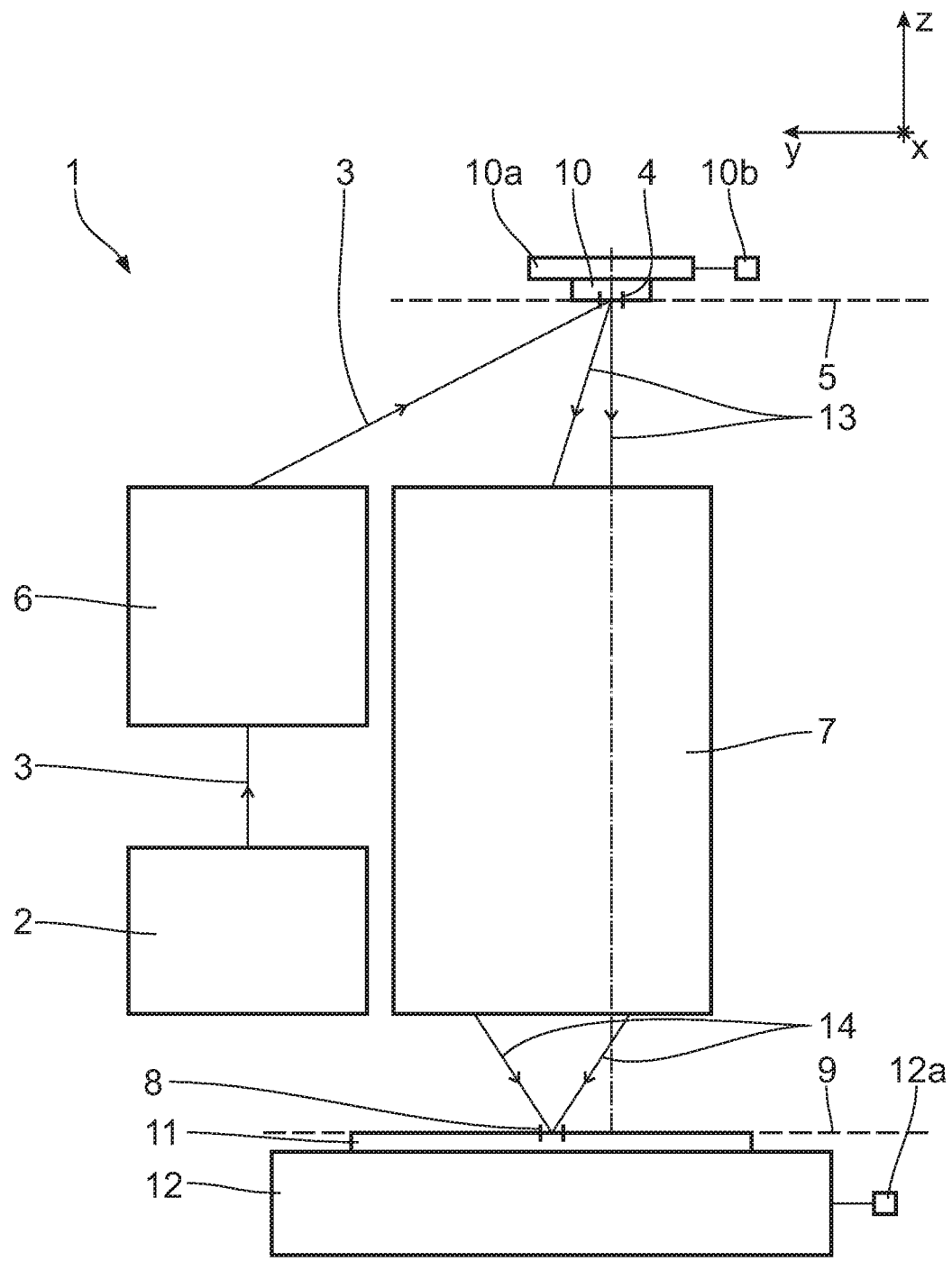
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source ((laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward.

In the projection optical unit 7, the object field 4 and the image field 8 have a bent or curved embodiment and, in particular, an embodiment shaped like a partial ring. A radius of curvature of this field curvature can be 81 mm on the image side. A basic form of a boundary contour of the object field 4 or of the image field 8 has a corresponding bend. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

Figure 2:
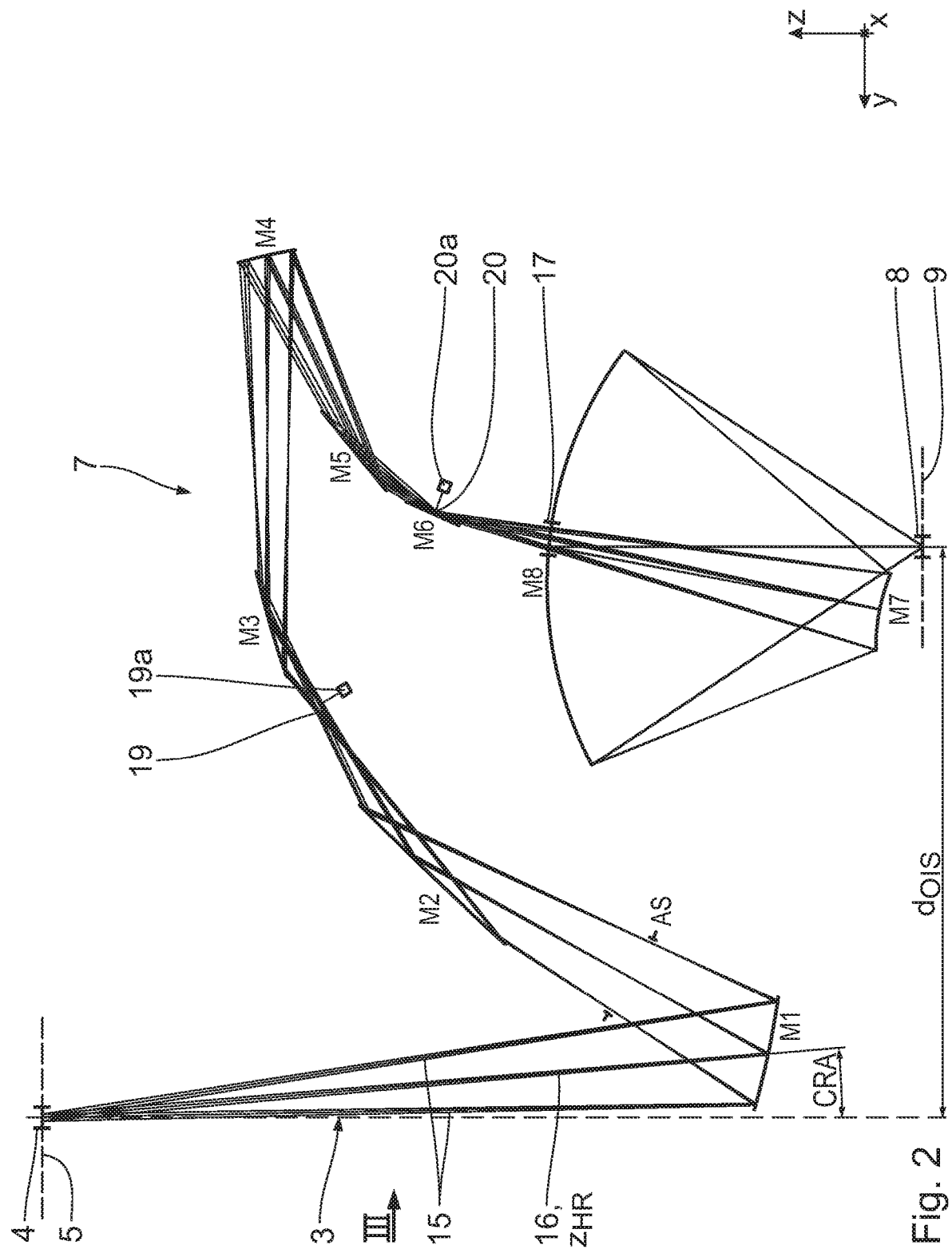
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of two selected field points is depicted.

One of the exemplary embodiments depicted in FIGS. 2 et seq. can be used for the projection optical unit 7. The projection optical unit 7 according to FIG. 2 reduces by a factor of 4 in a sagittal plane xz and reduces by factor of 8 in a meridional plane yz. The projection optical unit 7 is an anamorphic projection optical unit. Other reduction scales in the two imaging light planes xz, yz are also possible, for example 3×, 5×, 6×, 7× or else reduction scales that are greater than 8×. Alternatively, the projection optical unit 7 may also have the respective same reduction scale in the two imaging light planes xz, yz, for example a reduction by a factor of 8. Then, other reduction scales are also possible, for example 4×, 5× or even reduction scales which are greater than 8×. The respective reduction scale may or may not be accompanied by an image flip, which is subsequently also elucidated by an appropriate sign specification of the reduction scale.

In the embodiment of the projection optical unit 7 according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 3:
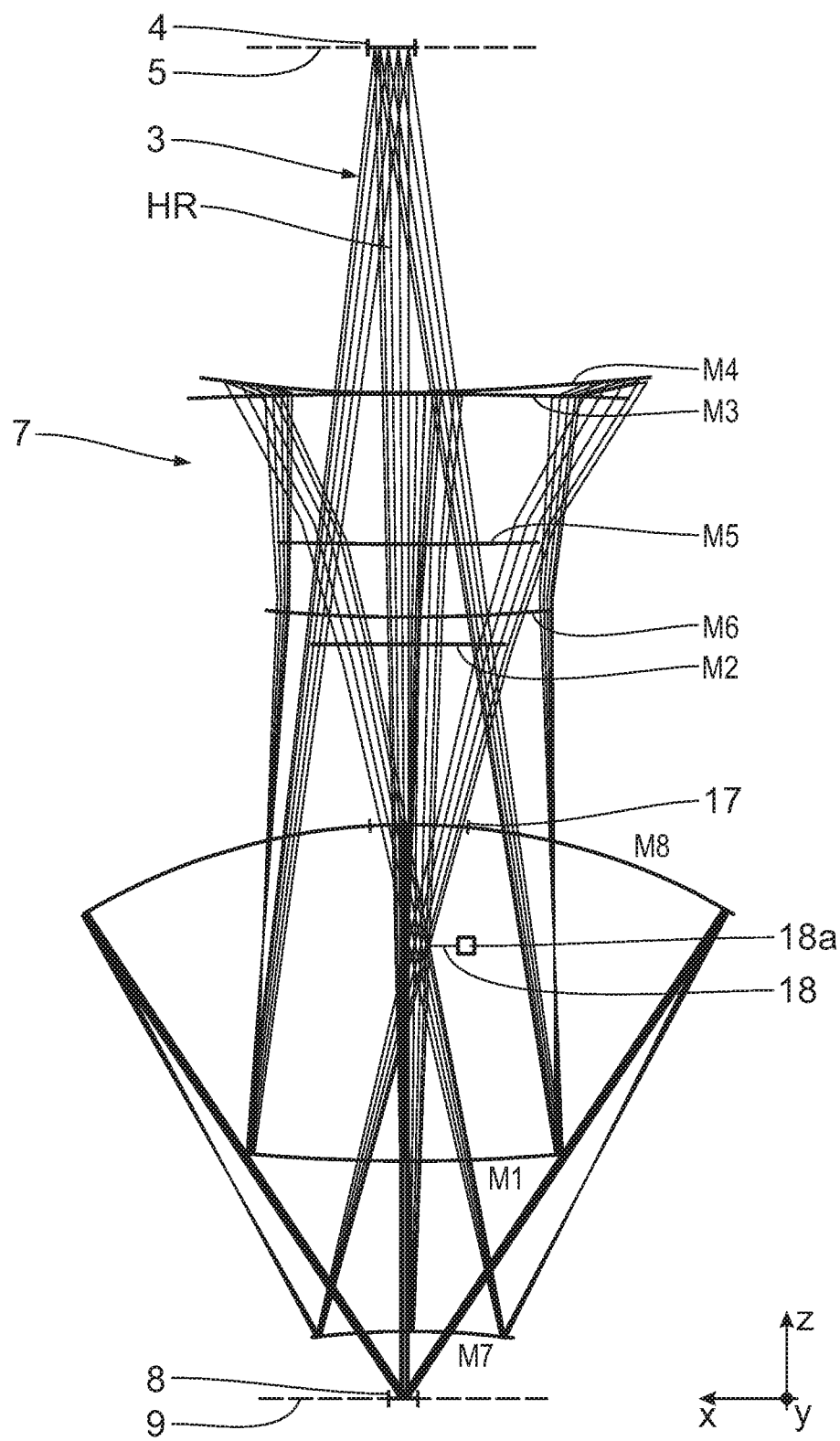
FIG. 3 shows a view of the imaging optical unit according to FIG. 2, as seen from the viewing direction III in FIG. 2.

FIGS. 2 and 3 show the optical design of a first embodiment of the projection optical unit 7. FIG. 2 shows the projection optical unit 7 in a meridional section, i.e. the beam path of the imaging light 3 in the yz plane. The meridional plane yz is also referred to as the second imaging light plane. FIG. 3 shows the imaging beam path of the projection optical unit 7 in the sagittal plane xz. A first imaging light plane $xz_{HR}$ is the plane which is spanned at the respective location of the beam path of the imaging light 3 by the first Cartesian object field coordinate x and a current imaging light main propagation direction $z_{HR}$. The imaging light main propagation direction $z_{HR}$ is the beam direction of a chief ray 16 of a central field point. As a rule, this imaging light main propagation direction $z_{HR}$ changes at each mirror reflection at the mirrors M1 to M8. This change can be described as a tilt of the current imaging light main propagation direction $z_{HR}$ about the first Cartesian object field coordinate x about a tilt angle which equals the deflection angle of this chief ray 16 of the central field point at the respectively considered mirror M1 to M8. Subsequently, the first imaging light playing $xz_{HR}$ is also referred to as first imaging light plane xz for simplification purposes.

The second imaging light plane yz likewise contains the imaging light main propagation direction $z_{HR}$ and is perpendicular to the first imaging light plane $xz_{HR}$.

Since the projection optical unit 7 is only folded in the meridional plane yz, the second imaging light plane yz coincides with the meridional plane.

FIG. 2 depicts the beam path of in each case three individual rays 15 emanating from three object field points which are spaced apart from one another in the y-direction in FIG. 2. What is depicted are chief rays 16, i.e. individual rays 15 which pass through the center of a pupil in a pupil plane of the projection optical unit 7, and in each case an upper coma ray and a lower coma ray of these two object field points. Proceeding from the object field 4, the chief rays 16 include an angle CRA of 5.1° with a normal of the object plane 5.

The object plane 5 lies parallel to the image plane 9.

The projection optical unit 7 has an image-side numerical aperture of 0.55.

The projection optical unit 7 according to FIG. 2 has a total of eight mirrors, which, proceeding from the object field 4, are numbered M1 to M8 in the sequence of the beam path of the individual rays 15.

Figure 4:
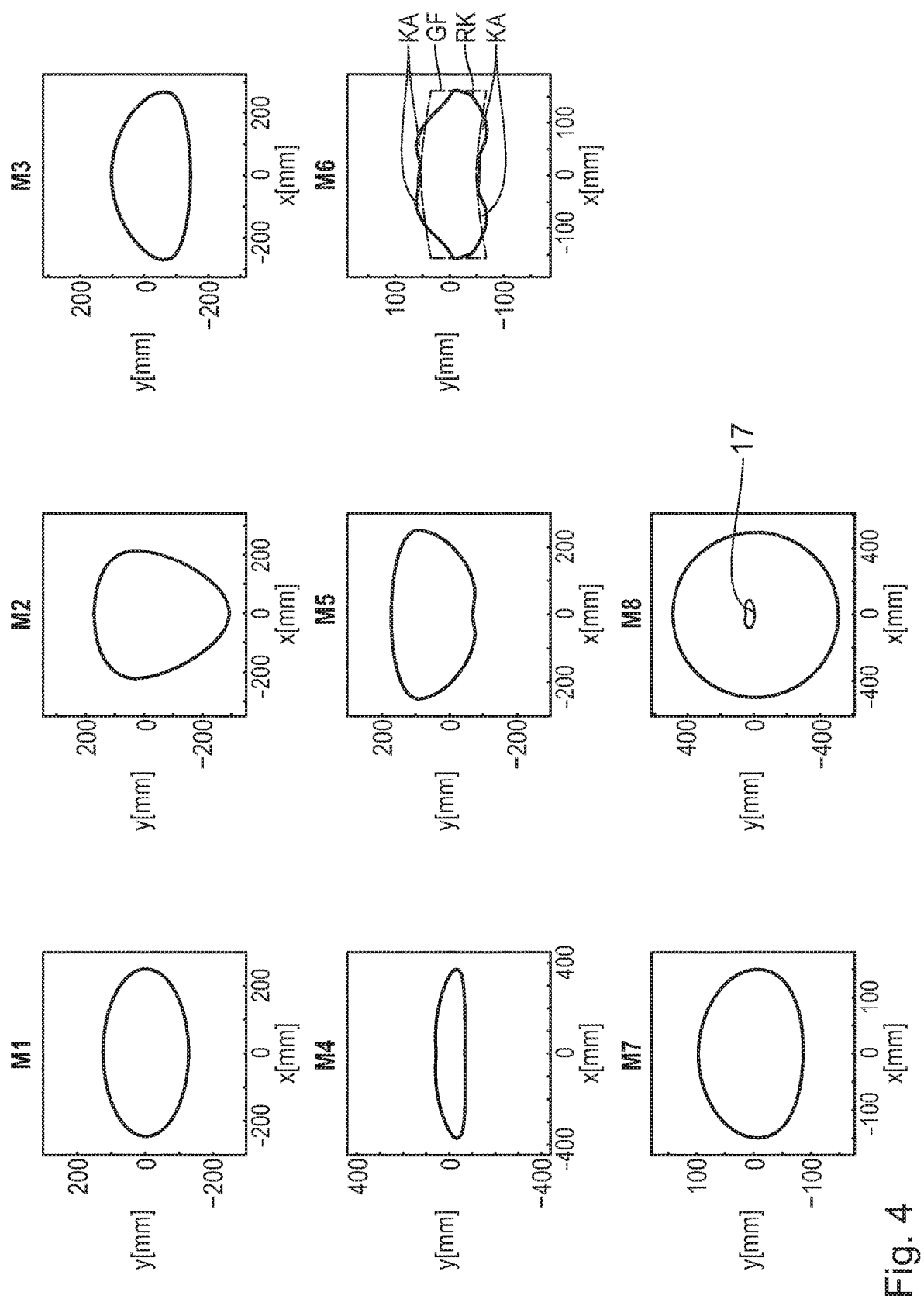
FIG. 4 shows plan views of boundary contours of optically used areas of the mirrors of the imaging optical unit according to FIGS. 2 and 3.

FIGS. 2 to 4 depict sections of the calculated reflection surfaces of the mirrors M1 to M8. A portion of these calculated reflection surfaces is used. Only this actually used region of the reflection surfaces, plus an overhang, is actually present in the real mirrors M1 to M8. These used reflection surfaces are carried in a known manner by mirror bodies.

In the projection optical unit 7 according to FIG. 2, the mirrors M1, M4, M7 and M8 are configured as mirrors for normal incidence, that is to say as mirrors onto which the imaging light 3 impinges with an angle of incidence that is smaller than 45°. Thus, overall, the projection optical unit 7 according to FIG. 2 has four mirrors M1, M4, M7 and M8 for normal incidence. These mirrors for normal incidence are also referred to as NI (normal incidence) mirrors.

The mirrors M2, M3, M5 and M6 are mirrors for grazing incidence of the illumination light 3, that is to say mirrors onto which the illumination light 3 impinges with angles of incidence that are greater than 45° and, in particular, greater than 60°. A typical angle of incidence of the individual rays 15 of the imaging light 3 on the mirrors M2, M3 and M5, M6 for grazing incidence lies in the region of 80°. Overall, the projection optical unit 7 according to FIG. 2 has exactly four mirrors M2, M3, M5 and M6 for grazing incidence. These mirrors for grazing incidence are also referred to as GI (grazing incidence) mirrors.

The mirrors M2 and M3 form a mirror pair arranged in succession directly in the beam path of the imaging light 3. The mirrors M5 and M6 also form a mirror pair arranged directly in succession in the beam path of the imaging light 3.

The mirror pairs M2, M3 on the one hand and M5, M6 on the other hand reflect the imaging light 3 in such a way that the angles of reflection of the individual rays 15 add up at the respective mirrors M2, M3 and M5, M6 of these two mirror pairs. Thus, the respective second mirror M3 and M6 of the respective mirror pair M2, M3 and M5, M6 increases a deflecting effect which the respective first mirror M2, M5 exerts on the respective individual ray 15. This arrangement of the mirrors of the mirror pairs M2, M3 and M5, M6 corresponds to that described in DE 10 2009 045 096 A1 for an illumination optical unit.

The mirrors M2, M3, M5 and M6 for grazing incidence each have very large absolute values for the radius, that is to say they have a relatively small deviation from a planar surface. These mirrors M2, M3, M5 and M6 for grazing incidence each have a comparatively weak refractive power, i.e. a lower beam-forming effect than a mirror which is concave or convex overall. The mirrors M2, M3, M5 and M6 contribute to a specific imaging aberration correction and, in particular, to a local imaging aberration correction.

A deflection direction is defined below on the basis of the respectively depicted meridional sections for the purposes of characterizing a deflecting effect of the mirrors of the projection optical unit 7. As seen in the respective incident beam direction in the meridional section, for example according to FIG. 2, a deflecting effect of the respective mirror in the clockwise direction, i.e. a deflection to the right, is denoted by the abbreviation "R". By way of example, the mirror M2 of the projection optical unit 7 has such a deflecting effect "R". A deflecting effect of a mirror in the counterclockwise direction, i.e. toward the left as seen from the beam direction respectively incident on this mirror, is denoted by the abbreviation "L". The mirrors M1 and M5 of the projection optical unit 7 are examples of the "L" deflecting effect. A weakly deflecting effect, or an effect that does not deflect at all, of a mirror with a folding angle f, for which the following applies: $-1°<f<1°$, is denoted by the abbreviation "0". The mirror M7 of the projection optical unit 7 is an example for the "0" deflecting effect. Overall, the projection optical unit 7 for the mirrors M1 to M8 has the following sequence of deflecting effects: LRRRLL0R.

In principle, all described exemplary embodiments of the projection optical units can be mirrored about a plane extending parallel to the xz-plane without this changing fundamental imaging properties in the process. However, this naturally then changes the sequence of deflecting effects, which has the following sequence in the case of a projection optical unit which emerges by appropriate mirroring from the projection optical unit 7: RLLLRR0L.

A selection of the deflection effect, i.e. a selection of a direction of the respective incident beam, for example on the mirror M4, and a selection of a deflection direction of the mirror pairs M2, M3 and M5, M6, is respectively selected in such a way that an installation space that is available for the projection optical unit 7 is used efficiently.

The mirrors M1 to M8 carry a coating optimizing the reflectivity of the mirrors M1 to M8 for the imaging light 3. Here, this can be a ruthenium coating, a multilayer with, in each case, an uppermost layer made of e.g. ruthenium. In the mirrors M2, M3, M5 and M6 for grazing incidence, use can be made of a coating with e.g. one ply of molybdenum or ruthenium. These highly reflecting layers, in particular of the mirrors M1, M4, M7 and M8 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon. These may contain additional separation layers made of e.g. C (carbon), $B_4C$ (boron carbide) and can be terminated by a protective layer or a protective layer system toward the vacuum.

For the purposes of calculating an overall reflectivity of the projection optical unit 7, a system transmission is calculated as follows: A mirror reflectivity is determined at each mirror surface depending on the angle of incidence of a guide ray, i.e. a chief ray of a central object field point, and combined by multiplication to form the system transmission.

Details in respect of calculating the reflectivity are explained in WO 2015/014 753 A1.

Further information in respect of reflection at a GI mirror (mirror for grazing incidence) are found in WO 2012/126 867 A. Further information in respect of the reflectivity of NI mirrors (normal incidence mirrors) can be found in DE 101 55 711 A.

An overall reflectivity or system transmission of the projection optical unit 7, emerging as a product of the reflectivities of all mirrors M1 to M8 of the projection optical unit 7, is R=8.02%.

The mirror M8, that is to say the last mirror upstream of the image field 8 in the imaging beam path, has a passage opening 17 for the passage of the imaging light 3 which is reflected from the antepenultimate mirror M6 toward the penultimate mirror M7. The mirror M8 is used in a reflective manner around the passage opening 17. All other mirrors M1 to M7 do not have a passage opening and are used in a reflective manner in a region connected in a gap-free manner.

In the first imaging light plane xz, the projection optical unit 7 has exactly one first plane intermediate image 18 in the imaging light beam path between the mirrors M6 and M7. This first plane intermediate image 18 lies in the region of the passage opening 17. A distance between the passage opening 17 and the image field 8 is more than four times greater than a distance between the passage opening 17 and the first plane intermediate image 18.

In the second imaging light plane yz that is perpendicular to the first imaging light plane xz (cf. FIG. 2), the imaging light 3 passes through exactly two second plane intermediate images 19 and 20. The first of these two second plane intermediate images 19 lies between the mirrors M2 and M3 in the imaging light beam path. The other one of the two second plane intermediate images 20 lies in the region of the reflection of the imaging light 3 at the mirror M6.

The number of the first plane intermediate images, i.e. exactly one first plane intermediate image in the projection optical unit 7, and the number of the second plane intermediate images, i.e. exactly two second plane intermediate images in the projection optical unit 7, differ from one another in the projection optical unit 7. In the projection optical unit 7, this number of intermediate images differs by exactly one.

The second imaging light plane yz, in which the greater number of intermediate images, namely the two second plane intermediate images 19 and 20, are present, coincides with the folding plane yz of the GI mirrors M2, M3 and M5, M6. This folding plane is the plane of incidence of the chief ray 16 of the central field point upon reflection at the respective GI mirror. The second plane intermediate images are not, as a rule, perpendicular to the chief ray 16 of the central field point which defines the imaging light main propagation direction $z_{HR}$. An intermediate image tilt angle, i.e. a deviation from this perpendicular arrangement, is arbitrary as a matter of principle and may lie between 0° and +/−89°.

Auxiliary devices 18a, 19a, 20a can be arranged in the region of the intermediate images 18, 19, 20. These auxiliary devices 18a to 20a can be field stops for defining, at least in sections, a boundary of the imaging light beam. A field intensity prescription device in the style of an UNICOM, in particular with finger stops staggered in the x-direction, can also be arranged in one of the intermediate image planes of the intermediate images 18 to 20.

The mirrors M1 to M8 are embodied as free-form surfaces which cannot be described by a rotationally symmetric function. Other embodiments of the projection optical unit 7, in which at least one of the mirrors M1 to M8 is embodied as a rotationally symmetric asphere, are also possible. An asphere equation for such a rotationally symmetric asphere is known from DE 10 2010 029 050 A1. It is also possible for all mirrors M1 to M8 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} +$$
$$C_1 x + C_2 y + C_3 x^2 + C_4 xy + C_5 y^2 + C_6 x^3 + \ldots + \quad (1)$$
$$C_9 y^3 + C_{10} x^4 + \ldots + C_{12} x^2 y^2 + \ldots + C_{14} y^4 + C_{15} x^5 +$$
$$\ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2+y^2=r^2$. Here, r is the distance from the reference axis of the free-form equation (x=0; y=0).

In the free-form surface equation (1), $C_1$, $C_2$, $C_3$ ... denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

FIG. 4 shows boundary contours of the reflection surfaces in each case impinged upon by the imaging light 3 on the mirrors M1 to M8 of the projection optical unit 7, i.e. the so-called footprints of the mirrors M1 to M8. These boundary contours are in each case depicted in an x/y-diagram, which corresponds to the local x- and y-coordinates of the respective mirror M1 to M8. The illustrations are true to scale in millimeters. Moreover, the form of the passage opening 17 is depicted in the illustration relating to the mirror M8.

The following table summarizes the parameters "maximum angle of incidence", "extent of the reflection surface in the x-direction", "extent of the reflection surface in the y-direction" and "maximum mirror diameter" for the mirrors M1 to M8:

| | M1 | M2 | M3 | M4 | M5 | M6 | M7 | M8 |
|---|---|---|---|---|---|---|---|---|
| Maximum angle of incidence [°] | 17.6 | 81.3 | 79.4 | 14.1 | 80.4 | 83.2 | 22.5 | 6.3 |
| Extent of the reflection surface in the x-direction [mm] | 497.3 | 441.9 | 524.9 | 731.8 | 464.7 | 314.0 | 298.0 | 1003.7 |
| Extent of the reflection surface in the | 252.4 | 462.4 | 250.5 | 130.0 | 231.8 | 132.6 | 183.2 | 984.2 |

|  | M1 | M2 | M3 | M4 | M5 | M6 | M7 | M8 |
|---|---|---|---|---|---|---|---|---|
| y-direction [mm] |  |  |  |  |  |  |  |  |
| Maximum mirror diameter [mm] | 497.3 | 494.0 | 524.9 | 731.8 | 464.7 | 314.0 | 298.0 | 1004.0 |

On account of the second plane intermediate images 19 and 20 in the region of the GI mirrors M2, M3, M5 and M6, these GI mirrors, too, do not have an extreme extent in the y-direction. A y/x-aspect ratio of corresponding surface dimension of the reflection surfaces of these GI mirrors M2, M3, M6 and M7 is only greater than 1 for the mirror M2 and is approximately 1.05 there. None of the GI mirrors has a y/x-aspect ratio that is greater than 1.05. The y/x-aspect ratio deviates most strongly from the value of 1 at the mirrors M4 of the mirrors M1 to M8 of the projection optical unit 7 and there it has a value of approximately 1:5.6. In all other mirrors, the y/x-aspect ratio lies in the range between 3:1 and 1:3.

The mirror M8 that predetermines the image-side numerical aperture has the largest maximum mirror diameter with a diameter of 1004 mm. None of the other mirrors M1 to M7 have a maximum diameter which is greater than 80% of the maximum mirror diameter of the mirror M8.

A pupil-defining aperture stop AS is arranged in the imaging light beam path between the mirrors M1 and M2 in the projection optical unit 7. In the region of the aperture stop AS, the entire imaging light beam is accessible over its entire circumference.

The mirror M6 of the projection optical unit 7 (cf. FIG. 4) has a reflection surface that can be used for reflection, with a boundary contour RK. This boundary contour RK has a basic form GF which is indicated by dashed lines in relation to the mirror M6 in FIG. 4. This basic format GF corresponds to a curved basic form of the object field 4. The basic form GF of the mirror M6 corresponds to that of the object field 4, i.e. it is likewise curved.

Two contour bulges KA are arranged along a side edge of the boundary contour RK of the mirror M6 that lies at the top in FIG. 4.

The boundary contour RK of the mirror M6 follows a boundary contour of an entire imaging light beam at the reflection at the mirror M6. This boundary contour of the entire imaging light beam has corresponding contour bulges, which is due to the intermediate imaging by the second plane intermediate image 20.

Two further contour bulges KA are arranged on the opposite side edge of the boundary contour RK, depicted at the bottom in FIG. 4.

The contour bulges KA are respectively arranged along the two long sides of the basic form GF.

The optical design data of the reflection surfaces of the mirrors M1 to M8 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 7 and summarizes the numerical aperture NA, the calculated design wavelength for the imaging light, the reduction factors βx and βy in the two imaging light planes xz and yz, the dimensions of the image field in the x-direction and y-direction, image field curvature, and an image aberration value rms and a stop location. This curvature is defined as the inverse radius of curvature of the field. The image aberration value is specified in mλ (ml), i.e. it depends on the design wavelength. Here, this is the rms value of the wavefront aberration.

The second of these tables provides vertex point radii (Radius_x=$R_x$, Radius_y=$R_y$) and refractive power values (Power_x, Power_y) for the optical surfaces of the optical components. Negative values of radius mean curves which are concave toward the incident illumination light 3 in the section of the respective surface with the considered plane (xz, yz), which is spanned by a surface normal at the vertex point with the respective direction of curvature (x, y). The two radii Radius_x, Radius_y may have explicitly different signs.

The vertex points at each optical surface are defined as points of incidence of a guide ray which travels from an object field center to the image field 8 along a plane of symmetry x=0, i.e. the plane of the drawing of FIG. 2 (meridional plane).

The refractive powers Power_x ($P_x$), Power_y ($P_y$) at the vertex points are defined as:

$$P_x = -\frac{2\cos AOI}{R_x}$$

$$P_y = -\frac{2}{R_y \cos AOI}$$

Here, AOI denotes an angle of incidence of the guide ray with respect to the surface normal.

The third table specifies, for the mirrors M1 to M8, in millimeters, the conic constants $k_x$ and $k_y$, the vertex point radius $R_x$ (=Radius_x) and the free-form surface coefficients $C_n$. Coefficients $C_n$ not tabulated in the table each have the value of 0.

The fourth table still specifies the magnitude along which the respective mirror, proceeding from a reference surface, was decentered (DCY) in the y-direction, and displaced (DCZ) and tilted (TLA, TLC) in the z-direction. This corresponds to a parallel shift and a tilting in the case of the freeform surface design method. Here, a displacement is carried out in the y-direction and in the z-direction in mm, and tilting is carried out about the x-axis and about the z-axis. In this case, the angle of rotation is specified in degrees. Decentering is carried out first, followed by tilting. The reference surface during decentering is in each case the first surface of the specified optical design data. Decentering in the y-direction and in the z-direction is also specified for the object field 4. In addition to the surfaces assigned to the individual mirrors, the fourth table also tabulates the image plane as the first surface, the object plane as the last surface and optionally a stop surface (with the label "Stop").

The fifth table still specifies the transmission data of the mirrors M8 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table specifies an edge of the stop AS as a polygonal line in local coordinates xyz. As described above, the stop AS is decentered and tilted.

TABLE 1 for FIG. 2

| Exemplary embodiment | FIG. 2 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.0 mm |
| Field curvature | 0.012345 1/mm |
| rms | 12.0 ml |
| Stop | AS |

TABLE 2 for FIG. 2

| Surface | Radius_x [mm] | Power_x [1/mm] | Radius_y [mm] | Power_y [1/mm] | Operating mode |
|---|---|---|---|---|---|
| M8 | −977.9363886 | 0.0020361 | −929.6273166 | 0.0021610 | REFL |
| M7 | 1294.8209643 | −0.0015445 | 435.8531595 | −0.0045890 | REFL |
| M6 | 18365.5486866 | −0.0000231 | −46554.4044838 | 0.0002030 | REFL |
| M5 | 5259.3234531 | −0.0000933 | −9321.2739117 | 0.0008744 | REFL |
| M4 | −1765.3339870 | 0.0011067 | −1142.0480083 | 0.0017928 | REFL |
| M3 | 2922.7328266 | −0.0001820 | −2482.4542085 | 0.0030292 | REFL |
| M2 | 1651.2946943 | −0.0003085 | −8489.6411649 | 0.0009249 | REFL |
| M1 | −2632.7505211 | 0.0007257 | −1790.4348754 | 0.0011694 | REFL |

TABLE 3a for FIG. 2

| Coefficient | M8 | M7 | M6 |
|---|---|---|---|
| KY | 0.00000000 | 0.00000000 | 0.00000000 |
| KX | −0.11558328 | −0.06317830 | −0.67536006 |
| RX | −977.93638860 | 1294.82096400 | 18365.54869000 |
| C7 | −3.26431733e−09 | −9.19931196e−07 | 6.01520941e−08 |
| C9 | 1.58538114e−09 | −1.11351361e−09 | 8.67911005e−10 |
| C10 | −2.62749675e−11 | 1.65294576e−09 | 2.46957387e−11 |
| C12 | −3.89038959e−11 | 5.8094008e−09 | 5.62790766e−11 |
| C14 | −1.02513051e−11 | 5.53161746e−09 | 2.39097835e−11 |
| C16 | −5.05646011e−15 | −5.96237142e−12 | −2.22416819e−14 |
| C18 | −4.92292703e−15 | −1.27228894e−11 | 2.83846346e−13 |
| C20 | 1.16365138e−15 | 5.18801779e−12 | 5.76795483e−15 |
| C21 | −3.04440558e−17 | 5.32997236e−15 | −1.09361216e−16 |
| C23 | −7.98657435e−17 | 4.06529865e−14 | 7.9007479e−16 |
| C25 | −6.41119264e−17 | 7.80652921e−14 | −4.56580147e−16 |
| C27 | −1.39235463e−17 | 8.10562525e−14 | −2.24207356e−15 |
| C29 | −6.20803428e−21 | −2.93716245e−17 | 9.54358468e−19 |
| C31 | −1.24534312e−20 | −1.84555197e−16 | −5.3458423e−18 |
| C33 | −4.42030372e−21 | −1.84586928e−16 | −1.86756383e−17 |
| C35 | 1.07126508e−21 | 1.91912568e−16 | 1.00354655e−17 |
| C36 | −2.91575118e−23 | 9.09001497e−20 | 6.26271473e−21 |
| C38 | −1.08152276e−22 | 6.67834705e−19 | −6.49920584e−20 |
| C40 | −1.4917793e−22 | 1.73448182e−18 | 1.11297067e−19 |
| C42 | −8.53194437e−23 | 2.43380836e−18 | 3.95874101e−19 |
| C44 | −1.41286848e−23 | 5.65275748e−19 | 5.41032235e−19 |
| C46 | −5.48565523e−27 | −6.08367951e−22 | −2.03215013e−22 |
| C48 | −1.54244255e−26 | −3.0535911e−21 | −4.18114672e−22 |
| C50 | −8.36720446e−27 | −1.37751887e−22 | −5.5893905e−22 |
| C52 | −5.14729095e−28 | 1.06533988e−20 | 8.75292138e−21 |
| C54 | 4.65607389e−28 | 1.19886682e−21 | −4.41429933e−21 |
| C55 | −3.994753e−29 | −1.37140533e−24 | −2.55530798e−25 |
| C57 | −1.95743945e−28 | −1.10267807e−23 | 3.51112917e−24 |
| C59 | −3.82935802e−28 | −1.41353816e−23 | −6.14784987e−24 |
| C61 | −3.52698144e−28 | 9.07886953e−24 | −6.9704448e−23 |
| C63 | −1.4336365e−28 | −7.49817063e−24 | −7.39060153e−23 |
| C65 | −1.94273034e−29 | 3.91695015e−23 | −5.92226689e−23 |
| C67 | −1.57733117e−32 | −4.88361615e−27 | 9.64794763e−27 |
| C69 | −6.12153839e−32 | −3.56715922e−26 | 5.2372298e−26 |
| C71 | −1.18717428e−31 | −3.19191477e−25 | 2.13380099e−25 |
| C73 | −1.063393e−31 | −7.51279757e−25 | 2.45159051e−25 |
| C75 | −2.89486089e−32 | −6.71222307e−25 | −1.71851249e−24 |

TABLE 3a-continued for FIG. 2

| Coefficient | M8 | M7 | M6 |
|---|---|---|---|
| C77 | 6.32013344e−33 | 7.38715108e−25 | 9.74025575e−25 |
| C78 | 1.11262585e−35 | 3.03620946e−29 | 2.58218161e−30 |
| C80 | 4.67368442e−35 | 4.91226123e−28 | −6.72675352e−29 |
| C82 | 1.23352933e−34 | 1.67499613e−27 | 1.55650129e−29 |
| C84 | 1.53536949e−34 | 2.38894849e−27 | 2.90832154e−27 |
| C86 | 9.5650515e−35 | −8.23315242e−29 | 6.09750745e−27 |
| C88 | 1.71733925e−35 | −8.61039219e−28 | 6.1107714e−27 |
| C90 | −5.94121394e−36 | −1.76523408e−27 | 7.99611209e−28 |
| C92 | 1.4787702e−38 | −2.58993199e−31 | −1.58067878e−31 |
| C94 | 8.90625365e−38 | −1.71267929e−30 | −1.06702074e−30 |

TABLE 3a-continued for FIG. 2

| Coefficient | M8 | M7 | M6 |
|---|---|---|---|
| C96 | 2.89055314e−37 | −2.40810729e−31 | −7.02875699e−30 |
| C98 | 4.29516754e−37 | 2.22333849e−29 | −3.28419568e−29 |
| C100 | 3.17681665e−37 | 5.50483336e−29 | −2.1648152e−29 |
| C102 | 8.36108049e−38 | 5.43169134e−29 | 1.11856162e−28 |
| C104 | −9.74872514e−39 | −7.63910208e−30 | −6.57499885e−29 |
| C105 | −1.04610049e−40 | 0 | 0 |
| C107 | −7.41863701e−40 | 0 | 0 |
| C109 | −2.255693e−39 | 0 | 0 |
| C111 | −3.77109587e−39 | 0 | 0 |
| C113 | −3.64577025e−39 | 0 | 0 |
| C115 | −2.02577223e−39 | 0 | 0 |
| C117 | −5.69128325e−40 | 0 | 0 |
| C119 | −4.83815892e−41 | 0 | 0 |
| C121 | −4.67494483e−44 | 0 | 0 |
| C123 | −3.13407576e−43 | 0 | 0 |
| C125 | −8.99958812e−43 | 0 | 0 |
| C127 | −1.4543934e−42 | 0 | 0 |
| C129 | −1.2834763e−42 | 0 | 0 |
| C131 | −6.10286793e−43 | 0 | 0 |
| C133 | −8.34784383e−44 | 0 | 0 |
| C135 | 2.74349368e−44 | 0 | 0 |

TABLE 3b for FIG. 2

| Coefficient | M5 | M4 | M3 |
|---|---|---|---|
| KY | 0.00000000 | 0.00000000 | 0.77165478 |
| KX | 0.27864052 | 0.19204874 | 0.00000000 |
| RX | 5259.32345300 | −1765.33398700 | 2922.73282700 |
| C7 | −1.8652865e−07 | −4.24630231e−08 | 1.94384684e−07 |
| C9 | −1.02802052e−07 | −6.52977487e−07 | −7.17829652e−08 |
| C10 | −5.35811112e−11 | 1.10296456e−10 | −7.42346358e−11 |
| C12 | −1.99417399e−10 | 1.00977633e−10 | 3.76056759e−11 |
| C14 | 1.01835137e−10 | −2.41010461e−09 | 3.93568892e−11 |
| C16 | −2.80626289e−13 | −5.69400376e−14 | 1.25218538e−13 |
| C18 | −1.17577236e−13 | 1.19732124e−12 | −2.13740953e−13 |

TABLE 3b-continued for FIG. 2

| Coefficient | M5 | M4 | M3 |
|---|---|---|---|
| C20 | −2.50255951e−13 | −4.32169574e−12 | −9.64163266e−14 |
| C21 | 2.6907927e−16 | 2.39267428e−18 | −1.53152765e−17 |
| C23 | −4.23262886e−16 | −4.05603783e−16 | 4.40460986e−16 |
| C25 | 2.15191279e−16 | 1.89419852e−15 | 2.63263458e−16 |
| C27 | −5.663038e−16 | 7.91269635e−14 | −4.09740933e−16 |
| C29 | −1.5876173e−19 | 8.03015961e−21 | 1.86842113e−20 |
| C31 | −2.92538582e−18 | −1.25575575e−18 | −2.14335016e−19 |
| C33 | 3.14262906e−18 | −7.82872258e−17 | 3.26621777e−18 |
| C35 | −2.0088391e−18 | −1.00119594e−15 | 4.39403082e−19 |
| C36 | −5.08999445e−21 | 2.78323568e−23 | −1.48137274e−21 |
| C38 | −7.30929047e−21 | 3.91351204e−22 | −6.05704744e−22 |
| C40 | −2.98409959e−21 | 2.36229594e−20 | −9.24943789e−21 |
| C42 | 3.84399776e−20 | 7.46681843e−19 | 1.57963955e−21 |
| C44 | 3.13179317e−20 | 2.73402949e−18 | 2.68227984e−21 |
| C46 | −5.10842468e−24 | 8.55981332e−26 | 1.99536481e−24 |
| C48 | 2.91936197e−23 | 3.82725655e−25 | 9.32028588e−24 |
| C50 | 1.38453799e−22 | −1.24908171e−22 | −1.36675154e−23 |
| C52 | 5.51592482e−22 | −1.4570635e−21 | −1.17711866e−22 |
| C54 | 3.41044893e−22 | 8.01441707e−20 | −9.9016006e−23 |
| C55 | 5.17252551e−26 | −1.34968706e−29 | −1.52532943e−27 |
| C57 | 2.00318594e−25 | −1.44840346e−27 | 2.0470899e−26 |
| C59 | 2.10437127e−25 | 1.6131965e−26 | 6.73921181e−26 |
| C61 | 3.69625695e−25 | 8.05459452e−25 | 3.84979616e−25 |
| C63 | 3.90489396e−24 | −9.87992209e−23 | 7.45595383e−26 |
| C65 | 1.69415126e−25 | −8.02607569e−22 | 3.07812088e−25 |
| C67 | 3.23262405e−28 | 1.14795879e−32 | −4.40966022e−29 |
| C69 | 2.68979529e−29 | −1.90474992e−29 | −5.89666435e−29 |
| C71 | −3.36239328e−27 | −8.67278176e−28 | −7.78323397e−28 |
| C73 | −9.49129081e−27 | 2.06524492e−26 | −4.01125727e−28 |
| C75 | 9.56175133e−27 | 5.20174159e−25 | 3.52455817e−27 |
| C77 | −1.16580455e−26 | −1.72107549e−24 | 6.57922701e−28 |
| C78 | 9.80464919e−32 | −4.54180435e−34 | 7.49347454e−32 |
| C80 | −9.31289455e−31 | 6.32640281e−33 | −2.27529195e−31 |
| C82 | −7.94127312e−30 | 1.28727506e−31 | 1.93638319e−31 |
| C84 | −3.16841696e−29 | 5.32074606e−31 | 3.0973772e−30 |
| C86 | −7.96302059e−29 | −1.02870035e−29 | −3.39277553e−30 |
| C88 | −1.07641552e−29 | 7.15154387e−27 | 1.49638592e−29 |
| C90 | −5.80007699e−29 | 5.52471571e−26 | −1.81838477e−29 |
| C92 | −6.37618517e−33 | −1.00673819e−36 | 4.35344188e−34 |
| C94 | −7.23981776e−33 | 1.93844772e−35 | 6.92879874e−34 |
| C96 | −2.27198696e−32 | 4.0369611e−34 | −1.30815712e−33 |
| C98 | −8.07732983e−32 | 1.1395269e−32 | −5.54290471e−33 |
| C100 | −1.81611958e−31 | −1.72883542e−30 | −1.51072988e−32 |
| C102 | −5.61071528e−32 | −4.78892158e−29 | −9.32848301e−32 |
| C104 | −8.84936177e−32 | −2.47120721e−28 | 5.24911338e−32 |

TABLE 3c for FIG. 2

| Coefficient | M2 | M1 |
|---|---|---|
| KY | −0.01234570 | 0.00000000 |
| KX | 0.00000000 | 0.00000000 |
| RX | 1651.29469400 | −2632.75052100 |
| C7 | −1.51550123e−07 | −7.36996938e−09 |
| C9 | −1.21487821e−08 | 2.0569377e−08 |
| C10 | 2.09113187e−10 | −1.80026904e−11 |
| C12 | −7.96285921e−11 | −2.02425339e−10 |
| C14 | 1.20235152e−10 | −1.58699294e−10 |
| C16 | −2.42936866e−13 | 1.14876287e−13 |
| C18 | 3.56848304e−16 | 4.28329459e−13 |
| C20 | −2.73831533e−13 | −3.62201583e−14 |
| C21 | 4.93325127e−16 | 5.51321462e−17 |
| C23 | 1.59461068e−16 | −5.36481007e−17 |
| C25 | 6.66776901e−16 | −3.27342504e−16 |
| C27 | 2.41302066e−16 | 1.34172814e−15 |
| C29 | 7.485099e−20 | −1.44207244e−19 |
| C31 | 4.18658537e−19 | 1.32626192e−18 |
| C33 | −2.38338714e−18 | 4.93631418e−18 |
| C35 | −1.15578785e−18 | −6.59449991e−18 |
| C36 | 4.45559292e−21 | −7.91898678e−22 |
| C38 | 1.53820416e−21 | −5.64637331e−21 |

TABLE 3c-continued for FIG. 2

| Coefficient | M2 | M1 |
|---|---|---|
| C40 | 3.30412695e−21 | −1.46982681e−20 |
| C42 | 5.95781353e−21 | −3.05459185e−20 |
| C44 | 4.72401785e−21 | 6.10830044e−20 |
| C46 | 6.64520361e−24 | 7.70691095e−25 |
| C48 | 3.47713297e−25 | 9.16676497e−25 |
| C50 | −2.00485e−23 | −1.06076605e−22 |
| C52 | −2.14721965e−23 | −1.99224578e−22 |
| C54 | −9.43870644e−25 | −9.42098864e−23 |
| C55 | −5.89271373e−27 | 8.8726833e−27 |
| C57 | −5.14053514e−26 | 1.32158184e−25 |
| C59 | −2.26598784e−26 | 4.00410895e−25 |
| C61 | 3.67898874e−26 | 4.34484571e−25 |
| C63 | 6.45066115e−26 | 3.6616824e−25 |
| C65 | −1.70603744e−26 | −2.44627583e−24 |
| C67 | 9.80740962e−29 | 4.64135426e−29 |
| C69 | 3.87068653e−29 | 2.42039766e−28 |
| C71 | 2.12238797e−28 | 2.00886711e−27 |
| C73 | −7.90980539e−29 | 8.12221417e−27 |
| C75 | −1.71846637e−28 | 9.69211396e−27 |
| C77 | −4.83228352e−29 | −2.69100732e−27 |
| C78 | −3.28414165e−31 | −4.34877232e−32 |
| C80 | 6.2173288e−31 | −1.23197166e−30 |
| C82 | 5.25200248e−31 | −5.95477298e−30 |
| C84 | 4.09914682e−31 | −1.20688548e−29 |
| C86 | 6.87904365e−31 | 2.4844433e−30 |
| C88 | 4.06358345e−31 | 1.08603958e−29 |
| C90 | 2.87455932e−31 | 1.73556337e−28 |
| C92 | −1.43700292e−33 | −6.95582298e−35 |
| C94 | 6.74298218e−34 | −2.81521715e−34 |
| C96 | −1.7534426e−33 | −1.38405426e−32 |
| C98 | −3.15685068e−33 | −8.4479462e−32 |
| C100 | −1.49584673e−33 | −2.7006613e−31 |
| C102 | −4.70629963e−34 | −2.3767521e−31 |
| C104 | −3.32523652e−34 | −5.76041521e−31 |

TABLE 4a for FIG. 2

| Surface | DCX | DCY | DCZ |
|---|---|---|---|
| Image | 0.00000000 | 0.00000000 | 0.00000000 |
| M8 | 0.00000000 | 0.00000000 | 882.77565409 |
| M7 | 0.00000000 | 147.74416815 | 103.43278922 |
| M6 | −0.00000000 | −82.17184405 | 1159.82035546 |
| M5 | −0.00000000 | −195.88699161 | 1313.90521342 |
| M4 | −0.00000000 | −689.91126350 | 1545.33998989 |
| M3 | −0.00000000 | 161.29497309 | 1546.43843672 |
| M2 | 0.00000000 | 732.36714651 | 1201.83267617 |
| Stop | 0.00000000 | 1015.58933861 | 693.77057038 |
| M1 | 0.00000000 | 1198.65681500 | 365.37240755 |
| Object | 0.00000000 | 1348.48550683 | 2077.92168912 |

TABLE 4b for FIG. 2

| Surface | TLA[deg] | TLB[deg] | TLC[deg] |
|---|---|---|---|
| Image | −0.00000000 | 0.00000000 | −0.00000000 |
| M8 | 5.36724017 | 0.00000000 | −0.00000000 |
| M7 | 191.50652875 | 0.00000000 | −0.00000000 |
| M6 | −65.64698575 | 0.00000000 | 0.00000000 |
| M5 | −39.33707785 | 0.00000000 | 0.00000000 |
| M4 | 77.48616539 | −0.00000000 | −0.00000000 |
| M3 | −15.51718699 | 0.00000000 | −0.00000000 |
| M2 | −45.98528751 | 0.00000000 | 0.00000000 |
| Stop | 29.56527173 | 180.00000000 | 0.00000000 |
| M1 | 192.06886766 | −0.00000000 | −0.00000000 |
| Object | −0.00000146 | 0.00000000 | −0.00000000 |

TABLE 5 for FIG. 2

| Surface | Angle of incidence [deg] | Reflectivity |
|---|---|---|
| M8 | 5.39974096 | 0.66267078 |
| M7 | 0.65775307 | 0.66564975 |
| M6 | 77.78202576 | 0.84766857 |
| M5 | 75.79531335 | 0.81712415 |
| M4 | 12.35481935 | 0.64834731 |
| M3 | 74.57586411 | 0.79655325 |
| M2 | 75.24373779 | 0.80800760 |
| M1 | 17.20845857 | 0.62924549 |
| Overall transmission | | 0.0802 |

TABLE 6 for FIG. 2

| X [mm] | Y [mm] | Z [mm] |
|---|---|---|
| 0.00000000 | 89.20801645 | 0.00000000 |
| 34.08528121 | 88.17188871 | 0.00000000 |
| 67.40598766 | 85.11507465 | 0.00000000 |
| 99.20831752 | 80.16474983 | 0.00000000 |
| 128.76104217 | 73.46969353 | 0.00000000 |
| 155.36725085 | 65.16806914 | 0.00000000 |
| 178.37639394 | 55.38904414 | 0.00000000 |
| 197.19924577 | 44.26886612 | 0.00000000 |
| 211.32549205 | 31.96726025 | 0.00000000 |
| 220.34120483 | 18.68302504 | 0.00000000 |
| 223.94717509 | 4.66585955 | 0.00000000 |
| 221.97922526 | −9.77769625 | 0.00000000 |
| 214.42559512 | −24.28603688 | 0.00000000 |
| 201.43485904 | −38.45542703 | 0.00000000 |
| 183.31296701 | −51.86145417 | 0.00000000 |
| 160.51193019 | −64.08136185 | 0.00000000 |
| 133.61280933 | −74.71394168 | 0.00000000 |
| 103.30527919 | −83.39836098 | 0.00000000 |
| 70.36584216 | −89.83225300 | 0.00000000 |
| 35.63590906 | −93.78743681 | 0.00000000 |
| 0.00000000 | −95.12190481 | 0.00000000 |
| −35.63590906 | −93.78743681 | 0.00000000 |
| −70.36584216 | −89.83225300 | 0.00000000 |
| −103.30527919 | −83.39836098 | 0.00000000 |
| −133.61280933 | −74.71394168 | 0.00000000 |
| −160.51193019 | −64.08136185 | 0.00000000 |
| −183.31296701 | −51.86145417 | 0.00000000 |
| −201.43485904 | −38.45542703 | 0.00000000 |
| −214.42559512 | −24.28603688 | 0.00000000 |
| −221.97922526 | −9.77769625 | 0.00000000 |
| −223.94717509 | 4.66585955 | 0.00000000 |
| −220.34120483 | 18.68302504 | 0.00000000 |
| −211.32549205 | 31.96726025 | 0.00000000 |
| −197.19924577 | 44.26886612 | 0.00000000 |
| −178.37639394 | 55.38904414 | 0.00000000 |
| −155.36725085 | 65.16806914 | 0.00000000 |
| −128.76104217 | 73.46969353 | 0.00000000 |
| −99.20831752 | 80.16474983 | 0.00000000 |
| −67.40598766 | 85.11507465 | 0.00000000 |
| −34.08528121 | 88.17188871 | 0.00000000 |

An overall reflectivity of the projection optical unit 7 is 8.02%.

The reference axes of the mirrors are generally tilted with respect to a normal of the image plane 9, as is made clear by the tilt values in the tables.

The mirrors M1, M4 and M8 have negative values for the radius, i.e. they are, in principle, concave mirrors. The mirror M7 has a positive value for the radius, i.e. it is, in principle, a convex mirror. The mirrors M2, M3, M5 and M6 have radius values with different signs, i.e. they are toric or saddle mirrors.

The image field 8 has an x-extent of two-times 13 mm and a y-extent of 1 mm. The projection optical unit 7 is optimized for an operating wavelength of the illumination light 3 of 13.5 nm.

An edge of a stop surface of the stop (cf., also, table 6 for FIG. 2) emerges from intersection points on the stop surface of all rays of the illumination light 3 which, on the image side, propagate at the field center point in the direction of the stop surface with a complete image-side telecentric aperture. When the stop is embodied as an aperture stop, the edge is an inner edge.

The stop AS can lie in a plane or else have a three-dimensional embodiment. The extent of the stop AS can be smaller in the scan direction (y) than in the cross scan direction (x).

An installation length of the projection optical unit 7 in the z-direction, i.e. a distance between the object plane 5 and the image plane 9, is approximately 2080 mm.

In the projection optical unit 7, a pupil obscuration is 15% of the entire aperture of the entry pupil. Thus, less than 15% of the numerical aperture is obscured as a result of the passage opening 17. The obscuration edge is constructed in a manner analogous to the construction of the stop edge explained above in conjunction with the stop 18. In the case of an embodiment as an obscuration stop, the edge is an outer edge of the stop. In a system pupil of the projection optical unit 7, a surface which cannot be illuminated due to the obscuration is less than $0.15^2$ of the surface of the overall system pupil. The non-illuminated surface within the system pupil can have a different extent in the x-direction than in the y-direction. The non-illuminated surface in the system pupil can be round, elliptical, square or rectangular. Moreover, this surface in the system pupil which cannot be illuminated can be decentered in the x-direction and/or in the y-direction in relation to a center of the system pupil.

A y-distance $d_{OIS}$ between a central object field point and a central image field point is approximately 1350 mm. A working distance between the mirror M7 and the image plane 9 is 77 mm.

The mirrors of the projection optical unit 7 can be housed in a cuboid with the xyz-edge lengths of 1004 mm×2021 mm×1534 mm.

The projection optical unit 7 is approximately telecentric on the image side.

The obscuration edge is constructed in a manner analogous to the construction of the stop edge explained above in conjunction with the stop 18. In the case of an embodiment as an obscuration stop, the edge is an outer edge of the stop. In a system pupil of the projection optical unit 7, a surface which cannot be illuminated due to the obscuration is less than $0.15^2$ of the surface of the overall system pupil. The non-illuminated surface within the system pupil can have a different extent in the x-direction than in the y-direction. The non-illuminated surface in the system pupil can be round, elliptical, square, rectangular or else have the form of a polygonal line. Moreover, this surface in the system pupil which cannot be illuminated can be decentered in the x-direction and/or in the y-direction in relation to a center of the system pupil.

Figure 6:
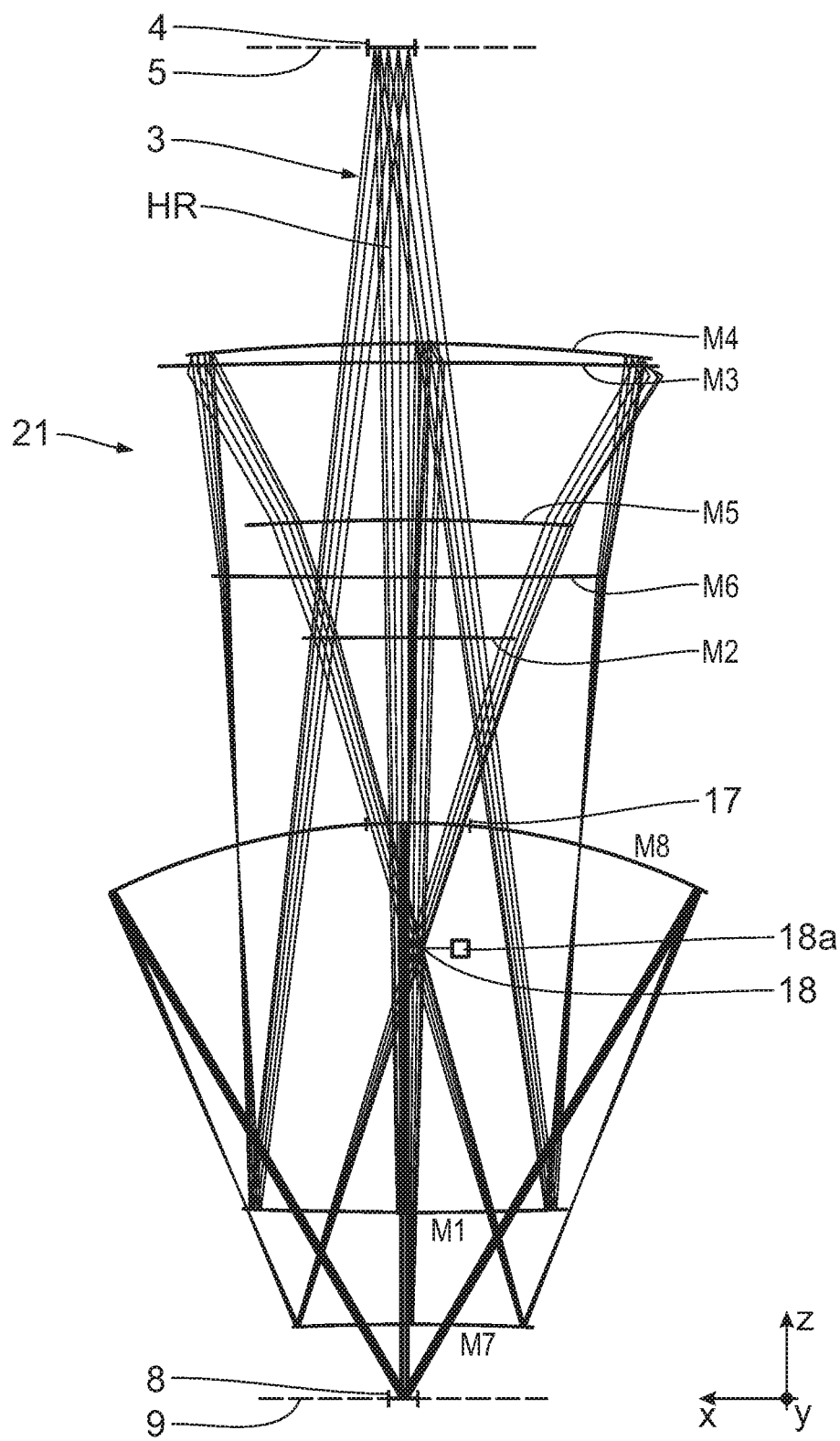
FIG. 6 shows a view of the imaging optical unit according to FIG. 5, as seen from the viewing direction VI in FIG. 5.
Figure 7:
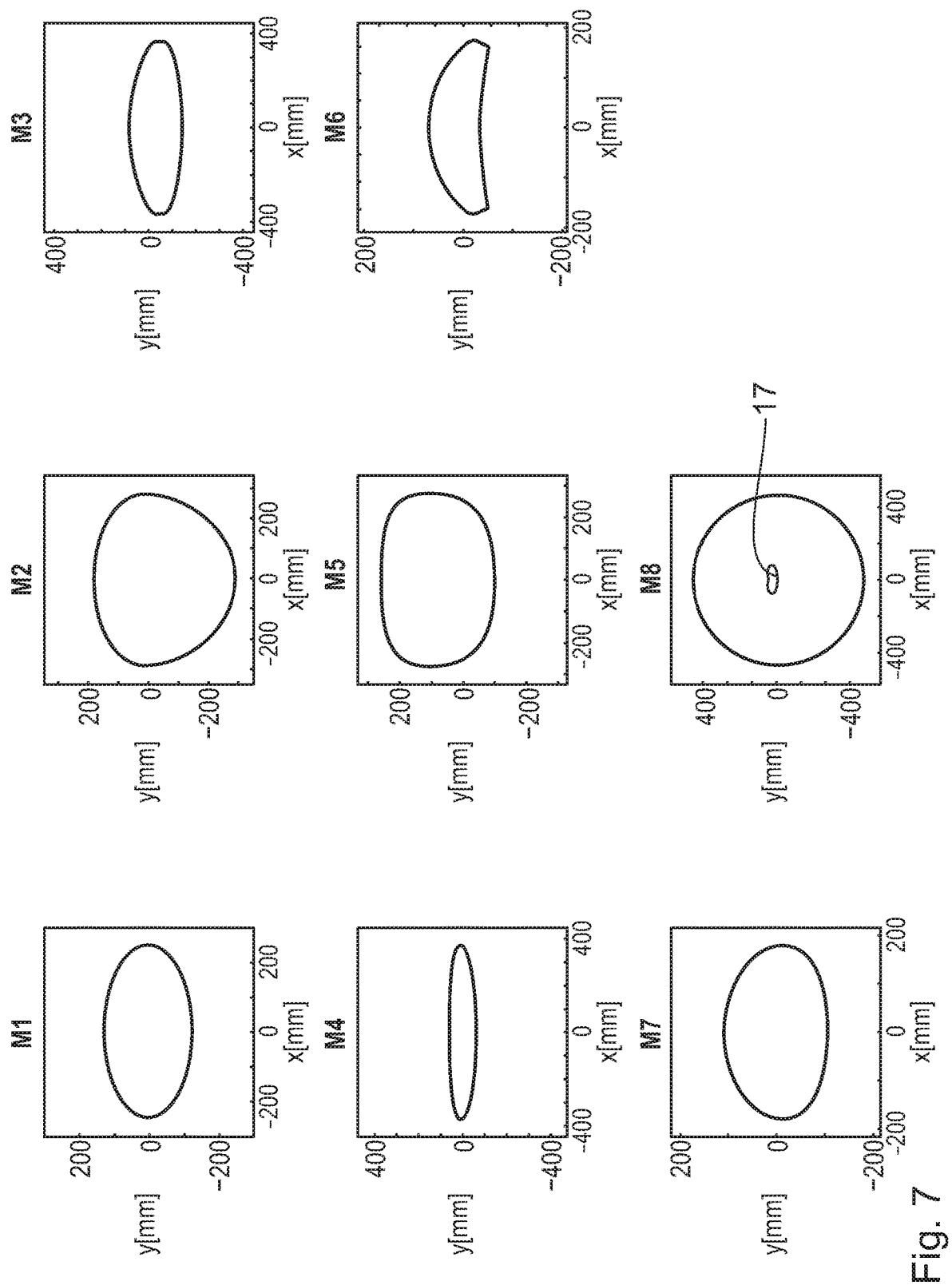
FIG. 7 shows plan views of boundary contours of optically used areas of the mirrors of the imaging optical unit according to FIGS. 5 and 6.

A further embodiment of a projection optical unit 21, which can be used in the projection exposure apparatus 1 according to FIG. 1 instead of the projection optical unit 7, is explained in the following text on the basis of FIGS. 5 to 7. Components and functions which were already explained above in the context of FIGS. 1 to 4 are appropriately denoted by the same reference signs and are not discussed again in detail.

The mirrors M1 to M8 are once again embodied as free-form surface mirrors, for which the free-form surface equation (1), specified above, applies.

The following table once again shows the mirror parameters of mirrors M1 to M8 of the projection optical unit 21.

|  | M1 | M2 | M3 | M4 | M5 | M6 | M7 | M8 |
|---|---|---|---|---|---|---|---|---|
| Maximum angle of incidence [°] | 17.7 | 83.6 | 79.1 | 15.4 | 82.1 | 84.1 | 21.7 | 8.5 |
| Extent of the reflection surface in the x-direction [mm] | 480.9 | 612.0 | 734.0 | 786.4 | 550.3 | 348.7 | 352.8 | 930.1 |
| Extent of the reflection surface in the y-direction [mm] | 240.7 | 495.6 | 227.5 | 123.4 | 359.4 | 121.4 | 211.1 | 921.6 |
| Maximum mirror diameter [mm] | 480.9 | 612.8 | 734.0 | 786.5 | 550.8 | 348.7 | 353.0 | 936.4 |

None of the GI mirrors M2, M3, M5 and M6 has a y/x-aspect ratio of its reflection surface that is greater than 1. The NI mirror M4 has the most extreme y/x-aspect ratio at approximately 1:6.4.

Here too, the mirror M8 has the largest maximum mirror diameter, measuring less than 950 mm.

The optical design data from the projection optical unit 21 can be gathered from the following tables, which, in terms of their design, correspond to the tables for the projection optical unit 7 according to FIG. 2.

Figure 5:
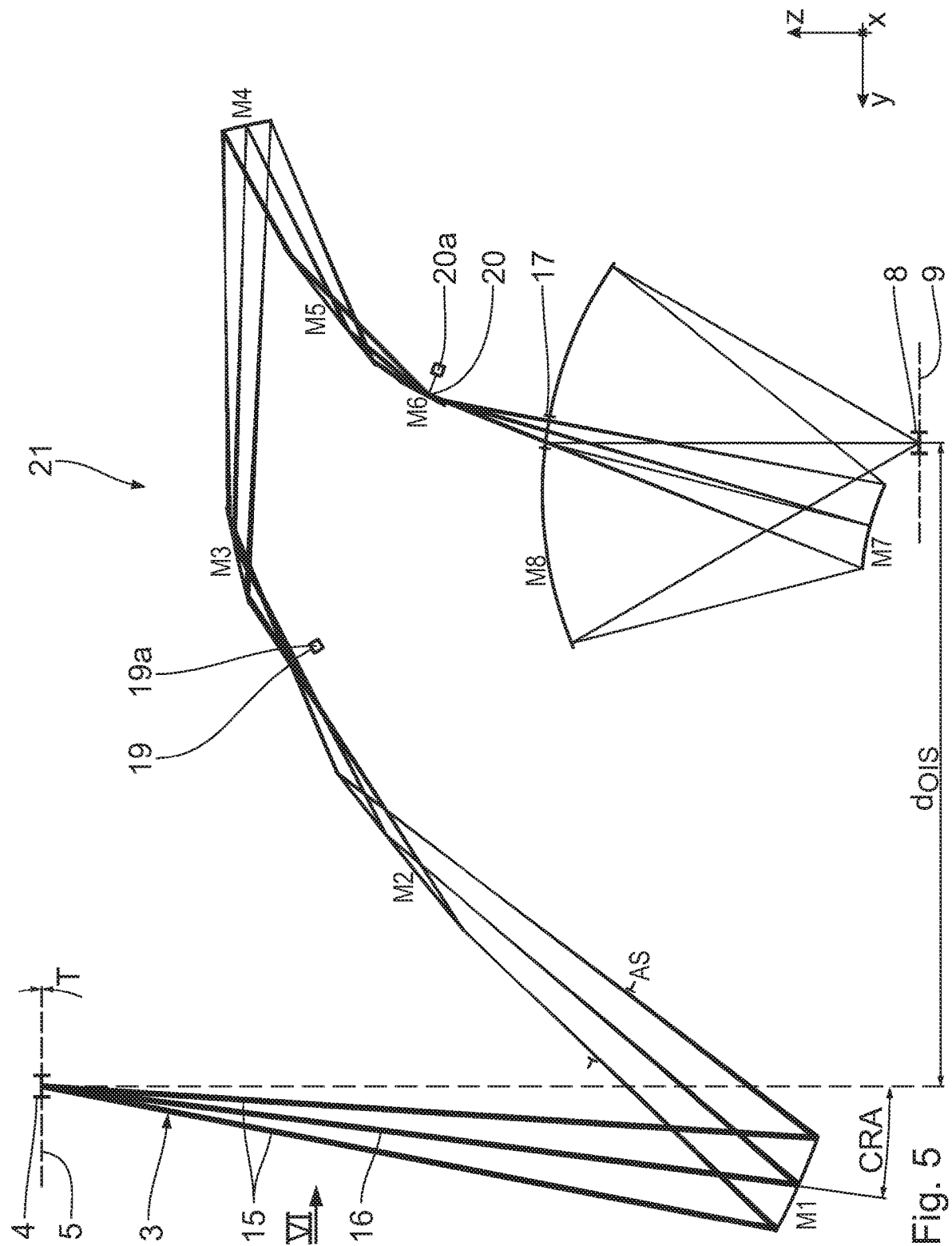
FIG. 5 shows, in an illustration similar to FIG. 2, a further embodiment of an imaging optical unit which can be used as a projection lens in the projection exposure apparatus according to FIG. 1.

TABLE 1 for FIG. 5

| Exemplary embodiment | FIG. 5 |
|---|---|
| NA | 0.5 |
| Wavelength | 13.5 nm |
| beta_x | 4.0 |
| beta_y | −8.0 |
| Field dimension_x | 26.0 mm |
| Field dimension_y | 1.2 mm |
| Field curvature | 0.0 1/mm |
| rms | 9.2 ml |
| Stop | AS |

TABLE 2

| Surface | Radius_x [mm] | Power_x [1/mm] | Radius_y [mm] | Power_y [1/mm] | Operating mode |
|---|---|---|---|---|---|
| M8 | −1028.1890922 | 0.0019300 | −959.8491743 | 0.0021000 | REFL |
| M7 | 3932.1050547 | −0.0005085 | 641.6674836 | −0.0031174 | REFL |
| M6 | −5352.1107774 | 0.0000757 | −24854.2346696 | 0.0003974 | REFL |
| M5 | −2870.1334684 | 0.0001444 | −5932.2095215 | 0.0016270 | REFL |
| M4 | −2683.8914762 | 0.0007230 | −1481.1480890 | 0.0013918 | REFL |
| M3 | −3205.8052729 | 0.0001568 | −3694.8995054 | 0.0021542 | REFL |
| M2 | 20005.7694322 | −0.0000193 | −14932.3149158 | 0.0006929 | REFL |
| M1 | −5312.3214757 | 0.0003611 | −2012.9727538 | 0.0010359 | REFL | for FIG. 5

TABLE 3a for FIG. 5

| Coefficient | M8 | M7 | M6 |
|---|---|---|---|
| KY | 0.00000000 | 0.00000000 | 0.00000000 |
| KX | −0.11707187 | −0.04806187 | −0.41102881 |
| RX | −1028.18909200 | 3932.10505500 | −5352.11077700 |
| C7 | −8.32110151e−09 | −7.75192759e−07 | −8.38431813e−08 |
| C9 | −2.65634274e−09 | −5.91270104e−07 | −3.8859897e−08 |
| C10 | −1.7055709e−11 | 3.50377124e−10 | 3.03629175e−10 |
| C12 | −3.4222558e−11 | 2.1099725e−09 | 6.89418154e−11 |
| C14 | −1.77106861e−11 | 4.80002309e−09 | −6.72089575e−11 |
| C16 | −1.14467378e−14 | −8.02970149e−13 | 6.68672697e−13 |
| C18 | −1.24019197e−14 | −7.25793342e−12 | 5.77645684e−13 |
| C20 | 1.84961531e−15 | 7.83383236e−13 | −2.52644253e−14 |
| C21 | −2.15820281e−17 | 1.42170913e−15 | 6.13051461e−16 |
| C23 | −6.10692437e−17 | 7.31997494e−15 | −3.41664153e−16 |
| C25 | −7.16991235e−17 | 1.49144421e−14 | −4.4277313e−17 |
| C27 | −1.35420803e−17 | −4.03527766e−15 | −1.58210976e−14 |
| C29 | −8.62061614e−21 | −4.29985657e−18 | 8.20744059e−18 |
| C31 | −2.63207728e−20 | −3.69588953e−17 | −4.68525896e−18 |
| C33 | −7.2137657e−21 | 1.19620901e−18 | 3.06007835e−17 |
| C35 | −9.80087706e−21 | −1.70594431e−17 | −1.6890856e−16 |
| C36 | −2.13708366e−23 | −4.21759943e−21 | −5.74352644e−21 |
| C38 | −8.22434751e−23 | 2.3951499e−20 | 5.33179782e−20 |
| C40 | −1.43850238e−22 | 1.30926569e−19 | 1.67190312e−20 |
| C42 | −8.16684483e−23 | 4.14969602e−19 | 1.38769568e−18 |
| C44 | −2.80014827e−23 | 1.4099488e−18 | 1.0296977e−17 |
| C46 | −1.18829244e−27 | −4.53220944e−24 | −1.42509336e−22 |
| C48 | −2.81954585e−26 | −1.41737217e−22 | 4.69109246e−22 |
| C50 | −1.85733281e−26 | −3.26256632e−22 | 5.80444096e−22 |
| C52 | −2.72041596e−26 | −3.37691673e−21 | −1.98920261e−20 |
| C54 | 2.37702476e−28 | −7.74548198e−21 | 2.08508467e−19 |
| C55 | −2.53602461e−29 | 1.08361867e−25 | 7.70794381e−26 |
| C57 | −1.39992921e−28 | 5.30294989e−25 | −2.55960339e−24 |
| C59 | −2.72691538e−28 | 1.10149469e−24 | −1.59315739e−23 |
| C61 | −2.38086239e−28 | 2.23222466e−25 | −4.74854092e−23 |
| C63 | −1.24030935e−28 | 1.09712699e−23 | −1.18627931e−21 |
| C65 | −1.85427438e−29 | 1.0229509e−23 | −1.02720137e−21 |
| C67 | −2.74820055e−32 | −7.25647164e−28 | 4.8045814e−27 |
| C69 | −5.18070943e−32 | −3.24196497e−27 | 1.25489123e−26 |
| C71 | −7.2409432e−32 | −6.87767424e−27 | −7.19619324e−26 |
| C73 | −1.24626527e−31 | −5.1366772e−26 | 2.03225531e−24 |
| C75 | −5.2993749e−32 | −1.47904291e−25 | −4.00593467e−24 |
| C77 | −3.2164977e−32 | −9.75767738e−27 | −4.61398026e−23 |
| C78 | −1.96159183e−35 | −5.95503793e−31 | −1.02993847e−31 |
| C80 | 2.07477209e−35 | −3.50991441e−30 | 5.33686479e−29 |
| C82 | −6.79009521e−35 | 9.70294329e−31 | 5.73736763e−28 |
| C84 | −1.54323386e−34 | 1.54338338e−28 | 1.87312898e−27 |
| C86 | −1.96855426e−34 | 8.86955354e−28 | 2.39794826e−26 |
| C88 | −1.38189955e−34 | 1.47179885e−27 | 1.67777792e−25 |
| C90 | −4.9760176e−35 | 7.92160236e−28 | −2.42405976e−25 |
| C92 | −1.24122918e−38 | 8.64955586e−33 | −6.17875305e−32 |
| C94 | −2.2387216e−37 | 2.699854e−32 | −7.1703801e−31 |
| C96 | −3.4409904e−37 | −1.55238589e−32 | −9.54082667e−31 |
| C98 | −2.84279628e−37 | −9.78290545e−31 | −5.27094915e−29 |
| C100 | 1.21418438e−38 | −3.4681581e−30 | −2.14210068e−28 |

TABLE 3a-continued for FIG. 5

| Coefficient | M8 | M7 | M6 |
|---|---|---|---|
| C102 | −1.88826532e−38 | −4.2071042e−30 | 1.19333327e−27 |
| C104 | 1.67545048e−38 | −3.90299739e−30 | 2.27692876e−28 |
| C105 | −3.31353145e−41 | 0 | 0 |
| C107 | −4.0002151e−40 | 0 | 0 |
| C109 | −1.25330728e−39 | 0 | 0 |
| C111 | −2.07743415e−39 | 0 | 0 |
| C113 | −2.25065136e−39 | 0 | 0 |
| C115 | −1.47353035e−39 | 0 | 0 |
| C117 | −4.51645253e−40 | 0 | 0 |
| C119 | −2.28432172e−41 | 0 | 0 |

TABLE 3a-continued for FIG. 5

| Coefficient | M8 | M7 | M6 |
|---|---|---|---|
| C121 | 8.2888995e−44 | 0 | 0 |
| C123 | 4.00545577e−43 | 0 | 0 |
| C125 | 7.56772316e−43 | 0 | 0 |
| C127 | 4.05636636e−43 | 0 | 0 |
| C129 | −2.53940071e−43 | 0 | 0 |
| C131 | −6.85819455e−43 | 0 | 0 |
| C133 | −2.51739126e−43 | 0 | 0 |
| C135 | −3.47946269e−44 | 0 | 0 |

TABLE 3b for FIG. 5

| Coefficient | M5 | M4 | M3 |
|---|---|---|---|
| KY | 0.00000000 | 0.00000000 | 0.64021352 |
| KX | 0.22282184 | 0.21746393 | 0.00000000 |
| RX | −2870.13346800 | −2683.89147600 | −3205.80527300 |
| C7 | −1.47299147e−07 | −2.64994677e−08 | 6.28701185e−08 |
| C9 | −6.23337864e−08 | −1.57634285e−07 | −4.65369704e−08 |
| C10 | 1.48854604e−10 | −1.192183e−11 | −2.29686752e−11 |
| C12 | −1.02913792e−10 | −1.86491276e−10 | 1.57020008e−11 |
| C14 | −2.53637748e−11 | −2.79043703e−09 | 1.16183001e−11 |
| C16 | 2.70788001e−13 | −9.12488689e−14 | −2.86529362e−15 |
| C18 | −1.56818296e−13 | −2.21807015e−12 | −1.98396494e−14 |
| C20 | −1.1477383e−13 | 1.49107451e−11 | 1.38283753e−13 |
| C21 | 1.67397123e−16 | −2.28964432e−17 | 4.39106972e−17 |
| C23 | 8.37104743e−16 | −8.9801365e−16 | 4.11622891e−17 |
| C25 | −7.47250405e−17 | 7.10807871e−15 | −1.21811131e−16 |
| C27 | −1.79902189e−16 | 2.2394936e−14 | −5.03509402e−16 |
| C29 | 8.27076091e−19 | −1.70454112e−19 | 4.82882592e−20 |
| C31 | 1.84287894e−18 | −1.34325393e−18 | 9.5068104e−20 |
| C33 | 1.21320541e−18 | −3.6138162e−17 | 5.1685178e−19 |
| C35 | 5.48084095e−19 | −3.8395771e−15 | 7.87749871e−18 |
| C36 | 1.85465234e−21 | −3.7251701e−23 | 1.26079958e−22 |
| C38 | 3.46046896e−21 | −1.05875826e−21 | −2.79363614e−22 |
| C40 | 9.44259685e−21 | −4.07620659e−20 | −2.48686978e−21 |
| C42 | 1.93639312e−20 | −3.72631463e−18 | −9.54609358e−21 |
| C44 | 1.81285681e−20 | −3.33714823e−18 | 4.8548579e−20 |
| C46 | 5.86611261e−24 | −3.27395572e−25 | −7.44419579e−26 |
| C48 | 1.21250192e−23 | −2.48877687e−23 | −1.45146899e−24 |
| C50 | 4.70679809e−23 | −1.629748e−21 | 1.70329245e−24 |
| C52 | 1.35442554e−22 | 4.947345e−21 | −5.74686981e−23 |
| C54 | 1.89474646e−22 | 2.46150233e−19 | −9.92108773e−22 |
| C55 | −8.51982321e−27 | −2.55798506e−29 | 1.77784215e−28 |
| C57 | 9.55965768e−27 | −9.67336823e−27 | 4.80247741e−27 |
| C59 | 8.56706064e−27 | −5.9830259e−25 | 4.94864751e−26 |
| C61 | 5.43620015e−26 | 2.99229925e−24 | 2.11534673e−25 |
| C63 | 5.14940966e−25 | 2.11963201e−22 | 9.49895777e−25 |
| C65 | 1.1325732e−24 | −6.55165767e−23 | 2.64833059e−24 |
| C67 | −3.20050186e−29 | 1.08799851e−31 | −4.25371744e−32 |
| C69 | −8.93307827e−29 | −5.9737815e−29 | −2.87246881e−30 |
| C71 | −4.40848262e−28 | 2.50559555e−27 | 6.01241562e−30 |
| C73 | −8.53288765e−28 | 4.77493797e−26 | −1.42915015e−27 |
| C75 | 1.04138051e−27 | −1.07454562e−24 | −1.45023879e−27 |
| C77 | 3.95557803e−27 | −1.58374495e−23 | 3.7330166e−26 |
| C78 | 7.67993746e−33 | 1.3603387e−34 | −4.70533824e−34 |
| C80 | −1.82202453e−31 | 2.8502332e−32 | −2.19064865e−32 |
| C82 | −7.59424732e−31 | 2.35506707e−30 | −4.5067788e−31 |
| C84 | −2.61465311e−30 | 4.19888867e−29 | −2.62808797e−30 |
| C86 | −4.10291005e−30 | −2.35024421e−28 | 3.12051609e−30 |
| C88 | 9.79786373e−31 | −1.33377231e−26 | −2.37410837e−29 |
| C90 | 7.50555478e−30 | −1.17432361e−26 | −2.93732287e−28 |
| C92 | −3.9655732e−35 | 1.72718937e−36 | 3.90363721e−36 |
| C94 | −4.46917432e−34 | 4.18220567e−34 | 1.49283393e−34 |
| C96 | −1.56112844e−33 | 1.35239086e−32 | 1.97806516e−33 |
| C98 | −4.3774859e−33 | 1.80150492e−31 | 8.83974058e−33 |
| C100 | −5.4549234e−33 | −9.86612463e−31 | −1.93388477e−33 |
| C102 | 2.81497244e−34 | 2.95757417e−29 | 9.15264296e−32 |
| C104 | 5.98693118e−33 | 4.50915131e−28 | 6.27379138e−31 |

TABLE 3c for FIG. 5

| Coefficient | M2 | M1 |
|---|---|---|
| KY | 0.01610994 | 0.00000000 |
| KX | 0.00000000 | 0.00000000 |
| RX | 20005.76943000 | −5312.32147600 |
| C7 | 9.97757392e−08 | 1.14515844e−09 |
| C9 | 2.91949621e−10 | 4.55089269e−08 |
| C10 | 2.70115051e−11 | 6.40348255e−11 |
| C12 | 3.25994029e−11 | 6.56125263e−11 |
| C14 | 6.37320775e−11 | −1.21032297e−10 |
| C16 | −5.70345897e−14 | −5.86255456e−14 |
| C18 | −2.34998283e−13 | −6.57703817e−14 |
| C20 | −1.02164563e−13 | −4.83818491e−14 |
| C21 | 1.81446991e−16 | −3.12737429e−17 |
| C23 | 8.47472643e−17 | 1.02850187e−17 |
| C25 | 5.297863e−16 | 5.14354465e−16 |
| C27 | −5.75737107e−16 | −4.3062722e−16 |
| C29 | 3.55617149e−20 | 1.49808819e−20 |
| C31 | −5.36437096e−19 | 5.5378949e−19 |
| C33 | 2.34497633e−19 | −4.15769813e−19 |
| C35 | 1.69984307e−18 | 3.04906337e−18 |
| C36 | −1.9178023e−22 | 1.70283147e−22 |
| C38 | 7.87813152e−23 | 7.11597023e−22 |
| C40 | 1.83575044e−21 | 2.0097976e−21 |
| C42 | −2.14115511e−21 | 5.03016856e−21 |
| C44 | 1.29072759e−22 | −4.06117639e−20 |
| C46 | −4.36456706e−24 | −4.25906296e−26 |
| C48 | −1.08223127e−23 | 4.71637846e−25 |
| C50 | −4.4109074e−24 | −1.24191908e−23 |
| C52 | 1.09242646e−23 | −1.79368118e−22 |
| C54 | 2.91487178e−24 | −5.96112215e−24 |
| C55 | 1.97519267e−27 | −1.32162791e−27 |
| C57 | 7.06505036e−27 | −8.3877702e−27 |
| C59 | 2.358499e−27 | −5.87441823e−26 |
| C61 | −4.8961744e−26 | −2.56618026e−25 |
| C63 | −6.59136487e−26 | 9.06106721e−26 |
| C65 | −2.64120864e−26 | 1.79467821e−25 |
| C67 | 3.46228797e−29 | 7.84570376e−30 |
| C69 | 1.1864846e−28 | 4.81900485e−31 |
| C71 | 2.08001966e−28 | −1.15249378e−28 |
| C73 | 1.84703515e−28 | 1.36349585e−27 |
| C75 | 3.16029006e−29 | 6.24230347e−27 |
| C77 | −2.54423051e−29 | 5.21093708e−27 |
| C78 | −1.03407606e−33 | 3.54875723e−33 |
| C80 | −3.59466643e−32 | 4.11652826e−32 |
| C82 | −9.23602595e−32 | 2.71629404e−31 |
| C84 | −1.25103753e−31 | 2.30117719e−30 |
| C86 | 2.6498546e−31 | 4.73398183e−30 |
| C88 | 6.38528862e−31 | 4.03545839e−30 |
| C90 | 3.10355559e−31 | −8.23151308e−30 |
| C92 | −1.05059842e−34 | −6.41686536e−35 |
| C94 | −5.23779013e−34 | −1.71973327e−34 |
| C96 | −8.7667225e−34 | 5.7757545e−34 |
| C98 | −8.99395043e−34 | 2.97547589e−34 |
| C100 | −1.13652161e−33 | −3.04986257e−32 |
| C102 | −1.1517371e−33 | −1.32076094e−31 |
| C104 | −4.20064583e−34 | −5.22857669e−32 |

TABLE 4a for FIG. 5

| Surface | DCX | DCY | DCZ |
|---|---|---|---|
| Image | 0.00000000 | 0.00000000 | 0.00000000 |
| M8 | 0.00000000 | 0.00000000 | 882.77533922 |
| M7 | 0.00000000 | 195.71291787 | 116.12641402 |
| M6 | 0.00000000 | −112.88128115 | 1167.50030789 |
| M5 | 0.00000000 | −262.73607799 | 1347.86961998 |
| M4 | −0.00000000 | −750.53634909 | 1589.60226228 |
| M3 | −0.00000000 | 235.35640877 | 1618.85948606 |
| M2 | −0.00000000 | 927.86499038 | 1259.80535144 |
| Stop | −0.00000000 | 1378.82735066 | 728.11966836 |

TABLE 4a-continued for FIG. 5

| Surface | DCX | DCY | DCZ |
|---|---|---|---|
| M1 | −0.00000000 | 1754.86756418 | 284.76737249 |
| Object | −0.00000000 | 1522.31770430 | 2073.12928528 |

TABLE 4b for FIG. 5

| Surface | TLA[deg] | TLB[deg] | TLC[deg] |
|---|---|---|---|
| Image | −0.00000000 | 0.00000000 | −0.00000000 |
| M8 | 7.16040462 | 0.00000000 | −0.00000000 |
| M7 | 195.33928697 | 0.00000000 | −0.00000000 |
| M6 | −61.96084316 | 0.00000000 | 0.00000000 |
| M5 | −38.32023492 | −0.00000000 | −0.00000000 |
| M4 | 77.66939217 | −0.00000000 | 0.00000000 |
| M3 | −12.85309098 | −0.00000000 | −0.00000000 |
| M2 | −38.55110875 | −0.00000000 | 0.00000000 |
| Stop | 26.91995318 | 180.00000000 | −0.00000000 |
| M1 | 203.85632932 | 0.00000000 | −0.00000000 |
| Object | 1.40889103 | −0.00000000 | 0.00000000 |

TABLE 5 for FIG. 5

| Surface | Angle of incidence[deg] | Reflectivity |
|---|---|---|
| M8 | 7.16040462 | 0.66024220 |
| M7 | 1.01847774 | 0.66560265 |
| M6 | 78.31860788 | 0.85537503 |
| M5 | 78.04078388 | 0.85141092 |
| M4 | 14.03041098 | 0.64275475 |
| M3 | 75.44710587 | 0.81140397 |
| M2 | 78.85487636 | 0.86287678 |
| M1 | 16.44743829 | 0.63285937 |
| Overall transmission | | 0.0911 |

TABLE 6 for FIG. 5

| X[mm] | Y[mm] | Z[mm] |
|---|---|---|
| 0.00000000 | 80.61237695 | 0.00000000 |
| 38.90654191 | 79.83106129 | 0.00000000 |
| 76.96347650 | 77.46957065 | 0.00000000 |
| 113.32346519 | 73.48914023 | 0.00000000 |
| 147.14570305 | 67.86143904 | 0.00000000 |
| 177.60579355 | 60.59847490 | 0.00000000 |
| 203.91466853 | 51.76925797 | 0.00000000 |
| 225.34730932 | 41.50446204 | 0.00000000 |
| 241.27817834 | 29.99597516 | 0.00000000 |
| 251.21769593 | 17.49549950 | 0.00000000 |
| 254.84363465 | 4.31151215 | 0.00000000 |
| 252.02218346 | −9.19816293 | 0.00000000 |
| 242.81597223 | −22.64006773 | 0.00000000 |
| 227.47918826 | −35.60512570 | 0.00000000 |
| 206.44159792 | −47.69252180 | 0.00000000 |
| 180.28421807 | −58.53347376 | 0.00000000 |
| 149.71031735 | −67.81061415 | 0.00000000 |
| 115.51564449 | −75.26961108 | 0.00000000 |
| 78.56077700 | −80.72207728 | 0.00000000 |
| 39.74742241 | −84.04138390 | 0.00000000 |
| 0.00000000 | −85.15555607 | 0.00000000 |
| −39.74742241 | −84.04138390 | 0.00000000 |
| −78.56077700 | −80.72207728 | 0.00000000 |
| −115.51564449 | −75.26961108 | 0.00000000 |
| −149.71031735 | −67.81061415 | 0.00000000 |
| −180.28421807 | −58.53347376 | 0.00000000 |

TABLE 6-continued for FIG. 5

| X[mm] | Y[mm] | Z[mm] |
| --- | --- | --- |
| −206.44159792 | −47.69252180 | 0.00000000 |
| −227.47918826 | −35.60512570 | 0.00000000 |
| −242.81597223 | −22.64006773 | 0.00000000 |
| −252.02218346 | −9.19816293 | 0.00000000 |
| −254.84363465 | 4.31151215 | 0.00000000 |
| −251.21769593 | 17.49549950 | 0.00000000 |
| −241.27817834 | 29.99597516 | 0.00000000 |
| −225.34730932 | 41.50446204 | 0.00000000 |
| −203.91466853 | 51.76925797 | 0.00000000 |
| −177.60579355 | 60.59847490 | 0.00000000 |
| −147.14570305 | 67.86143904 | 0.00000000 |
| −113.32346519 | 73.48914023 | 0.00000000 |
| −76.96347650 | 77.46957065 | 0.00000000 |
| −38.90654191 | 79.83106129 | 0.00000000 |

An overall reflectivity of the projection optical unit 21 is 9.11%.

The projection optical unit 21 has an image-side numerical aperture of 0.50. In the first imaging light plane xz, the projection optical unit 21 has a reduction factor $\beta_x$ of 4.00. In the second imaging light plane yz, the projection optical unit 21 has a reduction factor $\beta_y$ of 8.00. An object-side chief ray angle is 6.0°. A pupil obscuration is 17%. An object-image offset $d_{OIS}$ is approximately 1520 mm. The mirrors of the projection optical unit 21 can be housed in a cuboid with xyz-edge lengths of 930 mm×2625 mm×1570 mm.

The reticle 10 and hence the object plane 5 are tilted at an angle T of 1.4° about the x-axis. This tilt angle T is indicated in FIG. 5.

A working distance between the mirror M7 closest to the wafer and the image plane 9 is approximately 80 mm.

FIG. 7 shows, once again, the boundary contours of the reflection surfaces of the mirrors M1 to M8 of the projection optical unit 21.

Figure 9:
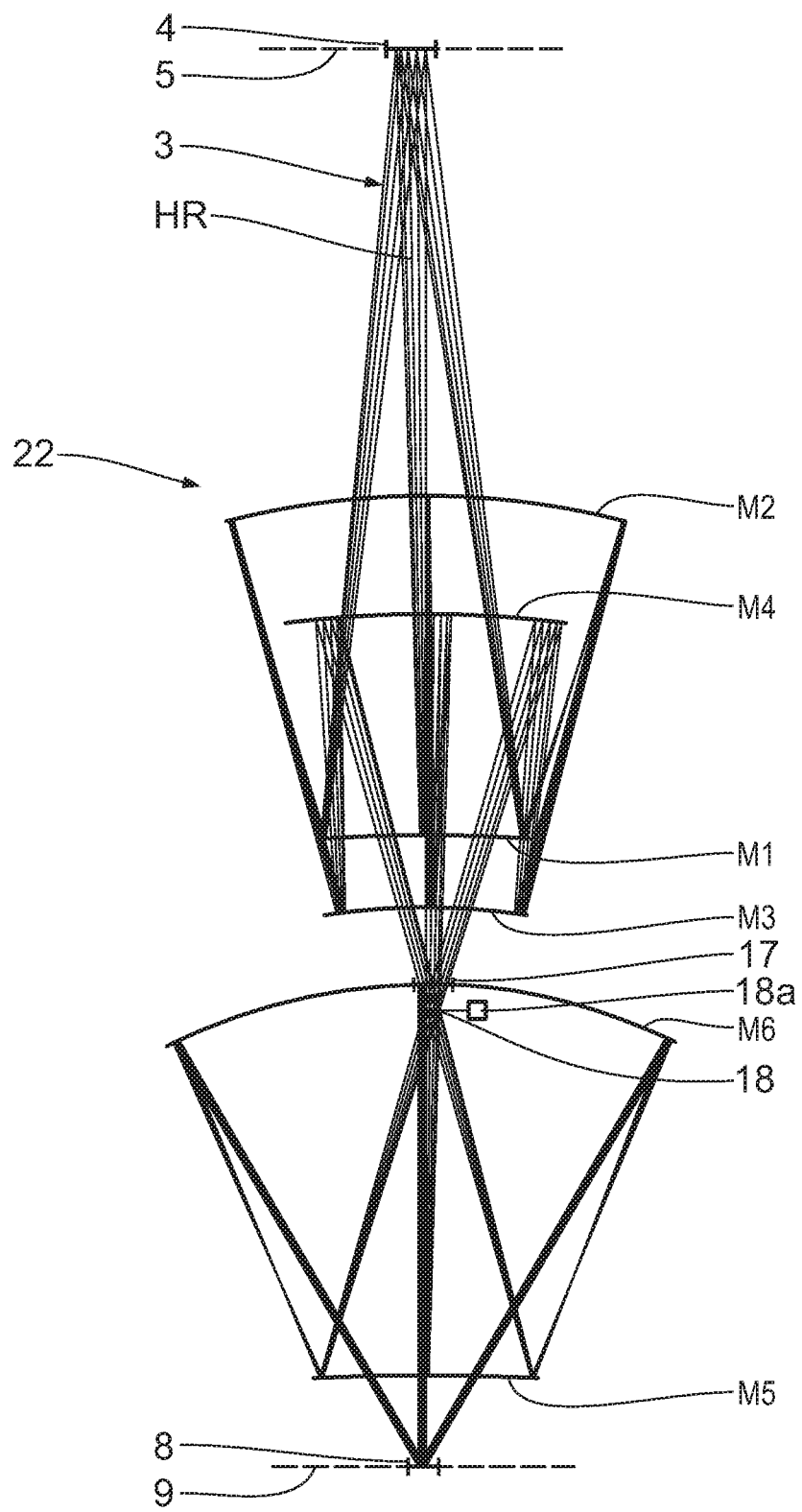
Figure 10:
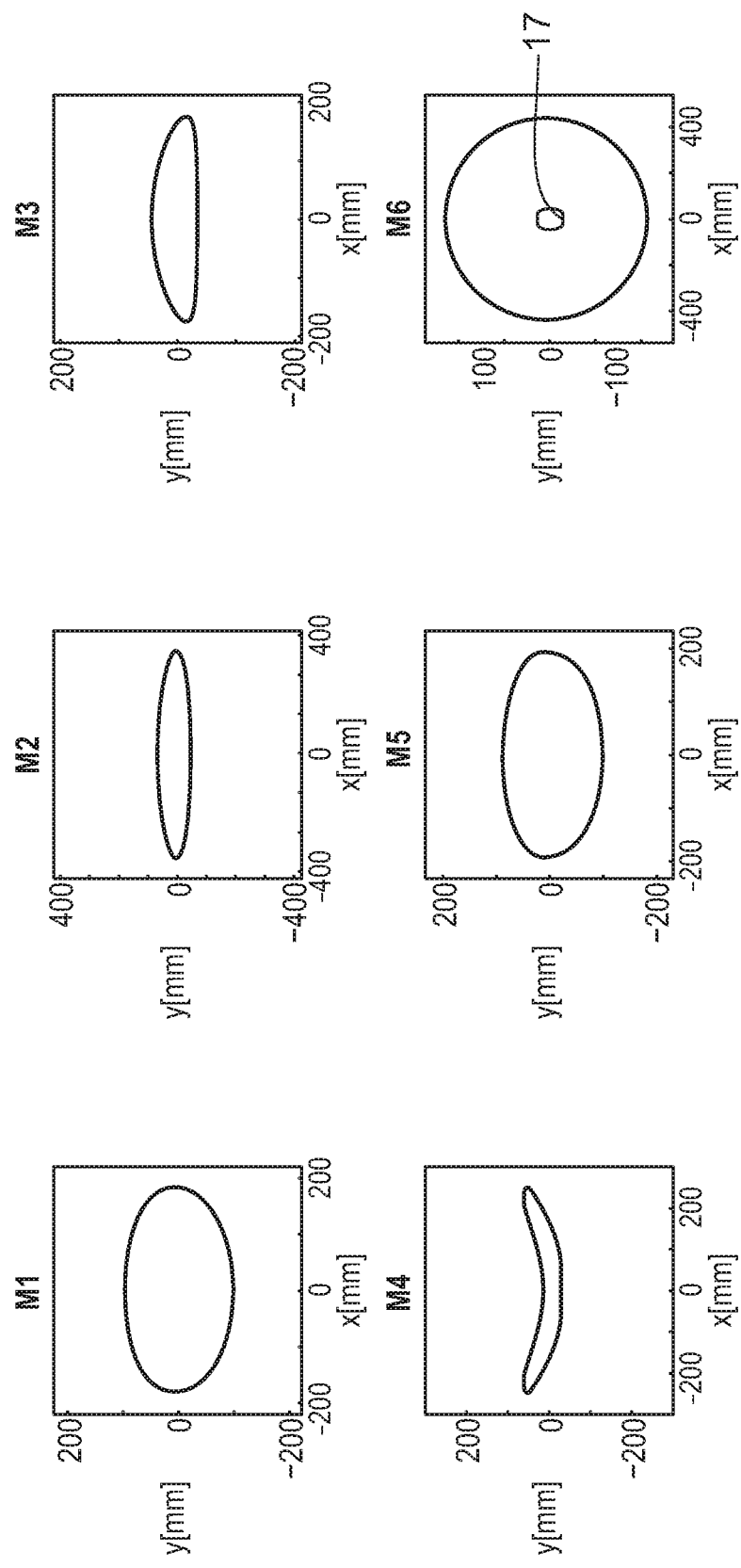

A further embodiment of a projection optical unit 22, which can be used in the projection exposure apparatus 1 according to FIG. 1 instead of the projection optical unit 7, is explained in the following text on the basis of FIGS. 8 to 10. Components and functions which were already explained above in the context of FIGS. 1 to 7 are denoted, where applicable, by the same reference signs and are not discussed again in detail.

The projection optical unit 22 has a total of six mirrors M1 to M6 in the beam path of the imaging light 3 between the object field 4 and the image field 8. All six mirrors M1 to M6 are embodied as NI mirrors. Once again, the free-form equation (1) specified above applies to the mirrors M1 to M6.

The projection optical unit 22 for the mirrors M1 to M6 has the following sequence of deflecting effects: RLRL0L.

The following table once again shows the mirror parameters of mirrors M1 to M6 of the projection optical unit 22.

| | M1 | M2 | M3 | M4 | M5 | M6 |
| --- | --- | --- | --- | --- | --- | --- |
| Maximum angle of incidence [°] | 21.7 | 15.0 | 14.9 | 10.5 | 20.5 | 9.9 |
| Extent of the reflection surface in the x-direction [mm] | 368.5 | 707.4 | 350.4 | 481.0 | 383.2 | 888.8 |
| Extent of the reflection surface in the y-direction [mm] | 195.0 | 115.4 | 75.8 | 87.3 | 188.8 | 866.8 |
| Maximum mirror diameter [mm] | 368.7 | 707.5 | 350.4 | 481.0 | 383.2 | 889.4 |

Once again, the last mirror in the imaging beam path M6 has the largest mirror diameter in this case at less than 900 mm. Four of the six mirrors have a maximum mirror diameter that is less than 500 mm. Three of the six mirrors have a maximum mirror diameter that is less than 400 mm.

The projection optical unit 22, too, has exactly one first plane intermediate image 18 and two second plane intermediate images 19, 20. The first plane intermediate image 18 lies in the beam path of the imaging light 3 between the mirrors M4 and M5 in the region of the passage opening 17 in the mirror M6.

The first of the two second plane intermediate images 19 lies between the mirrors M1 and M2 in the imaging light beam path. In the region of this first second plane intermediate image 19, the entire imaging light beam is accessible from the outside.

The second of the two second plane intermediate images 20 lies between the mirrors M3 and M4 in the imaging light beam path, near the reflection at the mirror M4.

FIG. 10 shows, once again, the boundary contours of the reflection surfaces of the mirrors M1 to M6 of the projection optical unit 22.

The optical design data from the projection optical unit 22 can be gathered from the following tables, which, in terms of their design, correspond to the tables for the projection optical unit 7 according to FIG. 2.

Figure 8:
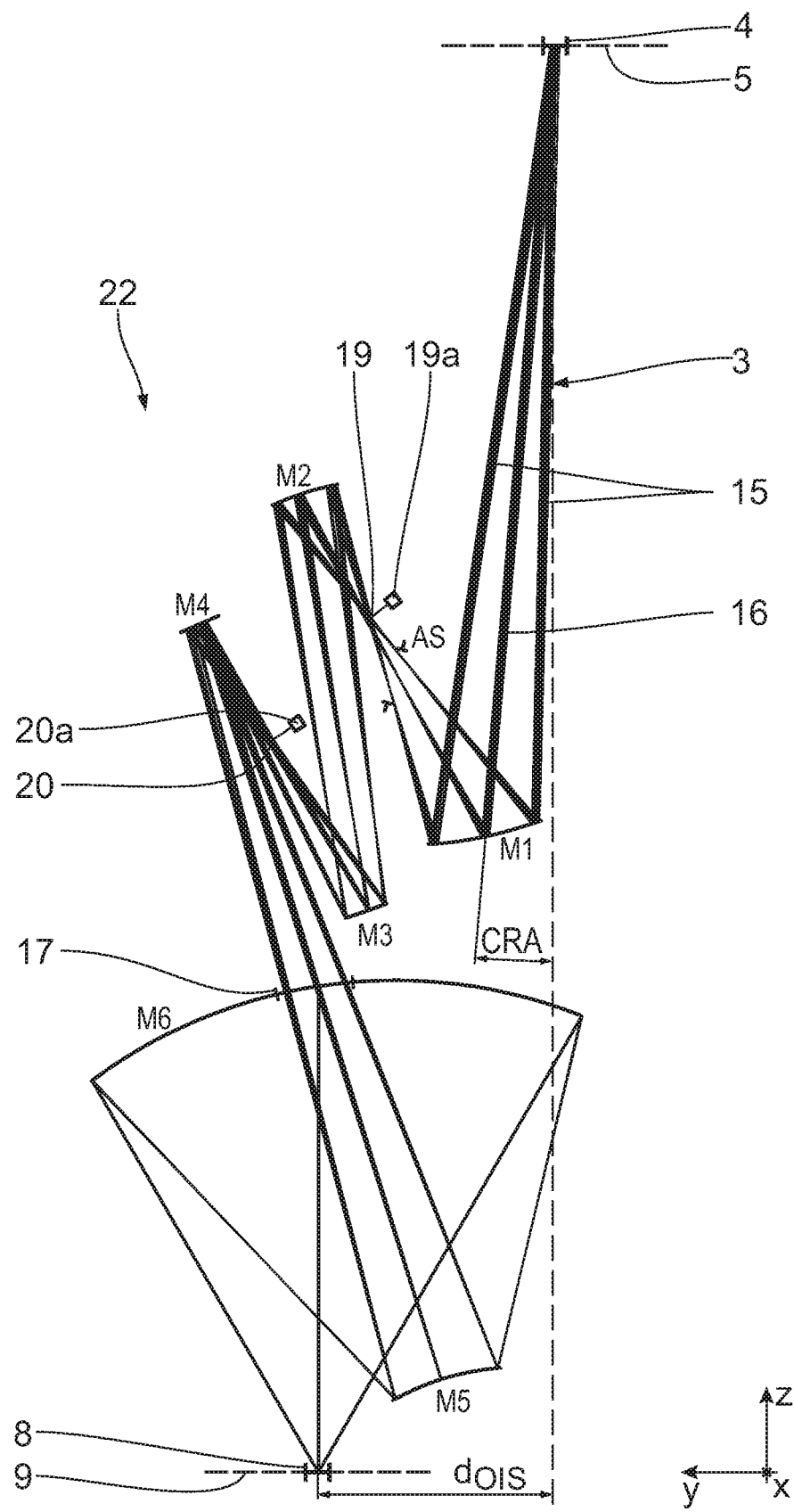
FIGS. 8-31 show, in illustrations similar to FIGS. 5 to 7, further embodiments of an imaging optical unit which can be used as a projection lens in the projection exposure apparatus according to FIG. 1.

TABLE 1 for FIG. 8

| Exemplary embodiment | FIG. 8 |
| --- | --- |
| NA | 0.5 |
| Wavelength | 13.5 nm |
| beta_x | 4.0 |
| beta_y | −8.0 |
| Field dimension_x | 26.0 mm |
| Field dimension_y | 1.0 mm |
| Field curvature | −0.012345 1/mm |
| rms | 30.4 ml |
| Stop | AS |

TABLE 2 for FIG. 8

| Surface | Radius_x[mm] | Power_x[1/mm] | Radius_y[mm] | Power_y[1/mm] | Operating mode |
|---|---|---|---|---|---|
| M6 | −1014.9918248 | 0.0019477 | −893.7079569 | 0.0022640 | REFL |
| M5 | 4610.1894926 | −0.0004338 | 445.6719052 | −0.0044876 | REFL |
| M4 | −1174.3233785 | 0.0016932 | −1051.9540567 | 0.0019123 | REFL |
| M3 | 1010.0226976 | −0.0019510 | −1197.8415209 | 0.0016946 | REFL |
| M2 | −1312.0179701 | 0.0015026 | −457.6913193 | 0.0044329 | REFL |
| M1 | 2662.6604435 | −0.0007175 | −689.9531731 | 0.0030345 | REFL |

TABLE 3a for FIG. 8

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −1014.99182500 | 4610.18949300 | −1174.32337800 |
| C7 | −1.63639571e−08 | 6.87483772e−07 | 5.05861922e−08 |
| C9 | −2.56462343e−09 | −8.13225055e−08 | −6.91885105e−08 |
| C10 | −3.47436391e−11 | 5.1256056e−10 | 2.20583412e−11 |
| C12 | −4.44052628e−11 | 1.08128581e−09 | −1.23932264e−11 |
| C14 | −1.24765499e−11 | 1.98667881e−09 | 1.3750797e−10 |
| C16 | −1.67475636e−14 | 8.26682729e−13 | 1.38362898e−14 |
| C18 | −9.76310679e−15 | 4.46159816e−12 | 2.16077936e−13 |
| C20 | −1.45702228e−15 | −3.24741965e−12 | −2.28312825e−13 |
| C21 | −3.24995571e−17 | 1.05414267e−15 | 4.08171639e−17 |
| C23 | −9.0792086e−17 | 6.91730224e−15 | 4.24398459e−16 |
| C25 | −7.35193153e−17 | 8.25850133e−15 | −1.75536482e−15 |
| C27 | −1.85937479e−17 | 3.10952802e−14 | 1.1585979e−14 |
| C29 | −3.5703491e−21 | 3.79157699e−18 | 1.86810268e−19 |
| C31 | −1.62630367e−20 | 1.17545811e−17 | −4.986125502e−18 |
| C33 | −6.86959019e−21 | 5.76661234e−17 | 4.52757427e−17 |
| C35 | 8.17002723e−22 | 1.66090704e−18 | −1.08408627e−16 |
| C36 | −3.2700837e−23 | 2.65910919e−21 | −2.31577232e−23 |
| C38 | −1.34204537e−22 | 1.56511463e−20 | −7.09104552e−21 |
| C40 | −2.04464085e−22 | 1.10292873e−19 | 7.98817392e−20 |
| C42 | −1.28721975e−22 | 3.17002038e−19 | −2.25764225e−19 |
| C44 | −2.96501352e−23 | 8.14163076e−19 | −2.01105282e−18 |
| C46 | 3.53309255e−27 | 1.82114149e−23 | −6.19948554e−24 |
| C48 | −7.54713713e−27 | 1.58912096e−22 | 6.80341023e−23 |
| C50 | −1.78836502e−26 | 4.08001034e−22 | 3.63898676e−23 |
| C52 | −3.86147907e−27 | 1.28151939e−21 | −7.13925671e−21 |
| C54 | 7.91589003e−28 | −2.63398048e−21 | 1.04122167e−20 |
| C55 | −1.43124789e−29 | 1.33926566e−26 | −1.1354639e−27 |
| C57 | −9.15031711e−29 | 1.44374755e−25 | 3.20632475e−27 |
| C59 | −1.89538308e−28 | 1.17688068e−24 | 2.94313435e−25 |
| C61 | −1.69419016e−28 | 3.65160042e−24 | −3.37682466e−24 |
| C63 | −7.08899858e−29 | −5.45288447e−24 | −2.87305808e−23 |
| C65 | −1.19238698e−29 | −4.81365787e−24 | 1.92631285e−22 |
| C67 | 8.84476216e−33 | 0 | 0 |
| C69 | −1.98727303e−32 | 0 | 0 |
| C71 | −4.96871795e−32 | 0 | 0 |
| C73 | −1.44538227e−32 | 0 | 0 |
| C75 | 1.04191135e−32 | 0 | 0 |
| C77 | 4.64811674e−33 | 0 | 0 |
| C78 | −7.8772164e−35 | 0 | 0 |
| C80 | −4.88956574e−34 | 0 | 0 |
| C82 | −1.35090835e−33 | 0 | 0 |
| C84 | −1.94584721e−33 | 0 | 0 |
| C86 | −1.54538702e−33 | 0 | 0 |
| C88 | −6.249653e−34 | 0 | 0 |
| C90 | −9.73653236e−35 | 0 | 0 |

TABLE 3b for FIG. 8

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | 1010.02269800 | −1312.01797000 | 2662.66044300 |
| C7 | 1.22170857e−06 | −6.37823316e−08 | −1.04546816e−07 |
| C9 | 3.4882529e−07 | −4.66354991e−08 | 4.33781443e−07 |
| C10 | 1.79366666e−10 | 1.60437821e−11 | 1.67219502e−10 |
| C12 | 2.29403181e−09 | −2.76521017e−10 | 1.27323858e−10 |
| C14 | −2.35161032e−09 | −5.10158035e−12 | 7.40803126e−11 |
| C16 | −1.96936012e−12 | −5.01626897e−14 | 1.9388874e−13 |
| C18 | −3.06827899e−12 | −4.35561341e−13 | −2.24745804e−13 |
| C20 | 9.34367333e−13 | 1.3947707e−13 | 1.42809061e−13 |
| C21 | −2.08970015e−15 | 2.70438568e−17 | 8.36581833e−17 |
| C23 | −1.44355508e−14 | −4.62969015e−16 | 9.24640588e−17 |
| C25 | −1.03942716e−14 | −1.77055219e−15 | 9.30437101e−16 |
| C27 | 4.45724605e−14 | 1.3432402e−15 | 4.97813101e−16 |
| C29 | −1.13501065e−17 | −2.08662747e−20 | −1.06307014e−18 |
| C31 | −7.37625827e−17 | −1.11182127e−18 | −1.03467079e−19 |
| C33 | −5.22864623e−16 | 1.63709053e−18 | −4.43520233e−18 |
| C35 | −3.18335684e−15 | 1.15476436e−16 | −7.19972734e−18 |
| C36 | −1.48856757e−22 | 3.17157665e−23 | −2.01947584e−22 |
| C38 | 2.4509923e−20 | −1.76326446e−22 | −1.15195494e−21 |
| C40 | 4.57082031e−19 | −1.18268185e−21 | −1.7753503e−20 |
| C42 | 5.32101962e−18 | 2.19596361e−19 | −7.59631967e−20 |
| C44 | −1.5864064e−17 | 2.06176518e−18 | −5.39549368e−20 |
| C46 | 5.09328497e−23 | 4.19812761e−28 | −4.26631568e−25 |
| C48 | 1.03961327e−22 | −3.07261947e−24 | 8.61056344e−24 |
| C50 | 1.74534839e−21 | −8.0086339e−24 | 6.16639119e−23 |
| C52 | 7.74976733e−20 | 1.84308643e−21 | 7.81194941e−23 |
| C54 | 1.25718836e−20 | 9.71541989e−21 | 1.67382093e−22 |
| C55 | 2.02154535e−26 | −1.81898014e−29 | −3.72618487e−27 |
| C57 | 1.9578895e−25 | −7.72527746e−28 | 1.92836548e−26 |
| C59 | 3.33959317e−24 | 7.31594235e−27 | 1.55354656e−27 |
| C61 | −4.88859554e−23 | −4.2851618e−26 | 6.3515115e−25 |
| C63 | −5.77450758e−22 | 2.46460998e−24 | 2.18154993e−24 |
| C65 | −3.46696439e−21 | −1.16458004e−23 | 2.03857604e−24 |

TABLE 4a for FIG. 8

| Surface | DCX | DCY | DCZ |
|---|---|---|---|
| Image plane | 0.00000000 | 0.00000000 | 0.00000000 |
| M6 | 0.00000000 | 0.00000000 | 851.91437338 |
| M5 | 0.00000000 | −215.33453017 | 163.05420307 |
| M4 | −0.00000000 | 202.86472499 | 1489.58314522 |
| M3 | −0.00000000 | −88.22184657 | 985.10610976 |
| M2 | −0.00000000 | 34.90345715 | 1713.07366623 |
| Stop | −0.00000000 | −135.82751472 | 1401.74952443 |
| M1 | −0.00000000 | −293.49163988 | 1114.25248790 |
| Object plane | −0.00000000 | −414.92461745 | 2499.99892470 |

TABLE 4b for FIG. 8

| Surface | TLA[deg] | TLB[deg] | TLC[deg] |
|---|---|---|---|
| Image plane | −0.00000000 | 0.00000000 | −0.00000000 |
| M6 | −8.67950248 | 0.00000000 | −0.00000000 |
| M5 | 162.57155265 | 0.00000000 | −0.00000000 |
| M4 | −23.74155941 | −0.00000000 | −0.00000000 |
| M3 | 160.20743108 | 0.00000000 | −0.00000000 |
| M2 | −19.17019370 | −0.00000000 | −0.00000000 |
| Stop | −73.99216967 | 180.00000000 | 0.00000000 |
| M1 | 168.13377923 | 0.00000000 | −0.00000000 |
| Object plane | 0.00803708 | −0.00000000 | −0.00000000 |

TABLE 5 for FIG. 8

| Surface | Angle of incidence[deg] | Reflectivity |
|---|---|---|
| M6 | 8.71355191 | 0.65746407 |
| M5 | 0.04144783 | 0.66566082 |
| M4 | 6.17488689 | 0.66169307 |
| M3 | 9.84785496 | 0.65503404 |
| M2 | 9.68325312 | 0.65540855 |
| M1 | 17.20204356 | 0.62927702 |
| Overall transmission | | 0.0782 |

TABLE 6 for FIG. 8

| X[mm] | Y[mm] | Z[mm] |
|---|---|---|
| 0.00000000 | 33.91943836 | 0.00000000 |
| 39.06721628 | 33.65070311 | 0.00000000 |
| 77.39353501 | 32.85500161 | 0.00000000 |
| 114.21865728 | 31.55954113 | 0.00000000 |
| 148.74973474 | 29.79710172 | 0.00000000 |
| 180.16015462 | 27.59244760 | 0.00000000 |
| 207.60469095 | 24.95188839 | 0.00000000 |
| 230.25345814 | 21.86101434 | 0.00000000 |
| 247.34324552 | 18.29294351 | 0.00000000 |
| 258.23929132 | 14.22650701 | 0.00000000 |
| 262.49585262 | 9.66923988 | 0.00000000 |
| 259.90237404 | 4.67735378 | 0.00000000 |
| 250.50536902 | −0.63372866 | 0.00000000 |
| 234.60234893 | −6.09139258 | 0.00000000 |
| 212.71071500 | −11.47957768 | 0.00000000 |

TABLE 6-continued for FIG. 8

| X[mm] | Y[mm] | Z[mm] |
|---|---|---|
| 185.51982813 | −16.56006824 | 0.00000000 |
| 153.83698419 | −21.09555441 | 0.00000000 |
| 118.53749665 | −24.86968553 | 0.00000000 |
| 80.52602701 | −27.70183298 | 0.00000000 |
| 40.71219752 | −29.45685009 | 0.00000000 |
| 0.00000000 | −30.05126322 | 0.00000000 |
| −40.71219752 | −29.45685009 | 0.00000000 |
| −80.52602701 | −27.70183298 | 0.00000000 |
| −118.53749665 | −24.86968553 | 0.00000000 |
| −153.83698419 | −21.09555441 | 0.00000000 |
| −185.51982813 | −16.56006824 | 0.00000000 |
| −212.71071500 | −11.47957768 | 0.00000000 |
| −234.60234893 | −6.09139258 | 0.00000000 |
| −250.50536902 | −0.63372866 | 0.00000000 |
| −259.90237404 | 4.67735378 | 0.00000000 |
| −262.49585262 | 9.66923988 | 0.00000000 |
| −258.23929132 | 14.22650701 | 0.00000000 |
| −247.34324552 | 18.29294351 | 0.00000000 |
| −230.25345814 | 21.86101434 | 0.00000000 |
| −207.60469095 | 24.95188839 | 0.00000000 |
| −180.16015462 | 27.59244760 | 0.00000000 |
| −148.74973474 | 29.79710172 | 0.00000000 |
| −114.21865728 | 31.55954113 | 0.00000000 |
| −77.39353501 | 32.85500161 | 0.00000000 |
| −39.06721628 | 33.65070311 | 0.00000000 |

An overall reflectivity of the projection optical unit 22 is 7.82%.

The projection optical unit 22 has a numerical aperture of 0.50. A reduction factor is 4.0 ($\beta_x$) in the first imaging light plane xz and 8.0 ($\beta_y$) in the second imaging light plane yz. A chief ray angle CRA in relation to a normal of the object field 4 is 5.0°. A maximum pupil obscuration is 15%. An object-image offset $d_{OIS}$ is approximately 415 mm. The mirrors of the projection optical unit 22 can be housed in a cuboid with xyz-edge lengths of 889 mm×860 mm×1602 mm.

The object plane 5 and the image plane 9 extend parallel to one another.

A working distance between the mirror M5 closest to the wafer and the image plane 9 is 129 mm. A mean wavefront aberration rms is 30.4 mλ.

An aperture stop AS is arranged upstream of the first second plane intermediate image 19 in the imaging light beam path between the mirrors M1 and M2 in the projection optical unit 22. The entire imaging light beam is completely accessible at the location of the aperture stop AS.

Figure 12:
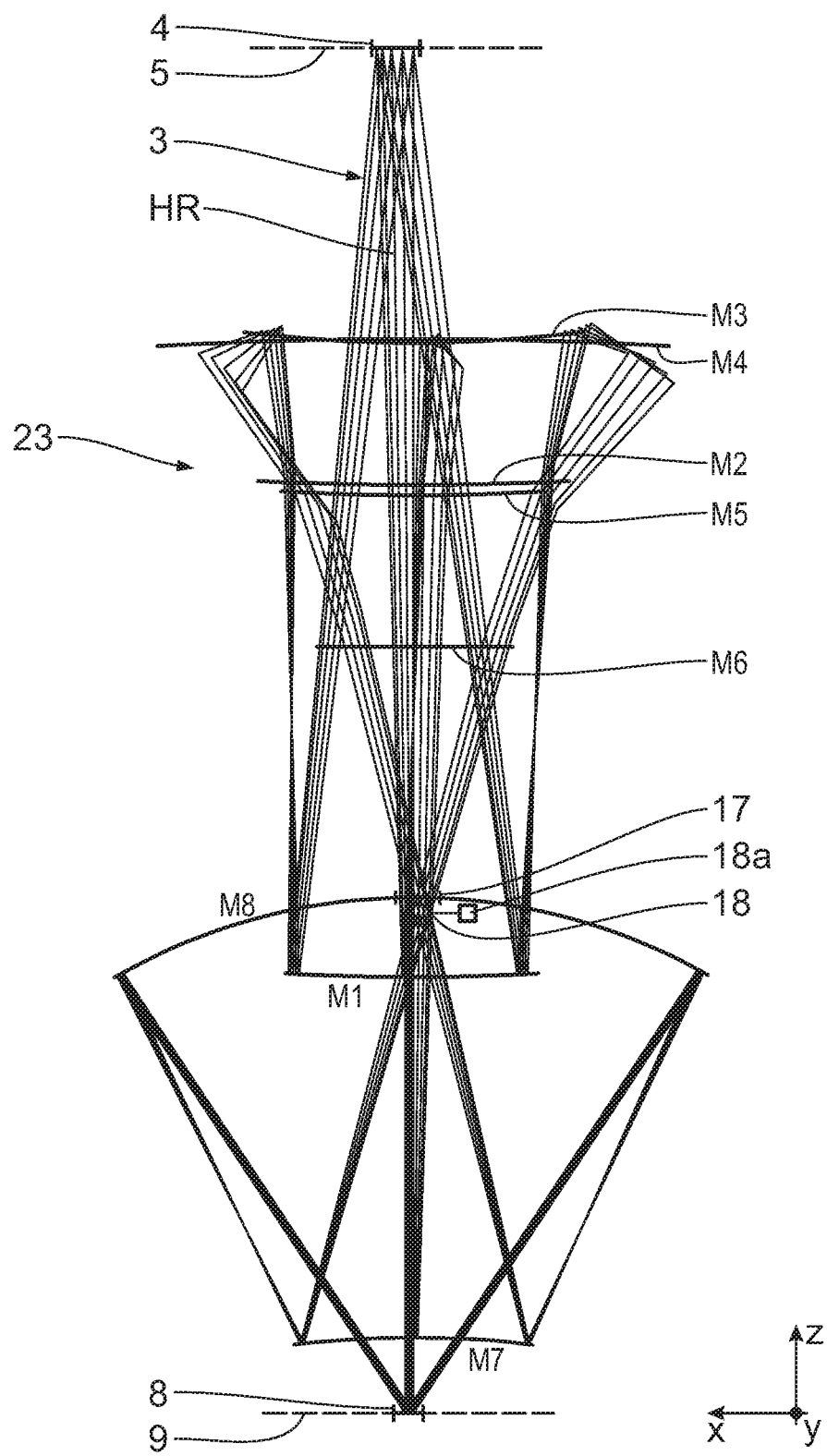
Figure 13:
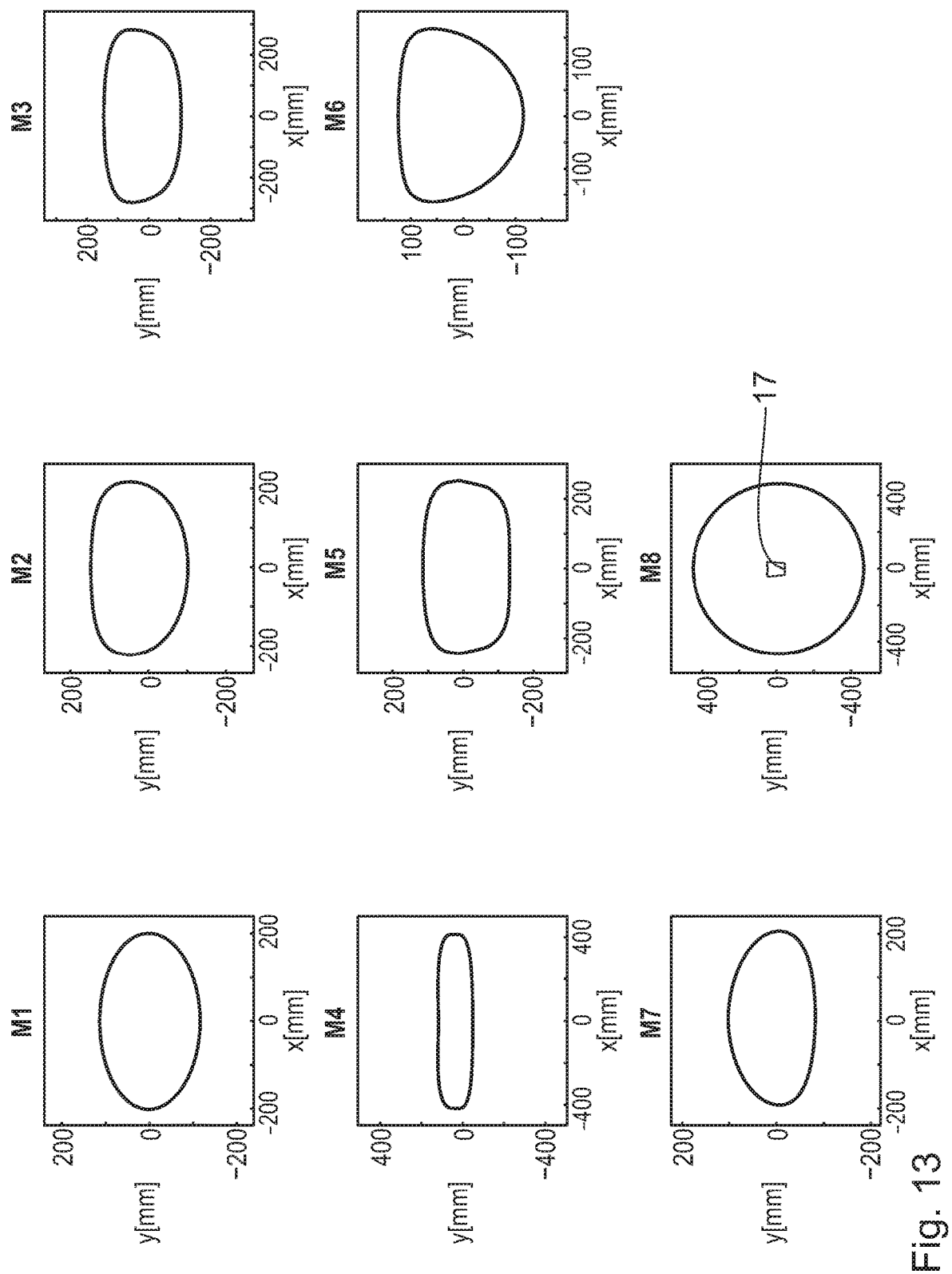

A further embodiment of a projection optical unit 23, which can be used in the projection exposure apparatus 1 according to FIG. 1 instead of the projection optical unit 7, is explained in the following text on the basis of FIGS. 11 to 13. Components and functions which were already explained above in the context of FIGS. 1 to 10 are denoted, where applicable, by the same reference signs and are not discussed again in detail.

The basic design of the projection optical unit 23, in particular the sequence of NI mirrors and GI mirrors, is similar, once again, to the design of the projection optical units 7 and 21.

The mirrors M1 to M8 are once again embodied as free-form surfaces, for which the free-form surface equation (1), specified above, applies.

The following table once again shows the mirror parameters of mirrors M1 to M8 of the projection optical unit 23.

| | M1 | M2 | M3 | M4 | M5 | M6 | M7 | M8 |
|---|---|---|---|---|---|---|---|---|
| Maximum angle of incidence [°] | 20.0 | 76.2 | 77.4 | 14.8 | 78.7 | 81.0 | 22.0 | 7.6 |
| Extent of the reflection surface in the x-direction [mm] | 399.2 | 447.1 | 565.9 | 829.9 | 496.6 | 329.7 | 370.5 | 945.8 |
| Extent of the reflection surface in the y-direction [mm] | 229.5 | 251.5 | 251.8 | 169.3 | 249.6 | 235.8 | 185.3 | 919.8 |
| Maximum mirror diameter [mm] | 399.4 | 447.4 | 565.9 | 830.0 | 496.6 | 330.1 | 370.6 | 946.3 |

All mirrors M1 to M8 and, in particular, the GI mirrors M2, M3, M5 and M6 have a y/x-aspect ratio that is less than 1. Once again, the last mirror in the imaging light beam path, mirror M8, has the largest mirror diameter, measuring almost 950 mm. Six of the eight mirrors have a diameter that is less than 570 mm. Five of the eight mirrors have a diameter that is less than 500 mm. Three of the eight mirrors have a diameter that is less than 400 mm.

The projection optical unit 23 has exactly one first plane intermediate image 18, once again in the region of the passage opening 17 in the mirror M8 that is last in the imaging light beam path. Furthermore, the projection optical unit 23 has a total of three second plane intermediate images 19, 24 and 25. The second plane intermediate image 24, which is first in the imaging light beam path, of the projection optical unit 23 lies between the mirrors M1 and M2 in the imaging light beam path and is completely accessible. The second plane intermediate images 19, which is second in the imaging light beam path, lies between the mirrors M2 and M3 in the imaging light beam path. The second plane intermediate images 25, which is third in the imaging light beam path, lies between the mirrors M3 and M4 in the imaging light beam path.

In relation to the mirror M2, one of the second plane intermediate images, namely the intermediate image 24, lies upstream of this GI mirror M2 and the NI mirror M1 that, in the beam path, is directly upstream of the mirror in the beam path and the next second plane intermediate image 19 lies downstream of the mirror M2 and upstream of the GI mirror M3 that, in the beam path, is directly downstream of the mirror. In this way, the GI mirror M3, too, lies between two second plane intermediate images 19 and 25. This arrangement of the two GI mirrors M2 and M3 between two second plane intermediate images 24 and 19 and 19 and 25, respectively, in this case, leads to an extent of these mirrors M2 and M3 not becoming too large in the y-direction despite the large angle of incidence on these two GI mirrors M2 and M3.

In the projection optical unit 23, the number of the first plane intermediate images differs from the number of second plane intermediate images by two.

FIG. 13 shows, once again, the boundary contours of the reflection surfaces of the mirrors M1 to M8.

The optical design data from the projection optical unit 23 can be gathered from the following tables, which, in terms of their design, correspond to the tables for the projection optical unit 7 according to FIG. 2.

Figure 11:
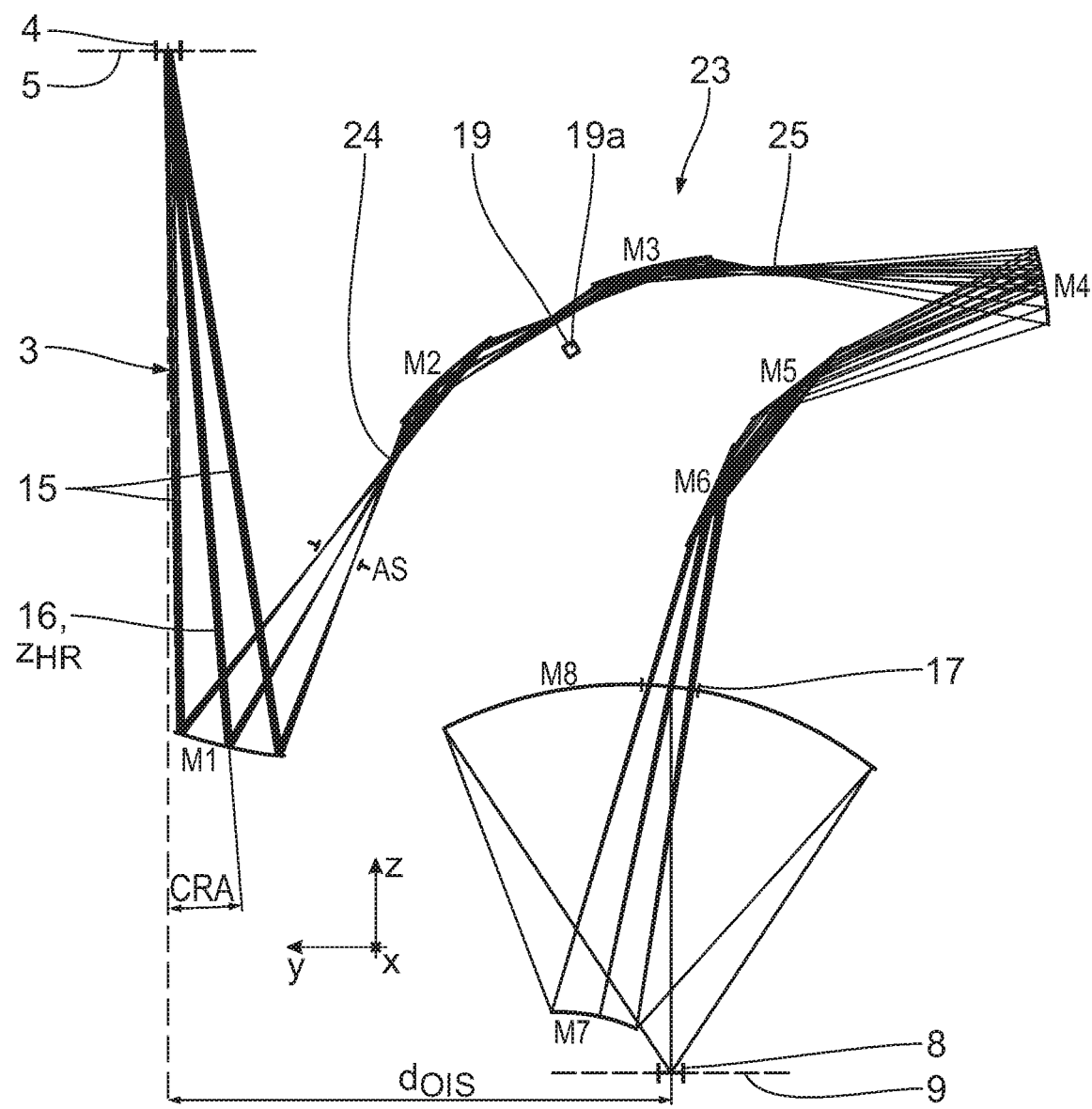

TABLE 1 for FIG. 11

| Exemplary embodiment | FIG. 11 |
|---|---|
| NA | 0.55 |
| Wavelength | 13.5 nm |
| beta_x | 4.5 |
| beta_y | 8.0 |
| Field dimension_x | 26.0 mm |
| Field dimension_y | 1.0 mm |
| Field curvature | 0.012345 1/mm |
| rms | 24.8 ml |
| Stop | AS |

TABLE 2 for FIG. 11

| Surface | Radius_x[mm] | Power_x[1/mm] | Radius_y[mm] | Power_y[1/mm] | Operating mode |
|---|---|---|---|---|---|
| M8 | −953.6498674 | 0.0020852 | −863.7070005 | 0.0023289 | REFL |
| M7 | 2308.9882772 | −0.0008662 | 391.2204972 | −0.0051122 | REFL |
| M6 | 9658.7357159 | −0.0000478 | 3111.8571118 | −0.0027854 | REFL |
| M5 | 3851.9659125 | −0.0001115 | 5994.4927929 | −0.0015541 | REFL |
| M4 | −1667.4841416 | 0.0011730 | −752.6104660 | 0.0027173 | REFL |
| M3 | 1905.0727177 | −0.0002547 | −1075.1194517 | 0.0076679 | REFL |
| M2 | 2138.0869388 | −0.0002430 | −864.5423534 | 0.0089053 | REFL |
| M1 | −3536.1125421 | 0.0005403 | −988.4714077 | 0.0021179 | REFL |

TABLE 3a for FIG. 11

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −953.64986730 | 2308.98827700 | 9658.73571600 |
| C7 | −2.22708175e−09 | −6.91396275e−07 | −4.11083096e−07 |
| C9 | 6.92896088e−09 | 6.95739894e−07 | −1.35296426e−07 |
| C10 | −4.33919499e−12 | 7.10184469e−10 | 8.68487959e−11 |
| C12 | −2.89123145e−11 | 1.52069726e−09 | 8.4433536e−11 |
| C14 | −8.71987959e−12 | 2.08177301e−09 | 5.45808309e−10 |
| C16 | −8.74336708e−15 | −1.1921338e−12 | −3.78983348e−13 |
| C18 | 3.54027801e−15 | −1.48310938e−12 | −1.9991786e−12 |
| C20 | 7.7050072e−15 | 1.10792541e−11 | −8.1961092e−13 |
| C21 | −1.337077e−17 | 1.13443702e−17 | 4.98626651e−16 |
| C23 | −5.92031494e−17 | 1.2659377e−14 | 4.44580625e−16 |
| C25 | −5.74369237e−17 | 1.92128159e−14 | 2.20063337e−15 |
| C27 | −1.40128254e−17 | 5.55778233e−14 | 3.41024779e−15 |
| C29 | −8.8183677e−21 | −1.02813716e−17 | 3.12210591e−19 |
| C31 | −4.70913655e−21 | −1.49218467e−17 | −1.1994085e−17 |
| C33 | 1.31878574e−20 | 1.7182799e−17 | −3.37395149e−17 |
| C35 | 8.8318716e−21 | 2.06086404e−16 | −2.46938063e−17 |
| C36 | −2.52492021e−23 | 2.67591142e−20 | −4.5558175e−20 |
| C38 | −9.83537761e−23 | 4.15456058e−20 | −1.48484206e−20 |
| C40 | −1.57747152e−22 | 1.53357719e−19 | 3.50389768e−21 |
| C42 | −9.70680981e−23 | 4.17441636e−19 | 1.61335261e−19 |
| C44 | −1.94775827e−23 | 1.05280588e−18 | −1.2699496e−19 |
| C46 | −8.68286173e−27 | 5.15251583e−23 | −4.80088793e−22 |
| C48 | −3.08227673e−26 | −9.29040968e−23 | 5.06879666e−22 |
| C50 | −1.43858909e−26 | −4.10730564e−22 | 1.33502706e−21 |
| C52 | 8.30889224e−27 | −2.05745722e−21 | 1.93623086e−21 |
| C54 | 5.30486044e−27 | −2.67755405e−21 | −2.17618862e−22 |
| C55 | −4.63046046e−30 | −3.25292546e−25 | 1.98546568e−24 |
| C57 | −9.39092565e−29 | −1.69856578e−25 | −1.68377598e−24 |
| C59 | −2.07380678e−28 | −3.16582308e−24 | 2.04251254e−24 |
| C61 | −2.5301093e−28 | −1.04673475e−23 | 3.7329624e−25 |
| C63 | −1.42078456e−28 | −5.09423332e−24 | 2.05490534e−23 |
| C65 | −2.90099345e−29 | −7.85991524e−24 | 1.49401369e−23 |
| C67 | −1.03726667e−32 | −1.32354182e−27 | 2.65357044e−26 |
| C69 | 3.43484911e−32 | −4.85145166e−28 | −2.4662259e−26 |
| C71 | 1.47350771e−31 | 1.32173476e−26 | −7.52616524e−26 |
| C73 | 2.20731256e−31 | 1.18787482e−25 | −1.55971922e−25 |
| C75 | 1.27957619e−31 | 3.74259495e−25 | −8.48519515e−26 |

TABLE 3a-continued for FIG. 11

| Coefficient | M8 | M7 | M6 |
|---|---|---|---|
| C77 | 3.05045038e−32 | 6.69790007e−25 | 2.4106086e−26 |
| C78 | −8.08438843e−35 | 3.10582806e−30 | −3.15506345e−29 |
| C80 | −5.33507979e−34 | 1.46918389e−29 | 1.34252881e−28 |
| C82 | −1.45494891e−33 | 1.63440897e−28 | −1.130906e−28 |
| C84 | −1.77334302e−33 | 8.28609845e−28 | −1.42102698e−28 |
| C86 | −1.0728849e−33 | 2.0265052e−27 | −7.92059242e−28 |
| C88 | −3.14533478e−34 | 2.00292243e−27 | −1.90061294e−27 |
| C90 | −3.62310307e−35 | 4.60528862e−27 | −8.19891657e−28 |
| C92 | −2.10825946e−38 | 7.75920339e−33 | −4.38295239e−31 |
| C94 | −1.89410857e−37 | −2.76161652e−32 | 5.5931353e−31 |

TABLE 3a-continued for FIG. 11

| Coefficient | M8 | M7 | M6 |
|---|---|---|---|
| C96 | −6.11342862e−37 | −2.56662189e−31 | 1.52276815e−30 |
| C98 | −9.82533213e−37 | −2.12912577e−30 | 2.76638929e−30 |
| C100 | −7.57114364e−37 | −7.1611517e−30 | 5.30427726e−30 |
| C102 | −2.76706333e−37 | −1.49858531e−29 | 1.03346049e−30 |
| C104 | −3.91409133e−38 | 8.168915e−30 | −4.71627921e−31 |
| C105 | 1.30795789e−40 | −1.31817471e−35 | 1.20977915e−34 |
| C107 | 9.65901044e−40 | −1.26931175e−34 | −2.45248062e−33 |
| C109 | 3.13255514e−39 | −1.82499426e−33 | 4.76819617e−33 |
| C111 | 4.73813484e−39 | −1.26748341e−32 | 2.71472842e−33 |
| C113 | 3.46842424e−39 | −4.55926104e−32 | 1.42634982e−32 |
| C115 | 1.05817389e−39 | −9.65149938e−32 | 4.44412642e−32 |
| C117 | 3.46863288e−41 | −1.10688586e−31 | 5.15740381e−32 |
| C119 | −1.95806808e−41 | −9.6895382e−33 | 1.78585218e−32 |
| C121 | −9.86388998e−45 | 0 | 0 |
| C123 | −1.15483765e−43 | 0 | 0 |
| C125 | 2.80307739e−43 | 0 | 0 |
| C127 | 1.48788179e−42 | 0 | 0 |
| C129 | 2.20554522e−42 | 0 | 0 |
| C131 | 1.73538345e−42 | 0 | 0 |
| C133 | 7.32406904e−43 | 0 | 0 |
| C135 | 1.30647414e−43 | 0 | 0 |
| C136 | −2.51510668e−46 | 0 | 0 |
| C138 | −2.18777209e−45 | 0 | 0 |
| C140 | −8.73933701e−45 | 0 | 0 |
| C142 | −1.84588291e−44 | 0 | 0 |
| C144 | −2.24093845e−44 | 0 | 0 |
| C146 | −1.62951234e−44 | 0 | 0 |
| C148 | −6.95575174e−45 | 0 | 0 |
| C150 | −1.60650247e−45 | 0 | 0 |
| C152 | −1.60339863e−46 | 0 | 0 |

TABLE 3b for FIG. 11

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 3851.96591300 | −1667.48414200 | 1905.07271800 |
| C7 | 1.22859438e−07 | 1.16740006e−07 | 3.95673757e−07 |
| C9 | 9.36510041e−08 | 4.85163876e−08 | 3.15401785e−07 |
| C10 | −1.19183083e−10 | 3.19830516e−12 | −3.97230764e−10 |
| C12 | 1.72203066e−10 | −1.0052782e−11 | −6.69392837e−10 |
| C14 | 2.23394608e−10 | −2.11360925e−10 | −7.20620228e−10 |
| C16 | −2.31839315e−13 | 2.59109296e−14 | −5.28212155e−13 |
| C18 | 1.80332614e−13 | −4.76153787e−14 | 1.06006303e−12 |
| C20 | 7.27536115e−13 | −1.1206662e−12 | 1.944371e−12 |
| C21 | −7.88583079e−18 | 8.07826975e−18 | 4.2907125e−16 |
| C23 | −6.29581241e−16 | 2.42631794e−17 | −1.28611937e−15 |
| C25 | 8.71627214e−16 | −4.19446399e−16 | −4.69085643e−15 |
| C27 | 2.55176244e−15 | −2.80158755e−15 | −5.87158197e−15 |
| C29 | −8.64454797e−19 | −8.43084834e−21 | 1.63376273e−18 |
| C31 | −6.0647703e−19 | 1.36024001e−19 | 3.96140838e−18 |
| C33 | −2.34974902e−18 | −2.7865049e−18 | 1.227677e−17 |
| C35 | 8.71114798e−18 | 2.14184133e−17 | 1.31596761e−17 |
| C36 | 3.3700367e−21 | −1.3712054e−23 | 1.46270175e−21 |
| C38 | −1.85528518e−21 | −7.61964911e−23 | 1.70938421e−21 |
| C40 | −1.37962106e−20 | 4.30922944e−22 | −7.14839055e−21 |
| C42 | −4.62529356e−20 | −4.74458048e−20 | −2.3077492e−20 |
| C44 | −3.12819501e−20 | −8.71004582e−20 | 3.05152745e−20 |
| C46 | 3.23184954e−23 | 9.96979971e−26 | 1.95058108e−24 |
| C48 | 1.3694096e−23 | 1.01755658e−25 | 3.42145549e−24 |
| C50 | 2.05573669e−22 | 1.33621582e−23 | 9.93301807e−23 |
| C52 | 3.1180598e−22 | −7.13156626e−22 | 4.04026987e−22 |
| C54 | 3.57860299e−23 | −7.82210858e−21 | 8.44742313e−22 |
| C55 | −3.87334641e−26 | 6.93046716e−30 | −6.72095988e−27 |
| C57 | 1.49329687e−25 | 8.08596814e−28 | −5.74744789e−26 |
| C59 | 4.19709817e−25 | −1.65358077e−27 | −1.59309952e−25 |
| C61 | 3.94020888e−24 | 2.81149827e−25 | −1.55028309e−24 |
| C63 | 7.23174029e−24 | −2.13334271e−24 | −5.74854863e−24 |
| C65 | 1.07149845e−23 | −5.99274968e−23 | −9.89232845e−24 |
| C67 | −4.64943492e−28 | −3.25441971e−31 | −7.46767666e−30 |
| C69 | 1.6981346e−29 | −6.47924174e−30 | 7.63657816e−29 |
| C71 | −1.86598355e−27 | 1.21842872e−29 | 4.99956952e−28 |
| C73 | −7.36494557e−27 | 1.74514795e−27 | 1.48529228e−27 |
| C75 | −2.04730955e−27 | 9.98234615e−26 | −3.46704751e−27 |
| C77 | 1.99371493e−26 | 2.58665375e−25 | −4.34329914e−26 |
| C78 | 1.45038539e−31 | 8.34095716e−35 | 2.05909046e−32 |
| C80 | −2.5293606e−30 | −4.82206167e−33 | 4.8671983e−31 |
| C82 | −3.63634853e−30 | −1.40771474e−32 | 5.11840897e−31 |
| C84 | −6.53186569e−29 | −6.54331204e−31 | 1.25252e−29 |
| C86 | −2.6613913e−28 | 1.87631998e−30 | 8.55280419e−29 |
| C88 | −4.62635571e−28 | 1.48298151e−27 | 2.86137741e−28 |
| C90 | −6.18523745e−28 | 5.36798943e−27 | 3.48446373e−28 |
| C92 | 2.32207396e−33 | 1.42753873e−37 | 2.44920451e−34 |
| C94 | −2.04745568e−33 | 2.27330575e−35 | −1.27641527e−34 |
| C96 | −1.76045972e−33 | −1.94737917e−34 | −3.41179417e−33 |
| C98 | 4.49216894e−33 | −9.91240601e−33 | −8.8221502e−33 |
| C100 | −8.24120927e−32 | 3.56554008e−33 | −3.7003387e−32 |
| C102 | −5.98019017e−31 | 8.25368113e−30 | 9.21723637e−32 |
| C104 | −7.43854852e−31 | 2.44582791e−29 | 1.21518455e−30 |
| C105 | 9.61099067e−38 | −2.13122119e−40 | 1.57023792e−38 |
| C107 | 1.33574615e−35 | 1.00516673e−38 | −6.64416881e−37 |
| C109 | 3.0413733e−36 | 8.77932337e−38 | −4.68884249e−36 |
| C111 | 2.63488695e−34 | −1.86963182e−36 | −6.3997021e−35 |
| C113 | 2.00767073e−33 | −3.0673235e−35 | −5.08585923e−34 |
| C115 | 5.44782166e−33 | 6.82269904e−35 | −2.42661715e−33 |
| C117 | 9.50194881e−33 | 1.66156597e−32 | −5.80105722e−33 |
| C119 | 1.41231787e−32 | 3.55214787e−32 | −2.94550628e−33 |

TABLE 3c for FIG. 11

| Coefficient | M2 | M1 |
|---|---|---|
| KY | 0.00000000 | 0.00000000 |
| KX | 0.00000000 | 0.00000000 |
| RX | 2138.08693900 | −3536.11254200 |
| C7 | −5.08202758e−07 | 2.51152933e−08 |
| C9 | −4.64808292e−07 | −1.00801413e−07 |
| C10 | −5.2152857e−10 | 2.24633273e−11 |

TABLE 3c-continued for FIG. 11

| Coefficient | M2 | M1 |
| --- | --- | --- |
| C12 | −1.2267042e−09 | 2.81663757e−10 |
| C14 | −1.10849009e−09 | 2.97053626e−10 |
| C16 | −2.52456679e−14 | 7.12707541e−14 |
| C18 | −2.43228507e−12 | 4.33393838e−13 |
| C20 | −3.36955187e−12 | −1.75916282e−13 |
| C21 | −3.84258086e−16 | 2.33914375e−16 |
| C23 | 1.24580259e−15 | −5.24252881e−16 |
| C25 | −7.13518758e−15 | 9.94837914e−17 |
| C27 | −1.09465829e−14 | −1.8200099e−16 |
| C29 | −2.45456804e−18 | −4.06697139e−19 |
| C31 | −1.05895518e−18 | −9.64572917e−19 |
| C33 | −2.56862086e−17 | −9.64610367e−20 |
| C35 | −3.11915404e−17 | −3.47465193e−18 |
| C36 | 5.42483468e−21 | −2.62416646e−21 |
| C38 | −1.28767465e−20 | −1.44806927e−21 |
| C40 | −1.35252884e−20 | −1.12861847e−20 |
| C42 | −9.46548492e−20 | −1.66263444e−20 |
| C44 | −3.08566898e−20 | −1.69962152e−20 |
| C46 | −8.72930921e−24 | 7.78828244e−24 |
| C48 | 4.85393634e−23 | 1.16957458e−24 |
| C50 | 2.32310873e−23 | 1.39613061e−23 |
| C52 | −2.39006483e−22 | −1.04152972e−22 |
| C54 | 9.02421435e−22 | −3.89969663e−22 |
| C55 | −1.01540766e−25 | 1.57448755e−26 |
| C57 | 2.57150976e−25 | 1.58418149e−25 |
| C59 | 4.56583035e−25 | 1.25865785e−24 |
| C61 | 6.19287099e−25 | 3.30511747e−24 |
| C63 | 1.87389977e−24 | 3.45411645e−24 |
| C65 | 9.25959414e−24 | 2.02675319e−25 |
| C67 | 1.04592096e−28 | −1.69192397e−29 |
| C69 | −1.23125975e−27 | 5.09626594e−28 |
| C71 | −3.49347998e−27 | 1.52966585e−27 |
| C73 | −1.24984375e−27 | 5.22009103e−27 |
| C75 | 2.53379392e−26 | 1.58063539e−26 |
| C77 | 2.22668166e−26 | 2.90525317e−26 |
| C78 | 4.36147293e−31 | 1.14436766e−31 |
| C80 | −3.50509868e−30 | −4.10818926e−30 |
| C82 | −1.09441954e−29 | −3.97798422e−29 |
| C84 | −2.64435076e−29 | −1.48424979e−28 |
| C86 | −4.36593909e−30 | −2.45523884e−28 |
| C88 | 1.03536362e−28 | −2.03667484e−28 |
| C90 | −1.91004648e−28 | 5.93786093e−30 |
| C92 | −3.91796018e−33 | −3.34860549e−34 |
| C94 | 1.20860185e−32 | −8.83042357e−33 |
| C96 | 6.26423498e−32 | −3.97981753e−32 |
| C98 | 1.38594908e−31 | −1.28012778e−31 |
| C100 | 2.04699035e−31 | −2.79159426e−31 |
| C102 | −6.47529985e−33 | −5.09078455e−31 |
| C104 | −1.42008486e−30 | −5.24494913e−31 |
| C105 | −1.83450743e−36 | −1.5810545e−36 |
| C107 | 4.66809471e−36 | 3.91193275e−35 |
| C109 | 1.33330289e−34 | 4.3895162e−34 |
| C111 | 4.18080915e−34 | 2.21004026e−33 |
| C113 | 9.08314357e−34 | 5.17653775e−33 |
| C115 | 7.49682185e−34 | 6.37788931e−33 |
| C117 | −8.10366391e−34 | 4.23046932e−33 |
| C119 | −2.83722223e−33 | 2.68970093e−35 |

TABLE 4a for FIG. 11

| Surface | DCX | DCY | DCZ |
| --- | --- | --- | --- |
| Image | 0.00000000 | 0.00000000 | 0.00000000 |
| M8 | 0.00000000 | 0.00000000 | 825.93553536 |
| M7 | 0.00000000 | 152.41225394 | 120.73685442 |
| M6 | −0.00000000 | −86.70381571 | 1227.10679876 |
| M5 | −0.00000000 | −288.90332638 | 1486.61328456 |
| M4 | −0.00000000 | −788.79112975 | 1720.09206911 |
| M3 | 0.00000000 | 63.19842658 | 1714.10424934 |
| M2 | 0.00000000 | 501.09999256 | 1469.79865760 |
| Stop | 0.00000000 | 709.45610187 | 1107.00590480 |

TABLE 4a-continued for FIG. 11

| Surface | DCX | DCY | DCZ |
| --- | --- | --- | --- |
| M1 | 0.00000000 | 944.01022630 | 698.59677889 |
| Object | 0.00000000 | 1073.94708727 | 2183.78189551 |

TABLE 4b for FIG. 11

| Surface | TLA[deg] | TLB[deg] | TLC[deg] |
| --- | --- | --- | --- |
| Image | −0.00000000 | 0.00000000 | −0.00000000 |
| M8 | 6.09778402 | 0.00000000 | −0.00000000 |
| M7 | 192.19556804 | 0.00000000 | −0.00000000 |
| M6 | −64.93990082 | −0.00000000 | −0.00000000 |
| M5 | −38.55543909 | −0.00000000 | −0.00000000 |
| M4 | 77.28091044 | −0.00000000 | −0.00000000 |
| M3 | −14.77992460 | 0.00000000 | −0.00000000 |
| M2 | −44.64396244 | 0.00000000 | 0.00000000 |
| Stop | 24.06892752 | 180.00000000 | 0.00000000 |
| M1 | 192.43462686 | −0.00000000 | −0.00000000 |
| Object | −0.00000000 | 0.00000000 | 0.00000000 |

TABLE 5 for FIG. 11

| Surface | Angle of incidence[deg] | Reflectivity |
| --- | --- | --- |
| M8 | 6.13281062 | 0.66174979 |
| M7 | 0.12234545 | 0.66566439 |
| M6 | 76.65954883 | 0.83082833 |
| M5 | 77.60306126 | 0.84505091 |
| M4 | 12.04904974 | 0.64926632 |
| M3 | 75.95982040 | 0.81978588 |
| M2 | 74.94335346 | 0.80291383 |
| M1 | 17.19094173 | 0.62933155 |
| Overall transmission | | 0.0832 |

TABLE 6 for FIG. 11

| X[mm] | Y[mm] | Z[mm] |
| --- | --- | --- |
| 0.00000000 | −33.70252519 | 0.00000000 |
| 30.86140168 | −33.30508715 | 0.00000000 |
| 60.93202620 | −32.11151271 | 0.00000000 |
| 89.44636869 | −30.12170033 | 0.00000000 |
| 115.68586451 | −27.34710426 | 0.00000000 |
| 138.99559433 | −23.82429945 | 0.00000000 |
| 158.79775798 | −19.62526558 | 0.00000000 |
| 174.60427294 | −14.85927900 | 0.00000000 |
| 186.02935604 | −9.66597496 | 0.00000000 |
| 192.80157508 | −4.20338061 | 0.00000000 |
| 194.77348028 | 1.36441882 | 0.00000000 |
| 191.92612369 | 6.87758580 | 0.00000000 |
| 184.36687248 | 12.18822531 | 0.00000000 |
| 172.32108075 | 17.16515588 | 0.00000000 |
| 156.11966244 | 21.69588021 | 0.00000000 |
| 136.18490669 | 25.68612451 | 0.00000000 |
| 113.01636038 | 29.05791801 | 0.00000000 |
| 87.17765216 | 31.74769820 | 0.00000000 |
| 59.28476118 | 33.70545241 | 0.00000000 |
| 29.99574553 | 34.89486127 | 0.00000000 |
| 0.00000000 | 35.29381045 | 0.00000000 |
| −29.99574553 | 34.89486127 | 0.00000000 |
| −59.28476118 | 33.70545241 | 0.00000000 |
| −87.17765216 | 31.74769820 | 0.00000000 |
| −113.01636038 | 29.05791801 | 0.00000000 |
| −136.18490669 | 25.68612451 | 0.00000000 |

TABLE 6-continued for FIG. 11

| X[mm] | Y[mm] | Z[mm] |
|---|---|---|
| −156.11966244 | 21.69588021 | 0.00000000 |
| −172.32108075 | 17.16515588 | 0.00000000 |
| −184.36687248 | 12.18822531 | 0.00000000 |
| −191.92612369 | 6.87758580 | 0.00000000 |
| −194.77348028 | 1.36441882 | 0.00000000 |
| −192.80157508 | −4.20338061 | 0.00000000 |
| −186.02935604 | −9.66597496 | 0.00000000 |
| −174.60427294 | −14.85927900 | 0.00000000 |
| −158.79775798 | −19.62526558 | 0.00000000 |
| −138.99559433 | −23.82429945 | 0.00000000 |
| −115.68586451 | −27.34710426 | 0.00000000 |
| −89.44636869 | −30.12170033 | 0.00000000 |
| −60.93202620 | −32.11151271 | 0.00000000 |
| −30.86140168 | −33.30508715 | 0.00000000 |

The projection optical unit 23 has an overall transmission of 8.32%.

The projection optical unit 23 has an image-side numerical aperture of 0.55.

In the first imaging light plane xz, the reduction factor $\beta_x$ is 4.50. In the second imaging light plane yz, the reduction factor $\beta_x$ is 8.00. An object-field-side chief ray angle is 5.0°. A maximum pupil obscuration is 12%. An object-image offset $d_{OIS}$ is approximately 1080 mm. The mirrors of the projection optical unit 23 can be housed in a cuboid with xyz-edge lengths of 946 mm×1860 mm×1675 mm.

In the projection optical unit 23, the object plane 5 and the image plane 9 extend parallel to one another. A working distance between the mirror M7 closest to the wafer and the image plane 9 is 94 mm. A mean wavefront aberration rms is approximately 24 mλ.

An aperture stop AS is arranged upstream of the first second plane intermediate image 24 in the imaging light beam path between the mirrors M1 and M2. The entire imaging light beam is completely accessible in the region of the aperture stop AS.

Figure 15:
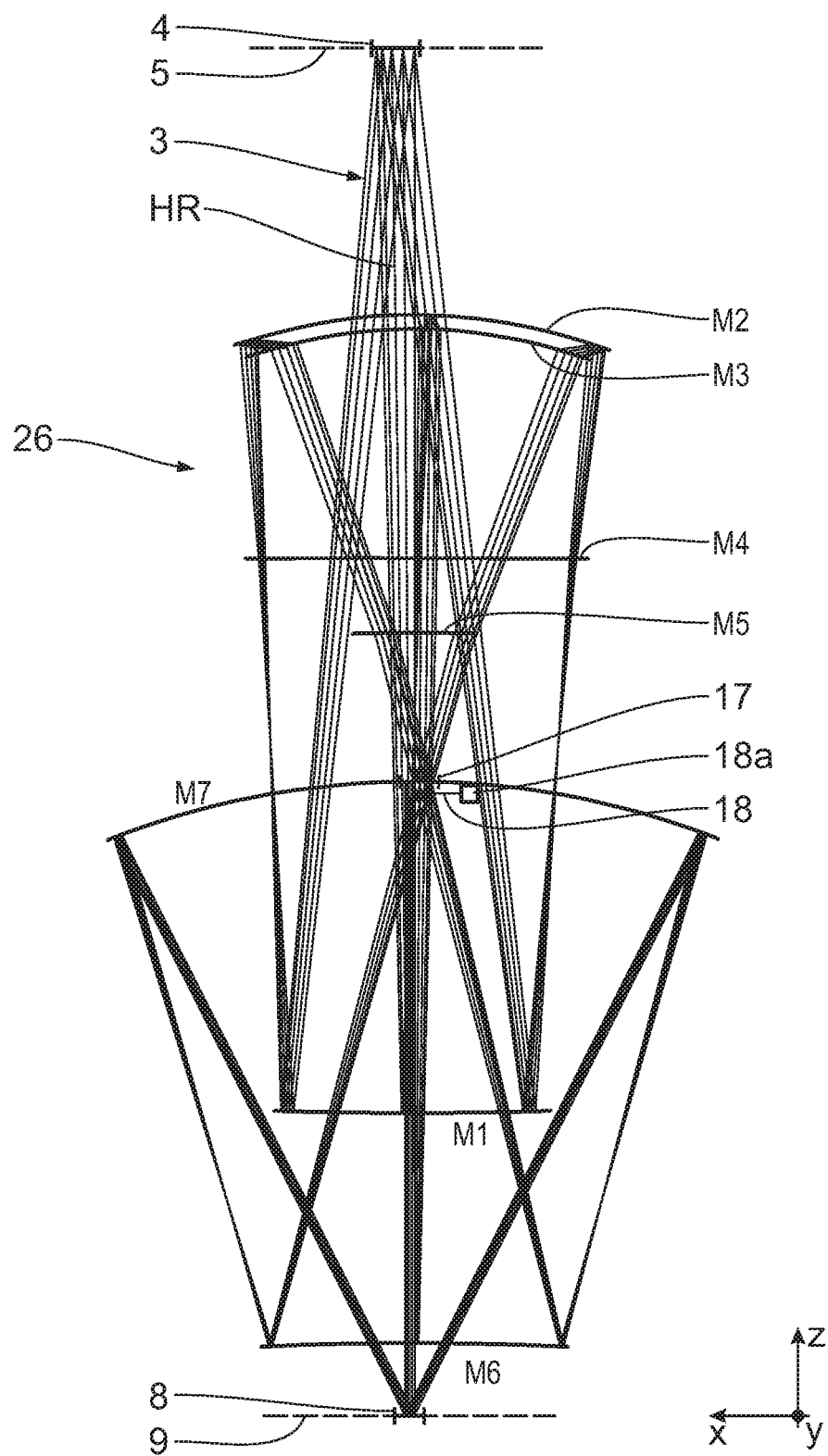
Figure 16:
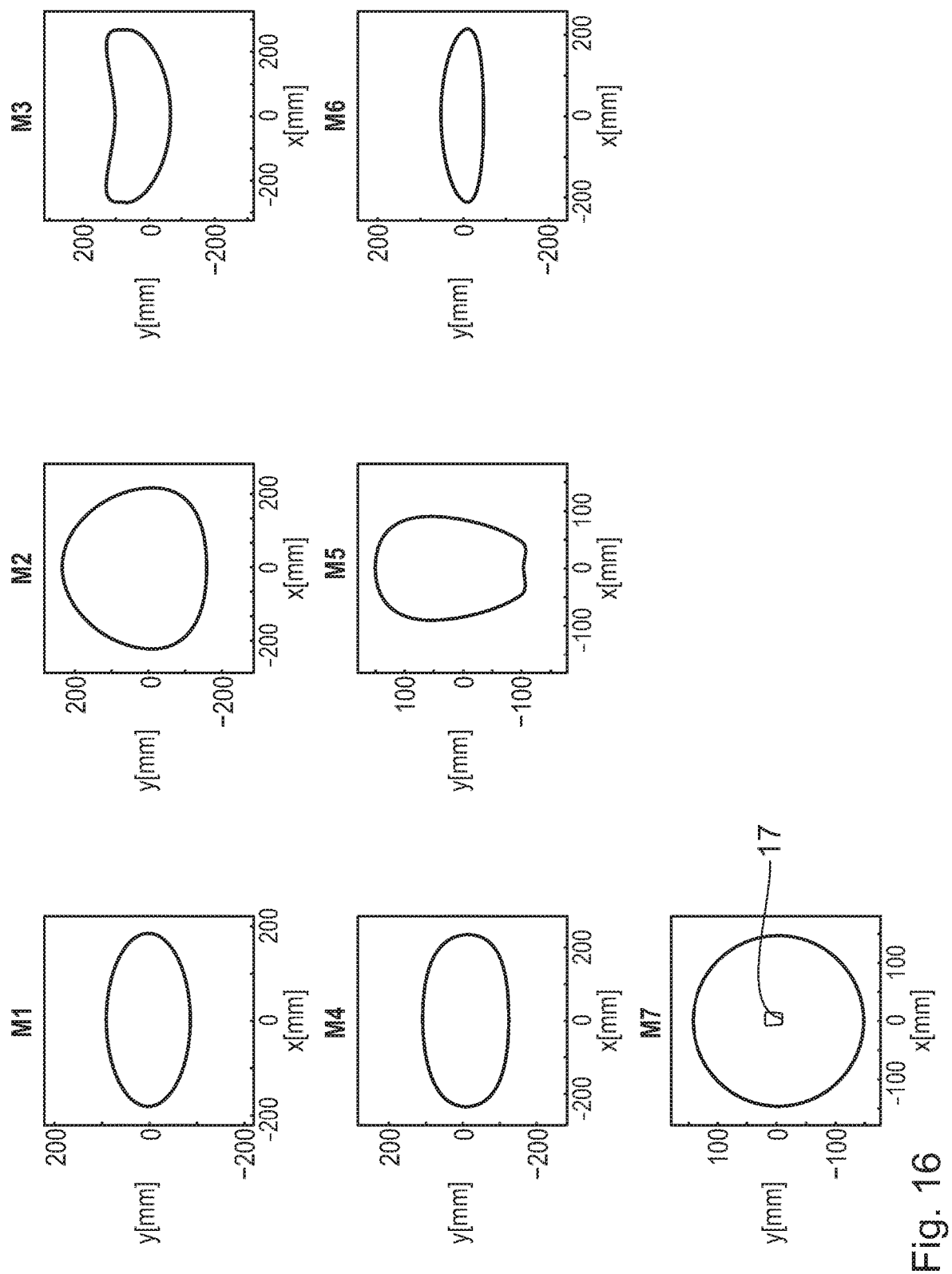

A further embodiment of a projection optical unit 26, which can be used in the projection exposure apparatus 1 according to FIG. 1 instead of the projection optical unit 7, is explained in the following text on the basis of FIGS. 14 to 16. Components and functions which were already explained above in the context of FIGS. 1 to 13 are denoted, where applicable, by the same reference signs and are not discussed again in detail.

Mirrors M1, M6 and M7 are embodied as NI mirrors and the mirrors M2 to M5 are embodied as GI mirrors. The GI mirrors M2 to M5 have a deflecting effect in the same direction, Overall, the following applies for the sequence of the deflecting effect in the mirrors M1 to M7 of the projection optical unit 26: RLLLL0R.

The mirrors M1 to M7 are once again embodied as free-form surface mirrors, for which the free-form surface equation (1), specified above, applies.

The following table once again shows the mirror parameters of mirrors M1 to M7 of the projection optical unit 26.

| | M1 | M2 | M3 | M4 | M5 | M6 | M7 |
|---|---|---|---|---|---|---|---|
| Maximum angle of incidence [°] | 16.9 | 78.6 | 75.1 | 72.2 | 76.5 | 16.3 | 10.0 |
| Extent of the reflection surface in the x-direction [mm] | 366.4 | 442.6 | 520.2 | 464.1 | 182.3 | 409.8 | 821.9 |
| Extent of the reflection surface in the y-direction [mm] | 177.5 | 393.2 | 193.4 | 231.3 | 260.7 | 100.6 | 796.0 |
| Maximum mirror diameter [mm] | 366.5 | 448.5 | 520.3 | 464.1 | 268.7 | 409.8 | 822.4 |

Only the mirror M5 has a y/x-aspect ratio that is greater than 1. The y/x-aspect ratio of the mirror M5 is less than 1.5.

The last mirror M7 has the largest mirror diameter, measuring approximately 820 mm. None of the other mirrors M1 to M6 has a larger diameter than 525 mm. Five of the seven mirrors have a maximum diameter smaller than 450 mm.

The projection optical unit 26, once again, has exactly one first plane intermediate image 18 and two second plane intermediate images 19, 20. The first plane intermediate image 18 is arranged exactly level with the passage of the imaging light through the passage opening 17. This causes a very small x-extent of the passage opening 17. The two second plane intermediate images 19, 20 are arranged, firstly, in the imaging light beam path between the GI mirrors M3 and M4 and, secondly, in the imaging light beam path between the GI mirrors M4 and M5. Hence, the GI mirror M4 is, once again, a GI mirror between two second plane intermediate images, as already explained above in conjunction with the embodiment according to FIGS. 11 to 13.

The projection optical unit 26 has, firstly, an odd number of mirrors and, secondly, a difference in the number of first plane intermediate images and second plane intermediate images of exactly 1. This achieves an image position that is the right way round in comparison with the object position; i.e., an "image flip" is compensated.

FIG. 16 shows, once again, the boundary contours of the reflection surfaces of the mirrors M1 to M7.

The optical design data from the projection optical unit 26 can be gathered from the following tables, which, in terms of their design, correspond to the tables for the projection optical unit 7 according to FIG. 2.

Figure 14:
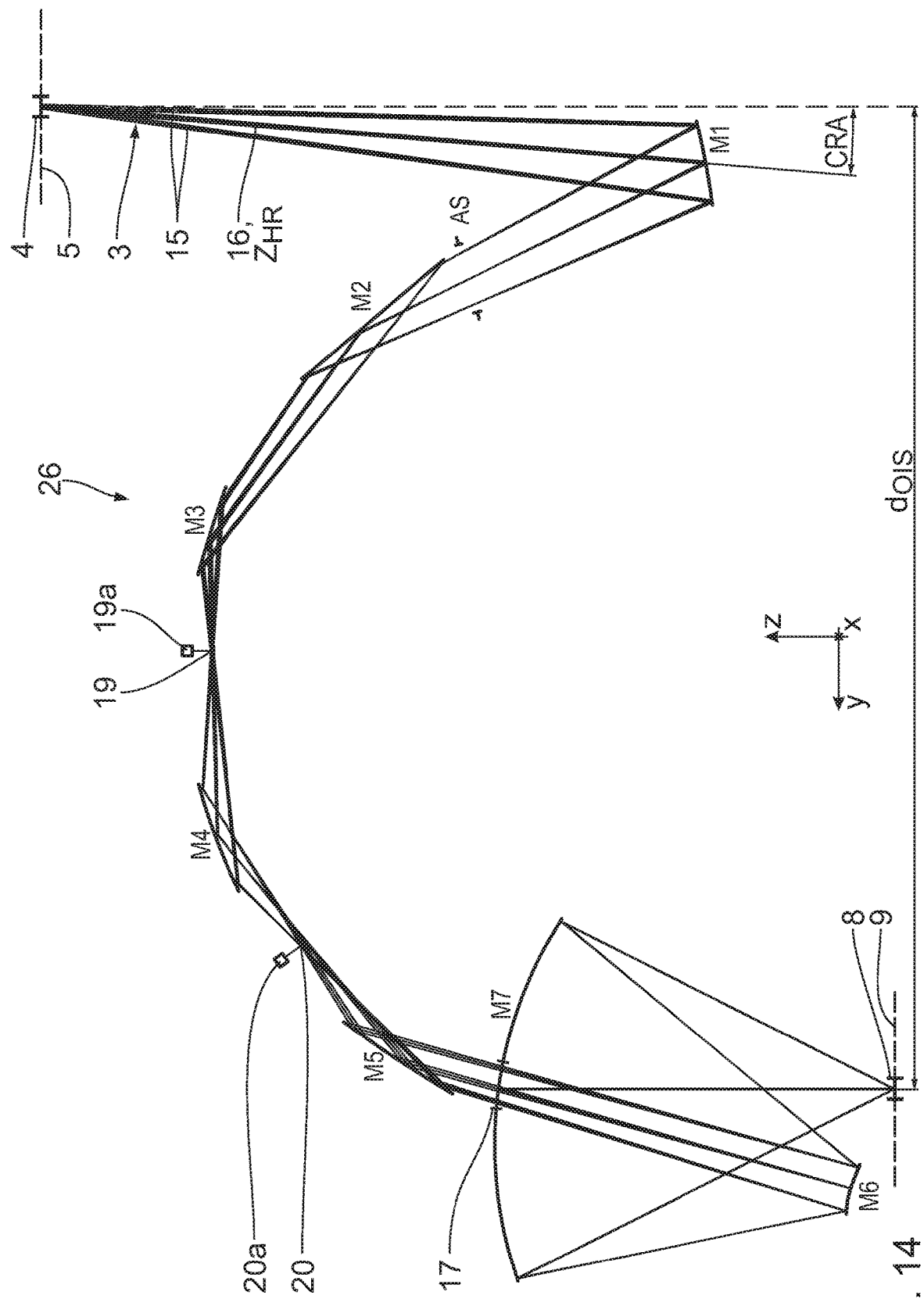

TABLE 1 for FIG. 14

| Exemplary embodiment | FIG. 14 |
|---|---|
| NA | 0.45 |
| Wavelength | 13.5 nm |
| beta_x | −4.0 |
| beta_y | −8.0 |
| Field dimension_x | 26.0 mm |
| Field dimension_y | 1.2 mm |
| Field curvature | 0.0 1/mm |
| rms | 40.1 ml |
| Stop | AS |

TABLE 2 for FIG. 14

| Surface | Radius_x[mm] | Power_x[1/mm] | Radius_y[mm] | Power_y[1/mm] | Operating mode |
|---|---|---|---|---|---|
| M7 | −1118.1920556 | 0.0017717 | −899.8350288 | 0.0022439 | REFL |
| M6 | −77660.0792965 | 0.0000257 | 221.9926726 | −0.0090093 | REFL |
| M5 | −1386.8269930 | 0.0004288 | −2455.8257737 | 0.0027388 | REFL |
| M4 | −811.5247859 | 0.0008055 | −1112.5367564 | 0.0055003 | REFL |
| M3 | −1397.9253073 | 0.0004552 | −2809.2148857 | 0.0022378 | REFL |
| M2 | −16748.6228787 | 0.0000291 | 86553.8665992 | −0.0000949 | REFL |
| M1 | −5806.9159005 | 0.0003319 | −1647.2565533 | 0.0012601 | REFL |

TABLE 3a for FIG. 14

| Coefficient | M7 | M6 | M5 |
|---|---|---|---|
| KY | 0.00000000 | 0.00000000 | 0.00000000 |
| KX | −0.00137021 | 0.91505988 | 0.56499787 |
| RX | −1118.19205600 | 77660.07930000 | −1386.82699300 |
| C7 | −1.35972277e−09 | −1.31702537e−06 | 8.21566727e−08 |
| C9 | −1.19562911e−09 | −1.06795699e−06 | 6.71317569e−08 |
| C10 | −1.27946071e−11 | 6.00960647e−10 | −1.85048122e−10 |
| C12 | −3.62273134e−11 | 1.17179851e−09 | −7.91150245e−11 |
| C14 | −3.22516678e−12 | −2.45659314e−08 | −3.48012619e−11 |
| C16 | −8.90234813e−15 | −6.8386461e−14 | −8.39554879e−13 |
| C18 | −5.48904832e−15 | 1.19036933e−11 | −7.17409427e−14 |
| C20 | −3.99556769e−16 | 8.45160514e−11 | 3.60144042e−14 |
| C21 | −2.1960617e−17 | 2.49887747e−16 | 7.12991585e−16 |
| C23 | −5.89249041e−17 | 9.32259724e−15 | −2.90210248e−15 |
| C25 | −4.55753256e−17 | −6.68675048e−14 | −3.70422222e−17 |
| C27 | −5.5757165e−18 | 1.19018192e−12 | 8.51977396e−17 |
| C29 | −2.4344109e−21 | −8.62777329e−18 | 1.74126592e−17 |
| C31 | −5.55579318e−21 | 3.34187564e−17 | −7.17207054e−18 |
| C33 | −3.31675441e−21 | −1.29777485e−16 | 2.10588262e−18 |
| C35 | 1.75995157e−21 | −8.94713659e−16 | 1.15186427e−18 |
| C36 | −1.41908532e−23 | 3.26000767e−21 | −1.19195804e−20 |
| C38 | −7.80332525e−23 | −6.53124238e−21 | 9.90671134e−20 |
| C40 | −1.13822672e−22 | 6.68112351e−19 | −5.5105019e−20 |
| C42 | −5.90298206e−23 | −1.86124502e−18 | −5.32734848e−22 |
| C44 | −6.65947093e−24 | −1.01586039e−16 | 7.15851654e−21 |
| C46 | −2.00312205e−27 | 8.88928654e−24 | −9.36621032e−22 |

TABLE 3a-continued for FIG. 14

| Coefficient | M7 | M6 | M5 |
|---|---|---|---|
| C48 | −3.84346115e−27 | −5.50464203e−23 | −3.68359583e−22 |
| C50 | −1.21351091e−26 | −1.75186317e−21 | −7.42676069e−22 |
| C52 | −5.94610051e−27 | 1.06480223e−19 | −2.26019232e−22 |
| C54 | −1.02529435e−27 | 6.80466177e−20 | 6.85884917e−24 |
| C55 | −1.87169414e−29 | −3.03257207e−27 | −3.53966472e−25 |
| C57 | −7.63481393e−29 | −1.65155904e−26 | −6.31531629e−24 |
| C59 | −1.618503e−28 | 3.24021454e−24 | −2.08579182e−24 |
| C61 | −1.50863465e−28 | −3.30781882e−23 | −2.85752418e−24 |
| C63 | −7.4694491e−29 | −2.05676238e−22 | −8.81519764e−25 |
| C65 | −8.40416665e−30 | 1.06163773e−21 | −2.93156768e−26 |
| C67 | 3.03979955e−33 | 0 | 0 |
| C69 | 1.86338693e−33 | 0 | 0 |
| C71 | −6.61723971e−32 | 0 | 0 |
| C73 | −1.08032051e−31 | 0 | 0 |
| C75 | −2.27309233e−32 | 0 | 0 |
| C77 | 6.99250984e−33 | 0 | 0 |
| C78 | −1.01710204e−35 | 0 | 0 |
| C80 | −1.77734667e−34 | 0 | 0 |
| C82 | −4.92421677e−34 | 0 | 0 |
| C84 | −5.90814608e−34 | 0 | 0 |
| C86 | −3.58119042e−34 | 0 | 0 |
| C88 | −7.3533067e−35 | 0 | 0 |
| C90 | 9.04662218e−36 | 0 | 0 |

TABLE 3b for FIG. 14

| Coefficient | M4 | M3 | M2 |
|---|---|---|---|
| KY | 0.00000000 | 0.14280139 | 0.01218901 |
| KX | −0.07494948 | 0.00000000 | 0.00000000 |
| RX | −811.52478590 | −1397.92530700 | −16748.62288000 |
| C7 | −3.86023657e−08 | −1.7217439e−07 | 1.68453717e−07 |
| C9 | 3.81360594e−07 | −2.22668277e−08 | 5.53150287e−08 |
| C10 | −9.50508955e−12 | −1.34447743e−10 | 5.4023144e−11 |
| C12 | −5.70678081e−11 | 9.89796339e−11 | 1.09720673e−10 |
| C14 | 8.49743848e−12 | −8.20556261e−11 | 1.13182448e−10 |
| C16 | 1.61961347e−14 | 3.16757938e−13 | 8.17990626e−14 |
| C18 | −1.81336141e−12 | −1.46692844e−13 | −7.87681986e−14 |
| C20 | −2.45995083e−12 | 3.69363439e−13 | 2.2119085e−13 |
| C21 | −6.01959296e−17 | 2.32061711e−16 | 4.88073984e−16 |
| C23 | 9.61849791e−16 | −6.62327921e−16 | 8.33140175e−16 |
| C25 | 3.76110948e−15 | 4.1293339e−16 | 5.11355813e−16 |
| C27 | 4.07712151e−16 | −1.30372287e−15 | 5.07663031e−16 |
| C29 | −6.19189144e−19 | −1.12258072e−18 | −8.07168061e−19 |
| C31 | 1.20524092e−18 | 3.06340009e−19 | 3.29075739e−18 |
| C33 | 1.72295617e−17 | −8.88294932e−18 | 3.4168599e−18 |
| C35 | 1.70676574e−17 | −1.38680217e−17 | 1.83754623e−18 |
| C36 | 1.43724929e−22 | −7.1900244e−22 | −3.39550843e−23 |
| C38 | −3.38007799e−22 | 2.93538162e−21 | 2.70487171e−21 |
| C40 | −2.74909383e−20 | −1.10840295e−20 | 1.63959268e−21 |
| C42 | −6.45193579e−20 | −3.57255186e−20 | 6.86550247e−21 |
| C44 | 7.36421248e−20 | −8.97646863e−20 | 4.94290723e−21 |
| C46 | 2.3853282e−24 | 3.37918053e−24 | 3.13909373e−24 |
| C48 | 1.56518232e−23 | −3.28081782e−24 | −6.07559407e−24 |

TABLE 3b-continued for FIG. 14

| Coefficient | M4 | M3 | M2 |
|---|---|---|---|
| C50 | 3.29980178e−23 | 1.15298309e−23 | −1.68311399e−23 |
| C52 | −1.06645652e−22 | −1.67150633e−22 | −1.09033213e−23 |
| C54 | −2.15354941e−22 | −3.05800431e−22 | 5.37428244e−24 |
| C55 | 1.02369612e−28 | 7.38084675e−28 | 9.80514031e−27 |
| C57 | −3.04109444e−27 | −7.17188177e−27 | 1.00470224e−26 |
| C59 | −3.11173505e−26 | 3.89129269e−26 | −2.43587516e−26 |
| C61 | 2.38777712e−25 | −2.43305684e−26 | −7.71285207e−26 |
| C63 | −1.38932479e−26 | −3.05746638e−25 | −4.41126952e−26 |
| C65 | −4.39598759e−25 | −5.10266314e−25 | −3.4826267e−28 |

TABLE 3c for FIG. 14

| Coefficient | M1 |
|---|---|
| KY | 0.00000000 |
| KX | 0.00000000 |
| RX | −5806.91590000 |
| C7 | −1.57733574e−08 |
| C9 | 4.04579031e−08 |
| C10 | −4.89660517e−11 |
| C12 | 4.59750467e−10 |
| C14 | 8.1358196e−10 |
| C16 | 2.24075942e−13 |
| C18 | −1.3292697e−13 |
| C20 | 2.50231172e−12 |
| C21 | 7.03566708e−17 |
| C23 | −6.62324975e−17 |
| C25 | −8.78933469e−16 |
| C27 | −8.82219671e−16 |
| C29 | −7.23734311e−19 |
| C31 | −1.78828999e−18 |
| C33 | 2.4711693e−17 |
| C35 | 1.58549093e−17 |
| C36 | −7.87923961e−22 |
| C38 | −1.47075761e−21 |
| C40 | −6.17727512e−20 |
| C42 | −2.51981333e−20 |
| C44 | −6.28995506e−20 |
| C46 | 5.69906696e−24 |
| C48 | 5.15465198e−23 |
| C50 | −4.7110842e−23 |
| C52 | −8.65036303e−22 |
| C54 | −2.31317136e−22 |
| C55 | 4.3793195e−27 |
| C57 | −1.6423552e−27 |
| C59 | 1.37172536e−25 |
| C61 | 1.63243103e−24 |
| C63 | −6.69935139e−26 |
| C65 | 6.65963303e−24 |

TABLE 4a for FIG. 14

| Surface | DCX | DCY | DCZ |
|---|---|---|---|
| Image | 0.00000000 | 0.00000000 | 0.00000000 |
| M7 | 0.00000000 | 0.00000000 | 871.29627896 |
| M6 | 0.00000000 | 218.32338321 | 98.52317410 |
| M5 | 0.00000000 | −58.06517479 | 1076.82261676 |
| M4 | −0.00000000 | −561.60349183 | 1493.78229143 |
| M3 | −0.00000000 | −1208.38154717 | 1510.41842453 |
| M2 | 0.00000000 | −1670.36640710 | 1179.32899124 |
| Stop | 0.00000000 | −1788.84239898 | 938.34283647 |
| M1 | 0.00000000 | −2045.77302675 | 415.73295536 |
| Object | 0.00000000 | −2170.48986012 | 1880.60987391 |

TABLE 4b for FIG. 14

| Surface | TLA[deg] | TLB[deg] | TLC[deg] |
|---|---|---|---|
| Image | −0.00000000 | 0.00000000 | −0.00000000 |
| M7 | 7.88800730 | 0.00000000 | −0.00000000 |
| M6 | 195.77601460 | 0.00000000 | −0.00000000 |
| M5 | −56.92538181 | 0.00000000 | −0.00000000 |
| M4 | −20.55009475 | −0.00000000 | −0.00000000 |
| M3 | 17.07725962 | 0.00000000 | 0.00000000 |
| M2 | 49.72391045 | 0.00000000 | −0.00000000 |
| Stop | 164.02654214 | −0.00000000 | −0.00000000 |
| M1 | 169.34310441 | −0.00000000 | −0.00000000 |
| Object | 9.09286877 | 0.00000000 | 180.00000000 |

TABLE 5 for FIG. 14

| Surface | Angle of incidence [deg] | Reflectivity |
|---|---|---|
| M7 | 7.88800730 | 0.65901737 |
| M6 | 0.00000000 | 0.66565840 |
| M5 | 72.70139641 | 0.76171724 |
| M4 | 70.92331654 | 0.72452174 |
| M3 | 71.44932909 | 0.73598206 |
| M2 | 75.90402008 | 0.81888591 |
| M1 | 15.52321404 | 0.63691659 |
| Overall transmission | | 0.0929 |

TABLE 6 for FIG. 14

| X [mm] | Y [mm] | Z [mm] |
|---|---|---|
| −0.00000000 | 60.12634248 | 0.00000000 |
| −31.00173429 | 59.39348922 | 0.00000000 |
| −61.23683000 | 57.21904481 | 0.00000000 |
| −89.95971748 | 53.67233536 | 0.00000000 |
| −116.46546521 | 48.86006031 | 0.00000000 |
| −140.10740705 | 42.91611197 | 0.00000000 |
| −160.31308861 | 35.99125711 | 0.00000000 |
| −176.59845642 | 28.24503313 | 0.00000000 |
| −188.57919514 | 19.84317315 | 0.00000000 |
| −195.97740908 | 10.96270342 | 0.00000000 |
| −198.62281719 | 1.80162097 | 0.00000000 |
| −196.45010574 | −7.41479310 | 0.00000000 |
| −189.49577612 | −16.43782216 | 0.00000000 |
| −177.89719433 | −25.01004611 | 0.00000000 |
| −161.89435001 | −32.88564405 | 0.00000000 |
| −141.83277687 | −39.84892316 | 0.00000000 |
| −118.16525762 | −45.72666520 | 0.00000000 |
| −91.45022545 | −50.39326310 | 0.00000000 |
| −62.34514559 | −53.76818640 | 0.00000000 |
| −31.59291444 | −55.80674921 | 0.00000000 |
| −0.00000000 | −56.48822373 | 0.00000000 |

TABLE 6-continued for FIG. 14

| X [mm] | Y [mm] | Z [mm] |
|---|---|---|
| 31.59291444 | −55.80674921 | 0.00000000 |
| 62.34514559 | −53.76818640 | 0.00000000 |
| 91.45022545 | −50.39326310 | 0.00000000 |
| 118.16525762 | −45.72666520 | 0.00000000 |
| 141.83277687 | −39.84892316 | 0.00000000 |
| 161.89435001 | −32.88564405 | 0.00000000 |
| 177.89719433 | −25.01004611 | 0.00000000 |
| 189.49577612 | −16.43782216 | 0.00000000 |
| 196.45010574 | −7.41479310 | 0.00000000 |
| 198.62281719 | 1.80162097 | 0.00000000 |
| 195.97740908 | 10.96270342 | 0.00000000 |
| 188.57919514 | 19.84317315 | 0.00000000 |
| 176.59845642 | 28.24503313 | 0.00000000 |
| 160.31308861 | 35.99125711 | 0.00000000 |
| 140.10740705 | 42.91611197 | 0.00000000 |
| 116.46546521 | 48.86006031 | 0.00000000 |
| 89.95971748 | 53.67233536 | 0.00000000 |
| 61.23683000 | 57.21904481 | 0.00000000 |
| 31.00173429 | 59.39348922 | 0.00000000 |

The projection optical unit 26 has an image field dimension of two-times 13.0 mm in the x-direction and of 1.2 mm in the y-direction. Unlike in the preceding embodiments, the object field 4 and the image field 8 each are rectangular in the projection optical unit 26. Accordingly, the field curvature is 0.

In the projection optical unit 26, an image-side numerical aperture is 0.45. A reduction factor is 4.00 ($\beta_x$) in the first imaging light plane xz and 8.00 ($\beta_y$) in the second imaging light plane yz. An object-side chief ray angle CRA is 4.2°. A pupil obscuration is at most 13%.

The projection optical unit 26 has an overall transmission of 9.29%.

An object-image offset $d_{OIS}$ is approximately 2170 mm in the projection optical unit 26. The mirrors of the projection optical unit 26 can be housed in a cuboid with the xyz-edge lengths of 822 mm×2551 mm×1449 mm.

In the projection optical unit 26, the object plane 5 is tilted relative to the image plane 9 by 9.1° about the x-axis.

A working distance between the mirror M6 closest to the wafer and the image plane is 80 mm. A mean wavefront aberration rms is approximately 35 mλ.

A further embodiment of a projection optical unit 27, which can be used in the projection exposure apparatus 1 according to FIG. 1 instead of the projection optical unit 7, is explained in the following text on the basis of FIGS. 17 to 19. Components and functions which were already explained above in the context of FIGS. 1 to 16 are denoted, where applicable, by the same reference signs and are not discussed again in detail.

The projection optical unit 27 has a total of 9 mirrors M1 to M9. The mirrors M1, M2, M3, M5, M6, M7 are embodied as GI mirrors. The remaining mirrors M4, M8 and M9 are embodied as NI mirrors. Like in all projection optical units described above, the last mirror M9 in the imaging light beam path is embodied with a passage opening 17 for the imaging light 3 in the projection optical unit 27 as well. In the projection optical unit 27, the imaging light beam path has a crossing point. Here, the imaging light partial beams, firstly, between the mirrors M2 and M3 and, secondly, between the mirrors M6 and M7 cross in a crossing region 28.

In the projection optical unit 27 too, a first plane intermediate image 18 is present near the passage opening 17 in the mirror M9 and two second plane intermediate images 19, 20. In the projection optical unit 27, the first of the two second plane intermediate images 19 lies between the mirrors M4 and M5 in the imaging light beam path, near the reflection at the mirror M5. The second of the two second plane intermediate images lies between the mirrors M7 and M8 in the imaging light beam path, near the reflection at the mirror M7.

An aperture stop AS lies in the imaging light beam path between the mirrors M2 and M3 and downstream of the crossing point 28. The imaging light beam is completely accessible in the region of the aperture stop AS.

The mirrors M1 to M9 are once again embodied as free-form surface mirrors, for which the free-form surface equation (1), specified above, applies.

The following table once again shows the mirror parameters of mirrors M1 to M9 of the projection optical unit 27.

|  | M1 | M2 | M3 | M4 | M5 | M6 | M7 | M8 | M9 |
|---|---|---|---|---|---|---|---|---|---|
| Maximum angle of incidence [°] | 83.1 | 75.4 | 82.3 | 16.1 | 78.8 | 75.6 | 82.9 | 75.6 | 68.8 |
| Extent of the reflection surface in the x-direction [mm] | 169.8 | 255.3 | 441.6 | 753.3 | 670.0 | 589.6 | 304.4 | 354.8 | 750.4 |
| Extent of the reflection surface in the y-direction [mm] | 326.6 | 366.7 | 407.7 | 134.7 | 97.9 | 264.6 | 132.0 | 176.2 | 731.9 |
| Maximum mirror diameter [mm] | 330.5 | 369.8 | 442.2 | 753.3 | 670.0 | 589.6 | 305.5 | 354.8 | 751.8 |

In the projection optical unit 27, the mirrors M1 and M2 have a y/x-aspect ratio that is greater than 1. None of the mirrors M1 to M9 has a y/x-aspect ratio that is greater than 2. The mirror M1 has the largest y/x-aspect ratio in the region of 1.9.

In the projection optical unit 27, the mirror M4 has the largest maximum diameter, measuring 753.3 mm. This diameter is slightly larger than that of the last mirror M9, which has a diameter of 751.8 mm. Five of the nine mirrors M1 to M9 have a diameter that is less than 450 mm. Four of the nine mirrors M1 to M9 have a diameter that is less than 400 mm.

Figure 19:
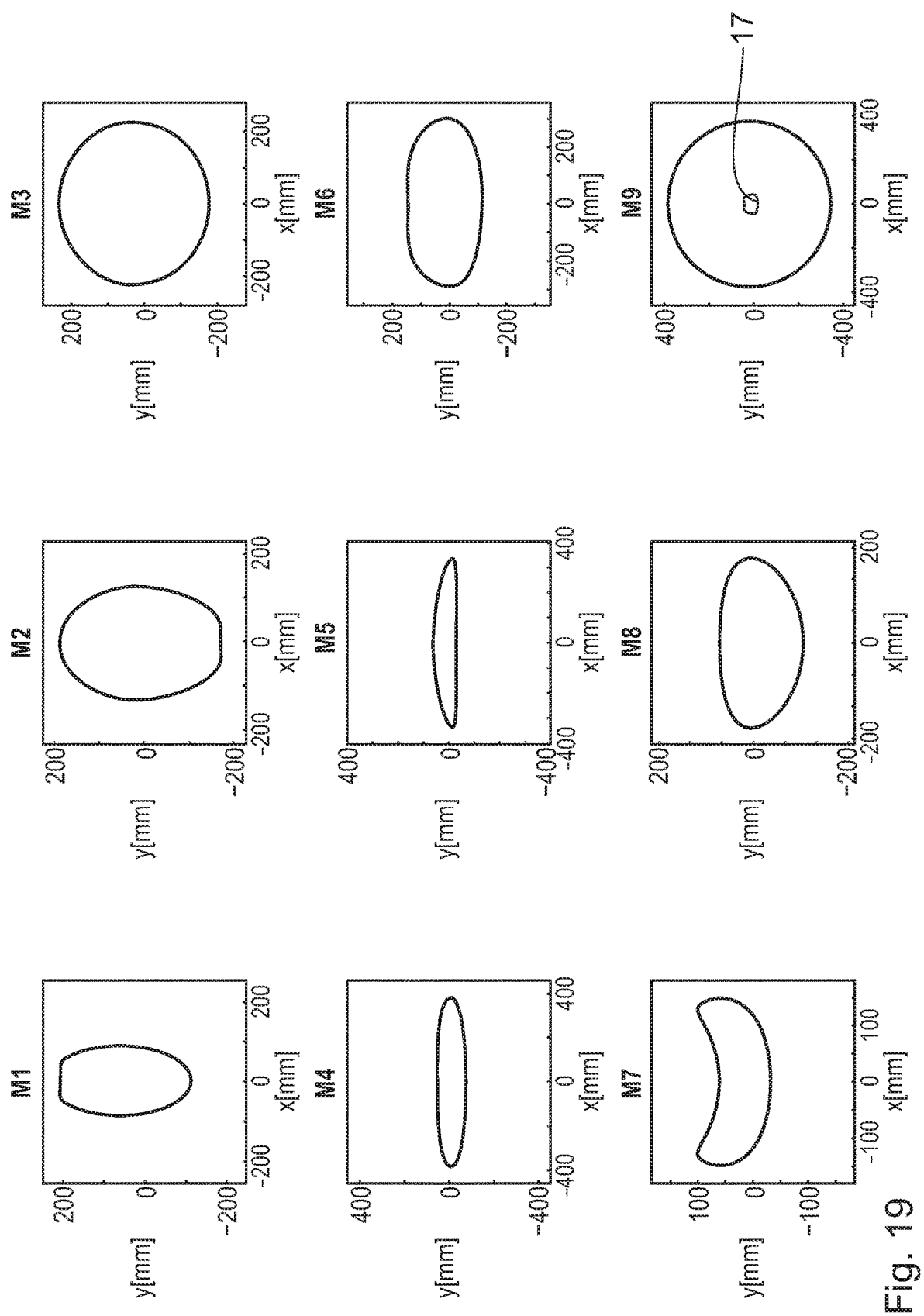

FIG. 19 shows the boundary contours of the reflection surfaces of the mirrors M1 to M9.

The optical design data from the projection optical unit 27 can be gathered from the following tables, which, in terms of their design, correspond to the tables for the projection optical unit 7 according to FIGS. 2 to 4.

Figure 17:
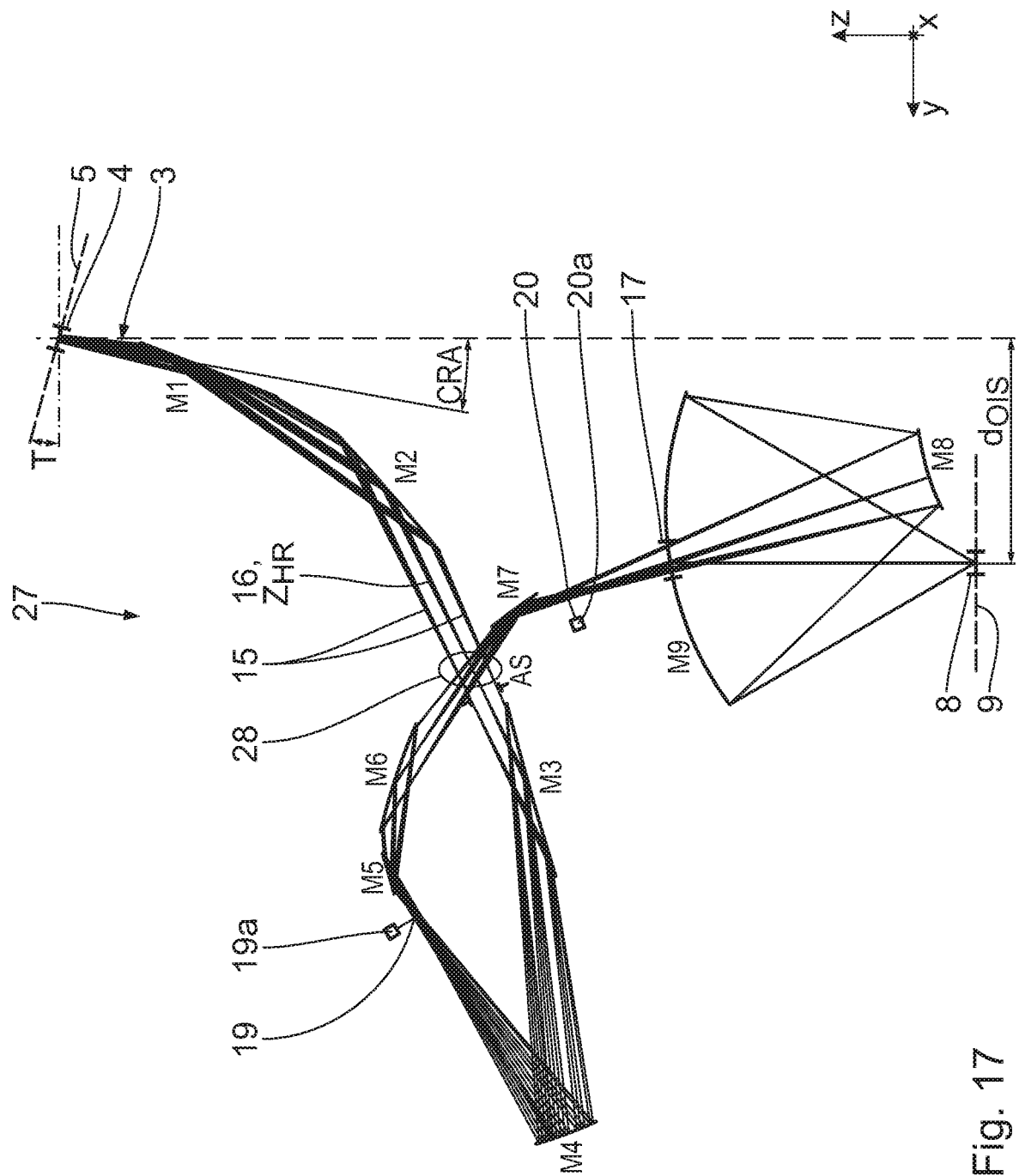
Figure 18:
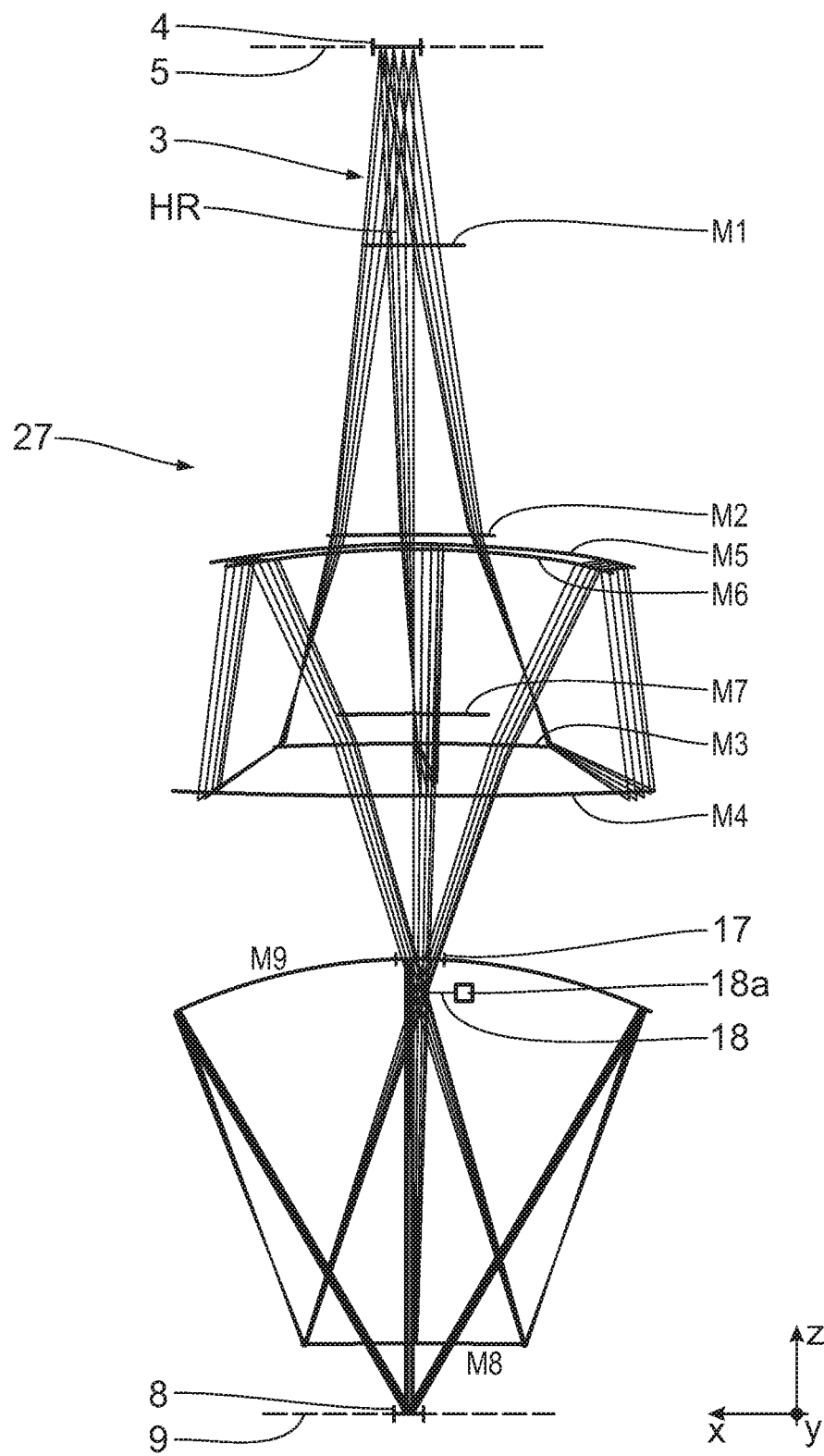

TABLE 1 for FIG. 17

| Exemplary embodiment | FIG. 17 |
|---|---|
| NA | 0.5 |
| Wavelength | 13.5 nm |
| beta_x | −4.0 |
| beta_y | −8.0 |
| Field dimension_x | 26.0 mm |
| Field dimension_y | 1.0 mm |
| Field curvature | 0.012345 1/mm |
| rms | 10.4 ml |
| Stop | AS |

TABLE 2 for FIG. 17

| Surface | Radius_x [mm] | Power_x [1/mm] | Radius_y [mm] | Power_y [1/mm] | Operating mode |
|---|---|---|---|---|---|
| M9 | −866.8072275 | 0.0022782 | −774.1551842 | 0.0026165 | REFL |
| M8 | 16799.3113404 | −0.0001190 | 468.0718547 | −0.0042729 | REFL |
| M7 | −2294.4146894 | 0.0002863 | −1705.1686250 | 0.0035712 | REFL |
| M6 | −1428.0401884 | 0.0003739 | −1527.9490527 | 0.0049036 | REFL |
| M5 | −1803.1480743 | 0.0003449 | 1798.9550061 | −0.0035758 | REFL |
| M4 | −3252.9549354 | 0.0005968 | −979.9292401 | 0.0021027 | REFL |
| M3 | 4728.4030238 | −0.0000695 | 9129.5671479 | −0.0013325 | REFL |
| M2 | 5562.6987709 | −0.0000997 | −5283.6560864 | 0.0013653 | REFL |
| M1 | −60685.4143772 | 0.0000065 | −9650.8869136 | 0.0010566 | REFL |

TABLE 3a for FIG. 17

| Coefficient | M9 | M8 | M7 |
|---|---|---|---|
| KY | 0.00000000 | 0.00000000 | 0.00000000 |
| KX | 0.00000000 | 0.00000000 | 0.00000000 |
| RX | −866.80722750 | 16799.31134000 | −2294.41468900 |
| C7 | −1.16750793e−08 | 8.78095547e−07 | −6.17468179e−08 |
| C9 | −3.227879e−08 | −1.8198111e−06 | −1.04202991e−07 |
| C10 | 1.9034586e−11 | 6.23675302e−10 | 7.3871998e−11 |
| C12 | −6.93669116e−11 | 9.021444e−10 | −5.40603404e−11 |
| C14 | −9.10699557e−12 | 6.12688457e−09 | −6.46020015e−11 |
| C16 | 3.15819834e−14 | 1.17072896e−12 | −3.52872023e−14 |
| C18 | −5.07731957e−14 | 6.23133942e−12 | 9.05095754e−13 |
| C20 | −3.43495607e−14 | −9.16741216e−12 | 2.0007813e−12 |
| C21 | −3.27663144e−17 | 9.71634515e−16 | 1.09224112e−16 |
| C23 | −1.23584293e−16 | 9.4783838e−15 | 4.07690678e−15 |
| C25 | −1.48878993e−16 | 7.54253173e−15 | 1.5218218e−14 |
| C27 | −2.01063297e−17 | −1.52044449e−13 | 6.05641827e−15 |
| C29 | 1.5610135e−20 | 8.3013727e−18 | 5.29921031e−18 |
| C31 | −1.99814617e−20 | 5.36304932e−18 | 8.07953201e−18 |
| C33 | −1.11450808e−19 | −2.50804621e−16 | −3.2570662e−16 |
| C35 | −6.07436807e−20 | 1.39798089e−15 | −8.05811987e−16 |
| C36 | −3.55570338e−23 | 3.89794855e−21 | −4.65712112e−22 |
| C38 | −2.50288622e−22 | 2.41971723e−20 | −7.26833672e−20 |
| C40 | −4.27782804e−22 | −6.12588427e−20 | −3.22790412e−18 |
| C42 | −2.71769746e−22 | 2.15559322e−18 | −1.50014564e−17 |
| C44 | −4.35242415e−23 | −3.53718368e−18 | −2.10967102e−17 |
| C46 | 3.94426924e−26 | −1.32724993e−23 | −1.02393958e−22 |
| C48 | 5.7285325e−27 | 5.76804727e−24 | −1.07933989e−20 |
| C50 | −1.74816328e−25 | 8.93039513e−22 | −8.20017408e−20 |
| C52 | −2.51560547e−25 | −6.17750026e−21 | −2.58788551e−19 |
| C54 | −5.59816005e−26 | −2.62650678e−20 | −2.59842357e−19 |
| C55 | −2.27621057e−29 | −4.92904916e−27 | 5.63858543e−26 |
| C57 | −4.68887693e−28 | 2.28490721e−25 | −1.91342595e−23 |
| C59 | −1.21077926e−27 | 1.24045883e−24 | −1.95979904e−22 |
| C61 | −1.34960352e−27 | 6.99435043e−24 | −1.01941857e−21 |
| C63 | −6.45173081e−28 | −3.32275577e−23 | −2.41468045e−21 |
| C65 | −5.87726468e−29 | 1.50175538e−22 | −1.7630178e−21 |
| C67 | 4.45396788e−32 | 5.1119351e−28 | −2.04915236e−26 |

TABLE 3a-continued for FIG. 17

| Coefficient | M9 | M8 | M7 |
|---|---|---|---|
| C69 | 5.51131174e−32 | 2.63032348e−27 | −2.53651339e−25 |
| C71 | −2.08374464e−31 | 7.53232015e−27 | −1.75316445e−24 |
| C73 | −6.43925301e−31 | −1.0184489e−25 | −6.62874977e−24 |
| C75 | −3.80140733e−31 | 5.90051712e−25 | −1.2861965e−23 |
| C77 | −2.62734124e−31 | 1.34460748e−24 | −6.1504095e−24 |
| C78 | −1.81539619e−34 | 1.4112104e−31 | −1.28307565e−29 |
| C80 | −3.87877832e−34 | −3.22975415e−31 | −1.77832019e−28 |
| C82 | −9.50620474e−34 | −2.74623061e−30 | −1.52243334e−27 |
| C84 | −1.22684771e−33 | −1.52852009e−28 | −7.00528843e−27 |
| C86 | −4.68273715e−34 | 4.63890933e−28 | −2.14475826e−26 |
| C88 | −3.31350093e−34 | −3.31483992e−27 | −3.7840444e−26 |
| C90 | −2.36738088e−34 | −1.42151698e−26 | −6.47532148e−27 |
| C92 | −9.00803971e−38 | −1.98638804e−33 | −4.9137387e−32 |

TABLE 3a-continued for FIG. 17

| Coefficient | M9 | M8 | M7 |
|---|---|---|---|
| C94 | 4.1621932e−37 | −1.61097703e−32 | −5.58389838e−31 |
| C96 | −3.03008076e−37 | −6.312729e−32 | −2.80619132e−30 |
| C98 | −1.85579089e−36 | 1.07008134e−30 | −9.56158675e−30 |
| C100 | −1.23900393e−36 | −2.08486148e−31 | −2.7250613e−29 |
| C102 | −1.34403292e−36 | 6.69649223e−30 | −5.09959978e−29 |
| C104 | 6.21670071e−37 | 3.5356384e−29 | 1.28713474e−29 |
| C105 | −1.98093774e−40 | 0 | 0 |
| C107 | −2.5557529e−39 | 0 | 0 |
| C109 | −1.05792795e−38 | 0 | 0 |
| C111 | −2.0513119e−38 | 0 | 0 |
| C113 | −2.38857043e−38 | 0 | 0 |
| C115 | −1.66561627e−38 | 0 | 0 |
| C117 | −5.21569492e−39 | 0 | 0 |
| C119 | −4.32149861e−40 | 0 | 0 |
| C121 | 5.86326897e−43 | 0 | 0 |
| C123 | 1.71432174e−43 | 0 | 0 |
| C125 | 9.72731414e−43 | 0 | 0 |
| C127 | 8.87965167e−43 | 0 | 0 |
| C129 | −1.24386669e−42 | 0 | 0 |
| C131 | −6.0507722e−42 | 0 | 0 |
| C133 | −1.87199557e−42 | 0 | 0 |
| C135 | −2.70433567e−42 | 0 | 0 |

TABLE 3b for FIG. 17

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −1428.04018800 | −1803.14807400 | −3252.95493500 |
| C7 | 4.27764592e−07 | 1.267072e−07 | 1.00985236e−07 |

TABLE 3b-continued for FIG. 17

| Coefficient | M6 | M5 | M4 |
|---|---|---|---|
| C9 | −6.14217231e−08 | −7.14563402e−09 | −6.1822491e−08 |
| C10 | 2.85032609e−10 | −1.59934504e−12 | −7.25353647e−11 |
| C12 | −2.10890593e−10 | 4.51122111e−10 | −5.08897932e−11 |
| C14 | −1.04116732e−09 | 1.3708745e−09 | −3.6473465e−11 |
| C16 | −5.47215882e−13 | −1.15113425e−13 | 1.49177251e−14 |
| C18 | −1.21252244e−12 | −6.08056768e−13 | 2.58895804e−13 |
| C20 | −8.04452139e−13 | −7.24133342e−13 | −1.04297967e−12 |
| C21 | 6.24395637e−17 | 1.12122965e−16 | 3.46316226e−17 |
| C23 | −1.22488487e−15 | 5.31682676e−16 | −4.3573283e−17 |
| C25 | 1.93894654e−15 | 3.79094438e−15 | 4.88555627e−16 |
| C27 | 6.1182821e−15 | −8.66426346e−14 | 7.49855686e−16 |
| C29 | −6.02877018e−19 | 9.12169339e−16 | 4.78255626e−20 |
| C31 | 3.15486125e−18 | −1.00992269e−18 | −6.70828206e−20 |
| C33 | 1.71876661e−17 | 9.37575205e−17 | 6.34973765e−19 |
| C35 | 8.81823493e−18 | 3.41647588e−15 | 1.22964652e−17 |
| C36 | 1.8107487e−22 | −2.89061035e−22 | −5.13743928e−23 |
| C38 | 2.81007224e−21 | 1.01682473e−21 | −5.57192066e−23 |
| C40 | 2.10783719e−21 | −5.76887097e−20 | −2.77676738e−21 |
| C42 | −2.02106332e−20 | −1.68705709e−18 | −2.72529513e−20 |
| C44 | −2.47262722e−19 | 1.4815978e−16 | 8.55807158e−20 |
| C46 | −2.18867888e−24 | −1.98347379e−24 | −9.52054888e−26 |
| C48 | −5.58835437e−24 | 2.67202796e−23 | 6.51265722e−25 |
| C50 | −1.32824471e−22 | −6.16516709e−22 | 3.20028199e−23 |
| C52 | −7.55905184e−22 | −5.2956271e−20 | 1.76590223e−22 |
| C54 | −1.38795101e−21 | 1.22196395e−18 | −5.1899596e−21 |
| C55 | −1.95572414e−27 | 9.54335495e−28 | 7.11250833e−29 |
| C57 | −1.54116067e−27 | 5.51567556e−27 | 8.95991852e−28 |
| C59 | −1.10763545e−25 | 4.96695555e−25 | 1.69284305e−27 |
| C61 | −5.90773942e−25 | −2.72829594e−23 | −1.5115867e−25 |
| C63 | −1.98933904e−24 | −4.01265763e−23 | 2.1243805e−24 |
| C65 | 1.26252468e−24 | −4.02328436e−20 | 2.08401169e−23 |
| C67 | 1.81326459e−29 | 5.67543261e−30 | 2.714e−32 |
| C69 | −5.52644338e−29 | −3.72360985e−28 | −1.38037069e−30 |
| C71 | −6.23281305e−29 | 2.22465939e−26 | −5.8554786e−29 |
| C73 | 1.81738193e−27 | −3.90182078e−25 | −6.6606928e−27 |
| C75 | 2.14916057e−26 | 3.31383345e−23 | −1.15631076e−26 |
| C77 | 2.45531374e−26 | −1.08852997e−21 | 1.19941073e−25 |
| C78 | 5.61446965e−33 | −1.62996535e−33 | −6.54978682e−35 |
| C80 | −3.14271637e−33 | −2.13205986e−32 | −3.84844227e−33 |
| C82 | 3.91267533e−32 | −4.18395599e−30 | −1.88731708e−32 |
| C84 | 5.72404322e−31 | 2.50482179e−28 | 4.0887544e−30 |
| C86 | 2.04498774e−29 | −6.91099846e−27 | 3.03868316e−29 |
| C88 | 1.54960845e−28 | 6.02044471e−25 | −1.88015638e−28 |
| C90 | 5.17527548e−30 | −1.0374045e−23 | −3.16125863e−27 |
| C92 | −6.42753428e−35 | −9.97525491e−36 | 1.2646031e−37 |
| C94 | 1.52301705e−35 | 1.82950393e−33 | 2.23965486e−35 |
| C96 | −1.47788252e−34 | −8.72657446e−32 | −6.71336498e−34 |
| C98 | 1.50892249e−34 | 1.35409691e−31 | −1.04126049e−32 |
| C100 | 3.98962853e−32 | −4.13438548e−29 | 2.263743e−31 |
| C102 | 3.01155182e−31 | 3.44434789e−27 | 1.40136966e−30 |
| C104 | −1.89515076e−31 | −3.63109737e−26 | 2.19047602e−29 |

TABLE 3c for FIG. 17

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | 4728.40302400 | 5562.69877100 | −60685.41438000 |
| C7 | 3.61924163e−08 | −2.6704986e−08 | 3.18396583e−08 |
| C9 | −9.09400287e−09 | 4.92069061e−08 | −5.61785678e−08 |
| C10 | 1.66121272e−10 | 2.85945157e−10 | 2.00099393e−11 |
| C12 | 3.14017712e−11 | 1.7543017e−10 | −1.96165665e−11 |
| C14 | 2.4941173e−11 | 1.9667076e−11 | −1.06060991e−10 |
| C16 | 2.31506575e−14 | −5.96445065e−14 | −7.74363249e−14 |
| C18 | 1.76964023e−13 | −8.28471598e−14 | −3.1260441e−13 |
| C20 | 1.63396775e−14 | 5.89862775e−14 | −2.21560889e−13 |
| C21 | −7.28717776e−17 | −4.02951969e−16 | −3.69444556e−17 |
| C23 | −3.75579206e−17 | 3.45033757e−16 | −9.78225945e−16 |
| C25 | 4.59399079e−16 | 1.24492889e−17 | −1.70892112e−16 |

TABLE 3c-continued for FIG. 17

| Coefficient | M3 | M2 | M1 |
|---|---|---|---|
| C27 | −1.18304491e−16 | −2.78756077e−16 | −4.32330918e−16 |
| C29 | −7.50643063e−19 | −3.0805972e−18 | −6.64795481e−20 |
| C31 | −9.33852618e−20 | 1.94354444e−18 | 9.2062443e−19 |
| C33 | 1.86784143e−18 | 1.72349432e−18 | −4.0341719e−19 |
| C35 | 2.66729478e−19 | 9.34868812e−19 | 7.75268883e−19 |
| C36 | 4.01258937e−22 | −2.33334008e−21 | 1.28461574e−19 |
| C38 | −8.23187379e−22 | −1.92684343e−20 | 1.99616288e−19 |
| C40 | 1.49421902e−21 | 2.31550048e−21 | 5.47670117e−20 |
| C42 | 4.72750154e−21 | −1.86112917e−21 | 1.95018351e−20 |
| C44 | −2.61134724e−21 | 9.05455405e−21 | 3.19738342e−21 |
| C46 | −8.1476518e−24 | 1.04531901e−22 | −3.14500232e−22 |
| C48 | −4.67926054e−24 | −3.07010776e−23 | 3.55621884e−22 |
| C50 | 9.96367582e−24 | 4.05168914e−23 | 1.15857141e−21 |
| C52 | −5.63570004e−24 | −4.25589231e−23 | 1.50292097e−22 |
| C54 | −1.96315571e−23 | 2.69155178e−24 | −4.22027773e−23 |
| C55 | −6.32105216e−26 | 2.36074182e−25 | −2.0609926e−23 |
| C57 | −5.5869514e−26 | 7.49827714e−25 | −2.67127439e−23 |
| C59 | −6.03481823e−27 | 1.27721888e−25 | −4.72519756e−24 |
| C61 | 5.72251835e−26 | 3.75574802e−25 | 2.43544621e−24 |
| C63 | −4.81078871e−26 | 1.38096394e−25 | −3.61474814e−25 |
| C65 | −5.293619e−28 | −1.47197601e−25 | −2.58312448e−25 |
| C67 | −1.05665619e−28 | 5.70444448e−29 | 1.04981547e−26 |
| C69 | −9.35967107e−29 | 1.54864005e−27 | −5.00353406e−26 |
| C71 | −7.45163445e−29 | 8.49518579e−28 | −9.69578012e−26 |
| C73 | 3.23937637e−29 | 1.17862243e−27 | −5.21036133e−26 |
| C75 | 1.23502373e−28 | 1.42504572e−27 | −5.29641094e−27 |
| C77 | 1.99884473e−28 | −9.05697691e−29 | −4.96757793e−29 |
| C78 | 4.62768807e−31 | −3.66791362e−30 | 1.17108755e−28 |
| C80 | 2.01004484e−31 | −1.33376517e−29 | 1.96800952e−27 |
| C82 | −2.04780369e−31 | −9.59453599e−30 | 4.90123394e−28 |
| C84 | −1.83439038e−31 | −6.383457e−30 | −7.65331985e−28 |
| C86 | 2.22521716e−31 | −1.45702307e−30 | −3.04755827e−28 |
| C88 | 1.4576265e−30 | −1.04939729e−30 | −1.27821433e−29 |
| C90 | 4.89653954e−31 | 1.6223442e−30 | 2.60372926e−30 |
| C92 | 1.291584e−33 | −4.48909307e−32 | 4.05041524e−30 |
| C94 | 1.68046406e−34 | −6.48100172e−32 | 8.44993426e−30 |
| C96 | 8.98812615e−34 | −8.87297065e−32 | 1.19335237e−31 |
| C98 | 1.44926189e−33 | −3.33931372e−32 | −1.58514417e−30 |
| C100 | 1.61667889e−33 | −1.1191494e−32 | −4.87213504e−31 |
| C102 | 2.9240278e−33 | −1.34011075e−32 | −6.07148296e−33 |
| C104 | 4.46022792e−34 | 2.24305766e−33 | 5.01077783e−33 |

TABLE 4a for FIG. 17

| Surface | DCX | DCY | DCZ |
|---|---|---|---|
| Image | 0.00000000 | 0.00000000 | 0.00000000 |
| M9 | 0.00000000 | 0.00000000 | 713.83346098 |
| M8 | 0.00000000 | −199.50194718 | 110.47777299 |
| M7 | 0.00000000 | 128.62607427 | 1098.64247245 |
| M6 | 0.00000000 | 515.91461114 | 1356.40753743 |
| M5 | 0.00000000 | 742.37411066 | 1363.84229101 |
| M4 | 0.00000000 | 1340.69974378 | 969.49103752 |
| M3 | 0.00000000 | 507.31215558 | 1051.71634870 |
| Stop | 0.00000000 | 308.06159909 | 1147.17260780 |
| M2 | 0.00000000 | −176.78443109 | 1379.45094669 |
| M1 | 0.00000000 | −469.61783006 | 1834.00281766 |
| Object | 0.00000000 | −525.34409896 | 2142.75119785 |

TABLE 4b for FIG. 17

| Surface | TLA [deg] | TLB [deg] | TLC [deg] |
|---|---|---|---|
| Image | −0.00000000 | 0.00000000 | −0.00000000 |
| M9 | −9.14833640 | 0.00000000 | −0.00000000 |
| M8 | 161.66708308 | −0.00000000 | −0.00000000 |

TABLE 4b-continued for FIG. 17

| Surface | TLA [deg] | TLB [deg] | TLC [deg] |
|---|---|---|---|
| M7 | 52.63856031 | −0.00000000 | −0.00000000 |
| M6 | 17.76332452 | 0.00000000 | −0.00000000 |
| M5 | −15.75408205 | 0.00000000 | −0.00000000 |
| M4 | 250.48833875 | 0.00000000 | −0.00000000 |
| M3 | 164.38361154 | −0.00000000 | 0.00000000 |
| Stop | 64.83614755 | −0.00000000 | 180.00000000 |
| M2 | 138.59631791 | −0.00000000 | −0.00000000 |
| M1 | 111.51091807 | −0.00000000 | 0.00000000 |
| Object | 15.48957967 | −0.00000000 | 180.00000000 |

TABLE 5 for FIG. 17

| Surface | Angle of incidence [deg] | Reflectivity |
|---|---|---|
| M9 | 9.10898391 | 0.65665659 |
| M8 | 0.15757055 | 0.66566547 |
| M7 | 70.82640064 | 0.72236638 |
| M6 | 74.51795811 | 0.79553776 |
| M5 | 71.88564195 | 0.74519096 |
| M4 | 13.92249363 | 0.64314446 |
| M3 | 80.53767244 | 0.88529643 |
| M2 | 73.90465970 | 0.78455360 |
| M1 | 78.68907114 | 0.86057777 |
| Overall transmission | | 0.0720 |

TABLE 6 for FIG. 17

| X [mm] | Y [mm] | Z [mm] |
|---|---|---|
| 0.00000000 | 33.09539039 | 0.00000000 |
| 27.98016280 | 32.83576102 | 0.00000000 |
| 55.32425435 | 32.05074898 | 0.00000000 |
| 81.40074512 | 30.72264495 | 0.00000000 |
| 105.58948827 | 28.82419673 | 0.00000000 |
| 127.29244915 | 26.32536013 | 0.00000000 |
| 145.94921302 | 23.20382833 | 0.00000000 |
| 161.05688683 | 19.45738748 | 0.00000000 |
| 172.19243862 | 15.11500672 | 0.00000000 |
| 179.03446120 | 10.24419289 | 0.00000000 |
| 181.38115751 | 4.95267331 | 0.00000000 |
| 179.16172567 | −0.61635830 | 0.00000000 |
| 172.43973897 | −6.29280692 | 0.00000000 |
| 161.40839010 | −11.88969195 | 0.00000000 |
| 146.37862928 | −17.21448827 | 0.00000000 |
| 127.76237102 | −22.08081609 | 0.00000000 |
| 106.05334108 | −26.31822001 | 0.00000000 |
| 81.80784000 | −29.77880701 | 0.00000000 |
| 55.62700619 | −32.34167284 | 0.00000000 |
| 28.14162808 | −33.91669706 | 0.00000000 |
| 0.00000000 | −34.44802533 | 0.00000000 |
| −28.14162808 | −33.91669706 | 0.00000000 |
| −55.62700619 | −32.34167284 | 0.00000000 |
| −81.80784000 | −29.77880701 | 0.00000000 |
| −106.05334108 | −26.31822001 | 0.00000000 |
| −127.76237102 | −22.08081609 | 0.00000000 |
| −146.37862928 | −17.21448827 | 0.00000000 |
| −161.40839010 | −11.88969195 | 0.00000000 |
| −172.43973897 | −6.29280692 | 0.00000000 |
| −179.16172567 | −0.61635830 | 0.00000000 |
| −181.38115751 | 4.95267331 | 0.00000000 |
| −179.03446120 | 10.24419289 | 0.00000000 |
| −172.19243862 | 15.11500672 | 0.00000000 |
| −161.05688683 | 19.45738748 | 0.00000000 |
| −145.94921302 | 23.20382833 | 0.00000000 |
| −127.29244915 | 26.32536013 | 0.00000000 |
| −105.58948827 | 28.82419673 | 0.00000000 |
| −81.40074512 | 30.72264495 | 0.00000000 |
| −55.32425435 | 32.05074898 | 0.00000000 |
| −27.98016280 | 32.83576102 | 0.00000000 |

The projection optical unit 27 has an overall transmission of 7.2%.

The projection optical unit 27 has an image-side numerical aperture of 0.50.

A reduction factor in the first imaging light plane xz is 4 ($\beta_x$). A reduction factor in the second imaging light plane xy is 8 ($\beta_y$). An object-side chief ray angle CRA is 5.5°. A maximum pupil obscuration is 15%.

An object-image offset $d_{OIS}$ of the projection optical unit 27 is approximately 530 mm. The mirrors of the projection optical unit 27 can be housed in a cuboid with the xyz-edge lengths of 753 mm×1869 mm×1860 mm.

In the projection optical unit 27, the object plane 5 is tilted relative to the image plane 9 by 15.5% about an axis that is parallel to the x-axis.

A working distance between the mirror M8 closest to the wafer and the image plane 9 is 83 mm. A mean wavefront aberration rms is 10.4 mλ.

Figure 21:
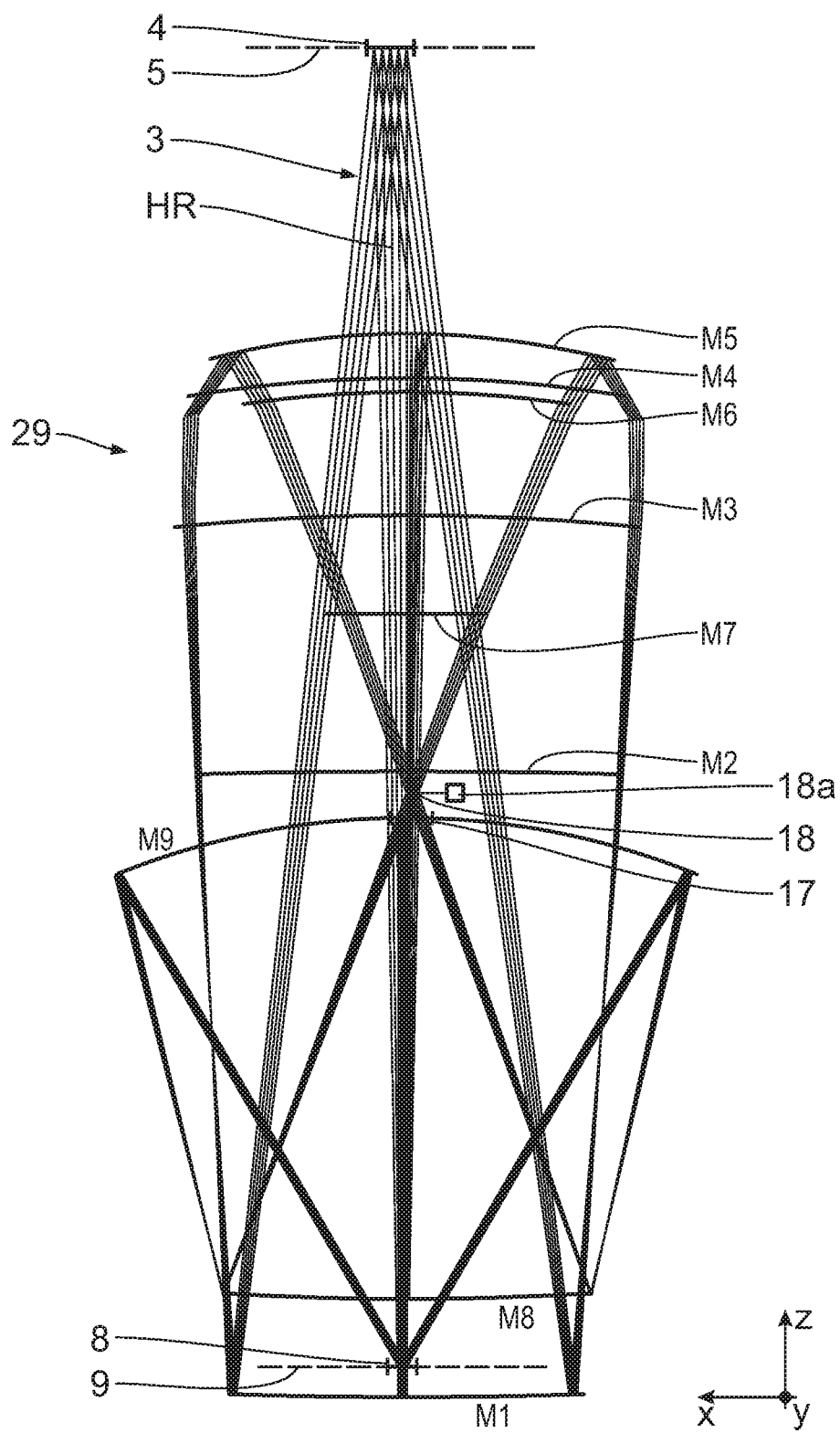
Figure 22:
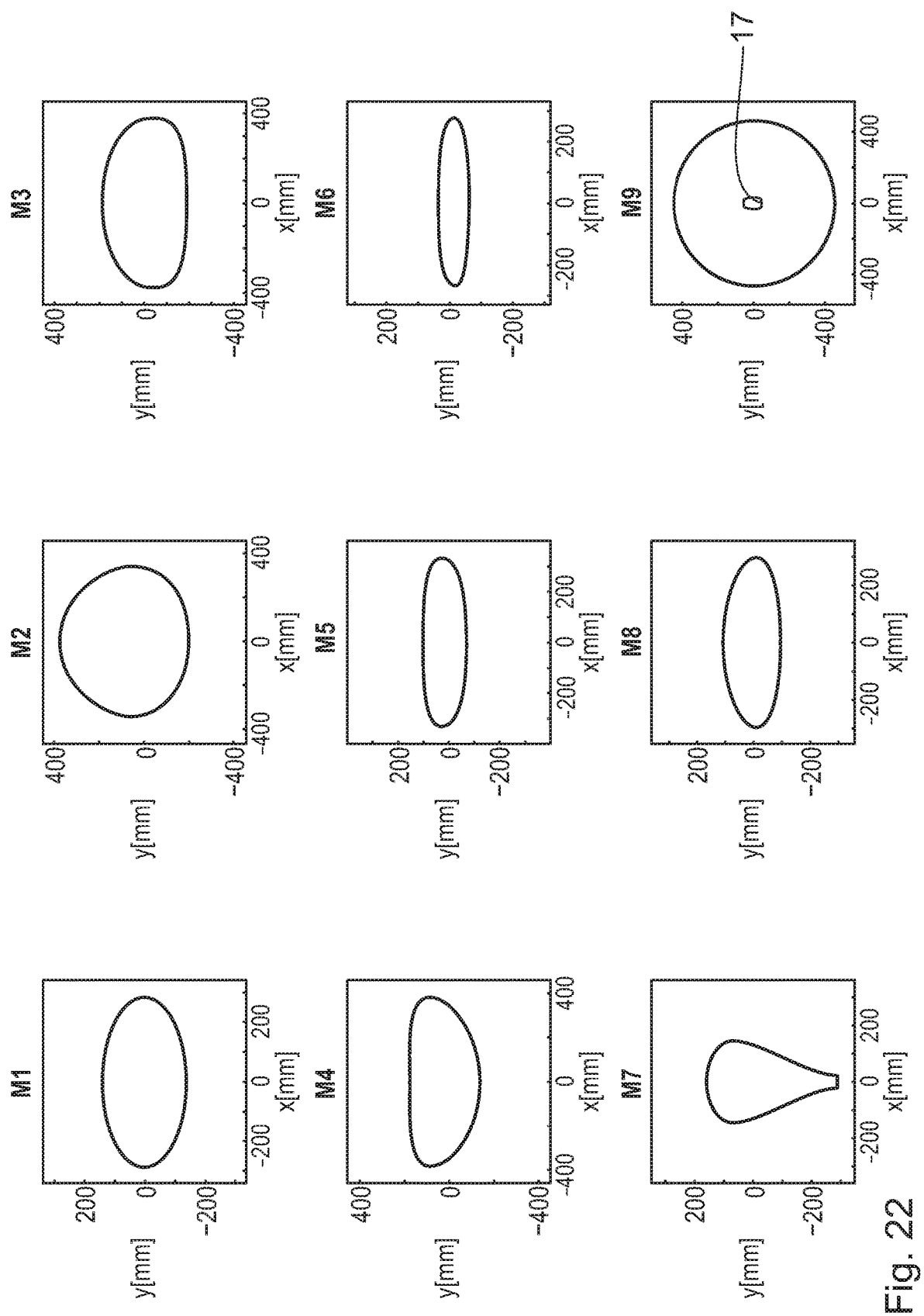

A further embodiment of a projection optical unit 29, which can be used in the projection exposure apparatus 1 according to FIG. 1 instead of the projection optical unit 7, is explained in the following text on the basis of FIGS. 20 to 22. Components and functions which were already explained above in the context of FIGS. 1 to 19 are denoted, where applicable, by the same reference signs and are not discussed again in detail.

Figure 20:
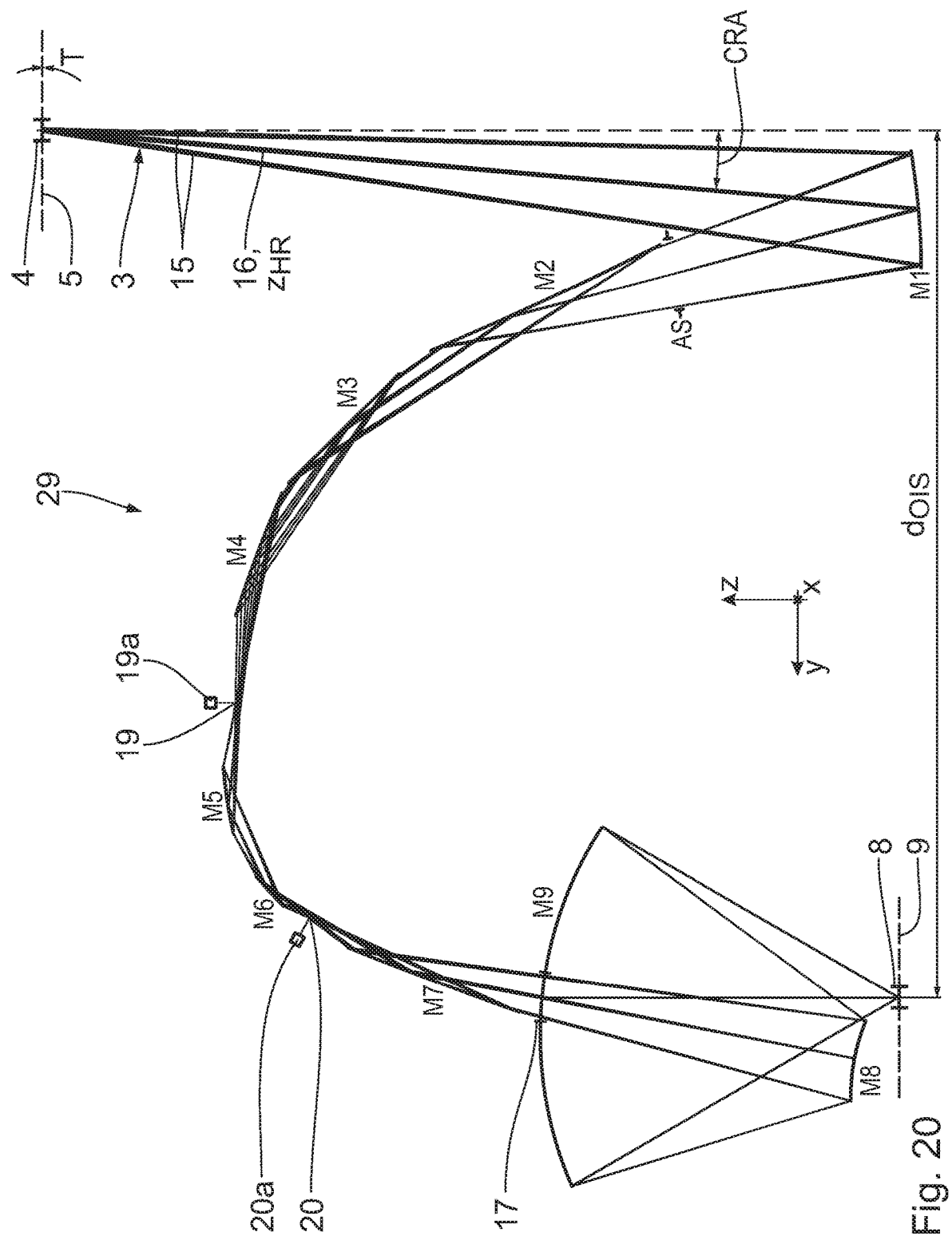

FIG. 20 shows a meridional section of the projection optical unit 29. FIG. 21 shows a sagittal view of the projection optical unit 29. FIG. 22 shows, once again, the boundary contours of the reflection surfaces of the mirrors M1 to M9 of the projection optical unit 29.

The projection optical unit 29 has 3 NI mirrors, namely the mirrors M1, M8 and M9. The projection optical unit 29 has 6 GI mirrors, namely the mirrors M2 to M7.

The mirrors M2 to M7 all have the same direction in terms of the mirror deflection effect. In this respect, the projection optical unit 29 is similar to the projection optical unit 26 according to FIGS. 14 to 16.

The mirrors M1 to M9 are once again embodied as free-form surface mirrors, for which the free-form surface equation (1), specified above, applies.

The following table once again shows the mirror parameters of mirrors M1 to M9 of the projection optical unit 29.

|  | M1 | M2 | M3 | M4 | M5 | M6 | M7 | M8 | M9 |
|---|---|---|---|---|---|---|---|---|---|
| Maximum angle of incidence [°] | 12.1 | 84.2 | 80.6 | 79.1 | 75.8 | 78.8 | 85.3 | 17.9 | 10.4 |
| Extent of the reflection surface in the x-direction [mm] | 567.4 | 681.0 | 749.5 | 752.9 | 644.5 | 538.0 | 281.4 | 589.1 | 929.8 |
| Extent of the reflection surface in the y-direction [mm] | 280.0 | 584.6 | 369.2 | 312.1 | 169.0 | 98.4 | 450.0 | 200.5 | 889.4 |
| Maximum mirror diameter [mm] | 567.6 | 681.3 | 750.7 | 752.7 | 644.5 | 538.1 | 452.3 | 589.1 | 930.3 |

Apart from the mirror M7, none of the mirrors of the projection optical unit 29 have a y/x-aspect ratio that is greater than 1. The y/x-aspect ratio of the mirror M7 is approximately 1.6.

The last mirror M9 in the imaging beam path has the largest maximum diameter, measuring 930.3 mm. The maximum diameters of all other mirrors M1 to M8 are less than 800 mm. Four of the nine mirrors M1 to M9 have a maximum diameter that is less than 600 mm.

Once again, the projection optical unit 29 has exactly one first plane intermediate image 18 in the region of the passage opening 17 in the mirror M9 and two second plane intermediate images 19, 20. The first of the two second plane intermediate images 19 lies between the GI mirrors M4 and M5 in the imaging light beam path. The second of the two second plane intermediate images 20 lies between the two GI mirrors M6 and M7 in the imaging light beam path.

The optical design data from the projection optical unit 29 can be gathered from the following tables, which, in terms of their design, correspond to the tables for the projection optical unit 7 according to FIG. 2.

TABLE 1 for FIG. 20

| Exemplary embodiment | FIG. 20 |
|---|---|
| NA | 0.5 |
| Wavelength | 13.5 nm |
| beta_x | −4.0 |
| beta_y | −8.0 |
| Field dimension_x | 26.0 mm |
| Field dimension_y | 1.2 mm |
| Field curvature | 0.0 1/mm |
| rms | 11.4 ml |
| Stop | AS |

TABLE 2 for FIG. 20

| Surface | Radius_x [mm] | Power_x [1/mm] | Radius_y [mm] | Power_y [1/mm] | Operating mode |
|---|---|---|---|---|---|
| M9 | −1221.3204850 | 0.0016299 | −934.3318163 | 0.0021506 | REFL |
| M8 | −4215.6636573 | 0.0004744 | 484.8221637 | −0.0041252 | REFL |
| M7 | −3514.6574105 | 0.0000960 | −8774.5487881 | 0.0013514 | REFL |
| M6 | −1322.0337936 | 0.0004485 | −1544.1607213 | 0.0043686 | REFL |
| M5 | −1225.5513700 | 0.0004448 | −1165.4051512 | 0.0062957 | REFL |
| M4 | −2025.8551251 | 0.0002369 | −3191.5729569 | 0.0026117 | REFL |
| M3 | −2688.6482003 | 0.0001407 | 26540.8770199 | −0.0003984 | REFL |
| M2 | −5902.4437402 | 0.0000558 | 6888.6468544 | −0.0017631 | REFL |
| M1 | −8202.7105009 | 0.0002401 | −1786.9980352 | 0.0011365 | REFL |

TABLE 3a for FIG. 20

| Coefficient | M9 | M8 | M7 |
|---|---|---|---|
| KY | 0.00000000 | 0.00000000 | 0.00000000 |
| KX | 0.00000000 | 0.00000000 | 0.00000000 |
| RX | −1221.32048500 | −4215.66365700 | −3514.65741100 |
| C7 | 6.48621457e−09 | −2.70181739e−07 | 8.70215332e−08 |
| C9 | 2.51048646e−09 | −2.09527218e−08 | 1.0113038e−07 |
| C10 | 1.11165132e−11 | 1.39330486e−10 | 1.53416608e−10 |
| C12 | −2.91336189e−11 | 2.28376849e−10 | −3.98919589e−10 |
| C14 | −3.29969657e−12 | −7.78019798e−10 | −1.19879074e−10 |
| C16 | −3.30962098e−14 | −3.14365711e−13 | 6.78606735e−13 |
| C18 | −5.74881439e−15 | −1.38334025e−12 | 2.50172985e−13 |
| C20 | 1.80725216e−16 | −1.91669172e−12 | 1.37309377e−13 |
| C21 | −1.51549926e−17 | 3.1057383e−17 | −1.60011616e−15 |
| C23 | −2.05973575e−17 | 4.30103776e−16 | 1.40263065e−15 |
| C25 | −4.20086457e−17 | 6.9930155e−16 | −8.79758937e−16 |
| C27 | −2.12400508e−18 | −4.03780946e−14 | −1.20104305e−16 |
| C29 | 1.46401176e−20 | 3.26975136e−19 | −1.42943118e−17 |
| C31 | −3.24776004e−20 | −1.36352471e−18 | 4.18802461e−18 |
| C33 | −1.58227638e−20 | −1.65158046e−17 | 2.50288724e−18 |
| C35 | 4.55306998e−22 | 4.30975727e−17 | 2.83728882e−19 |
| C36 | 4.37750241e−25 | 3.33999042e−22 | 8.85677189e−21 |
| C38 | −6.15751054e−23 | 7.72867676e−21 | −7.76607264e−20 |
| C40 | −7.41239376e−23 | 6.55036238e−20 | 5.92531624e−21 |
| C42 | −4.2219319e−23 | 1.92030538e−19 | −5.82582739e−21 |
| C44 | 4.71729051e−24 | −1.1750837e−18 | −4.39302422e−22 |
| C46 | −3.00005887e−26 | −3.07649844e−24 | 9.31126292e−23 |
| C48 | −5.02441216e−26 | −6.78983324e−23 | −3.53569596e−22 |
| C50 | −5.54469897e−26 | −2.02571647e−22 | 8.15194828e−24 |
| C52 | −5.86302543e−27 | 2.66454688e−21 | 3.01898725e−24 |
| C54 | 1.18379859e−26 | 1.2454532e−20 | −1.19322371e−24 |
| C55 | −1.46294994e−29 | −6.51798397e−28 | −2.12225804e−25 |
| C57 | −3.92398918e−29 | −9.21288857e−27 | −4.70156385e−25 |
| C59 | −1.07024742e−28 | −1.55766648e−26 | −2.8868744e−24 |
| C61 | −1.03272515e−28 | −1.62790893e−24 | −4.10931912e−25 |
| C63 | −2.52905737e−29 | −1.66410272e−23 | −3.27456225e−26 |
| C65 | 6.01515241e−30 | 1.15374037e−23 | 5.46227836e−27 |
| C67 | −6.77138154e−33 | 6.29495646e−30 | −3.98723172e−27 |
| C69 | −3.36895071e−32 | 2.74167033e−28 | −1.31637748e−26 |

TABLE 3a-continued for FIG. 20

| Coefficient | M9 | M8 | M7 |
|---|---|---|---|
| C71 | −5.91932375e−32 | 3.25317607e−27 | −1.64283121e−26 |
| C73 | −5.65496784e−32 | 9.06080301e−27 | −1.13987301e−27 |
| C75 | −4.22550137e−33 | −5.47076775e−26 | 2.26180236e−28 |
| C77 | 1.86347639e−33 | −2.69737159e−25 | −2.47129491e−30 |
| C78 | −5.69521668e−36 | 9.676187e−34 | −2.32708681e−33 |
| C80 | −1.44414441e−36 | −1.96827508e−32 | −2.4890295e−29 |
| C82 | −1.99322435e−34 | −1.56292087e−30 | −4.63833458e−29 |
| C84 | −2.96282143e−34 | −1.35084229e−29 | −3.19539678e−29 |
| C86 | −8.59003806e−35 | −1.65029179e−29 | 2.64292864e−30 |
| C88 | 2.78969129e−35 | 2.719885e−28 | −3.38078195e−31 |
| C90 | 2.7443014e−35 | 5.38264343e−28 | −8.02912406e−33 |
| C92 | 2.63716255e−38 | 0 | 0 |
| C94 | −1.41483782e−38 | 0 | 0 |
| C96 | −5.25192176e−38 | 0 | 0 |
| C98 | −2.20234859e−37 | 0 | 0 |
| C100 | −4.82347119e−38 | 0 | 0 |
| C102 | 1.86723295e−37 | 0 | 0 |
| C104 | 8.8737411e−38 | 0 | 0 |
| C105 | −4.36464732e−42 | 0 | 0 |
| C107 | −1.21008936e−40 | 0 | 0 |
| C109 | −3.65476049e−41 | 0 | 0 |
| C111 | −6.15824076e−41 | 0 | 0 |
| C113 | −7.64763975e−41 | 0 | 0 |
| C115 | −3.96878813e−41 | 0 | 0 |
| C117 | 7.7510377e−41 | 0 | 0 |
| C119 | 5.35056123e−41 | 0 | 0 |

TABLE 3b for FIG. 20

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −1322.03379400 | −1225.55137000 | −2025.85512500 |
| C7 | 4.27950112e−08 | −5.84703546e−08 | −8.97366121e−08 |
| C9 | 4.17284284e−07 | −9.39099159e−07 | −8.97651368e−08 |
| C10 | −1.7358341e−12 | −2.04679461e−11 | −3.35542823e−11 |
| C12 | −4.21877305e−10 | 5.37555035e−10 | −6.64926214e−11 |

TABLE 3b-continued for FIG. 20

| Coefficient | M6 | M5 | M4 |
|---|---|---|---|
| C14 | −3.15656821e−09 | −2.68438704e−09 | −1.78345381e−11 |
| C16 | −1.08839994e−13 | −6.61750395e−13 | 3.15319489e−14 |
| C18 | 4.01366751e−12 | 1.44422461e−12 | −7.98256204e−15 |
| C20 | 1.30233138e−11 | −1.03660478e−11 | −1.25346627e−13 |
| C21 | −1.07645526e−17 | 1.82221706e−17 | 4.02332593e−17 |
| C23 | −2.11833236e−15 | −2.48580207e−15 | 4.75597672e−17 |
| C25 | −9.67123493e−15 | 1.30554838e−14 | −2.10674203e−16 |
| C27 | −1.33144249e−13 | 2.09485848e−14 | 1.99899839e−16 |
| C29 | 1.88196584e−18 | 4.56414396e−19 | 8.74600426e−20 |
| C31 | 9.71980395e−18 | −3.44014518e−18 | −8.86388592e−19 |
| C33 | 1.82639944e−16 | 8.1516558e−17 | 1.23472448e−19 |
| C35 | 1.5126297e−15 | 2.78986798e−16 | 1.09548579e−19 |
| C36 | −4.625507e−22 | 2.18674967e−22 | 1.21593626e−22 |
| C38 | −2.76640535e−21 | 5.38282737e−21 | −1.20532003e−21 |
| C40 | 6.93994125e−20 | −2.09335725e−20 | 1.49330284e−21 |
| C42 | 6.12829851e−19 | −3.19701569e−19 | 5.02053714e−21 |
| C44 | 9.01881312e−19 | 2.42814691e−18 | −4.27170182e−21 |
| C46 | −1.38069564e−23 | −1.2039556e−24 | −1.15189186e−24 |
| C48 | −2.58649381e−22 | 7.77124773e−24 | 3.16705352e−24 |
| C50 | −2.90784805e−21 | −3.59675767e−22 | 4.0653015e−24 |
| C52 | −5.42006595e−20 | −3.5170037e−21 | −1.91026596e−23 |
| C54 | −2.29979118e−19 | −1.07320159e−20 | 9.44350026e−24 |
| C55 | 4.3212238e−27 | −6.42267011e−28 | −6.34734328e−28 |
| C57 | 1.22210193e−25 | −4.99247996e−27 | 3.71231003e−27 |
| C59 | −1.30493616e−24 | −1.21918885e−25 | 1.0081319e−27 |
| C61 | −6.14045583e−23 | 2.30701112e−24 | −4.23834329e−26 |
| C63 | −2.46817892e−22 | −4.92852048e−23 | −7.42880115e−26 |
| C65 | 5.49135377e−21 | −9.47901007e−23 | 3.62157818e−26 |
| C67 | 7.03790422e−29 | 5.43910058e−30 | 3.15461775e−30 |
| C69 | 2.97708262e−27 | 8.70163166e−30 | −5.37401656e−30 |
| C71 | 1.01856775e−25 | 1.02008574e−27 | −1.05505788e−29 |
| C73 | 2.19711129e−24 | 1.35856777e−26 | 1.68378824e−29 |
| C75 | 1.26099993e−23 | −2.42376141e−25 | 1.4961554e−28 |
| C77 | −7.11644827e−23 | 7.74230426e−25 | −1.92517608e−28 |
| C78 | −1.25601496e−32 | 8.04588789e−34 | 1.07210323e−33 |
| C80 | −1.08697771e−30 | 1.08540263e−32 | −4.28340028e−33 |
| C82 | −3.07198117e−29 | 6.63449584e−31 | 1.41427412e−33 |
| C84 | −8.12369626e−28 | −3.04722399e−30 | 1.04543684e−31 |
| C86 | −1.50045253e−26 | 7.92742778e−29 | 6.73484186e−31 |
| C88 | −6.8056223e−26 | −5.58379196e−28 | 1.28702955e−30 |
| C90 | 3.36436769e−25 | 6.19385096e−27 | 3.17119137e−31 |

TABLE 3c for FIG. 20

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | −2688.64820000 | −5902.44374000 | −8202.71050100 |
| C7 | −5.4242055e−09 | 8.83048352e−08 | 6.2978424e−09 |
| C9 | −1.34994231e−07 | 6.69061957e−08 | −2.81576029e−08 |
| C10 | −4.50309645e−11 | −9.75267665e−11 | 2.48161861e−11 |
| C12 | −9.28536251e−12 | −4.70618898e−11 | 2.99096443e−12 |
| C14 | 8.67137628e−12 | 5.02797113e−11 | −5.9279665e−11 |
| C16 | 1.06056197e−13 | −3.32025035e−13 | −4.50793228e−14 |
| C18 | 4.2812029e−14 | −1.4148906e−13 | 4.96691078e−14 |
| C20 | −8.67184017e−14 | −2.05141367e−14 | −1.048468e−13 |
| C21 | −1.1873352e−16 | 3.58039305e−17 | 2.89600708e−17 |
| C23 | −2.77948857e−16 | −3.09393609e−16 | 1.28726971e−16 |
| C25 | −6.49893216e−17 | −3.62342671e−16 | 5.07326679e−16 |
| C27 | 6.02898901e−17 | −1.8762241e−16 | −4.00525976e−16 |
| C29 | −1.57467526e−20 | 6.13077125e−19 | 6.09790017e−20 |
| C31 | −3.54755545e−19 | −2.24632097e−19 | 3.76370302e−19 |
| C33 | 1.16755371e−19 | −7.61264438e−19 | 1.10116263e−19 |
| C35 | −1.70088294e−19 | −4.44194779e−19 | −2.63499738e−18 |
| C36 | −7.01576249e−23 | 1.88463965e−22 | −4.5509124e−23 |
| C38 | 1.0799985e−21 | 3.89264895e−22 | −4.42107849e−22 |
| C40 | −1.82739825e−21 | 2.09684763e−23 | −3.53826268e−22 |
| C42 | −4.2205569e−21 | −1.20838494e−21 | −8.47370257e−22 |
| C44 | −3.93429468e−22 | −8.84141926e−22 | −5.43189415e−21 |

TABLE 3c-continued for FIG. 20

| Coefficient | M3 | M2 | M1 |
|---|---|---|---|
| C46 | −4.18972217e−25 | −1.84113508e−25 | −4.34461019e−25 |
| C48 | 3.46458657e−24 | 3.40575576e−24 | −7.24968778e−24 |
| C50 | 5.62145231e−24 | 5.45106155e−24 | −2.09880353e−23 |
| C52 | 9.15011889e−24 | 9.21654467e−24 | 1.16157164e−23 |
| C54 | 4.19488997e−24 | −1.59119253e−24 | 4.16022167e−23 |
| C55 | 4.72464228e−28 | −1.39930124e−27 | 7.24355278e−30 |
| C57 | −4.91680241e−27 | 1.56494908e−27 | −4.09367164e−28 |
| C59 | 5.25537606e−27 | 1.26075995e−26 | −2.48389699e−26 |
| C61 | 3.29546805e−26 | 1.44671246e−26 | −7.79737962e−26 |
| C63 | 4.56591637e−26 | 8.83632165e−27 | 2.60595725e−25 |
| C65 | 4.78091055e−26 | −1.98660532e−27 | 4.34169209e−25 |
| C67 | 2.17612083e−30 | −8.37804268e−31 | 1.59224842e−30 |
| C69 | −8.5439834e−30 | 6.28752374e−31 | 4.76515206e−29 |
| C71 | −2.65983135e−29 | 2.4285503e−30 | 3.30166016e−28 |
| C73 | −5.98513653e−29 | 1.42242261e−29 | 7.65304059e−28 |
| C75 | −7.69832277e−29 | 1.55423735e−29 | 2.64998122e−28 |
| C77 | −1.11232906e−28 | −9.76791313e−31 | −4.26662374e−28 |
| C78 | −4.63832043e−34 | 3.39359504e−33 | 5.21447544e−34 |
| C80 | 5.20269628e−33 | 9.14348231e−34 | 1.00883236e−32 |
| C82 | −1.31600486e−32 | −1.12272624e−32 | 2.25573959e−31 |
| C84 | −1.5855366e−31 | −1.22099672e−32 | 1.698327e−30 |
| C86 | −4.77316653e−31 | 5.53234051e−33 | 2.80871381e−30 |
| C88 | −9.19684751e−31 | 9.25716556e−33 | −3.34205539e−30 |
| C90 | −5.58433631e−31 | 4.34744206e−34 | −8.11996042e−30 |

TABLE 4a for FIG. 20

| Surface | DCX | DCY | DCZ |
|---|---|---|---|
| Image | 0.00000000 | 0.00000000 | 0.00000000 |
| M9 | 0.00000000 | 0.00000000 | 874.92613231 |
| M8 | 0.00000000 | 149.96653386 | 108.05779848 |
| M7 | 0.00000000 | −63.62123637 | 1200.25946018 |
| M6 | 0.00000000 | −271.52684626 | 1553.41894167 |
| M5 | −0.00000000 | −470.91963555 | 1646.49107699 |
| M4 | −0.00000000 | −1082.43401319 | 1575.57656013 |
| M3 | −0.00000000 | −1402.07740902 | 1356.86559672 |
| M2 | −0.00000000 | −1675.34361170 | 948.86652584 |
| Stop | −0.00000000 | −1780.47276911 | 552.55974886 |
| M1 | −0.00000000 | −1939.88081432 | −48.36287033 |
| Object | −0.00000000 | −2133.49017642 | 2102.38048006 |

TABLE 4b for FIG. 20

| Surface | TLA[deg] | TLB[deg] | TLC[deg] |
|---|---|---|---|
| Image | −0.00000000 | 0.00000000 | −0.00000000 |
| M9 | 5.53247750 | 0.00000000 | −0.00000000 |
| M8 | 191.06495501 | −0.00000000 | −0.00000000 |
| M7 | −69.22482399 | 0.00000000 | 0.00000000 |
| M6 | −42.26836342 | 0.00000000 | 0.00000000 |
| M5 | −9.20367069 | 0.00000000 | 0.00000000 |
| M4 | 20.49802677 | 0.00000000 | −0.00000000 |
| M3 | 45.28410877 | 0.00000000 | 0.00000000 |
| M2 | 65.66507482 | −0.00000000 | 0.00000000 |
| Stop | 170.67859831 | −0.00000000 | 0.00000000 |
| M1 | 175.14354488 | 0.00000000 | 0.00000000 |
| Object | 0.15719400 | −0.00000000 | 180.00000000 |

TABLE 5 for FIG. 20

| Surface | Angle of incidence[deg] | Reflectivity |
|---|---|---|
| M9 | 5.53247750 | 0.66251340 |
| M8 | 0.00000000 | 0.66565840 |
| M7 | 80.28977900 | 0.88208835 |
| M6 | 72.75376044 | 0.76274834 |
| M5 | 74.18154684 | 0.78956505 |
| M4 | 76.11675570 | 0.82230133 |
| M3 | 79.09716229 | 0.86620474 |
| M2 | 80.52187166 | 0.88509282 |
| M1 | 10.00034173 | 0.65468031 |
| Overall transmission | | 0.0967 |

TABLE 6 for FIG. 20

| X[mm] | Y[mm] | Z[mm] |
|---|---|---|
| −0.00000000 | 75.15520054 | 0.00000000 |
| −47.96870740 | 74.37166721 | 0.00000000 |
| −94.83418130 | 72.01003446 | 0.00000000 |
| −139.51000833 | 68.04638564 | 0.00000000 |
| −180.94300303 | 62.46695638 | 0.00000000 |
| −218.12954032 | 55.29603719 | 0.00000000 |
| −250.13349992 | 46.62001118 | 0.00000000 |
| −276.10831313 | 36.59891053 | 0.00000000 |
| −295.32537634 | 25.46381611 | 0.00000000 |
| −307.20933498 | 13.50153273 | 0.00000000 |
| −311.37631602 | 1.03396852 | 0.00000000 |
| −307.66695882 | −11.59968020 | 0.00000000 |
| −296.16560163 | −24.05538106 | 0.00000000 |
| −277.19991698 | −35.99362549 | 0.00000000 |
| −251.32062868 | −47.08956739 | 0.00000000 |
| −219.26580101 | −57.04356306 | 0.00000000 |
| −181.91736137 | −65.58890956 | 0.00000000 |
| −140.25750388 | −72.49589183 | 0.00000000 |
| −95.33052822 | −77.57496890 | 0.00000000 |
| −48.21392686 | −80.68258848 | 0.00000000 |
| −0.00000000 | −81.72869195 | 0.00000000 |
| 48.21392686 | −80.68258848 | 0.00000000 |
| 95.33052822 | −77.57496890 | 0.00000000 |

TABLE 6-continued for FIG. 20

| X[mm] | Y[mm] | Z[mm] |
|---|---|---|
| 140.25750388 | −72.49589183 | 0.00000000 |
| 181.91736137 | −65.58890956 | 0.00000000 |
| 219.26580101 | −57.04356306 | 0.00000000 |
| 251.32062868 | −47.08956739 | 0.00000000 |
| 277.19991698 | −35.99362549 | 0.00000000 |
| 296.16560163 | −24.05538106 | 0.00000000 |
| 307.66695882 | −11.59968020 | 0.00000000 |
| 311.37631602 | 1.03396852 | 0.00000000 |
| 307.20933498 | 13.50153273 | 0.00000000 |
| 295.32537634 | 25.46381611 | 0.00000000 |
| 276.10831313 | 36.59891053 | 0.00000000 |
| 250.13349992 | 46.62001118 | 0.00000000 |
| 218.12954032 | 55.29607159 | 0.00000000 |
| 180.94300303 | 62.46695638 | 0.00000000 |
| 139.51000833 | 68.04638564 | 0.00000000 |
| 94.83418130 | 72.01003446 | 0.00000000 |
| 47.96870740 | 74.37166721 | 0.00000000 |

The projection optical unit 29 has an overall transmission of 9.67%.

An image-side numerical aperture of the projection optical unit 29 is 0.50. The reduction factor $\beta_x$ in the first imaging light plane xz is 4. The reduction factor $\beta_y$ in the second imaging light plane yz is 8. Here too, the different number of intermediate images in the two imaging light planes leads to a correction of the image flip on account of the odd number of mirrors.

An object-side chief ray angle CRA is 5.0°. A maximum obscuration of the entry pupil is 12%. An object-image offset $d_{OIS}$ is approximately 2150 mm. The mirrors of the projection optical unit 29 can be housed in a cuboid with xyz-edge lengths of 930 mm×2542 mm×1713 mm.

The object plane 5 is tilted relative to the image plane 9 about the x-axis by an angle T of 0.2°.

A working distance between the mirror M8 closest to the wafer and the image plane 9 is 80 mm. A mean wavefront aberration rms is 11.4 mλ.

The aperture stop AS is arranged in the imaging light beam path between the mirrors M1 and M2 in the projection optical unit 29. The imaging light beam is completely accessible in the region of the aperture stop AS.

Figure 24:
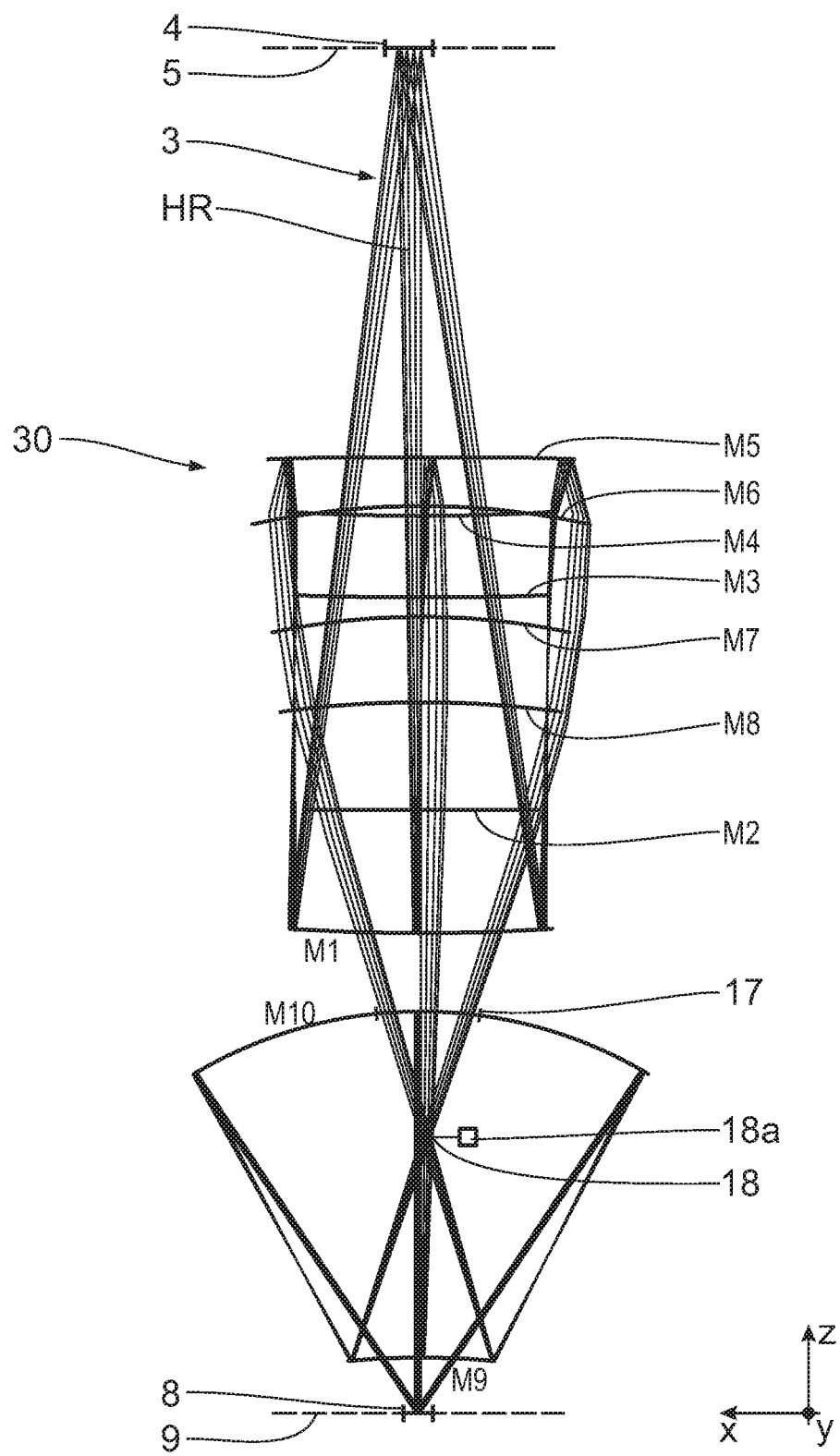
Figure 25:
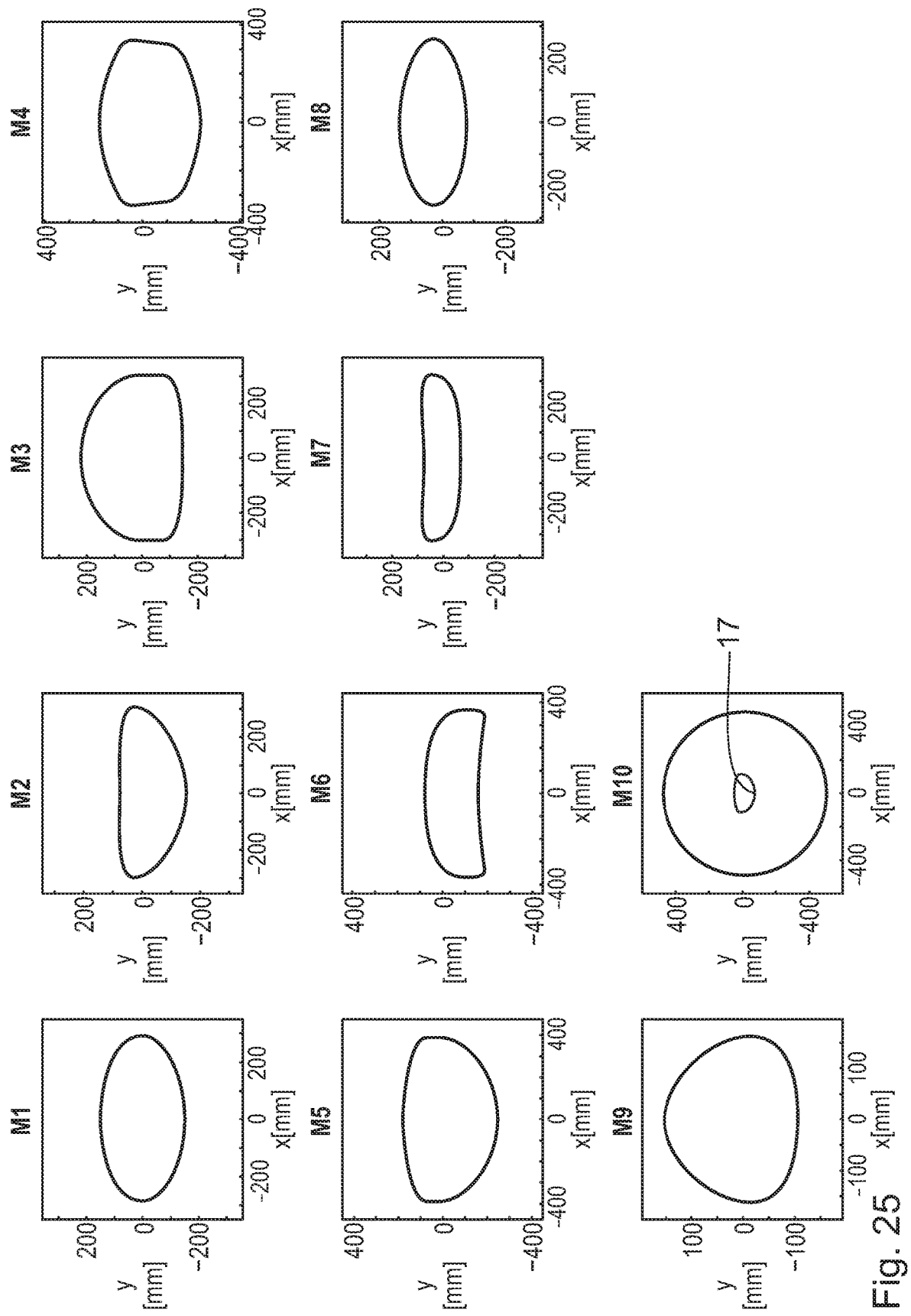

A further embodiment of a projection optical unit 30, which can be used in the projection exposure apparatus 1 according to FIG. 1 instead of the projection optical unit 7, is explained in the following text on the basis of FIGS. 23 to 25. Components and functions which were already explained above in the context of FIGS. 1 to 22 are denoted, where applicable, by the same reference signs and are not discussed again in detail.

Figure 23:
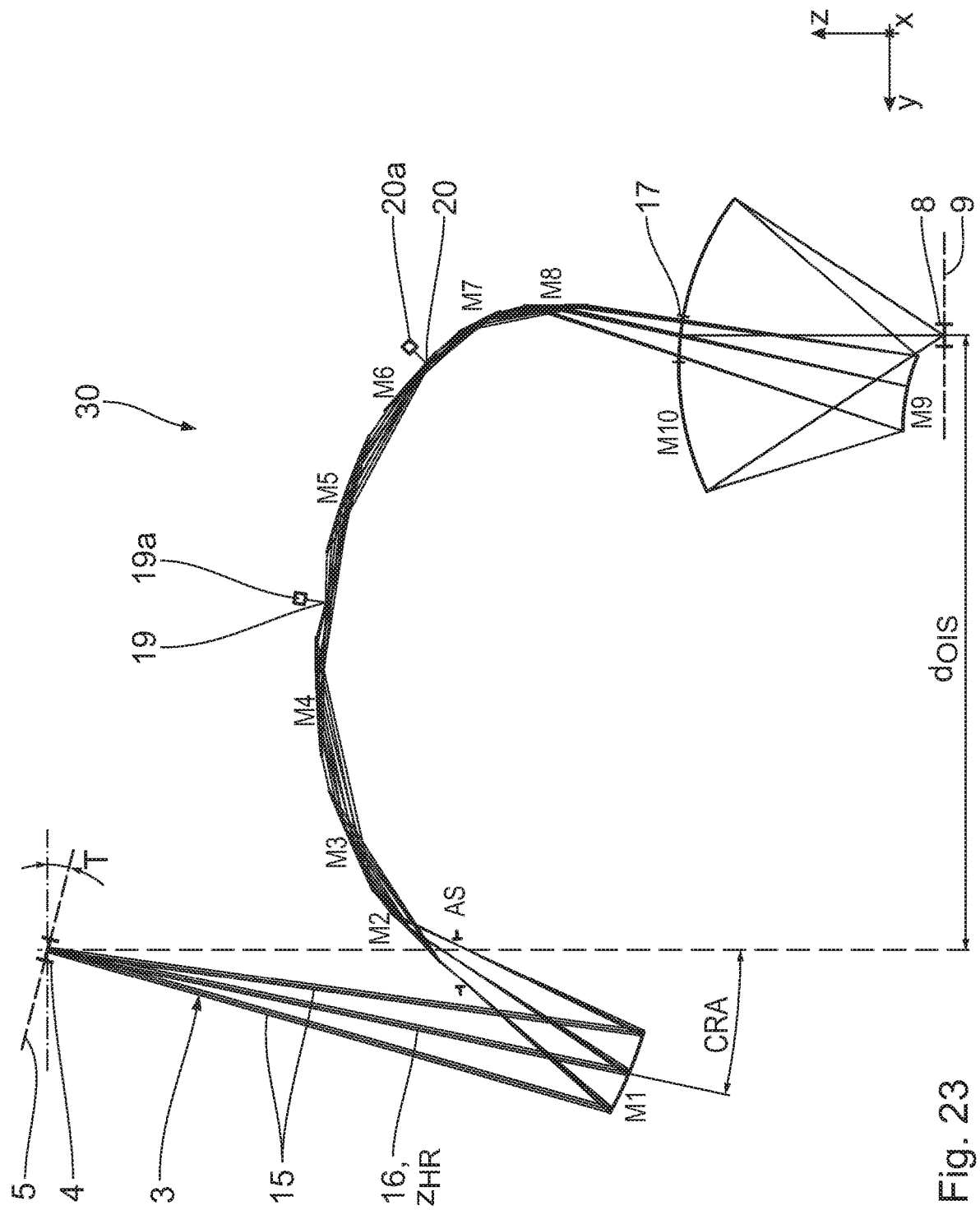

FIG. 23 shows a meridional section of the projection optical unit 30. FIG. 24 shows a sagittal view of the projection optical unit 30. FIG. 25 shows, once again, the boundary contours of the reflection surfaces of the ten mirrors M1 to M10 of the projection optical unit 30.

The projection optical unit 30 has three NI mirrors, namely the mirrors M1, M9 and M10. The projection optical unit 30 has seven GI mirrors, namely the mirrors M2 to M8.

The mirrors M2 to M8 all have the same direction in terms of the mirror deflection effect. In this respect, the projection optical unit 30 is similar to the projection optical units 26 according to FIGS. 14 to 16 and 29 according to FIGS. 20 to 22.

The mirrors M1 to M10 are once again embodied as free-form surface mirrors, for which the free-form surface equation (1), specified above, applies.

The following tables once again show the mirror parameters of mirrors M1 to M10 of the projection optical unit 30.

| | M1 | M2 | M3 | M4 | M5 |
|---|---|---|---|---|---|
| Maximum angle of incidence [°] | 13.1 | 83.4 | 80.9 | 83.0 | 81.1 |
| Extent of the reflection surface in the x-direction [mm] | 585.6 | 573.4 | 596.4 | 684.0 | 746.7 |
| Extent of the reflection surface in the y-direction [mm] | 298.5 | 234.7 | 366.9 | 417.9 | 419.8 |
| Maximum mirror diameter [mm] | 585.6 | 573.5 | 603.1 | 689.3 | 748.8 |

| | M6 | M7 | M8 | M9 | M10 |
|---|---|---|---|---|---|
| Maximum angle of incidence [°] | 83.5 | 80.6 | 80.9 | 24.0 | 8.2 |
| Extent of the reflection surface in the x-direction [mm] | 731.5 | 643.0 | 524.9 | 323.8 | 1008.4 |
| Extent of the reflection surface in the y-direction [mm] | 262.5 | 153.0 | 213.1 | 258.0 | 996.9 |
| Maximum mirror diameter [mm] | 733.0 | 643.0 | 525.0 | 324.0 | 1008.9 |

All mirrors M1 to M10 of the projection optical unit 30 have a y/x-aspect ratio that is less than 1.

The last mirror M10 in the imaging beam path has the largest maximum diameter, measuring 1008.9 mm. The maximum diameters of all other mirrors M1 to M9 are less than 750 mm. Seven of the ten mirrors have a maximum diameter that is less than 700 mm. Four of the ten mirrors have a maximum diameter that is less than 600 mm.

Once again, the projection optical unit 30 has exactly one first plane intermediate image 18 in the region of the passage opening 17 in the mirror M10 and two second plane intermediate images 19, 20. A distance between the first plane intermediate image 18 and the passage opening 17 is less than a third of the distance between the last mirror M10 and the image field 8.

In the projection optical unit 30, the first of the two second plane intermediate images 19 lies in the region of a reflection of the imaging light 3 at the GI mirror M4. The second of the two second plane intermediate images 20 lies in the imaging light beam path in the region of the reflection at the GI mirror M6.

The optical design data from the projection optical unit 30 can be gathered from the following tables, which, in terms of their design, correspond to the tables for the projection optical unit 7 according to FIG. 2.

TABLE 1 for FIG. 23

| Exemplary embodiment | FIG. 23 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.0 mm |
| Field curvature | −0.012345 1/mm |
| rms | 10.4 ml |
| Stop | AS |

TABLE 2 for FIG. 23

| Surface | Radius_x[mm] | Power_x[1/mm] | Radius_y[mm] | Power_y[1/mm] | Operating mode |
|---|---|---|---|---|---|
| M10 | −975.5487706 | 0.0020377 | −962.5583837 | 0.0020905 | REFL |
| M9 | 1786.9869429 | −0.0011192 | 611.2039578 | −0.0032722 | REFL |
| M8 | −2095.9442088 | 0.0002189 | 3875.9706125 | −0.0022490 | REFL |
| M7 | −1045.4690941 | 0.0004223 | −10312.0596231 | 0.0008787 | REFL |
| M6 | −1215.3805004 | 0.0002681 | −38549.7142600 | 0.0003185 | REFL |
| M5 | −1644.5074901 | 0.0002579 | −2517.0332413 | 0.0037473 | REFL |
| M4 | −214162.6635241 | 0.0000017 | −3370.4881649 | 0.0032692 | REFL |
| M3 | 4047.7543473 | −0.0000871 | −7308.5674280 | 0.0015528 | REFL |
| M2 | 5005.1733746 | −0.0000808 | 1156.6671379 | −0.0085532 | REFL |
| M1 | −3798.9753152 | 0.0005177 | −1377.9111045 | 0.0014761 | REFL |

TABLE 3a for FIG. 23

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −975.54877060 | 1786.98694300 | −2095.94420900 |
| C7 | −5.95804097e−09 | −8.03929648e−07 | 8.3011434e−08 |
| C9 | 1.52364857e−08 | 7.43589206e−07 | 4.7181499e−07 |
| C10 | 9.28099e−13 | 2.37499492e−10 | −2.02775452e−11 |
| C12 | −2.03295286e−11 | 1.68623915e−09 | 9.33342076e−10 |
| C14 | −3.41805e−12 | 1.15900623e−09 | 1.88007174e−09 |
| C16 | −1.42799093e−14 | −2.01463554e−12 | 6.11396757e−13 |
| C18 | 4.97214041e−15 | 2.06895474e−13 | 4.85149273e−12 |
| C20 | 1.32525577e−14 | 2.94709467e−12 | 8.94508956e−12 |
| C21 | 1.49502256e−18 | 2.85556664e−16 | −7.74114074e−17 |
| C23 | −3.1935411e−17 | 9.04365887e−15 | 4.65092634e−15 |
| C25 | −3.31420566e−17 | 1.05454924e−14 | 3.08749913e−14 |
| C27 | −5.86281511e−18 | 7.34133351e−15 | 5.17090551e−14 |
| C29 | −1.26997904e−20 | 5.76866938e−18 | 9.30619914e−19 |
| C31 | −7.76177662e−21 | −1.79812907e−17 | 4.34796101e−17 |
| C33 | 1.50829309e−20 | 8.14507407e−18 | 2.19762816e−17 |
| C35 | 1.22801974e−20 | 2.27167577e−17 | 2.99980346e−16 |
| C36 | 2.1467814e−24 | 7.6583843e−20 | −1.11004135e−21 |
| C38 | −4.69712554e−23 | 6.25650447e−20 | 4.461594e−20 |
| C40 | −7.77443045e−23 | 3.54035566e−20 | 4.26992684e−19 |
| C42 | −4.52759935e−23 | 2.60958385e−20 | 1.54031954e−18 |
| C44 | −4.5075988e−24 | −1.97889894e−19 | 1.4763913e−18 |
| C46 | −1.2818549e−26 | −2.24761699e−22 | 5.00232186e−23 |
| C48 | −1.56907351e−26 | −9.99234563e−23 | 3.46718952e−22 |
| C50 | 7.63880336e−27 | 3.04672894e−22 | 2.81615015e−21 |
| C52 | 2.62423865e−26 | 1.12872852e−21 | 7.73566576e−21 |
| C54 | 1.3223325e−26 | −1.39660252e−21 | 7.25601264e−21 |
| C55 | −4.91404028e−31 | −1.7749894e−24 | 7.28168609e−27 |
| C57 | −5.49015313e−29 | −4.18918707e−25 | −2.27362519e−25 |
| C59 | −1.19636029e−28 | 2.37980171e−24 | 1.10460061e−24 |
| C61 | −1.21575333e−28 | 1.30384498e−24 | 7.85664558e−24 |
| C63 | −4.81080894e−29 | 3.8847099e−24 | 3.09055201e−23 |
| C65 | −1.11934428e−29 | 6.79231048e−24 | 6.70387564e−23 |
| C67 | −3.35019698e−32 | −2.38620726e−28 | −2.44599566e−28 |
| C69 | −5.67292204e−32 | −1.19770461e−27 | 1.34268575e−27 |
| C71 | −6.03548629e−32 | −8.03882829e−27 | 1.73920457e−26 |
| C73 | 6.30996158e−33 | −1.53983174e−26 | 1.45057385e−25 |
| C75 | 5.19267709e−32 | −6.20914706e−26 | 4.77275337e−25 |
| C77 | 1.23924124e−32 | 4.47651624e−26 | 6.11524253e−25 |
| C78 | −2.3725453e−36 | 2.34547492e−29 | 4.49789027e−32 |
| C80 | −8.83337074e−35 | 1.30801418e−30 | 5.00787029e−30 |
| C82 | −3.20486752e−34 | −5.45618829e−29 | 6.24961973e−29 |
| C84 | −4.31424577e−34 | −1.19872753e−28 | 6.80689304e−28 |
| C86 | −2.83533832e−34 | −1.66096044e−29 | 3.1258368e−27 |
| C88 | −8.20994418e−35 | −2.02826868e−28 | 6.05199729e−27 |
| C90 | −1.16789084e−35 | −6.83570559e−29 | 2.9852638e−27 |
| C92 | −2.843655e−38 | 1.53289092e−32 | 1.35088954e−33 |
| C94 | 3.36094687e−38 | −1.7850554e−32 | 4.90992003e−32 |
| C96 | 1.49968333e−37 | 4.20515949e−32 | 9.22306786e−31 |
| C98 | 1.69899738e−37 | 1.4826376e−31 | 6.47768699e−30 |
| C100 | 8.80150382e−38 | 4.50266357e−31 | 2.24773669e−29 |
| C102 | −7.03462778e−38 | 1.46581483e−30 | 3.28786082e−29 |
| C104 | −2.97045845e−38 | −3.94310002e−31 | 5.81148918e−30 |
| C105 | −4.76141065e−42 | −1.41949569e−34 | −1.69050404e−37 |

TABLE 3a-continued for FIG. 23

| Coefficient | M10 | M9 | M8 |
|---|---|---|---|
| C107 | 1.6878978e−40 | 4.95411568e−35 | 6.59328032e−37 |
| C109 | 2.60807696e−40 | 9.52116258e−34 | 3.43622241e−34 |
| C111 | 3.44175669e−40 | 2.38482471e−33 | 3.4960256e−33 |
| C113 | 3.99153873e−40 | 2.88133837e−33 | 1.87453448e−32 |
| C115 | 1.03370812e−40 | 7.70741325e−34 | 5.38181997e−32 |
| C117 | −1.35912164e−40 | 5.14237082e−33 | 6.45183346e−32 |
| C119 | −2.83877758e−41 | 1.15789492e−34 | 5.47296591e−34 |
| C121 | −5.9855365e−44 | 0 | 0 |
| C123 | −3.58371657e−43 | 0 | 0 |
| C125 | −6.74451435e−43 | 0 | 0 |
| C127 | −5.68244733e−43 | 0 | 0 |
| C129 | −8.7411743e−44 | 0 | 0 |
| C131 | 2.72373418e−43 | 0 | 0 |
| C133 | 3.47596581e−43 | 0 | 0 |
| C135 | 1.15763536e−43 | 0 | 0 |
| C136 | 7.3034626e−48 | 0 | 0 |
| C138 | −4.12182647e−46 | 0 | 0 |
| C140 | −1.49526036e−45 | 0 | 0 |
| C142 | −3.2358839e−45 | 0 | 0 |
| C144 | −4.18920423e−45 | 0 | 0 |
| C146 | −3.39263213e−45 | 0 | 0 |
| C148 | −1.33209474e−45 | 0 | 0 |
| C150 | −1.863829e−47 | 0 | 0 |
| C152 | 6.14799467e−47 | 0 | 0 |

TABLE 3b for FIG. 23

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −1045.46909400 | −1215.38050000 | −1644.50749000 |
| C7 | 9.5792129e−08 | 9.85907747e−08 | 1.54027134e−07 |
| C9 | 6.62613291e−08 | −2.44290281e−08 | −9.05741401e−09 |
| C10 | −7.40502097e−11 | −4.12531064e−11 | −3.18252976e−11 |
| C12 | 4.08948603e−10 | −2.13920421e−10 | 1.69205919e−10 |
| C14 | −9.87692725e−10 | 9.31726672e−11 | −1.13306483e−12 |
| C16 | 2.14106934e−13 | 6.28352563e−14 | −2.24154389e−13 |
| C18 | 3.43955471e−13 | 4.40526697e−13 | 1.46427009e−15 |
| C20 | 1.97092267e−12 | −5.12351393e−13 | −5.17690392e−15 |
| C21 | −2.27675195e−16 | 1.18505694e−16 | 2.22667245e−16 |
| C23 | 2.42352609e−16 | −4.14773002e−16 | 1.79837464e−17 |
| C25 | 8.58109566e−15 | −1.56476746e−15 | 1.13489728e−16 |
| C27 | −2.25847919e−14 | 1.80874528e−15 | 2.01629864e−16 |
| C29 | −9.27614962e−19 | −3.8444837e−19 | −6.10856847e−19 |
| C31 | 7.90475103e−19 | 6.61811399e−19 | −4.27607556e−19 |
| C33 | −8.76130063e−18 | 6.63551226e−18 | −3.51912523e−19 |
| C35 | −1.35523796e−18 | −1.18525201e−17 | −6.95837547e−19 |
| C36 | 1.98141766e−22 | 2.92380598e−22 | −4.45944546e−22 |
| C38 | 3.654101e−21 | 1.43515228e−21 | 4.39560373e−22 |
| C40 | 3.03300085e−21 | −7.04841407e−21 | 1.80506109e−21 |
| C42 | 3.96315687e−19 | −2.20895897e−20 | 3.79556064e−21 |
| C44 | −7.54291762e−19 | 4.26828311e−20 | 6.39845413e−21 |
| C46 | 1.35299802e−23 | 8.61301054e−24 | 2.48638664e−24 |
| C48 | 1.7517203e−24 | −5.90539907e−25 | −2.7786426e−24 |
| C50 | 3.03043526e−22 | 1.90322534e−23 | −1.2995714e−23 |
| C52 | 4.48492838e−22 | 1.34714972e−22 | −3.17115678e−23 |
| C54 | 2.61364128e−21 | −2.00099998e−22 | −2.27789546e−23 |
| C55 | 2.62872082e−27 | −3.52236706e−27 | 4.46219179e−28 |
| C57 | −8.29018857e−26 | −7.37835617e−27 | 3.23080215e−27 |
| C59 | −9.87595964e−26 | 2.59399915e−28 | 5.88214824e−27 |
| C61 | −1.33683359e−24 | −1.20217809e−25 | 2.37543587e−26 |
| C63 | 2.38226885e−24 | −5.62138903e−25 | −1.29437348e−26 |
| C65 | 1.12061078e−23 | 1.57580136e−24 | −5.84130015e−26 |
| C67 | −8.62369094e−29 | −3.44232588e−29 | −1.30394282e−30 |
| C69 | 1.0856691e−28 | 6.66914299e−29 | 5.00509797e−30 |
| C71 | −2.00936961e−27 | 1.43708604e−28 | 3.39871859e−29 |
| C73 | −9.21543403e−27 | 3.23430874e−28 | 2.92457247e−28 |
| C75 | −8.74991463e−26 | 3.06388254e−28 | 6.08263151e−28 |
| C77 | −7.71033623e−25 | −1.17311277e−26 | 3.80152335e−28 |
| C78 | −6.23778722e−33 | 1.26615681e−32 | −4.13882349e−33 |

TABLE 3b-continued for FIG. 23

| Coefficient | M7 | M6 | M5 |
|---|---|---|---|
| C80 | 6.21014273e−31 | 3.5254233e−33 | −1.46703005e−32 |
| C82 | 8.95894887e−31 | −2.19232643e−31 | 1.85054171e−32 |
| C84 | −2.18641836e−31 | −1.17554177e−30 | −1.84470244e−32 |
| C86 | 1.3695322e−29 | 5.18933781e−30 | −9.47400187e−32 |
| C88 | 1.75395859e−27 | −9.16361654e−30 | 4.88248476e−31 |
| C90 | −1.43209341e−26 | 7.8544656e−29 | 1.17574141e−30 |
| C92 | 2.05090173e−34 | 3.9960171e−35 | −1.08187025e−35 |
| C94 | −7.60088632e−34 | −1.09957929e−34 | −1.18791897e−35 |
| C96 | 1.00872099e−32 | 4.54994406e−34 | −3.05105106e−34 |
| C98 | 2.26804397e−31 | 4.51060461e−33 | −2.50549956e−33 |
| C100 | 2.46369136e−30 | −4.31519977e−32 | −7.93503412e−33 |
| C102 | 1.13090407e−29 | 1.35113735e−31 | −1.22506006e−32 |
| C104 | 1.44593604e−29 | −3.99172166e−31 | −9.13299628e−33 |
| C105 | −4.19017572e−38 | −1.38399499e−38 | 1.89493701e−38 |
| C107 | −1.50992299e−36 | −1.40332039e−38 | 2.1432617e−38 |
| C109 | −4.25127052e−36 | 3.01861848e−37 | 1.09876139e−38 |
| C111 | 1.05208601e−34 | −6.8370801e−37 | 1.2616574e−36 |
| C113 | 1.76414667e−33 | −6.60279764e−36 | 7.4946947e−36 |
| C115 | 3.99316502e−33 | 9.13127758e−35 | 1.86018645e−35 |
| C117 | 1.48508087e−32 | −3.68280235e−34 | 2.26682249e−35 |
| C119 | 7.17664912e−31 | 8.31069559e−34 | 1.34001465e−35 |

TABLE 3c for FIG. 23

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | −214162.66350000 | 4047.75434700 | 5005.17337500 |
| C7 | 2.98068193e−07 | −3.40159923e−08 | 1.53289528e−07 |
| C9 | 5.61609225e−08 | −1.0109082e−07 | −1.19599907e−06 |
| C10 | −2.31126138e−10 | −1.13587051e−10 | −1.71565532e−10 |
| C12 | −9.68157642e−12 | −1.96351094e−12 | −9.69554638e−11 |
| C14 | 1.78309191e−11 | −2.07056507e−10 | 2.52024483e−09 |
| C16 | −1.43916345e−13 | −1.39220002e−13 | −3.34685833e−13 |
| C18 | −1.38913507e−13 | −6.9799513e−14 | 2.79609875e−12 |
| C20 | −4.27413144e−14 | −5.7781008e−13 | −3.54664231e−14 |
| C21 | −4.76669999e−16 | −2.33642412e−16 | 5.21059427e−16 |
| C23 | 4.42788651e−16 | −7.61513304e−17 | 1.96357314e−15 |
| C25 | 3.27344931e−17 | −6.04184022e−16 | −6.04569672e−16 |
| C27 | −6.38302953e−17 | −1.53772654e−15 | −5.41292875e−14 |
| C29 | −1.40930006e−18 | 1.96589441e−19 | −2.38101659e−18 |
| C31 | 3.79697584e−19 | −6.83863216e−19 | −1.51800562e−17 |
| C33 | 3.33127907e−19 | −2.23362525e−18 | −8.74528208e−17 |
| C35 | −1.65970278e−20 | −5.24001813e−18 | 4.78342984e−16 |
| C36 | 2.46259394e−21 | −7.31967756e−22 | −1.77577302e−21 |
| C38 | −9.63192307e−22 | 6.52093992e−22 | 4.99470817e−21 |
| C40 | −4.6441045e−22 | −2.83339637e−21 | 5.13512935e−20 |
| C42 | 6.32863913e−22 | −1.31280497e−20 | 8.91850061e−19 |
| C44 | 5.74325671e−22 | −2.16776697e−20 | −3.00994968e−18 |
| C46 | 6.35531003e−24 | 3.38804527e−24 | −5.59164118e−24 |
| C48 | −5.57913557e−25 | −3.20270766e−24 | −8.48881414e−24 |
| C50 | −1.7256835e−24 | −1.3538911e−23 | 2.8296468e−22 |
| C52 | −3.33754858e−24 | −6.04654145e−23 | −6.46376294e−21 |
| C54 | 3.48516782e−25 | −7.28443369e−23 | 1.32941809e−20 |
| C55 | −5.23980471e−27 | −3.85287855e−27 | −4.04572356e−27 |
| C57 | −4.69201423e−27 | 1.14702936e−26 | −4.39721795e−27 |
| C59 | −3.05001052e−27 | 1.13591604e−26 | −1.44344469e−26 |
| C61 | 8.5077925e−28 | −2.82985611e−26 | −5.73252344e−24 |
| C63 | −1.61770546e−26 | −9.78900011e−26 | 2.58611178e−23 |
| C65 | −1.33708124e−26 | −1.27638251e−25 | −1.54141621e−23 |
| C67 | −1.10490492e−29 | −1.44433652e−29 | 1.70927884e−28 |
| C69 | −4.15774494e−30 | 4.27636912e−29 | −8.23476294e−29 |
| C71 | −2.07939058e−29 | 8.82142368e−29 | −2.37746803e−28 |
| C73 | 6.3114047e−29 | 1.79835007e−28 | 5.30603865e−26 |
| C75 | 1.19639508e−28 | −2.14539274e−28 | 6.20757645e−26 |
| C77 | 1.38131207e−29 | −6.24476296e−28 | −2.94223714e−25 |
| C78 | −1.27622264e−33 | 8.64007915e−32 | −4.19387448e−33 |
| C80 | 4.1304249e−32 | −9.26936252e−32 | −3.59838074e−31 |
| C82 | 3.73020917e−32 | 8.32970473e−32 | 4.82922533e−31 |
| C84 | −3.48343186e−32 | 4.58966665e−31 | 1.04705138e−29 |

TABLE 3c-continued for FIG. 23

| Coefficient | M4 | M3 | M2 |
| --- | --- | --- | --- |
| C86 | −1.27316151e−31 | 1.50473043e−31 | −1.405332e−28 |
| C88 | 1.02926202e−31 | −4.84455042e−30 | −1.06018689e−27 |
| C90 | 1.5520292e−31 | −5.08388151e−30 | 2.33228215e−27 |
| C92 | −5.77087985e−36 | −2.3208429e−35 | −4.51778365e−34 |
| C94 | 3.27155345e−35 | −2.05177822e−34 | 5.85507675e−34 |
| C96 | 2.22541179e−34 | −1.4182386e−34 | −5.47410971e−33 |
| C98 | 1.2929922e−34 | −7.3618392e−34 | −2.13598023e−31 |
| C100 | −1.21610939e−33 | −3.56951639e−34 | −1.18107064e−30 |
| C102 | −1.38966172e−33 | −2.11845232e−32 | 3.21534062e−30 |
| C104 | −2.04957978e−34 | −1.52325188e−32 | −7.77916404e−30 |
| C105 | 2.32832807e−38 | −3.20761498e−37 | 5.85487373e−38 |
| C107 | −1.15973567e−37 | 1.32126849e−37 | 1.86190597e−36 |
| C109 | −1.3025795e−37 | −6.18369858e−37 | 2.34340078e−36 |
| C111 | −6.82017694e−37 | −2.75175491e−36 | 9.43098976e−35 |
| C113 | 7.41982901e−37 | −3.00662899e−36 | 1.09550777e−33 |
| C115 | 2.83757994e−36 | 5.08471416e−36 | 5.96651054e−33 |
| C117 | 2.33564828e−36 | −2.86756309e−35 | −1.87181852e−33 |
| C119 | −6.03189805e−37 | −1.32771814e−35 | 1.02742882e−32 |

TABLE 3d for FIG. 23

| Coefficient | M1 |
| --- | --- |
| KY | 0.00000000 |
| KX | 0.00000000 |
| RX | −3798.97531500 |
| C7 | −4.03766338e−09 |
| C9 | 4.3194842e−09 |
| C10 | 6.01080824e−11 |
| C12 | 1.63211364e−11 |
| C14 | −3.27624583e−11 |
| C16 | 3.92017522e−15 |
| C18 | −2.92031813e−14 |
| C20 | 2.05676259e−14 |
| C21 | 3.06304743e−17 |
| C23 | −2.76883852e−17 |
| C25 | −6.03618233e−17 |
| C27 | −1.63598483e−16 |
| C29 | −1.25011464e−19 |
| C31 | 1.42263601e−19 |
| C33 | 2.19802e−19 |
| C35 | −7.16733765e−19 |
| C36 | −2.29879048e−22 |
| C38 | −4.25456289e−23 |
| C40 | 6.77664934e−22 |
| C42 | −5.73097971e−23 |
| C44 | 1.03597287e−20 |
| C46 | 1.49835059e−25 |
| C48 | −4.94722185e−26 |
| C50 | −4.46231936e−24 |
| C52 | 3.41955215e−24 |
| C54 | −9.96533789e−24 |
| C55 | 3.57497059e−28 |
| C57 | −2.65994162e−27 |
| C59 | −3.06521007e−26 |
| C61 | −6.30968074e−26 |
| C63 | −1.0307333e−25 |
| C65 | −3.32819547e−25 |
| C67 | 1.85388921e−30 |
| C69 | −3.53159276e−30 |
| C71 | 3.10470607e−29 |
| C73 | 4.14868733e−29 |
| C75 | −7.66872797e−29 |
| C77 | 8.66901471e−28 |
| C78 | 4.01154289e−33 |
| C80 | 1.8007793e−32 |
| C82 | 2.61587328e−31 |
| C84 | 1.39265589e−30 |
| C86 | 3.42875335e−30 |
| C88 | 4.66556397e−30 |
| C90 | 5.03706516e−30 |

TABLE 3d-continued for FIG. 23

| Coefficient | M1 |
| --- | --- |
| C92 | −1.9480775e−36 |
| C94 | 2.1044583e−35 |
| C96 | 3.40943999e−34 |
| C98 | −1.69349476e−34 |
| C100 | −2.17147474e−34 |
| C102 | −4.10866825e−33 |
| C104 | −2.24081208e−32 |
| C105 | −1.3866307e−38 |
| C107 | 5.17463408e−39 |
| C109 | −8.29771816e−37 |
| C111 | −8.04376424e−36 |
| C113 | −2.81931438e−35 |
| C115 | −6.54260577e−35 |
| C117 | −5.75688991e−35 |
| C119 | 2.42635211e−36 |

TABLE 4a for FIG. 23

| Surface | DCX | DCY | DCZ |
| --- | --- | --- | --- |
| Image | 0.00000000 | 0.00000000 | 0.00000000 |
| M10 | 0.00000000 | 0.00000000 | 887.59443974 |
| M9 | 0.00000000 | 172.59978370 | 121.13732975 |
| M8 | −0.00000000 | −99.24967241 | 1334.28063207 |
| M7 | −0.00000000 | −43.11388355 | 1572.24075699 |
| M6 | −0.00000000 | 112.95031228 | 1761.46566363 |
| M5 | −0.00000000 | 503.77097618 | 2006.77295677 |
| M4 | −0.00000000 | 1183.14523455 | 2114.39526090 |
| M3 | −0.00000000 | 1743.06358961 | 1985.12864378 |
| M2 | −0.00000000 | 2003.97800329 | 1804.40694815 |
| Stop | −0.00000000 | 2113.61386051 | 1637.66603203 |
| M1 | −0.00000000 | 2492.77847092 | 1061.00930582 |
| Object | −0.00000000 | 2076.12855898 | 3021.09698946 |

TABLE 4b for FIG. 23

| Surface | TLA[deg] | TLB[deg] | TLC[deg] |
| --- | --- | --- | --- |
| Image | −0.00000000 | 0.00000000 | −0.00000000 |
| M10 | 6.34541885 | 0.00000000 | −0.00000000 |

TABLE 4b-continued for FIG. 23

| Surface | TLA[deg] | TLB[deg] | TLC[deg] |
|---|---|---|---|
| M9 | 192.66070633 | 0.00000000 | −0.00000000 |
| M8 | 89.67846951 | 0.00000000 | 0.00000000 |
| M7 | 63.60604245 | 0.00000000 | −0.00000000 |
| M6 | 41.30053662 | −0.00000000 | 0.00000000 |
| M5 | 20.55849861 | −0.00000000 | −0.00000000 |
| M4 | −1.99914258 | −0.00000000 | −0.00000000 |
| M3 | −23.85411988 | −0.00000000 | −0.00000000 |
| M2 | −45.69125060 | −0.00000000 | 0.00000000 |
| Stop | −3.79702826 | 180.00000000 | −0.00000000 |
| M1 | 202.66318975 | 0.00000000 | −0.00000000 |
| Object | 17.00057091 | −0.00000000 | 0.00000000 |

TABLE 5 for FIG. 23

| Surface | Angle of incidence[deg] | Reflectivity |
|---|---|---|
| M10 | 6.31397756 | 0.66150254 |
| M9 | 0.06437817 | 0.66566199 |
| M8 | 76.73613039 | 0.83201039 |
| M7 | 77.24808925 | 0.83978524 |
| M6 | 80.62494847 | 0.88641903 |
| M5 | 77.75809141 | 0.84731989 |
| M4 | 79.54253199 | 0.87222913 |
| M3 | 79.84982464 | 0.87631951 |
| M2 | 78.33671121 | 0.85563145 |
| M1 | 10.48014292 | 0.65352413 |
| Overall transmission | | 0.0988 |

TABLE 6 for FIG. 23

| X[mm] | Y[mm] | Z[mm] |
|---|---|---|
| 0.00000000 | 58.63894911 | 0.00000000 |
| 42.42944258 | 58.04084453 | 0.00000000 |
| 83.98447050 | 56.24367346 | 0.00000000 |
| 123.78358698 | 53.24189366 | 0.00000000 |
| 160.93247075 | 49.03816514 | 0.00000000 |
| 194.52480961 | 43.66001421 | 0.00000000 |
| 223.65792956 | 37.17775396 | 0.00000000 |
| 247.46839690 | 29.71554726 | 0.00000000 |
| 265.18506321 | 21.45178837 | 0.00000000 |
| 276.18941267 | 12.61227118 | 0.00000000 |
| 280.07094098 | 3.45771151 | 0.00000000 |
| 276.66743077 | −5.73341781 | 0.00000000 |
| 266.08310291 | −14.68331396 | 0.00000000 |
| 248.68009273 | −23.13096284 | 0.00000000 |
| 225.04389947 | −30.84493482 | 0.00000000 |
| 195.93172761 | −37.63275631 | 0.00000000 |
| 162.21535772 | −43.34567089 | 0.00000000 |
| 124.82654256 | −47.87714206 | 0.00000000 |
| 84.71129442 | −51.15623627 | 0.00000000 |
| 42.80037098 | −53.13928275 | 0.00000000 |
| 0.00000000 | −53.80277791 | 0.00000000 |
| −42.80037098 | −53.13928275 | 0.00000000 |
| −84.71129442 | −51.15623627 | 0.00000000 |
| −124.82654256 | −47.87714206 | 0.00000000 |
| −162.21535772 | −43.34567089 | 0.00000000 |
| −195.93172761 | −37.63275631 | 0.00000000 |
| −225.04389947 | −30.84493482 | 0.00000000 |
| −248.68009273 | −23.13096284 | 0.00000000 |
| −266.08310291 | −14.68331396 | 0.00000000 |
| −276.66743077 | −5.73341781 | 0.00000000 |
| −280.07094098 | 3.45771151 | 0.00000000 |
| −276.18941267 | 12.61227118 | 0.00000000 |
| −265.18506321 | 21.45178837 | 0.00000000 |
| −247.46839690 | 29.71554726 | 0.00000000 |
| −223.65792956 | 37.17775396 | 0.00000000 |

TABLE 6-continued for FIG. 23

| X[mm] | Y[mm] | Z[mm] |
|---|---|---|
| −194.52480961 | 43.66001421 | 0.00000000 |
| −160.93247075 | 49.03816514 | 0.00000000 |
| −123.78358698 | 53.24189366 | 0.00000000 |
| −83.98447050 | 56.24367346 | 0.00000000 |
| −42.42944258 | 58.04084453 | 0.00000000 |

The projection optical unit 30 has an overall transmission of 9.88%.

An image-side numerical aperture of the projection optical unit 30 is 0.55. The reduction factor $\beta_x$ in the first imaging light plane xz is 4. The reduction factor $\beta_y$ in the second imaging light plane yz is 8.

An object-side chief ray angle CRA is 5.0°. A maximum obscuration of the entry pupil is 20%. An object-image offset $d_{OIS}$ is approximately 2080 mm. The mirrors of the projection optical unit 30 can be housed in a cuboid with xyz-edge lengths of 1008 mm×3091 mm×2029 mm.

The object plane 5 is tilted relative to the image plane 9 about the x-axis by an angle T of 17°.

A working distance between the mirror M10 closest to the wafer and the image plane 9 is 87 mm. A mean wavefront aberration rms is 10.60 mλ.

The aperture stop AS is arranged in the imaging light beam path between the mirrors M1 and M2 in the projection optical unit 30. The imaging light beam is completely accessible in the region of the aperture stop AS.

Figure 27:
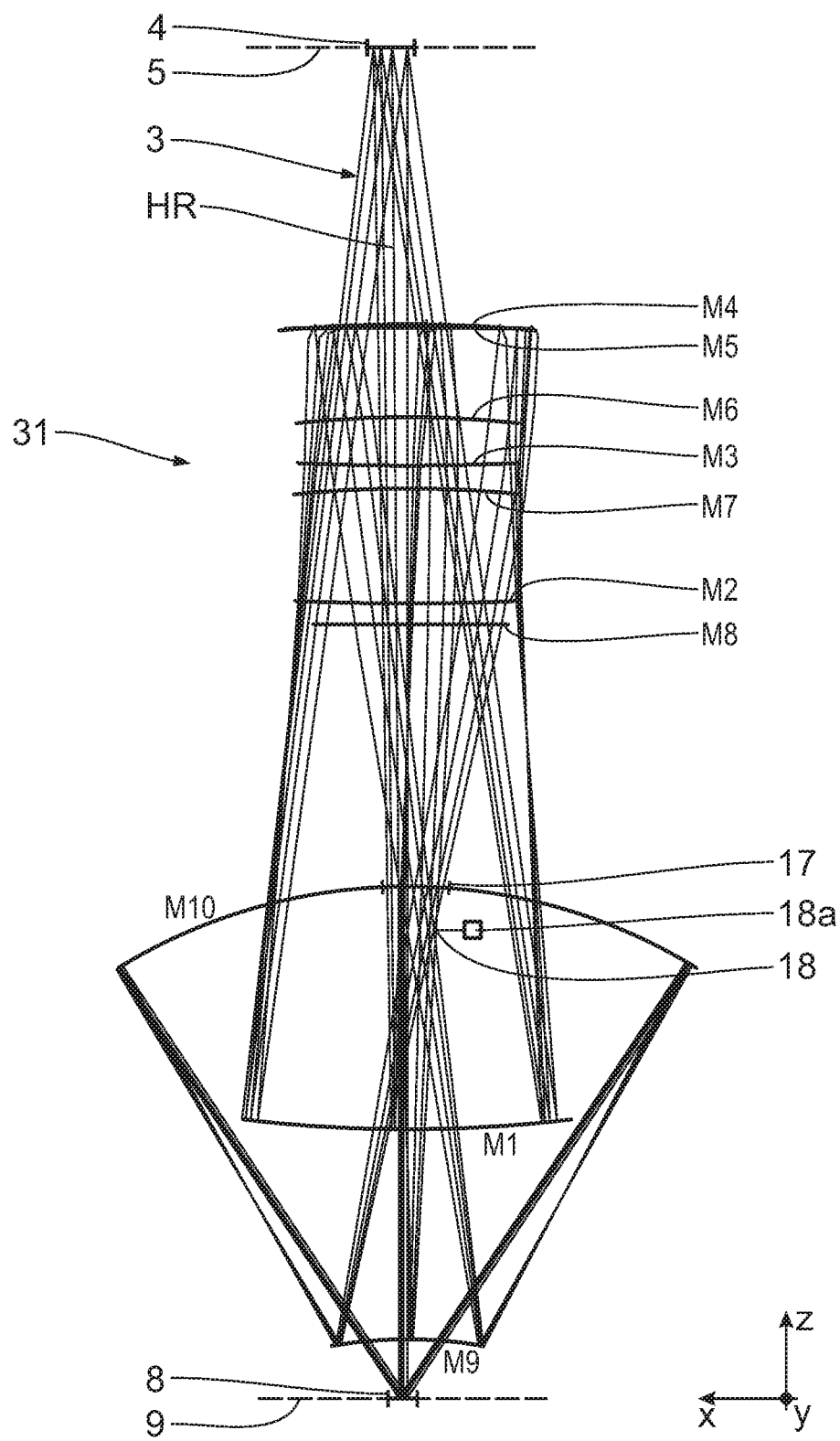
Figure 28:
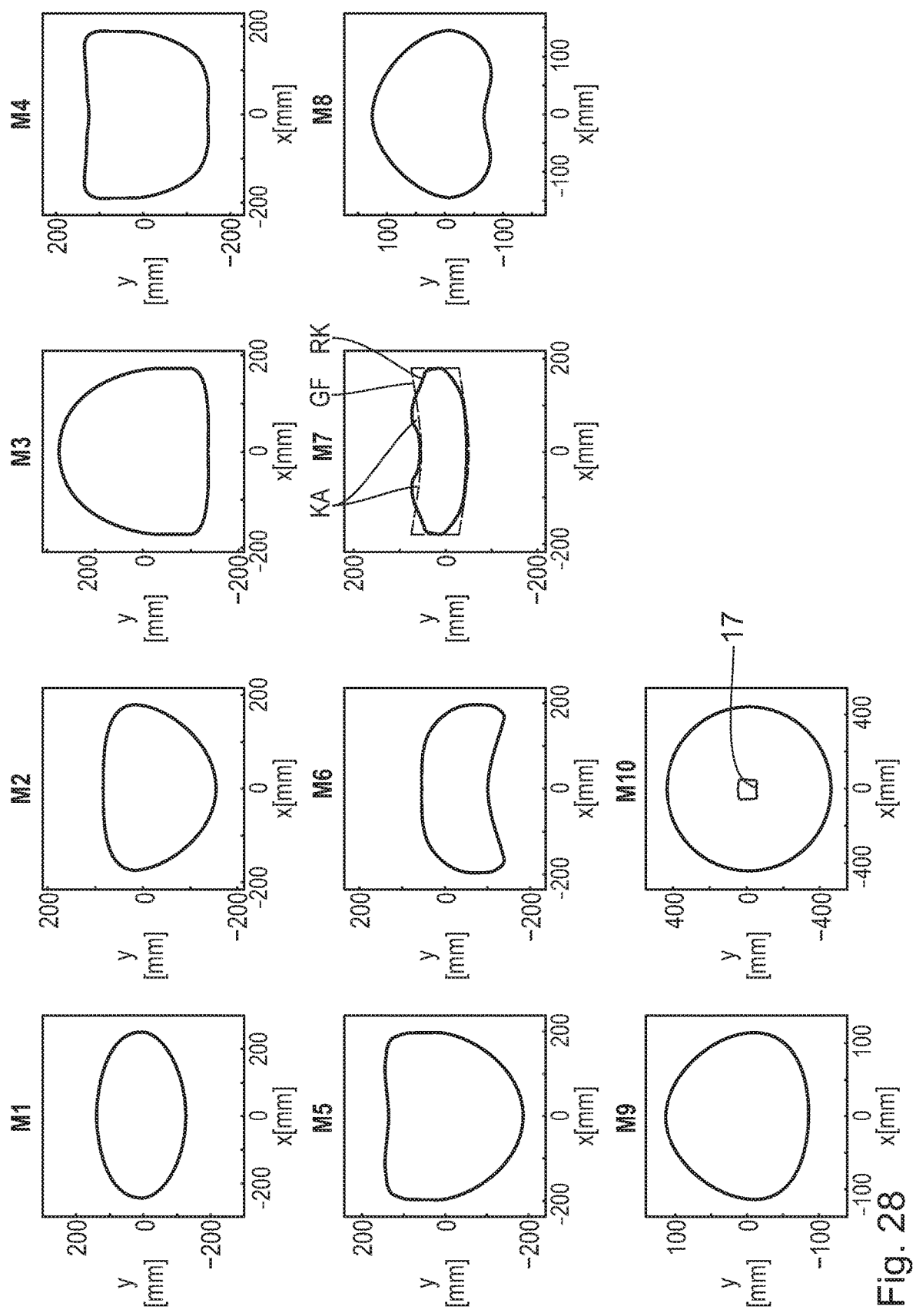

A further embodiment of a projection optical unit 31, which can be used in the projection exposure apparatus 1 according to FIG. 1 instead of the projection optical unit 7, is explained in the following text on the basis of FIGS. 26 to 28. Components and functions which were already explained above in the context of FIGS. 1 to 25 are denoted, where applicable, by the same reference signs and are not discussed again in detail.

Figure 26:
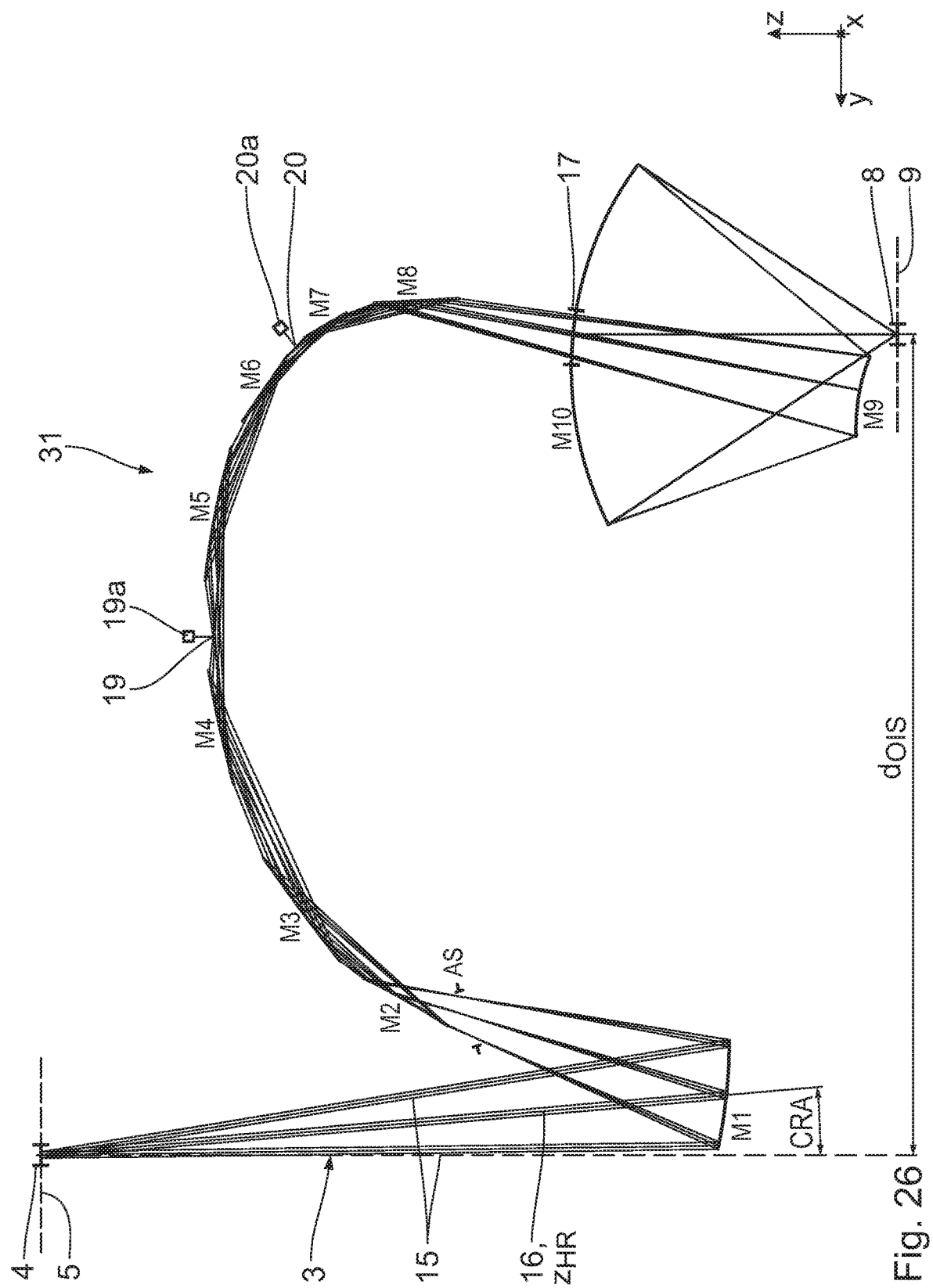

FIG. 26 shows a meridional section of the projection optical unit 31. FIG. 27 shows a sagittal view of the projection optical unit 31. FIG. 28 shows, once again, the boundary contours of the reflection surfaces of the ten mirrors M1 to M10 of the projection optical unit 31.

The projection optical unit 31 has three NI mirrors, namely the mirrors M1, M9 and M10. The projection optical unit 31 has seven GI mirrors, namely the mirrors M2 to M8.

The mirrors M2 to M8 all have the same direction in terms of the mirror deflection effect. In this respect, the projection optical unit 31 is similar to the projection optical unit 30 according to FIGS. 23 to 25.

The mirrors M1 to M10 are once again embodied as free-form surface mirrors, for which the free-form surface equation (1), specified above, applies.

The following tables once again show the mirror parameters of mirrors M1 to M10 of the projection optical unit 31.

| | M1 | M2 | M3 | M4 | M5 |
|---|---|---|---|---|---|
| Maximum angle of incidence [°] | 12.8 | 82.0 | 79.3 | 83.0 | 80.4 |
| Extent of the reflection surface in the x-direction [mm] | 507.0 | 348.8 | 349.6 | 328.9 | 399.0 |
| Extent of the reflection surface in the y-direction [mm] | 266.7 | 235.5 | 309.7 | 283.1 | 329.1 |

-continued

| | | | | | |
|---|---|---|---|---|---|
| Maximum mirror diameter [mm] | 507.1 | 349.1 | 385.0 | 408.8 | 421.5 |

| | M6 | M7 | M8 | M9 | M10 |
|---|---|---|---|---|---|
| Maximum angle of incidence [°] | 83.0 | 80.4 | 79.5 | 21.6 | 7.0 |
| Extent of the reflection surface in the x-direction [mm] | 388.8 | 358.0 | 290.1 | 233.2 | 891.4 |
| Extent of the reflection surface in the y-direction [mm] | 194.1 | 117.0 | 206.0 | 197.3 | 879.5 |
| Maximum mirror diameter [mm] | 393.8 | 358.0 | 290.3 | 234.2 | 892.0 |

All mirrors M1 to M10 of the projection optical unit 31 have a y/x-aspect ratio that is less than 1.

The last mirror M10 in the imaging beam path has the largest maximum diameter, measuring 892.0 mm. The maximum diameters of all other mirrors M1 to M9 are less than 550 mm. Eight of the ten mirrors have a maximum diameter that is less than 500 mm. Six of the ten mirrors have a maximum diameter that is less than 400 mm.

Once again, the projection optical unit 31 has exactly one first plane intermediate image 18 in the region of the passage opening 17 in the mirror M10 and two second plane intermediate images 19, 20. The first of the two second plane intermediate images 19 lies in the imaging beam path, the region of the reflection at the GI mirror M4. The second of the two second plane intermediate images 20 lies in the imaging beam path in the region of the reflection at the GI mirror M7.

The mirror M7 (cf. FIG. 28) has a reflection surface boundary contour RK with a basic form GF which, once again, corresponds to the curved basic form of the object field 4 or of the image field 8 of the projection optical unit 31. Two contour bulges KA are arranged along the side edge of this boundary contour RK, which is shown at the top in FIG. 28 and which is the long side edge in relation to the basic form GF. The function of these contour bulges KA corresponds to that which was already explained above with reference to the mirror M6 of the projection optical unit 7 in the embodiment according to FIGS. 2 to 4.

The optical design data from the projection optical unit 31 can be gathered from the following tables, which, in terms of their design, correspond to the tables for the projection optical unit 7 according to FIG. 2.

TABLE 1 for FIG. 26

| Exemplary embodiment | FIG. 26 |
|---|---|
| NA | 0.55 |
| Wavelength | 13.5 nm |
| beta_x | 4.0 |
| beta_y | −7.5 |
| Field dimension_x | 26.0 mm |
| Field dimension_y | 1.0 mm |
| Field curvature | −0.012345 1/mm |
| rms | 7.8 ml |
| Stop | AS |

TABLE 2 for FIG. 26

| Surface | Radius_x[mm] | Power_x[1/mm] | Radius_y[mm] | Power_y[1/mm] | Operating mode |
|---|---|---|---|---|---|
| M10 | −850.9984003 | 0.0023394 | −842.5330814 | 0.0023847 | REFL |
| M9 | 690.4525083 | −0.0028966 | 439.5683912 | −0.0045499 | REFL |
| M8 | −1626.5101949 | 0.0003056 | 18899.4493659 | −0.0004259 | REFL |
| M7 | −894.6483361 | 0.0005281 | −33415.4312586 | 0.0002534 | REFL |
| M6 | −1304.5130313 | 0.0002811 | −18951.9259358 | 0.0005756 | REFL |
| M5 | −2002.4714622 | 0.0002249 | −1848.6392687 | 0.0048054 | REFL |
| M4 | −13571.6618991 | 0.0000291 | −2667.7243909 | 0.0038029 | REFL |
| M3 | 2929.4401727 | −0.0001380 | −5283.0628904 | 0.0018729 | REFL |
| M2 | 1765.1515098 | −0.0002484 | 1283.3399004 | −0.0071079 | REFL |
| M1 | −2088.8983816 | 0.0009404 | −1280.5878935 | 0.0015901 | REFL |

TABLE 3a for FIG. 26

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −850.99840030 | 690.45250830 | −1626.51019500 |
| C7 | −7.03002946e−09 | −1.12832575e−06 | 6.12641257e−08 |
| C9 | 1.55280432e−08 | 1.2159954e−06 | 1.3921232e−07 |
| C10 | −1.12111283e−11 | 1.70900183e−09 | −1.05449944e−10 |
| C12 | −3.09329566e−11 | 5.22963449e−09 | 5.54183446e−10 |
| C14 | −1.74817678e−12 | 1.12031112e−09 | 3.43759946e−10 |
| C16 | −1.17459377e−14 | −1.10629457e−11 | 1.01509149e−12 |
| C18 | 6.10523134e−15 | 9.95900689e−12 | 6.2656672e−13 |
| C20 | 1.61333143e−14 | −4.44954285e−12 | 1.72502948e−12 |
| C21 | −1.59220258e−17 | 1.52048436e−14 | 5.145233e−16 |
| C23 | −7.04797949e−17 | 6.22062916e−14 | 5.09268635e−17 |
| C25 | −5.27874467e−17 | 7.53214031e−14 | 2.67922335e−15 |
| C27 | −1.10240684e−17 | 1.53301075e−14 | 7.76389234e−15 |
| C29 | −2.16726344e−20 | −1.38206693e−16 | −2.15656063e−18 |

TABLE 3a-continued for FIG. 26

| Coefficient | M10 | M9 | M8 |
|---|---|---|---|
| C31 | −9.04198121e−21 | 3.08632687e−17 | −8.64279245e−18 |
| C33 | 2.30879218e−20 | −5.76656034e−17 | 1.5099794e−17 |
| C35 | 1.00834913e−20 | −1.03425145e−16 | 2.63359643e−17 |
| C36 | −2.14878734e−23 | 7.59951862e−20 | −9.46694556e−21 |
| C38 | −1.19644095e−22 | 6.67732433e−19 | 1.9173226e−21 |
| C40 | −1.66028267e−22 | 1.35355603e−18 | −6.98066679e−20 |
| C42 | −9.26934025e−23 | 6.38737212e−19 | −5.18396999e−20 |
| C44 | −2.71890576e−23 | 1.08072084e−19 | 2.45233569e−19 |
| C46 | −3.03368513e−26 | −2.20243567e−21 | 1.5327447e−22 |
| C48 | −3.19077558e−26 | −2.43245202e−21 | 1.04282583e−21 |
| C50 | 1.16311692e−26 | −7.73188086e−21 | −1.17201163e−21 |
| C52 | 1.8557501e−26 | −1.40710351e−20 | −4.02316222e−21 |
| C54 | −1.13552496e−26 | −1.34258539e−20 | 5.39197892e−21 |
| C55 | −3.49082911e−29 | −5.77685598e−24 | 1.5698251e−24 |
| C57 | −3.19623602e−28 | 3.81572271e−23 | −2.70267218e−24 |
| C59 | −6.62888681e−28 | 1.13738432e−22 | −2.77569561e−24 |
| C61 | −5.49474662e−28 | 9.8457023e−23 | −8.1161275e−24 |
| C63 | −2.33723415e−28 | 6.44703944e−23 | −8.56751222e−24 |
| C65 | −6.11229244e−29 | −7.54582826e−23 | 4.1168243e−23 |
| C67 | −8.43043691e−32 | −2.50016809e−26 | −1.2946523e−26 |
| C69 | −2.12547632e−31 | 5.66061831e−26 | −9.65290282e−26 |
| C71 | −1.79344385e−31 | 4.54813421e−25 | −6.79293961e−26 |
| C73 | 1.06815298e−31 | 1.29533612e−24 | 4.956337e−25 |
| C75 | 1.05755587e−31 | 1.55384636e−24 | 6.14365077e−25 |
| C77 | 8.46368304e−33 | 5.60304945e−25 | −3.49493613e−25 |
| C78 | 1.06144694e−35 | 8.75573136e−28 | −1.03825281e−28 |
| C80 | 7.27835685e−34 | −2.58893701e−27 | 2.13916224e−28 |
| C82 | 2.42013765e−33 | −1.2067901e−26 | 1.24128655e−28 |
| C84 | 2.59612915e−33 | −1.49597539e−26 | 1.36300786e−27 |
| C86 | 8.89251311e−34 | −5.08486485e−27 | 2.54214587e−27 |
| C88 | 4.24278168e−35 | −4.81867076e−27 | 2.75194399e−27 |
| C90 | −8.34509197e−36 | 5.09469282e−27 | −5.79969549e−27 |
| C92 | 1.70298609e−37 | 8.27996984e−31 | 4.94243267e−31 |
| C94 | 7.35037693e−37 | −5.9450189e−30 | 3.34975554e−30 |
| C96 | 1.54424725e−36 | −2.94477093e−29 | 8.03367696e−30 |
| C98 | 6.13331746e−37 | −1.01069595e−28 | −3.3727749e−29 |
| C100 | −1.28065428e−36 | −2.0690222e−28 | −7.64674986e−29 |
| C102 | −9.35297851e−37 | −2.09170374e−28 | −3.50268561e−29 |
| C104 | −8.72230446e−38 | −1.92939795e−29 | 1.77267398e−29 |
| C105 | −4.33579071e−40 | −3.92839494e−32 | 2.73420503e−33 |
| C107 | −6.67869952e−39 | 1.31611785e−31 | −6.73493598e−33 |
| C109 | −2.55657274e−38 | 9.19416961e−31 | −8.86390859e−34 |
| C111 | −4.10862904e−38 | 1.67494418e−30 | −1.04183129e−31 |
| C113 | −3.02138728e−38 | 1.02449935e−30 | −3.89787802e−31 |
| C115 | −1.06320348e−38 | −3.76885269e−31 | −4.0813407e−31 |
| C117 | −2.62841711e−39 | −3.60960998e−31 | −6.43010051e−32 |
| C119 | −3.19060904e−40 | −9.39336476e−32 | 7.0451153e−31 |
| C121 | −8.77211122e−43 | −4.89468126e−35 | −7.66026768e−36 |
| C123 | −3.85601224e−42 | 6.89110707e−35 | −3.23128947e−35 |
| C125 | −9.53448338e−42 | 6.3366408e−34 | −2.45165302e−34 |
| C127 | −9.67154428e−42 | 2.01379939e−33 | 6.53749443e−34 |
| C129 | 6.71055197e−43 | 6.28157945e−33 | 2.58964212e−33 |
| C131 | 6.86184229e−42 | 9.91715428e−33 | 3.69905543e−33 |
| C133 | 3.00403221e−42 | 9.21971687e−33 | 2.53197671e−33 |
| C135 | 2.12945038e−43 | 1.25764882e−33 | 4.45495448e−33 |
| C136 | 1.13878838e−45 | 6.8751793e−37 | −2.4618018e−38 |
| C138 | 1.87411622e−44 | −2.13811275e−36 | 5.65630181e−38 |
| C140 | 8.54897409e−44 | −2.28771775e−35 | −2.62366196e−37 |
| C142 | 1.78978429e−43 | −5.83739868e−35 | 2.3076713e−36 |
| C144 | 1.87587925e−43 | −6.00556142e−35 | 1.27178851e−35 |
| C146 | 9.29426856e−44 | −4.29425805e−37 | 2.38221259e−35 |
| C148 | 2.25947742e−44 | 4.99346508e−35 | 2.24046545e−35 |
| C150 | 5.2803677e−45 | 4.17428318e−35 | 1.09648004e−35 |
| C152 | 5.67509953e−46 | 6.18032669e−36 | 9.30861482e−36 |
| C154 | 7.54374179e−49 | 0 | 0 |
| C156 | 4.33032443e−48 | 0 | 0 |
| C158 | 1.44192772e−47 | 0 | 0 |
| C160 | 2.32499596e−47 | 0 | 0 |
| C162 | 1.17862963e−47 | 0 | 0 |
| C164 | −1.16609868e−47 | 0 | 0 |
| C166 | −1.42697874e−47 | 0 | 0 |
| C168 | −4.03481152e−48 | 0 | 0 |
| C170 | −2.03671085e−49 | 0 | 0 |
| C171 | −1.661131e−51 | 0 | 0 |
| C173 | −2.82534838e−50 | 0 | 0 |
| C175 | −1.41975872e−49 | 0 | 0 |

TABLE 3a-continued for FIG. 26

| Coefficient | M10 | M9 | M8 |
|---|---|---|---|
| C177 | −3.59720313e−49 | 0 | 0 |
| C179 | −5.05571087e−49 | 0 | 0 |
| C181 | −3.89904427e−49 | 0 | 0 |
| C183 | −1.57429847e−49 | 0 | 0 |
| C185 | −4.02999425e−50 | 0 | 0 |
| C187 | −1.06893714e−50 | 0 | 0 |
| C189 | −1.25335447e−51 | 0 | 0 |

TABLE 3b for FIG. 26

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −894.64833610 | −1304.51303100 | −2002.47146200 |
| C7 | 1.08112771e−07 | 1.04335481e−07 | 1.10979512e−07 |
| C9 | −1.13000051e−07 | −2.20798445e−08 | 6.00145368e−09 |
| C10 | −1.17589399e−10 | −4.78714462e−11 | 6.40363293e−11 |
| C12 | 4.20978683e−10 | −2.5290518e−10 | 1.95262505e−10 |
| C14 | −1.39671003e−09 | 4.11188896e−10 | −1.57759281e−11 |
| C16 | −1.06370796e−12 | 2.58531409e−14 | −2.55096961e−13 |
| C18 | 1.63118441e−12 | −5.99630932e−13 | −4.64367829e−13 |
| C20 | −5.21760043e−12 | −1.84885391e−12 | 1.78763837e−13 |
| C21 | −4.20095046e−16 | 5.35288064e−18 | 4.78304505e−16 |
| C23 | −1.28788127e−15 | 1.16592841e−15 | 6.76366991e−16 |
| C25 | 2.24603177e−14 | −4.24493445e−16 | 6.43409213e−16 |
| C27 | −6.66272337e−14 | 1.37793734e−14 | −1.3197354e−16 |
| C29 | 3.41059778e−18 | 9.53689977e−20 | −2.58200642e−19 |
| C31 | −3.68397697e−16 | −2.92104626e−19 | −1.45175003e−18 |
| C33 | 1.52001612e−16 | −6.90020201e−18 | −1.00464425e−18 |
| C35 | −4.91058447e−16 | −1.20787125e−16 | −2.98913737e−19 |
| C36 | 4.98603076e−21 | −1.41092473e−21 | −2.74358727e−21 |
| C38 | −9.16903491e−21 | 1.97406532e−21 | 5.24074149e−22 |
| C40 | −1.47271995e−19 | −3.34460739e−20 | 1.40871746e−20 |
| C42 | 3.07422757e−18 | 1.06724041e−19 | 9.53341509e−21 |
| C44 | −6.2957705e−18 | 1.32000706e−18 | 1.47064843e−20 |
| C46 | −1.85365336e−22 | 4.76594089e−24 | 8.2933825e−24 |
| C48 | −1.28210118e−21 | 2.58185303e−23 | 6.44879498e−24 |
| C50 | −8.73336698e−21 | −1.26595369e−22 | −1.53890294e−23 |
| C52 | −1.99451811e−20 | −3.26154339e−21 | 9.77860571e−24 |
| C54 | −1.35148582e−19 | −7.66852471e−21 | 7.3231509e−25 |
| C55 | −2.04919022e−25 | −2.00836232e−25 | 1.76764762e−25 |
| C57 | −2.13209361e−25 | 2.12156909e−25 | 1.07292061e−25 |
| C59 | 6.67031327e−24 | −6.13616768e−25 | −2.86382758e−25 |
| C61 | −1.2510699e−22 | 4.10599237e−24 | −5.40705817e−25 |
| C63 | −5.62409591e−22 | 6.38112745e−23 | −5.83425481e−25 |
| C65 | −2.932744e−23 | −3.11441795e−23 | −1.829156e−24 |
| C67 | 9.07561132e−27 | −1.39972111e−27 | 9.8408785e−29 |
| C69 | 1.12029331e−25 | 1.70924762e−27 | −2.63624292e−28 |
| C71 | 2.34177287e−25 | 9.92372194e−27 | −1.3177282e−27 |
| C73 | 4.9855072e−24 | −5.32263488e−26 | −1.64852392e−28 |
| C75 | 1.07981493e−23 | −8.2123685e−25 | 1.25617763e−27 |
| C77 | 4.20616759e−23 | 1.17407193e−25 | 9.365847e−27 |
| C78 | 5.17650497e−30 | 8.29545495e−30 | −4.04537672e−30 |
| C80 | 8.1321703e−29 | −2.18697679e−29 | −2.11123385e−30 |
| C82 | −5.05010944e−28 | 5.08995306e−29 | 1.04180761e−29 |
| C84 | 4.1407741e−27 | 1.63285579e−28 | 3.49688833e−29 |
| C86 | 7.54993507e−26 | 4.12929765e−28 | 2.55288354e−29 |
| C88 | 2.95901058e−25 | 3.9753868e−27 | 2.10034523e−29 |
| C90 | −4.47805219e−25 | 2.10900597e−26 | 4.9364073e−29 |
| C92 | −3.17297336e−31 | 2.7136031e−32 | −1.0925254e−32 |
| C94 | −4.39871315e−30 | 7.74413927e−32 | −7.37173106e−33 |
| C96 | −2.21978454e−30 | −1.3340811e−30 | 2.05419638e−32 |
| C98 | −3.51293551e−29 | −6.54025347e−30 | −4.22617588e−32 |
| C100 | −1.7393042e−27 | 1.14443482e−29 | −3.18007759e−32 |
| C102 | 2.21659182e−27 | 1.63902209e−29 | −9.69320597e−32 |
| C104 | −2.261453e−26 | −3.72776469e−28 | −4.37544226e−31 |
| C105 | −4.12534461e−35 | −1.14480182e−34 | 3.01382907e−35 |
| C107 | −2.76513255e−33 | 2.48225368e−34 | 3.82965838e−35 |
| C109 | 6.66123874e−33 | 7.08107492e−34 | −2.24841818e−34 |
| C111 | 5.68286568e−32 | 1.28989041e−32 | −8.72165939e−34 |

TABLE 3b-continued for FIG. 26

| Coefficient | M7 | M6 | M5 |
| --- | --- | --- | --- |
| C113 | −2.21079604e−30 | 6.06542575e−32 | −7.27967829e−34 |
| C115 | −2.37579413e−29 | −2.19301557e−31 | −4.91779127e−34 |
| C117 | −6.27847083e−30 | −2.24385315e−31 | −2.37594002e−34 |
| C119 | −4.78585387e−29 | 2.80185274e−30 | −1.6756456e−34 |
| C121 | 3.90632846e−36 | −3.01907852e−37 | 1.34464067e−37 |
| C123 | 6.26723855e−35 | −7.38603762e−36 | 6.76565399e−38 |
| C125 | 1.05715992e−34 | 9.61938133e−36 | −1.51891289e−37 |
| C127 | −3.09523937e−33 | −8.01514865e−35 | 5.00274107e−37 |
| C129 | 1.20382485e−32 | −1.890792e−34 | 8.2689123e−37 |
| C131 | 1.5791079e−31 | 1.25739753e−33 | 1.40678273e−36 |
| C133 | −4.84783534e−31 | 6.43336332e−34 | 2.19255971e−36 |
| C135 | 3.25553962e−30 | −1.01661431e−32 | 7.71863723e−36 |
| C136 | −6.44594661e−41 | 5.18329556e−40 | −3.10095869e−41 |
| C138 | 3.35868415e−38 | 6.80645707e−39 | −4.35334696e−41 |
| C140 | 1.80786666e−37 | 1.78639777e−38 | 2.42366057e−39 |
| C142 | −2.38820743e−36 | −9.21396534e−38 | 1.02431909e−38 |
| C144 | −2.22167615e−35 | 3.78975523e−37 | 1.04663468e−38 |
| C146 | 3.32759736e−34 | −2.96891077e−37 | 6.10106481e−39 |
| C148 | 2.06724289e−33 | −1.82263628e−36 | −4.98328999e−40 |
| C150 | −3.9794396e−33 | −7.77903373e−37 | −3.42284275e−39 |
| C152 | 2.3470777e−32 | 1.47710607e−35 | −1.59359975e−38 |

TABLE 3c for FIG. 26

| Coefficient | M4 | M3 | M2 |
| --- | --- | --- | --- |
| KY | 0.00000000 | 0.00000000 | 0.00000000 |
| KX | 0.00000000 | 0.00000000 | 0.00000000 |
| RX | −13571.66190000 | 2929.44017300 | 1765.15151000 |
| C7 | 2.4867906e−07 | 4.08857083e−08 | −5.7556894e−09 |
| C9 | 1.31816749e−07 | −9.89325337e−08 | −1.14539535e−06 |
| C10 | −1.48061453e−10 | −9.97694826e−11 | −5.45484776e−11 |
| C12 | −1.21532663e−09 | 2.57218721e−10 | −6.04005833e−10 |
| C14 | 1.16631039e−10 | −4.04653062e−10 | 2.16860795e−09 |
| C16 | −1.2664286e−14 | −5.04233236e−14 | 2.44731848e−13 |
| C18 | −5.47315517e−13 | 3.35933025e−13 | 2.42823996e−12 |
| C20 | 2.41591161e−12 | −8.111824e−13 | −7.35728966e−14 |
| C21 | −1.59004743e−16 | −1.59830806e−15 | −2.30482615e−15 |
| C23 | 1.04464337e−15 | −2.87520329e−16 | −4.20889256e−16 |
| C25 | −1.55721846e−15 | 8.61175146e−16 | −7.33809515e−15 |
| C27 | 7.50169667e−16 | −4.10119512e−15 | −2.88368567e−14 |
| C29 | −2.18585533e−18 | −6.13843321e−19 | 1.48260706e−17 |
| C31 | 2.70123455e−18 | −1.38332816e−18 | −2.53495907e−17 |
| C33 | −4.38939645e−18 | 5.67758167e−18 | 5.60276862e−17 |
| C35 | 1.86451426e−18 | −1.33485001e−17 | 1.48945852e−16 |
| C36 | 5.00909256e−21 | −5.45445522e−21 | −4.95064554e−21 |
| C38 | −3.00745498e−21 | 6.14787355e−21 | −4.91817794e−20 |
| C40 | 1.78924217e−20 | −3.67760273e−21 | 1.6957518e−19 |
| C42 | −6.33866332e−21 | 2.49007667e−20 | −2.45066144e−19 |
| C44 | −9.33191026e−21 | −7.67966033e−20 | 2.10705647e−19 |
| C46 | 2.84838666e−23 | 5.43800202e−23 | 1.29798113e−22 |
| C48 | 3.60495373e−23 | 1.02681305e−22 | 7.8287201e−23 |
| C50 | 1.16022145e−22 | 4.84478465e−23 | −1.64313217e−21 |
| C52 | −7.7979898e−24 | 2.37125083e−22 | 1.04461941e−21 |
| C54 | −8.35587682e−23 | −3.51811104e−22 | −5.38944309e−21 |
| C55 | 1.14055283e−26 | −2.62138126e−25 | −4.35489266e−25 |
| C57 | −2.65384423e−26 | −3.11299601e−25 | −1.3762689e−24 |
| C59 | −3.70188932e−25 | −9.09955636e−25 | 5.9051924e−25 |
| C61 | 3.01756263e−25 | −8.80462249e−25 | 4.52988194e−24 |
| C63 | −4.07672634e−25 | 1.39144761e−24 | −2.30701197e−23 |
| C65 | 1.09635103e−24 | −5.99660749e−25 | −3.82791002e−23 |
| C67 | −1.38494804e−27 | −2.82529724e−27 | −2.5491701e−27 |
| C69 | −2.73347994e−27 | −6.39440845e−27 | −4.86335108e−27 |
| C71 | −5.51982944e−27 | −7.63567546e−27 | 4.16119656e−26 |
| C73 | −2.9413266e−27 | −7.47710103e−27 | 1.53698552e−25 |
| C75 | −8.74573032e−28 | 1.49764036e−27 | 3.27774011e−25 |
| C77 | 7.16378196e−27 | 5.65452184e−27 | 9.56022723e−25 |
| C78 | −2.49097034e−30 | 1.18516516e−29 | 1.89603348e−29 |
| C80 | −1.94277476e−30 | 6.00108899e−30 | 1.24066875e−28 |
| C82 | 4.00548354e−30 | 4.83120236e−29 | 4.6099092e−29 |
| C84 | −4.09297855e−30 | 4.89571367e−29 | −1.18235574e−28 |

TABLE 3c-continued for FIG. 26

| Coefficient | M4 | M3 | M2 |
|---|---|---|---|
| C86 | −2.79175815e−29 | −4.54130678e−30 | −3.51054923e−29 |
| C88 | 3.46634258e−29 | −5.10942244e−29 | −3.26522615e−28 |
| C90 | −6.98750754e−29 | 3.42818363e−30 | −3.78078944e−27 |
| C92 | 2.78034443e−32 | 7.07006655e−32 | 8.91891738e−32 |
| C94 | 6.87000404e−32 | 1.91992861e−31 | 1.68682533e−31 |
| C96 | 1.31346242e−31 | 3.33161247e−31 | −5.25800206e−31 |
| C98 | 1.91021348e−31 | 3.25505098e−31 | −5.93272094e−30 |
| C100 | 1.22327875e−31 | 1.57698995e−31 | −1.54795048e−29 |
| C102 | 4.57847514e−32 | −1.14929139e−31 | −1.44958724e−29 |
| C104 | −2.87175318e−31 | −3.24308979e−31 | −3.25867584e−29 |
| C105 | 7.49234545e−35 | −2.23778665e−34 | −3.95765903e−34 |
| C107 | 1.36436739e−34 | −5.50218186e−35 | −4.14957517e−33 |
| C109 | 4.06669286e−35 | −1.30072273e−33 | −3.38295815e−33 |
| C111 | 1.44266678e−34 | −2.12805306e−33 | 1.03803927e−33 |
| C113 | 7.55798972e−34 | −5.77392498e−34 | 1.72138239e−32 |
| C115 | 1.24090466e−33 | 4.04630096e−35 | 3.80780335e−32 |
| C117 | −1.51672627e−33 | 2.20736189e−33 | 3.60119016e−32 |
| C119 | 2.54322977e−33 | −1.94012119e−33 | 3.7836678e−31 |
| C121 | −1.47062443e−37 | −4.95634083e−37 | −6.48736325e−37 |
| C123 | −6.76764495e−37 | −2.62857791e−36 | −3.07063488e−36 |
| C125 | −1.52780264e−36 | −5.42778062e−36 | −8.49236895e−36 |
| C127 | −2.43152897e−36 | −6.8744822e−36 | 6.411214e−35 |
| C129 | −3.9070541e−36 | −2.64110857e−36 | 3.34055113e−34 |
| C131 | −1.52422552e−36 | −4.57033388e−36 | 4.96867057e−34 |
| C133 | −6.94885323e−37 | 1.42202438e−35 | 3.35741831e−34 |
| C135 | 4.46614262e−36 | −4.43260704e−36 | −1.41983923e−33 |
| C136 | −5.82720549e−40 | 1.2738577e−39 | 2.95962778e−39 |
| C138 | −1.48616538e−39 | 4.40022068e−40 | 4.81277463e−38 |
| C140 | −1.59901737e−39 | 1.67191433e−38 | 6.61371003e−38 |
| C142 | −4.27476461e−39 | 3.36569747e−38 | 8.78235469e−38 |
| C144 | −7.9967858e−39 | 2.28602413e−38 | −3.4335812e−37 |
| C146 | −2.28492536e−38 | 1.51730517e−39 | −1.52442242e−36 |
| C148 | −1.59254776e−38 | −1.46051228e−38 | −1.97429432e−36 |
| C150 | 2.45997969e−38 | 2.36937048e−38 | −1.26580266e−36 |
| C152 | −3.70175785e−38 | −4.00174707e−39 | 1.93212266e−36 |

TABLE 3d for FIG. 26

| Coefficient | M1 |
|---|---|
| KY | 0.00000000 |
| KX | 0.00000000 |
| RX | −2088.89838200 |
| C7 | −3.42683525e−08 |
| C9 | −1.6512688e−08 |
| C10 | 4.38584664e−11 |
| C12 | 4.18259048e−11 |
| C14 | −4.6250256e−12 |
| C16 | 2.38962576e−14 |
| C18 | −1.19663942e−13 |
| C20 | 2.61037397e−13 |
| C21 | 2.63044596e−17 |
| C23 | −2.37150015e−17 |
| C25 | 1.57559118e−16 |
| C27 | 4.7889248e−16 |
| C29 | 7.53232216e−20 |
| C31 | −2.05517927e−19 |
| C33 | −1.61629336e−19 |
| C35 | 1.45937682e−18 |
| C36 | 4.9764225e−23 |
| C38 | −3.27842891e−22 |
| C40 | −2.80802645e−21 |
| C42 | 2.769078e−21 |
| C44 | 1.47214512e−21 |
| C46 | 4.70047246e−25 |
| C48 | 7.39186519e−24 |
| C50 | 7.57901529e−23 |
| C52 | 1.65362047e−22 |
| C54 | 1.09834948e−22 |
| C55 | 3.21208271e−27 |
| C57 | 5.61919098e−27 |

TABLE 3d-continued for FIG. 26

| Coefficient | M1 |
|---|---|
| C59 | 1.22809043e−25 |
| C61 | 5.60328258e−25 |
| C63 | 5.47540805e−25 |
| C65 | −1.79792769e−25 |
| C67 | 4.27223866e−31 |
| C69 | −1.52895416e−28 |
| C71 | −1.99104409e−27 |
| C73 | −8.52429426e−27 |
| C75 | −1.37557711e−26 |
| C77 | −4.93968315e−27 |
| C78 | −6.87550869e−32 |
| C80 | −7.80050004e−32 |
| C82 | −2.51344446e−30 |
| C84 | −2.2898419e−29 |
| C86 | −6.02505261e−29 |
| C88 | −3.61828628e−29 |
| C90 | 5.5528325e−30 |
| C92 | −9.50562723e−36 |
| C94 | 1.49044558e−33 |
| C96 | 2.78503789e−32 |
| C98 | 1.77498716e−31 |
| C100 | 5.21503374e−31 |
| C102 | 5.64843247e−31 |
| C104 | 1.0992411e−31 |
| C105 | 6.42767711e−37 |
| C107 | 1.21466068e−36 |
| C109 | 2.44962564e−35 |
| C111 | 3.69492236e−34 |
| C113 | 1.7711647e−33 |
| C115 | 3.09168063e−33 |
| C117 | 1.83366676e−33 |

TABLE 3d-continued for FIG. 26

| Coefficient | M1 |
|---|---|
| C119 | 1.3402897e−34 |
| C121 | 6.32273889e−41 |
| C123 | −7.53170421e−39 |
| C125 | −1.44659913e−37 |
| C127 | −1.19754969e−36 |
| C129 | −5.25380881e−36 |
| C131 | −1.09748045e−35 |
| C133 | −9.51371783e−36 |
| C135 | −1.14567726e−36 |
| C136 | −2.32228213e−42 |
| C138 | −8.71321698e−42 |
| C140 | −1.04819209e−40 |
| C142 | −2.03692092e−39 |
| C144 | −1.44529556e−38 |
| C146 | −4.48708715e−38 |
| C148 | −6.21272731e−38 |
| C150 | −3.74464272e−38 |
| C152 | −8.57142389e−39 |

TABLE 4a for FIG. 26

| Surface | DCX | DCY | DCZ |
|---|---|---|---|
| Image | 0.00000000 | 0.00000000 | 0.00000000 |
| M10 | 0.00000000 | 0.00000000 | 786.31794313 |
| M9 | 0.00000000 | 135.66761714 | 90.09404872 |
| M8 | −0.00000000 | −80.64099022 | 1189.77813151 |
| M7 | −0.00000000 | −15.95855480 | 1398.24950705 |
| M6 | 0.00000000 | 93.52154823 | 1507.83829965 |
| M5 | 0.00000000 | 413.44248899 | 1650.69955943 |
| M4 | −0.00000000 | 950.27772844 | 1645.50394918 |
| M3 | −0.00000000 | 1417.56980610 | 1433.50578895 |
| M2 | −0.00000000 | 1602.36234269 | 1221.51469689 |
| Stop | −0.00000000 | 1657.11014994 | 1042.75065199 |
| M1 | −0.00000000 | 1849.90639774 | 413.22704495 |
| Object | 0.00000000 | 1995.41823598 | 2076.33636439 |

TABLE 4b for FIG. 26

| Surface | TLA[deg] | TLB[deg] | TLC[deg] |
|---|---|---|---|
| Image | −0.00000000 | 0.00000000 | −0.00000000 |
| M10 | 5.51329727 | 0.00000000 | −0.00000000 |
| M9 | 191.07732290 | 0.00000000 | −0.00000000 |
| M8 | 86.94524857 | −0.00000000 | 0.00000000 |
| M7 | 58.89543640 | 0.00000000 | −0.00000000 |
| M6 | 34.54583072 | 0.00000000 | 0.00000000 |
| M5 | 11.75436531 | 0.00000000 | −0.00000000 |
| M4 | −12.47852673 | 0.00000000 | 0.00000000 |
| M3 | −36.66195105 | −0.00000000 | −0.00000000 |
| M2 | −60.94687944 | −0.00000000 | 0.00000000 |
| Stop | −17.62929935 | 180.00000000 | −0.00000000 |
| M1 | 186.01364938 | −0.00000000 | −0.00000000 |
| Object | −0.00029494 | 0.00000000 | 0.00000000 |

TABLE 5 for FIG. 26

| Surface | Angle of incidence[deg] | Reflectivity |
|---|---|---|
| M10 | 5.47743096 | 0.66257916 |
| M9 | 0.16980600 | 0.66566578 |
| M8 | 75.61143735 | 0.81411830 |
| M7 | 76.33505862 | 0.82576260 |
| M6 | 79.43553650 | 0.87079247 |
| M5 | 76.98906045 | 0.83587884 |
| M4 | 78.63034221 | 0.85975915 |
| M3 | 78.33822296 | 0.85565285 |
| M2 | 77.33481505 | 0.84108094 |
| M1 | 10.82988596 | 0.65263931 |
| Overall transmission | | 0.0872 |

TABLE 6 for FIG. 26

| X[mm] | Y[mm] | Z[mm] |
|---|---|---|
| 0.00000000 | 55.07179086 | 0.00000000 |
| 28.32134635 | 54.58202803 | 0.00000000 |
| 55.98211712 | 53.09558841 | 0.00000000 |
| 82.33019561 | 50.57144987 | 0.00000000 |
| 106.73054258 | 46.97017287 | 0.00000000 |
| 128.57548660 | 42.28058930 | 0.00000000 |
| 147.29804478 | 36.53990071 | 0.00000000 |
| 162.38870287 | 29.84523566 | 0.00000000 |
| 173.41580382 | 22.35491655 | 0.00000000 |
| 180.04860871 | 14.27850894 | 0.00000000 |
| 182.08062285 | 5.85873273 | 0.00000000 |
| 179.44972021 | −2.65150686 | 0.00000000 |
| 172.25003968 | −11.00899969 | 0.00000000 |
| 160.72981012 | −18.99114170 | 0.00000000 |
| 145.27218516 | −26.39671205 | 0.00000000 |
| 126.36269179 | −33.04140748 | 0.00000000 |
| 104.55198226 | −38.75465411 | 0.00000000 |
| 80.42276570 | −43.38151418 | 0.00000000 |
| 54.56592829 | −46.78945614 | 0.00000000 |
| 27.56670420 | −48.87682670 | 0.00000000 |
| 0.00000000 | −49.57985235 | 0.00000000 |
| −27.56670420 | −48.87682670 | 0.00000000 |
| −54.56592829 | −46.78945614 | 0.00000000 |
| −80.42276570 | −43.38151418 | 0.00000000 |
| −104.55198226 | −38.75465411 | 0.00000000 |
| −126.36269179 | −33.04140748 | 0.00000000 |
| −145.27218516 | −26.39671205 | 0.00000000 |
| −160.72981012 | −18.99114170 | 0.00000000 |
| −172.25003968 | −11.00899969 | 0.00000000 |
| −179.44972021 | −2.65150686 | 0.00000000 |
| −182.08062285 | 5.85873273 | 0.00000000 |
| −180.04860871 | 14.27850894 | 0.00000000 |
| −173.41580382 | 22.35491655 | 0.00000000 |
| −162.38870287 | 29.84523566 | 0.00000000 |
| −147.29804478 | 36.53990071 | 0.00000000 |
| −128.57548660 | 42.28058930 | 0.00000000 |
| −106.73054258 | 46.97017287 | 0.00000000 |
| −82.33019561 | 50.57144987 | 0.00000000 |
| −55.98211712 | 53.09558841 | 0.00000000 |
| −28.32134635 | 54.58202803 | 0.00000000 |

The projection optical unit 31 has an overall transmission of 8.72%.

An image-side numerical aperture of the projection optical unit 31 is 0.55. The reduction factor $\beta_x$ in the first imaging light plane xz is 4. The reduction factor $\beta_y$ in the second imaging light plane yz is 7.5.

An object-side chief ray angle CRA is 5.0°. A maximum obscuration of the entry pupil is 16%. An object-image offset $d_{OIS}$ is approximately 3230 mm. The mirrors of the projection optical unit 31 can be housed in a cuboid with xyz-edge lengths of 891 mm×2395 mm×1615 mm.

In the projection optical unit 31, the object plane 5 extends parallel to the image plane 9.

A working distance between the mirror M10 closest to the wafer and the image plane 9 is 65 mm. A mean wavefront aberration rms is 7.65 mλ.

The aperture stop AS is arranged in the imaging light beam path between the mirrors M1 and M2 in the projection optical unit 31. The imaging light beam is completely accessible in the region of the aperture stop AS.

Figure 30:
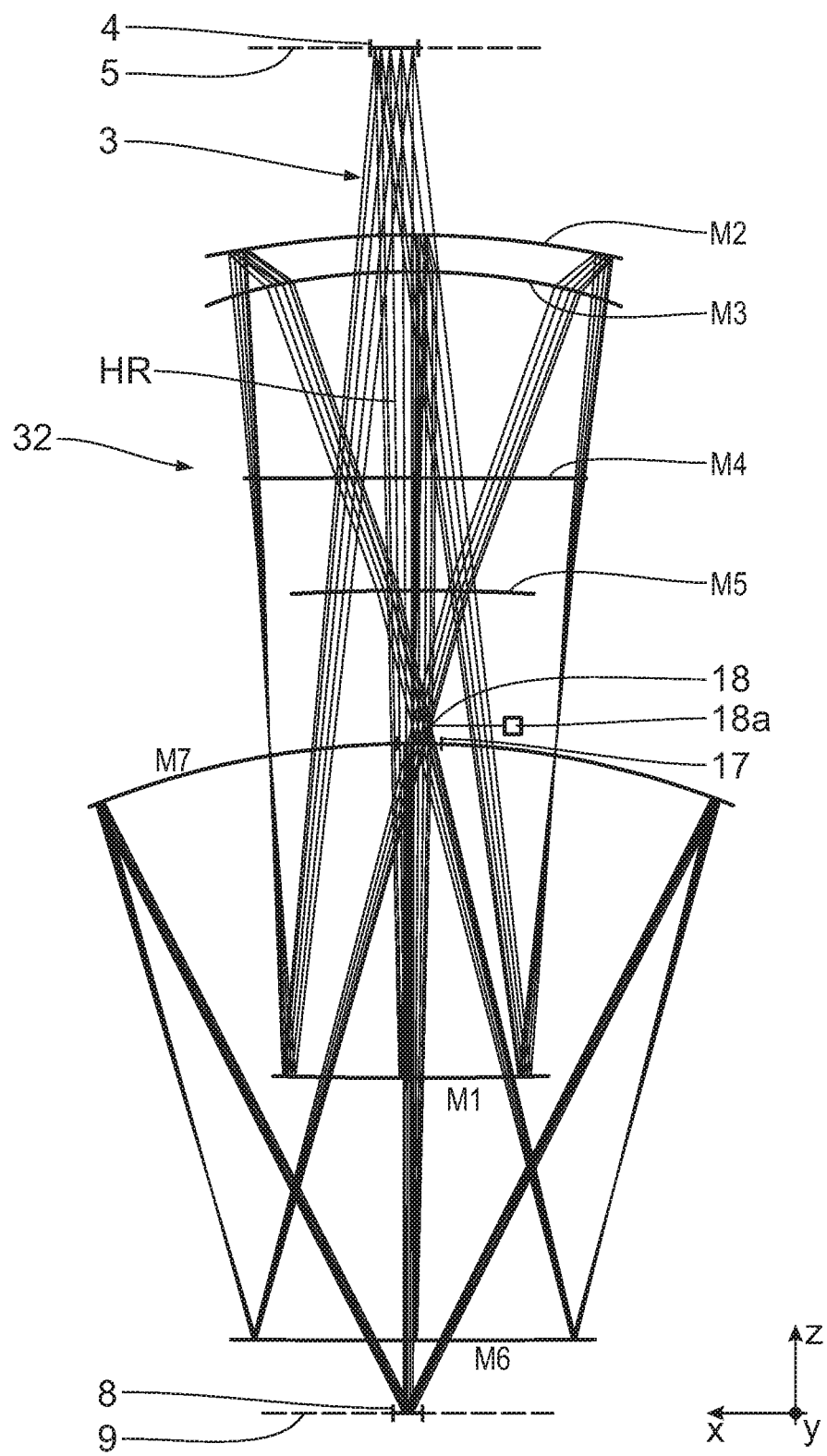
Figure 31:
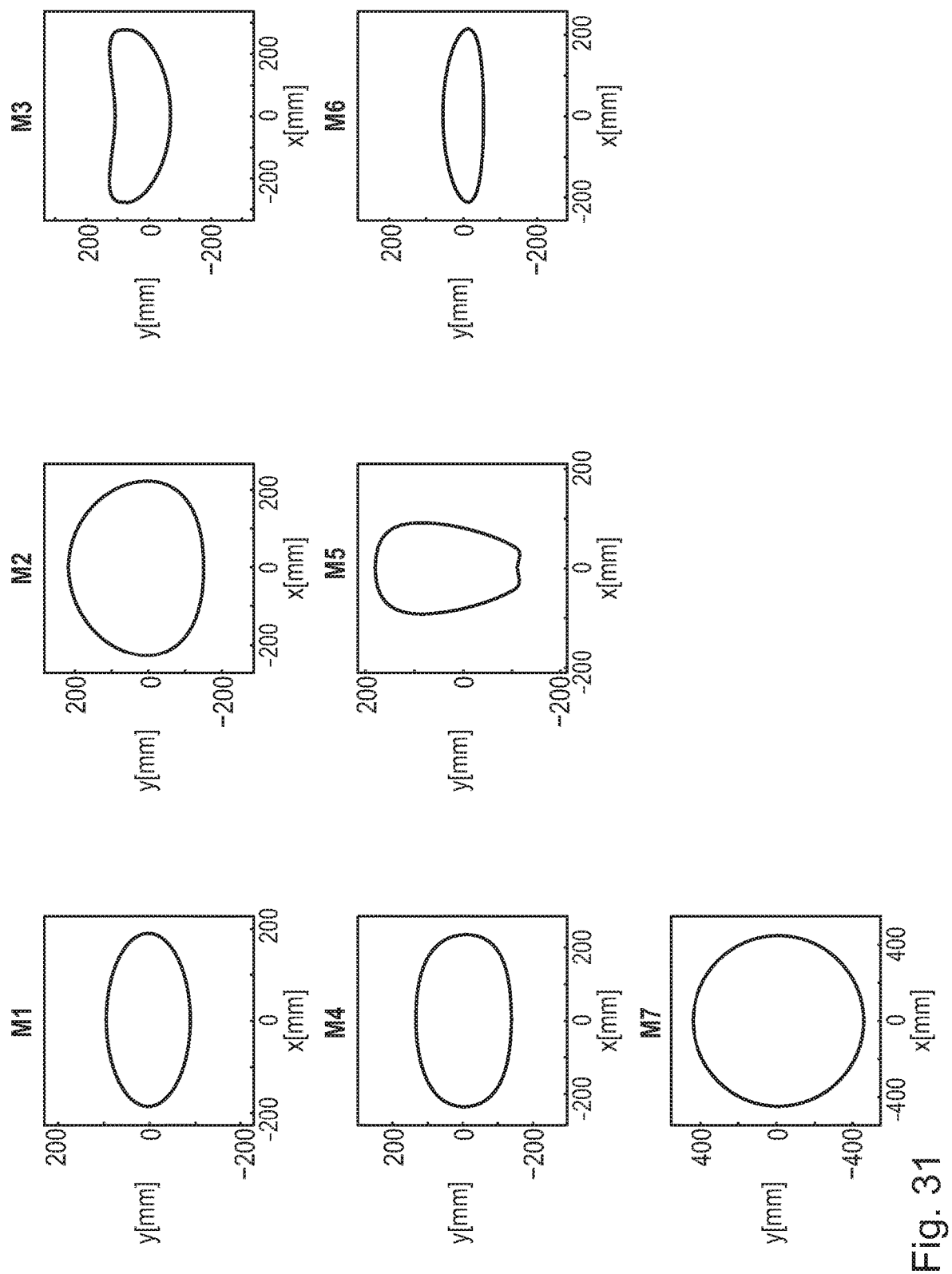

A further embodiment of a projection optical unit 32, which can be used in the projection exposure apparatus 1 according to FIG. 1 instead of the projection optical unit 7, is explained in the following text on the basis of FIGS. 29 to 31. Components and functions which were already explained above in the context of FIGS. 1 to 28 are denoted, where applicable, by the same reference signs and are not discussed again in detail.

Figure 29:
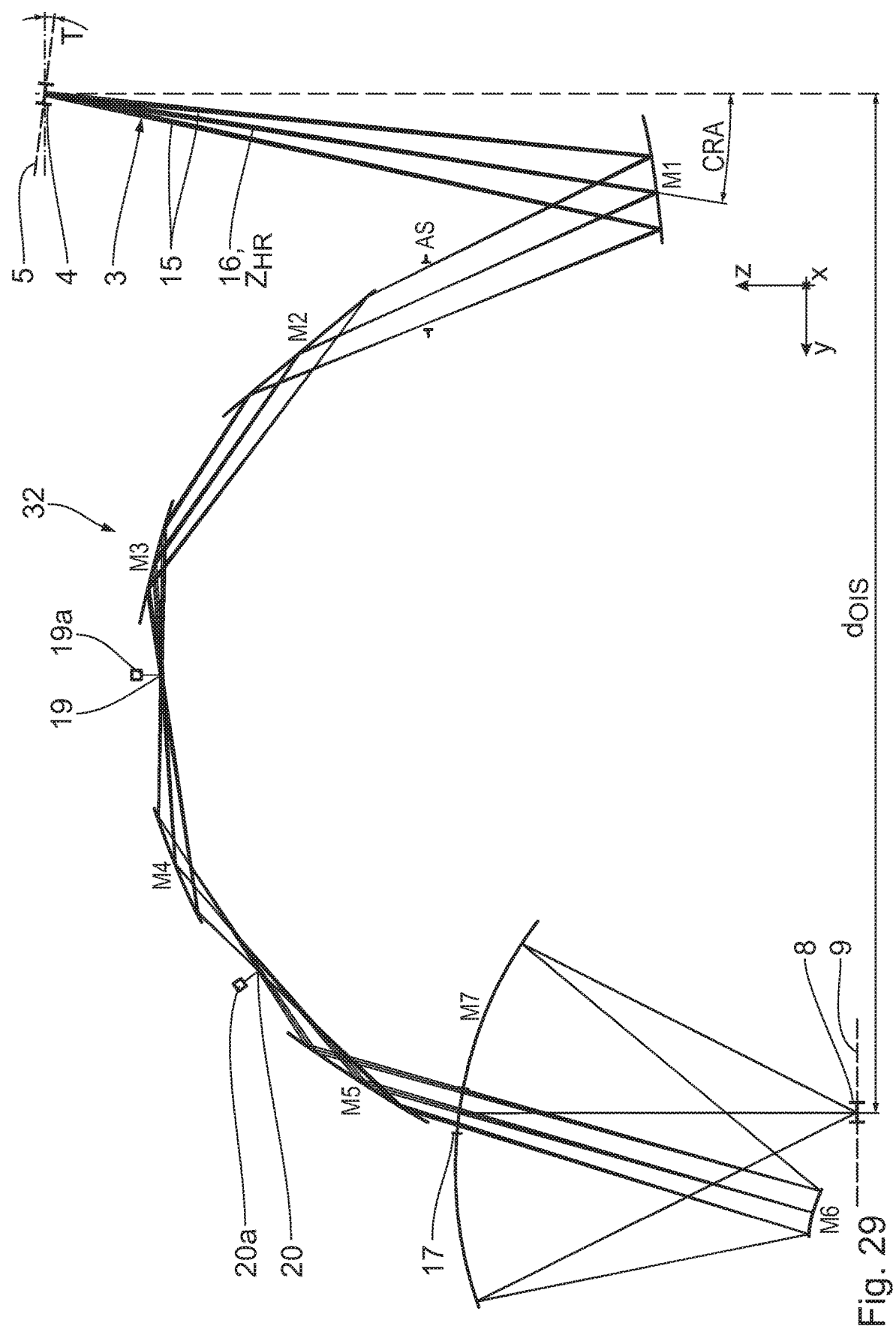

FIG. 29 shows a meridional section of the projection optical unit 32. FIG. 30 shows a sagittal view of the projection optical unit 32. FIG. 31 shows, once again, the boundary contours of the reflection surfaces of the seven mirrors M1 to M7 of the projection optical unit 32.

The projection optical unit 32 has three NI mirrors, namely the mirrors M1, M6 and M7. The projection optical unit 32 has four GI mirrors, namely the mirrors M2 to M5.

The mirrors M2 to M5 all have the same direction in terms of the mirror deflection effect. In this respect, the projection optical unit 32 is similar to the projection optical unit 26 according to FIGS. 14 to 16.

The mirrors M1 to M7 are once again embodied as free-form surface mirrors, for which the free-form surface equation (1), specified above, applies.

The following table once again shows the mirror parameters of mirrors M1 to M7 of the projection optical unit 32.

|  | M1 | M2 | M3 | M4 | M5 | M6 | M7 |
|---|---|---|---|---|---|---|---|
| Maximum angle of incidence [°] | 17.4 | 76.8 | 74.4 | 73.1 | 77.0 | 14.7 | 8.0 |
| Extent of the reflection surface in the x-direction [mm] | 376.0 | 475.6 | 562.6 | 479.7 | 181.9 | 468.4 | 902.7 |
| Extent of the reflection surface in the y-direction [mm] | 182.5 | 372.5 | 198.5 | 263.3 | 288.3 | 109.2 | 874.7 |
| Maximum mirror diameter [mm] | 376.1 | 476.1 | 562.6 | 479.7 | 294.6 | 468.4 | 903.2 |

Six of the mirrors M1 to M7 of the projection optical unit 32 have a y/x-aspect ratio that is less than 1. The y/x-aspect ratio of the mirror M5 is less than 1.6.

The last mirror M7 in the imaging beam path has the largest maximum diameter, measuring 903.2 mm. The maximum diameters of all other mirrors M1 to M6 are less than 600 mm. Five of the seven mirrors have a maximum diameter that is less than 500 mm.

Once again, the projection optical unit 32 has exactly one first plane intermediate image 18 in the region of the passage opening 17 in the mirror M7 and two second plane intermediate images 19, 20. The first of the two second plane intermediate images 19 lies between the mirrors M3 and M4 in the imaging beam path. The second of the two second plane intermediate images 20 lies between the mirrors M4 and M5 in the imaging beam path.

An image-side numerical aperture of the projection optical unit 32 is 0.45. The reduction factor $\beta_x$ in the first imaging light plane xz is 4. The reduction factor $\beta_y$ in the second imaging light plane yz is 8.

An object-side chief ray angle CRA is 5.2°. An object-image offset $d_{OIS}$ is approximately 2470 mm.

A working distance between the mirror M7 closest to the wafer and the image plane 9 is 87 mm. A mean wavefront aberration rms is 30.60 mλ.

The aperture stop AS is arranged in the imaging light beam path between the mirrors M1 and M2 in the projection optical unit 32. The imaging light beam is completely accessible in the region of the aperture stop AS.

A further embodiment of a projection optical unit 33, which can be used in the projection exposure apparatus 1 according to FIG. 1 instead of the projection optical unit 7, is explained in the following text on the basis of FIGS. 32 and 34. Components and functions which were already explained above in the context of FIGS. 1 to 31 are denoted, where applicable, by the same reference signs and are not discussed again in detail.

Figure 32:
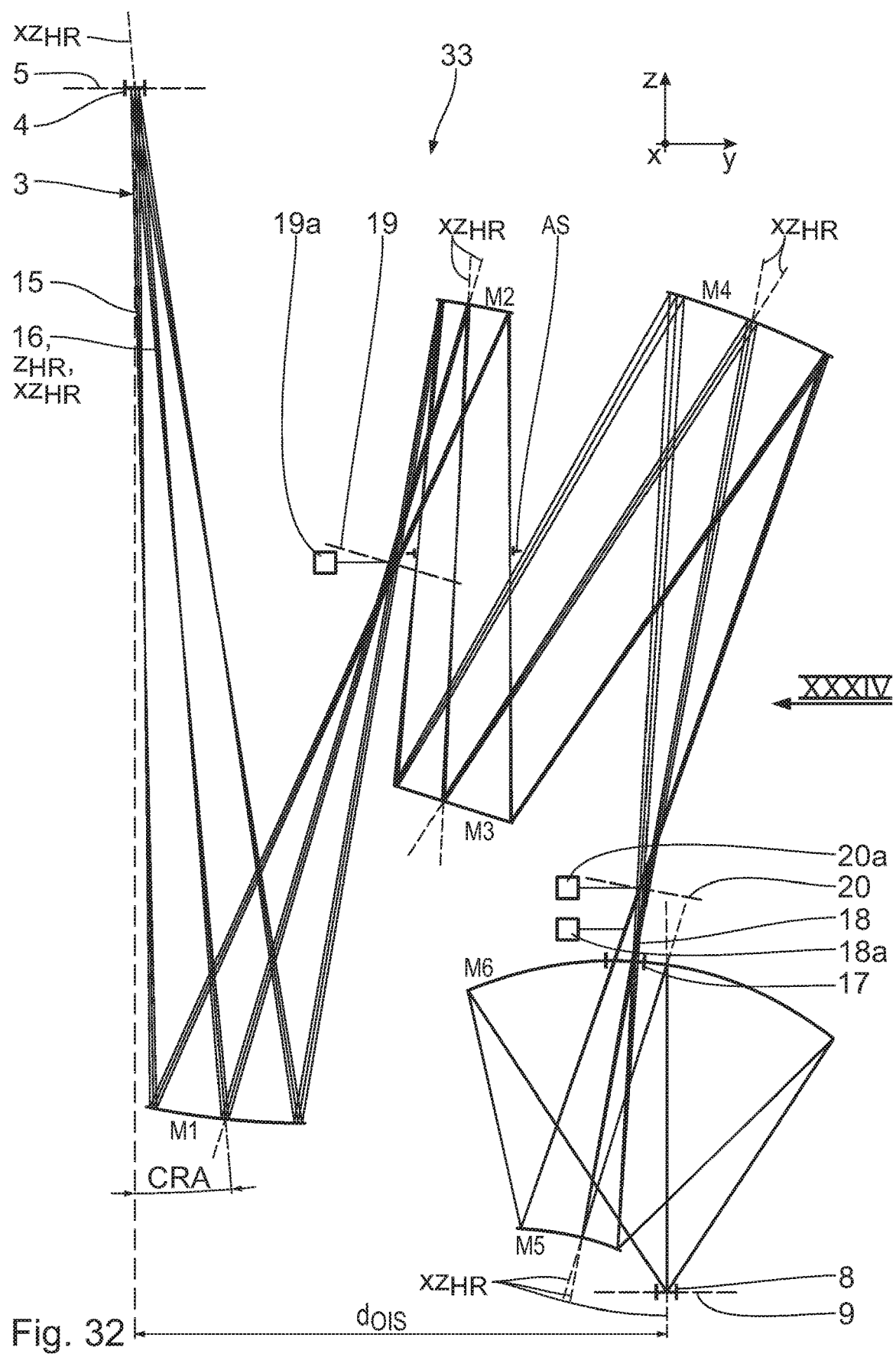
FIG. 32 shows, in a meridional section, an embodiment of an imaging optical unit which can be used as a projection lens in the projection exposure apparatus according to FIG. 1, wherein an imaging beam path for chief rays and for an upper coma ray and a lower coma ray of two selected field points is depicted.
Figure 34:
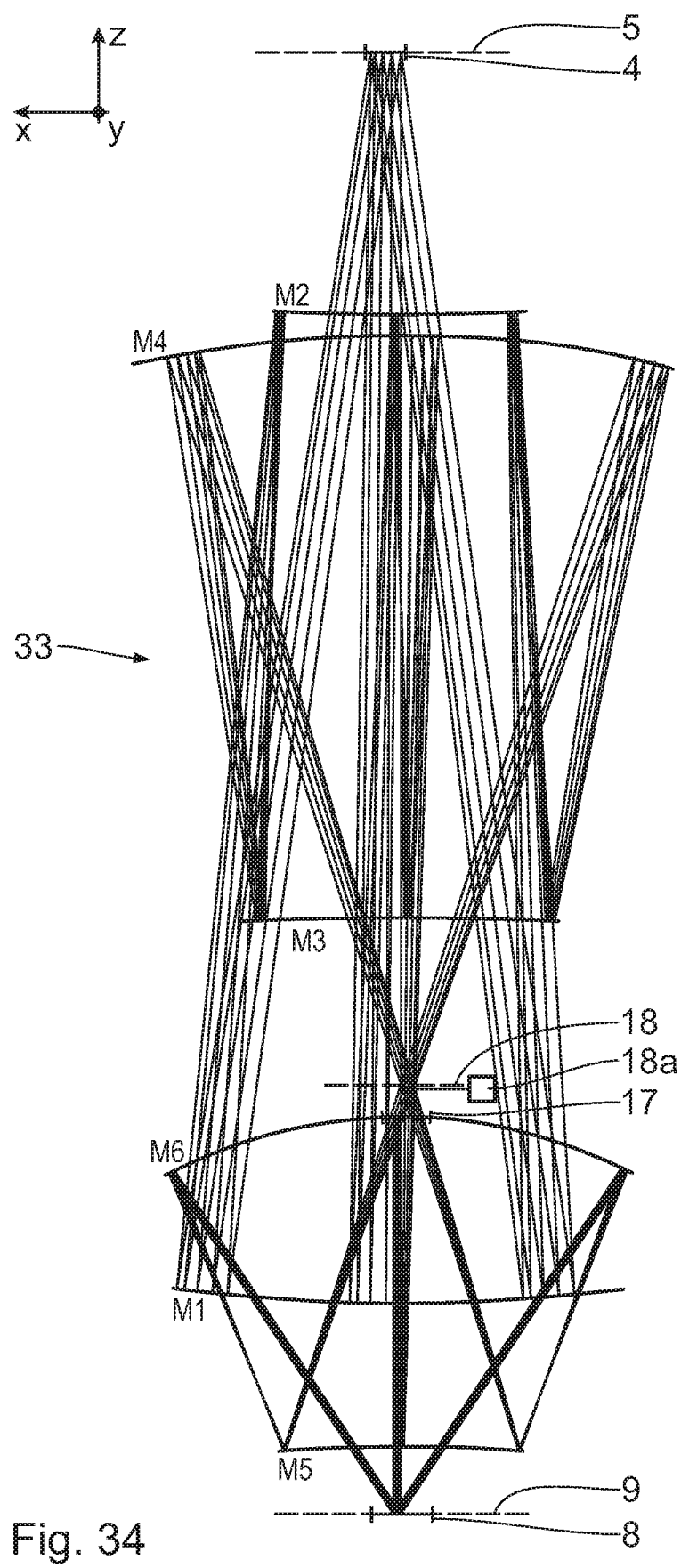
FIG. 34 shows a view from viewing direction XXXIV in FIG. 32.

The projection optical unit 33 according to FIGS. 32 and 34 reduces by a factor of 4 in the sagittal plane xz and by a factor of 8 in the meridional plane yz.

FIG. 32 shows the projection optical unit 33 in a meridional section, i.e. the beam path of the imaging light 3 (cf. individual rays 15 in FIG. 2) in the yz plane. FIG. 34 shows the projection optical unit 33 in a view in which the individual rays 15 are projected onto the xz plane, i.e. in a sagittal view. The meridional plane yz is also referred to as the second imaging light plane. A first imaging light plane $xz_{HR}$ is the plane which is spanned at the respective location of the beam path of the imaging light 3 by the first Cartesian object field coordinate x and a current imaging light main propagation direction $z_{HR}$. The imaging light main propagation direction $z_{HR}$ is the beam direction of a chief ray 16 of a central field point. As a rule, this imaging light main propagation direction $z_{HR}$ changes at each mirror reflection at the mirrors M1 to M6. This change can be described as a tilt of the current imaging light main propagation direction $z_{HR}$ about the first Cartesian object field coordinate x about a tilt angle which equals the deflection angle of this chief ray 16 of the central field point at the respectively considered mirror M1 to M6. The respective first imaging light planes $xz_{HR}$ are indicated by dashed lines in FIG. 32 and are perpendicular to the plane of the drawing (yz plane) in each case.

Subsequently, the first imaging light playing $xz_{HR}$ is also referred to as first imaging light plane xz for simplification purposes.

The second imaging light plane yz likewise contains the imaging light main propagation direction $z_{HR}$ and is perpendicular to the first imaging light plane $xz_{HR}$.

Since the projection optical unit 33 is only folded in the meridional plane yz, the second imaging light plane yz coincides with the meridional plane.

FIG. 32 depicts the beam path of in each case three individual rays 15 emanating from three object field points which are spaced apart from one another in the y-direction in FIG. 32. What is depicted are the chief rays 16, i.e. the individual rays 15 which pass through the center of a pupil in a pupil plane of the projection optical unit 33, and in each case an upper coma ray and a lower coma ray of these two object field points. Proceeding from the object field 4, the chief rays 16 include an angle CRA of 5.2° with a normal of the object plane 5.

The object plane 5 lies parallel to the image plane 9.

The projection optical unit 33 has an image-side numerical aperture of 0.55.

The projection optical unit 33 according to FIG. 32 has a total of six mirrors, which, proceeding from the object field 4, are numbered M1 to M6 in the sequence of the beam path of the individual rays 15.

FIG. 32 depicts sections of the calculated reflection surfaces of the mirrors M1 to M6. A portion of these calculated reflection surfaces is used. Only this actually used region of the reflection surfaces, plus an overhang, is actually present in the real mirrors M1 to M6. These used reflection surfaces are carried in a known manner by mirror bodies.

In the projection optical unit 33 according to FIG. 32, all mirrors M1 to M6 are configured as mirrors for normal incidence, that is to say as mirrors onto which the imaging light 3 impinges with an angle of incidence that is smaller than 45°. Thus, overall, the projection optical unit 7 according to FIG. 32 has six mirrors M1 to M6 for normal incidence. These mirrors for normal incidence are also referred to as NI (normal incidence) mirrors.

The projection optical unit 7 does not have a mirror for grazing incidence (GI mirror, grazing incidence mirror).

In principle, all described exemplary embodiments of the projection optical units can be mirrored about a plane extending parallel to the xz-plane without this changing fundamental imaging properties in the process.

The mirrors M1 to M6 carry a coating that optimizes the reflectivity of the mirrors M1 to M6 for the imaging light 3. These highly reflective layers can be embodied as multi-ply layers, where successive layers can be manufactured from different materials. Alternating material layers can also be used. A typical multi-ply layer can have fifty bilayers, respectively made of a layer of molybdenum and a layer of silicon. These may contain additional separation layers made of e.g. C (carbon), $B_4C$ (boron carbide) and can be terminated by a protective layer or a protective layer system toward the vacuum.

Further information in respect of the reflectivity of NI mirrors (normal incidence mirrors) can be found in DE 101 55 711 A.

An overall reflectivity or system transmission of the projection optical unit 33, emerging as a product of the reflectivities of all mirrors M1 to M8 of the projection optical unit 33, is approximately R=7.0%.

The mirror M6, that is to say the last mirror upstream of the image field 8 in the imaging beam path, has a passage opening 17 for the passage of the imaging light 3 which is reflected from the antepenultimate mirror M4 toward the penultimate mirror M5. The mirror M6 is used in a reflective manner around the passage opening 17. None of the other mirrors M1 to M5 have passage openings and the mirrors are used in a reflective manner in a continuous region without gaps.

In the first imaging light plane xz, the projection optical unit 33 has exactly one first plane intermediate image 18 in the imaging light beam path between the mirrors M4 and M5. This first plane intermediate image 18 lies in the region of the passage opening 17. A distance between the passage opening 17 and the image field 8 is more than four times greater than a distance between the passage opening 17 and the first plane intermediate image 18.

In the second imaging light plane yz that is perpendicular to the first imaging light plane xz, the imaging light 3 passes through exactly two second plane intermediate images 19 and 20. The first of these two second plane intermediate images 19 lies between the mirrors M1 and M2 in the imaging light beam path. The other one of the two second plane intermediate images 20 lies between the mirrors M4 and M5 in the imaging light beam path, in the region of the first plane intermediate image 18. Thus, both the first plane intermediate image 18 and the second plane intermediate image 20 lie in the region of the passage opening 17 in the mirror M6. The entire beam of the imaging light 3 has a small diameter at the location of the passage opening 17. Accordingly, the diameter of the passage opening 17 can be selected to be small without curtailing the imaging light 3 in the partial beam path between the mirrors M4 and M5.

The number of the first plane intermediate images, i.e. exactly one first plane intermediate image in the projection optical unit 33, and the number of the second plane intermediate images, i.e. exactly two second plane intermediate images in the projection optical unit 33, differ from one another in the projection optical unit 33. In the projection optical unit 33, this number of intermediate images differs by exactly one.

The second imaging light plane yz, in which the greater number of intermediate images, namely the two second plane intermediate images 19 and 20, are present, coincides with the folding plane yz of the mirrors M1 to M6. This folding plane is the plane of incidence of the chief ray 16 of the central field point upon reflection at the respective mirror M1 to M6. The second plane intermediate images are not, as a rule, perpendicular to the chief ray 16 of the central field point which defines the imaging light main propagation direction $z_{HR}$. An intermediate image tilt angle, i.e. a deviation from this perpendicular arrangement, is arbitrary as a matter of principle and may lie between 0° and +/−89°.

Auxiliary devices 18a, 19a, 20a can be arranged in the region of the intermediate images 18, 19, 20. These auxiliary devices 18a to 20a can be field stops for defining, at least in sections, a boundary of the imaging light beam. A field intensity prescription device in the style of an UNICOM, in particular with finger stops staggered in the x-direction, can also be arranged in one of the intermediate image planes of the intermediate images 18 to 20.

The mirrors M1 to M6 are embodied as free-form surfaces which cannot be described by a rotationally symmetric function. Other embodiments of the projection optical unit 33, in which at least one of the mirrors M1 to M6 is embodied as a rotationally symmetric asphere, are also possible. An asphere equation for such a rotationally symmetric asphere is known from DE 10 2010 029 050 A1. It is also possible for all mirrors M1 to M6 to be embodied as such aspheres.

The following table summarizes the parameters "maximum angle of incidence", "extent of the reflection surface in the x-direction", "extent of the reflection surface in the y-direction" and "maximum mirror diameter" for the mirrors M1 to M6 of the projection optical unit 33:

|  | M1 | M2 | M3 | M4 | M5 | M6 |
|---|---|---|---|---|---|---|
| Maximum angle of incidence [°] | 12.7 | 12.5 | 17.5 | 13.5 | 22.0 | 10.9 |
| Extent of the reflection surface in the x-direction [mm] | 763.7 | 426.9 | 524.9 | 913.0 | 407.7 | 793.7 |
| Extent of the reflection surface in the y-direction [mm] | 315.7 | 148.3 | 256.7 | 354.4 | 206.6 | 767.7 |
| Maximum mirror diameter [mm] | 763.9 | 426.9 | 524.9 | 913.0 | 407.8 | 793.8 |

A maximum angle of incidence of the imaging light on all mirrors M1 to M6 is less than 25°. This maximum angle of incidence is present on the mirror M5 and is 22.0°.

The maximum angle of incidence of the imaging light 3 on the first four mirrors M1 to M4 in the imaging light beam path downstream of the object field 4 is less than 20°. This largest angle of incidence on the first four mirrors M1 to M4 is present on the mirror M3 and is 17.5°.

A y/x-aspect ratio deviates most strongly from the value of 1 at the mirrors M4 of the mirrors M1 to M6 of the projection optical unit 33 and there it has a value of approximately 1:2.6. In all other mirrors, the y/x-aspect ratio lies in the range between 1:1 and 1:2.5. An x/y-aspect ratio of the mirrors M1 to M4 is greater than 2:1 in each case.

The mirror M4 has the largest maximum mirror diameter with a diameter of 913 mm. None of the other mirrors M1 to M3, M5, M6 have a maximum diameter which is greater than 800 mm.

A pupil-defining aperture stop AS is arranged in the imaging light beam path between the mirrors M2 and M3 in the projection optical unit 33. In the region of the aperture stop AS, the entire imaging light beam is accessible over its entire circumference. The aperture stop AS restricts the entire external cross section of the entire imaging light beam. The aperture stop AS is arranged spatially adjacent to the second plane intermediate image 19. This arrangement renders it possible to fold the imaging light partial beam between the mirrors M1 and M2 little in relation to the imaging light partial beam between the mirrors M2 and M3, and so a correspondingly low maximum angle of incidence of the entry rays of the imaging light 3 on the mirror M2 results.

The optical design data from the reflection surfaces of the mirrors M1 to M6 from the projection optical unit 33 can be gathered from the following tables, which, in terms of their design, correspond to the tables for the projection optical unit 7 according to FIG. 2.

TABLE 1 for FIG. 32

| Exemplary embodiment | FIG. 32 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.025 mm |
| Field curvature | 0.012055 1/mm |
| rms | 14.8 ml |
| Stop | AS |

TABLE 2 for FIG. 32

| Surface | Radius_x[mm] | Power_x[1/mm] | Radius_y[mm] | Power_y[1/mm] | Operating mode |
|---|---|---|---|---|---|
| M6 | −858.8749765 | 0.0023024 | −737.8428816 | 0.0027415 | REFL |
| M5 | 11682.0944369 | −0.0001709 | 534.1551388 | −0.0037506 | REFL |
| M4 | −1809.2188844 | 0.0010846 | −1922.0843519 | 0.0010605 | REFL |
| M3 | 6440.5662221 | −0.0003000 | −50750.8327561 | 0.0000408 | REFL |
| M2 | 4674.6964470 | −0.0004248 | −1689.0780794 | 0.0011926 | REFL |
| M1 | −3024.6211530 | 0.0006495 | −1563.8351466 | 0.0013020 | REFL |

TABLE 3a for FIG. 32

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −858.87497650 | 11682.09444000 | −1809.21888400 |
| C7 | −1.75601165e−08 | 9.76351323e−07 | 9.24894814e−09 |
| C9 | 4.12151659e−08 | −1.56366742e−06 | −1.30495858e−08 |
| C10 | −2.3717266e−11 | 4.05325511e−10 | −5.79972529e−12 |
| C12 | −7.77186732e−11 | 8.75399624e−10 | −3.79452218e−12 |
| C14 | −9.96610891e−12 | 4.36073106e−09 | −4.96523891e−13 |
| C16 | −4.78999259e−14 | 1.32627983e−12 | 3.34101424e−15 |
| C18 | 3.80178838e−14 | 2.2544009e−12 | −4.32759723e−15 |
| C20 | 6.511239e−14 | −1.98197357e−11 | 1.12275782e−14 |
| C21 | −3.92631731e−17 | 5.49613894e−16 | −2.56249544e−18 |
| C23 | −1.90245505e−16 | 4.01086987e−15 | −4.40565287e−18 |
| C25 | −1.74273842e−16 | −1.5885968e−14 | 8.76955689e−18 |
| C27 | −2.10056418e−17 | 7.29644441e−14 | −4.39478392e−17 |
| C29 | −6.92447499e−20 | 7.26806853e−19 | −1.16221193e−21 |
| C31 | −9.67320853e−22 | −9.07342399e−18 | 2.09560033e−20 |
| C33 | 1.58051548e−19 | 8.64687575e−17 | 9.71341566e−20 |
| C35 | 1.31073342e−19 | −6.14527486e−16 | 1.0702907e−19 |
| C36 | −7.37235909e−23 | 1.62385505e−21 | −1.65841605e−24 |
| C38 | −3.82619485e−22 | −2.24043808e−21 | −2.45488766e−24 |
| C40 | −6.28798296e−22 | 9.40837613e−20 | −4.20470613e−23 |
| C42 | −3.62609295e−22 | −1.26850842e−18 | 3.32122136e−22 |
| C44 | −1.13486477e−23 | 2.74573501e−18 | 1.21683021e−22 |
| C46 | −1.37331048e−25 | 4.2081407e−23 | 5.7969842e−27 |
| C48 | −1.47293299e−25 | 2.88686689e−22 | −2.23585834e−26 |
| C50 | 2.07891229e−25 | −2.45657195e−22 | −8.67407678e−25 |
| C52 | 5.16694591e−25 | 4.84753531e−21 | −2.97297137e−24 |
| C54 | 2.27538477e−25 | 6.32501824e−21 | −1.05704009e−23 |
| C55 | −3.24119108e−29 | −3.08147298e−26 | 5.64088431e−30 |
| C57 | −6.41610415e−28 | 3.57346972e−25 | −2.00859294e−29 |
| C59 | −1.69412665e−27 | 2.06843583e−24 | −9.52490119e−29 |
| C61 | −1.72411595e−27 | −2.47503441e−24 | 1.97416699e−27 |

TABLE 3a-continued for FIG. 32

| Coefficient | M6 | M5 | M4 |
|---|---|---|---|
| C63 | −5.7995256e−28 | 4.01267717e−23 | −3.83090877e−26 |
| C65 | −1.635162e−29 | −4.62428375e−23 | 1.21532476e−25 |
| C67 | 1.22726086e−31 | −1.2494157e−27 | −6.17049136e−32 |
| C69 | 2.84133671e−31 | −5.44453482e−27 | −7.76588296e−31 |
| C71 | 4.44381319e−31 | −3.78606642e−26 | −2.18932157e−31 |
| C73 | 1.77800746e−30 | −4.15333379e−26 | 1.78648032e−29 |
| C75 | 1.6160079e−30 | −1.24201006e−25 | 3.46971259e−29 |
| C77 | 3.10049067e−31 | −3.13835508e−25 | −2.00008177e−29 |
| C78 | −4.00765463e−34 | 3.71999699e−31 | −2.61982192e−35 |
| C80 | −2.12693373e−33 | −8.2624255e−30 | 5.31477481e−34 |
| C82 | −4.00467472e−33 | −9.39873312e−29 | 8.16603132e−33 |
| C84 | −6.27063161e−33 | −1.0314431e−28 | 1.14008163e−32 |
| C86 | −3.54293249e−33 | 9.4886599e−28 | −3.12780164e−32 |
| C88 | −9.29818695e−34 | −5.58939473e−27 | 2.06573781e−30 |
| C90 | −7.896513e−34 | −1.32131239e−27 | −6.03635915e−30 |
| C92 | −5.73838546e−37 | 1.70280303e−32 | 2.4443233e−37 |
| C94 | −3.39136484e−36 | 9.34845871e−32 | 5.29050095e−36 |
| C96 | −2.86917081e−36 | 5.06073109e−31 | 3.61960832e−35 |
| C98 | 5.07534678e−37 | 3.15612468e−30 | 4.788554298e−35 |
| C100 | −2.99347712e−36 | −6.44314e−30 | 5.76086779e−35 |
| C102 | −1.31255149e−36 | 3.67811047e−29 | 4.76487931e−34 |
| C104 | 1.74787841e−36 | −1.59011113e−29 | 2.31589865e−32 |
| C105 | −1.31762349e−40 | 1.09344483e−36 | 5.14787253e−41 |
| C107 | 3.54057177e−39 | 1.10846109e−34 | −2.64963079e−39 |
| C109 | −1.78073131e−39 | 1.72014461e−33 | −6.49527987e−38 |
| C111 | −1.55177824e−39 | 3.05219736e−33 | −3.04866424e−37 |
| C113 | 9.44170173e−40 | −1.606718e−32 | 3.01731009e−37 |
| C115 | −6.64945728e−39 | −5.29558524e−33 | 6.40489097e−37 |
| C117 | −3.11940525e−39 | 7.18345117e−32 | −4.90591508e−35 |
| C119 | 5.50110677e−39 | 7.25898814e−31 | 6.03700342e−35 |
| C121 | −9.71158605e−43 | −6.95775525e−38 | −3.26101881e−43 |
| C123 | 7.23217134e−43 | −3.34409103e−37 | −1.06619266e−41 |
| C125 | −5.69478444e−43 | −2.68711867e−36 | −1.08286695e−40 |
| C127 | 1.01640903e−41 | −1.59432765e−35 | −5.65210621e−40 |
| C129 | 3.54945098e−41 | −6.92583272e−35 | −6.24703952e−40 |
| C131 | 5.75167037e−41 | 1.44445437e−34 | −5.42019444e−39 |
| C133 | 3.08126364e−41 | −1.06727558e−33 | −1.50612862e−38 |
| C135 | 2.19317005e−42 | −4.78626916e−33 | −4.47539966e−37 |
| C136 | −2.9364696e−46 | −2.35545286e−41 | −3.64930823e−47 |
| C138 | −1.90854146e−44 | −2.28045861e−40 | 4.04460613e−45 |
| C140 | −4.87396267e−44 | −1.12315129e−38 | 1.50547812e−43 |
| C142 | −1.22392623e−43 | −5.18269145e−39 | 1.08187079e−42 |
| C144 | −1.5701492e−43 | 8.12616097e−38 | 2.14893577e−42 |
| C146 | −1.41544082e−43 | 7.94029513e−37 | −2.09572031e−41 |
| C148 | −4.16578745e−44 | −1.02187357e−37 | −5.68091764e−42 |
| C150 | −4.93563592e−45 | 2.08165148e−36 | 4.3697037e−40 |
| C152 | −1.23605467e−44 | 9.57945472e−36 | 5.32462749e−40 |

TABLE 3b for FIG. 32

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | 6440.56622200 | 4674.69644700 | −3024.62115300 |
| C7 | −2.75621082e−08 | 1.33344077e−07 | 8.13680852e−09 |
| C9 | 2.13772967e−07 | −4.88439323e−07 | −5.25766875e−08 |
| C10 | 9.05428093e−11 | 2.4651278e−10 | −4.04575459e−12 |
| C12 | 9.97338804e−11 | 3.42470844e−10 | −1.29491379e−11 |
| C14 | 8.68032839e−11 | 7.31944141e−10 | 7.96400769e−12 |
| C16 | −2.05047244e−13 | −1.75843577e−13 | 5.544904e−16 |
| C18 | 1.34167844e−13 | −1.38921296e−12 | −7.29182129e−15 |
| C20 | 1.73209287e−13 | −1.66984422e−12 | 3.01026401e−14 |
| C21 | 9.16122712e−17 | 4.83036548e−16 | −8.06064519e−19 |
| C23 | −1.09772479e−16 | 1.07200979e−15 | −1.50707101e−18 |
| C25 | −7.56588666e−16 | 5.73756053e−15 | −8.45373733e−18 |
| C27 | −1.67309364e−15 | 4.42677763e−15 | 3.25143759e−17 |
| C29 | 2.16545447e−19 | −1.13834484e−18 | −9.71555651e−22 |
| C31 | −5.68407901e−19 | −8.59930026e−18 | 1.00947506e−21 |
| C33 | −6.38803875e−18 | −1.94419133e−17 | −2.20716112e−20 |

TABLE 3b-continued for FIG. 32

| Coefficient | M3 | M2 | M1 |
|---|---|---|---|
| C35 | −6.0317108e−18 | −1.84553665e−16 | −9.50209226e−19 |
| C36 | 4.37147715e−22 | 8.94388533e−22 | 3.17263448e−25 |
| C38 | −2.31254227e−22 | 5.73932727e−21 | −5.13351486e−24 |
| C40 | −4.04758904e−21 | 1.11881151e−20 | 3.52315788e−23 |
| C42 | −3.17472839e−20 | 3.32163198e−19 | 6.48990287e−22 |
| C44 | −9.85162714e−20 | 1.8034724e−18 | 7.74038563e−21 |
| C46 | −4.1324221e−20 | 1.07264182e−23 | 6.57538448e−21 |
| C48 | −1.08450683e−23 | 1.14076514e−22 | −1.23024327e−27 |
| C50 | 3.68038057e−23 | 1.77193073e−21 | −5.48205165e−26 |
| C52 | 2.16095044e−22 | 6.33924939e−21 | −2.14983022e−24 |
| C54 | 2.41539568e−22 | 3.18513118e−20 | 4.11656476e−23 |
| C55 | −5.4475152e−27 | 8.76303942e−27 | −2.46528392e−30 |
| C57 | 8.2180888e−27 | −4.28356923e−26 | 1.32430341e−28 |
| C59 | 1.53403997e−25 | −9.18224618e−25 | −1.73597019e−28 |
| C61 | 4.03258962e−25 | 2.60047232e−24 | −4.7745939e−27 |
| C63 | 3.53575651e−24 | −7.63901326e−23 | −6.04547381e−26 |
| C65 | 8.31549041e−24 | −4.35078172e−22 | −7.54618751e−25 |
| C67 | 9.87087274e−29 | −3.56838335e−28 | −8.88835362e−32 |

TABLE 3b-continued for FIG. 32

| Coefficient | M3 | M2 | M1 |
|---|---|---|---|
| C69 | 6.42776984e−28 | −2.84407951e−27 | −5.61337491e−31 |
| C71 | 1.01602965e−27 | −4.57862438e−26 | −4.00758063e−30 |
| C73 | 1.41613033e−30 | −6.37072226e−25 | 9.87094819e−30 |
| C75 | 4.43477538e−27 | −1.92873559e−24 | 1.24431428e−28 |
| C77 | 5.64483223e−27 | −2.99431785e−24 | −1.94178739e−27 |
| C78 | 6.57189519e−32 | −3.55474086e−32 | 4.93765851e−36 |
| C80 | −3.95411808e−31 | −6.34983549e−32 | −1.37798134e−33 |
| C82 | −6.45360265e−30 | 5.97194435e−30 | −1.79738233e−33 |
| C84 | −1.76221617e−29 | −3.4243908e−28 | 9.45814317e−32 |
| C86 | −4.93632546e−29 | −2.90233773e−27 | 4.84143104e−31 |
| C88 | −3.47366201e−28 | 1.64734281e−26 | 2.85035612e−30 |
| C90 | −5.69693718e−28 | 8.7332442e−26 | 3.51411701e−29 |
| C92 | −9.41428626e−34 | 4.07301235e−33 | 4.99363876e−37 |
| C94 | −9.52828137e−33 | 3.91076643e−32 | 6.51134396e−36 |
| C96 | −4.03443132e−32 | 6.72956002e−31 | 4.31274648e−35 |
| C98 | −8.16791536e−32 | 1.07442969e−29 | 2.93394382e−34 |
| C100 | −5.06109148e−31 | 1.46674302e−28 | −1.25604389e−33 |
| C102 | −2.27324283e−30 | 4.12153973e−28 | −4.12484361e−33 |
| C104 | −3.25497507e−30 | 3.17476096e−28 | 7.96225335e−32 |
| C105 | −2.84264594e−37 | −8.01264065e−37 | 6.15642053e−41 |
| C107 | 4.14759235e−36 | 2.17790829e−35 | 6.4351619e−39 |
| C109 | 1.13957341e−34 | 3.89579308e−34 | 2.3184794e−38 |
| C111 | 3.64220606e−34 | 1.62536408e−32 | −7.22249316e−37 |
| C113 | 4.64657733e−34 | 1.53002667e−31 | −5.7129879e−36 |
| C115 | 2.88642202e−34 | 1.00791788e−30 | −2.03780388e−35 |
| C117 | 7.44826089e−33 | −4.72609071e−31 | −5.56109055e−35 |
| C119 | 1.00966682e−32 | −7.69819227e−30 | −6.86936805e−34 |
| C121 | 3.10161513e−39 | −1.4205369e−38 | −9.82000697e−43 |
| C123 | 4.61926649e−38 | −8.58182682e−38 | −2.14923463e−41 |
| C125 | 2.73215469e−37 | −4.42601259e−36 | −1.52471202e−40 |
| C127 | 9.55584866e−37 | −5.38081705e−35 | −1.039324e−39 |
| C129 | 4.89550473e−36 | −1.37871892e−33 | −4.79859802e−39 |
| C131 | 2.76267148e−35 | −1.46401094e−32 | 3.70949403e−38 |
| C133 | 1.08744782e−34 | −3.75359399e−32 | 5.38604799e−38 |
| C135 | 1.43759826e−34 | −3.76390962e−32 | −1.31857729e−36 |
| C136 | 3.12192213e−43 | 8.75181853e−42 | −2.53432908e−46 |
| C138 | −1.15972236e−41 | −2.91207673e−40 | −1.15659019e−44 |
| C140 | −6.88975315e−40 | −6.99129714e−39 | −4.69836892e−44 |
| C142 | −2.90125414e−39 | −2.13001905e−37 | 1.46558091e−42 |
| C144 | −4.26224447e−39 | −2.15878626e−36 | 2.57968797e−41 |
| C146 | 2.12388457e−38 | −1.92354163e−35 | 8.70323809e−41 |
| C148 | 1.00587068e−37 | −1.25257261e−34 | 3.0826717e−40 |
| C150 | 2.69054759e−37 | −1.60142154e−34 | 2.17287446e−40 |
| C152 | 3.45264757e−37 | 4.28993407e−35 | 3.7668963e−39 |

TABLE 4a for FIG. 32

| Surface | DCX | DCY | DCZ |
|---|---|---|---|
| Image | 0.00000000 | 0.00000000 | 0.00000000 |
| M6 | 0.00000000 | 0.00000000 | 680.26363148 |
| M5 | 0.00000000 | 175.01413342 | 115.40717146 |
| 0 | 0.00000000 | 67.03531830 | 696.81352059 |
| M4 | 0.00000000 | −177.89118720 | 2015.60763050 |
| M3 | 0.00000000 | 463.67514111 | 1019.61228072 |
| Stop | 0.00000000 | 437.35060541 | 1536.16364485 |
| M2 | 0.00000000 | 411.13780579 | 2050.52247554 |
| M1 | 0.00000000 | 916.20837074 | 360.59865458 |
| Object | 0.00000000 | 1103.19655335 | 2500.12593849 |

TABLE 4b for FIG. 32

| Surface | TLA [deg] | TLB [deg] | TLC [deg] |
|---|---|---|---|
| Image | −0.00000000 | 0.00000000 | −0.00000000 |
| M6 | 8.60749020 | 0.00000000 | −0.00000000 |
| M5 | 13.86804194 | 180.00000000 | 0.00000000 |
| Stop | 1.91361326 | 0.00000000 | −0.00000000 |
| M4 | 21.65427373 | 0.00000000 | −0.00000000 |
| M3 | 17.85241632 | 180.00000000 | 0.00000000 |
| AS | −1.32428889 | 0.00000000 | −0.00000000 |
| M2 | 9.77865522 | 0.00000000 | −0.00000000 |
| M1 | 5.82256804 | 180.00000000 | 0.00000000 |
| Object | 0.00521430 | 0.00000000 | −0.00000000 |

TABLE 5 for FIG. 32

| Surface | Angle of incidence [deg] | Reflectivity |
|---|---|---|
| M6 | 8.60749020 | 0.65767358 |
| M5 | 3.34693847 | 0.66458709 |
| M4 | 11.13317026 | 0.65184268 |
| M3 | 14.93502767 | 0.63931878 |
| M2 | 6.86126657 | 0.66070757 |
| M1 | 10.81735374 | 0.65267164 |
| Overall transmission | | 0.0785 |

TABLE 6 for FIG. 32

| X [mm] | Y [mm] | Z [mm] |
|---|---|---|
| −0.00000000 | −112.29771418 | 0.00000000 |
| −33.95300806 | −110.50829091 | 0.00000000 |
| −67.19709735 | −105.23305301 | 0.00000000 |
| −99.02112992 | −96.74222105 | 0.00000000 |
| −128.70836648 | −85.46276877 | 0.00000000 |
| −155.53408145 | −71.94865414 | 0.00000000 |
| −178.77033514 | −56.83454541 | 0.00000000 |
| −197.70656829 | −40.78032165 | 0.00000000 |
| −211.69220377 | −24.42406785 | 0.00000000 |
| −220.19846094 | −8.34604314 | 0.00000000 |
| −222.88505781 | 6.96008041 | 0.00000000 |
| −219.65050117 | 21.10835728 | 0.00000000 |
| −210.64850400 | 33.82750503 | 0.00000000 |
| −196.26500687 | 44.95249418 | 0.00000000 |
| −177.06410535 | 54.40979859 | 0.00000000 |
| −153.72103885 | 62.20042270 | 0.00000000 |
| −126.96076580 | 68.38008729 | 0.00000000 |
| −97.51311407 | 73.03741008 | 0.00000000 |
| −66.08745553 | 76.27157774 | 0.00000000 |
| −33.36449943 | 78.17125573 | 0.00000000 |
| −0.00000000 | 78.79727683 | 0.00000000 |
| 33.36449943 | 78.17125573 | 0.00000000 |
| 66.08745553 | 76.27157774 | 0.00000000 |
| 97.51311407 | 73.03741008 | 0.00000000 |
| 126.96076580 | 68.38008729 | 0.00000000 |
| 153.72103885 | 62.20042270 | 0.00000000 |
| 177.06410535 | 54.40979859 | 0.00000000 |
| 196.26500687 | 44.95249418 | 0.00000000 |
| 210.64850400 | 33.82750503 | 0.00000000 |
| 219.65050117 | 21.10835728 | 0.00000000 |
| 222.88505781 | 6.96008041 | 0.00000000 |
| 220.19846094 | −8.34604314 | 0.00000000 |
| 211.69220377 | −24.42406785 | 0.00000000 |
| 197.70656829 | −40.78032165 | 0.00000000 |
| 178.77033514 | −56.83454541 | 0.00000000 |
| 155.53408145 | −71.94865414 | 0.00000000 |
| 128.70836648 | −85.46276877 | 0.00000000 |
| 99.02112992 | −96.74222105 | 0.00000000 |
| 67.19709735 | −105.23305301 | 0.00000000 |
| 33.95300806 | −110.50829091 | 0.00000000 |

An overall reflectivity of the projection optical unit 33 is approximately 7.85%.

The reference axes of the mirrors are generally tilted with respect to a normal of the image plane 9, as is made clear by the tilt values in the tables.

The image field 8 has an x-extent of two-times 13 mm and a y-extent of 1 mm. The projection optical unit 33 is optimized for an operating wavelength of the illumination light 3 of 13.5 nm.

An edge of a stop surface of the stop (cf., also, table 6 for FIG. 32) emerges from intersection points on the stop surface of all rays of the illumination light 3 which, on the image side, propagate at the field center point in the direction of the stop surface with a complete image-side telecentric aperture. When the stop is embodied as an aperture stop, the edge is an inner edge.

The stop AS can lie in a plane or else have a three-dimensional embodiment. The extent of the stop AS can be smaller in the scan direction (y) than in the cross scan direction (x).

An installation length of the projection optical unit 33 in the z-direction, i.e. a distance between the object plane 5 and the image plane 9, is approximately 2500 mm.

In the projection optical unit 33, a pupil obscuration is 15% of the entire aperture of the entry pupil. Thus, less than 15% of the numerical aperture is obscured as a result of the passage opening 17. The obscuration edge is constructed in a manner analogous to the construction of the stop edge explained above in conjunction with the stop 18. In the case of an embodiment as an obscuration stop, the edge is an outer edge of the stop. In a system pupil of the projection optical unit 33, a surface which cannot be illuminated due to the obscuration is less than $0.15^2$ of the surface of the overall system pupil. The non-illuminated surface within the system pupil can have a different extent in the x-direction than in the y-direction. The non-illuminated surface in the system pupil can be round, elliptical, square or rectangular. Moreover, this surface in the system pupil which cannot be illuminated can be decentered in the x-direction and/or in the y-direction in relation to a center of the system pupil.

A y-distance $d_{OIS}$ (object-image offset) between a central object field point and a central image field point is approximately 1100 mm. A working distance between the mirror M5 and the image plane 9 is 90 mm.

The mirrors of the projection optical unit 33 can be housed in a cuboid with the xyz-edge lengths of 913 mm×1418 mm×1984 mm.

The projection optical unit 33 is approximately telecentric on the image side.

Figure 35:
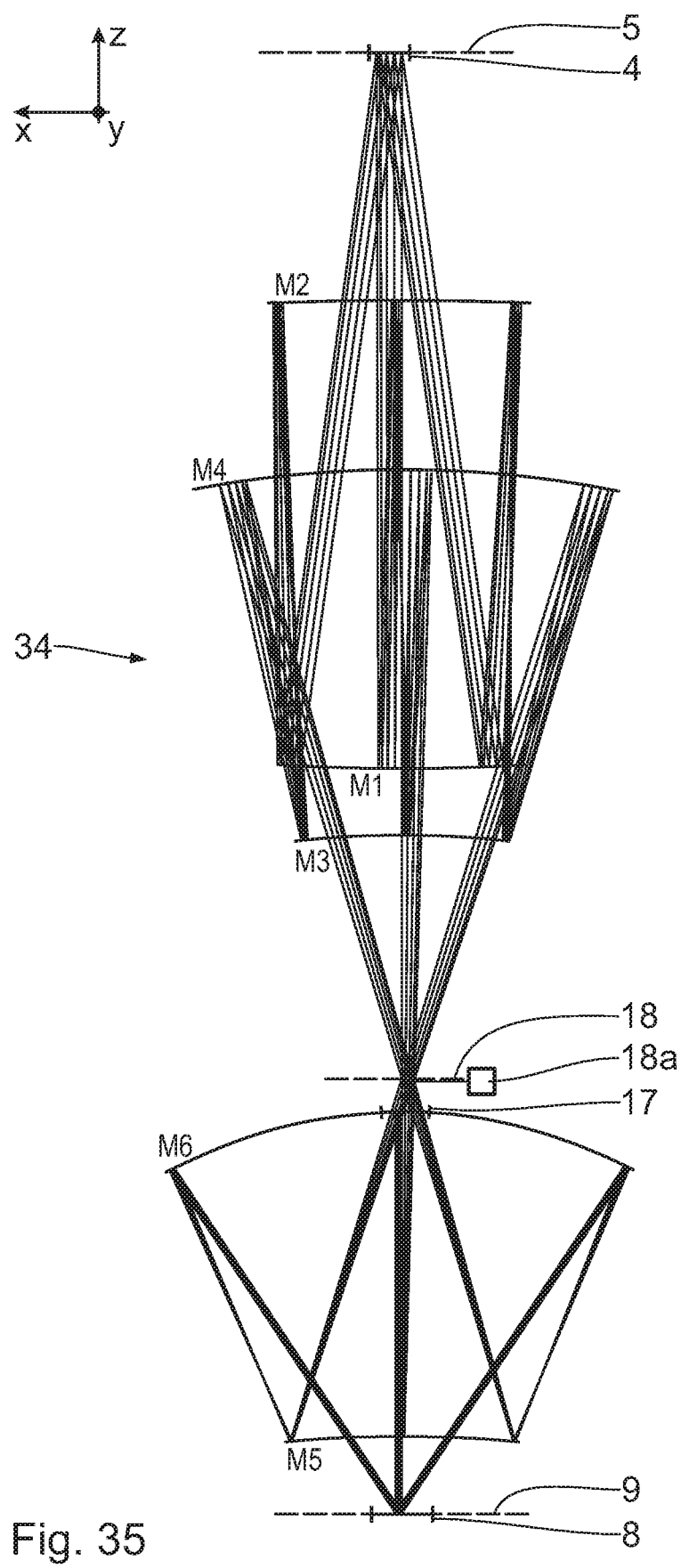
FIG. 35 shows a view from viewing direction XXXV in FIG. 33.

A further embodiment of a projection optical unit 34, which can be used in the projection exposure apparatus 1 according to FIG. 1 instead of the projection optical unit 7, is explained in the following text on the basis of FIGS. 33 and 35. FIG. 33 shows, once again, a meridional section and FIG. 35 shows a sagittal view of the projection optical unit 34. Components and functions which were already explained above in the context of FIGS. 1 to 32 and 34 are denoted, where applicable, by the same reference signs and are not discussed again in detail.

The mirrors M1 to M6 are once again embodied as free-form surface mirrors, for which the free-form surface equation (1) specified above applies.

The following table once again shows the mirror parameters of mirrors M1 to M6 of the projection optical unit 34.

|  | M1 | M2 | M3 | M4 | M5 | M6 |
| --- | --- | --- | --- | --- | --- | --- |
| Maximum angle of incidence [°] | 9.0 | 14.2 | 16.6 | 11.3 | 21.4 | 9.7 |
| Extent of the reflection surface in the x-direction [mm] | 509.7 | 525.9 | 442.0 | 857.3 | 464.6 | 950.6 |
| Extent of the reflection surface in the y-direction [mm] | 210.7 | 153.5 | 171.9 | 293.9 | 172.2 | 917.1 |
| Maximum mirror diameter [mm] | 509.7 | 526.0 | 442.1 | 857.3 | 464.6 | 950.9 |

None of the mirrors M1 to M6 has a y/x-aspect ratio of its reflection surface that is greater than 1. The mirror M2 has the smallest y/x-aspect ratio at approximately 1:3.4.

Here, the mirror M6 has the largest maximum mirror diameter, measuring 950.9 mm.

The optical design data from the projection optical unit 34 can be gathered from the following tables, which, in terms of their design, correspond to the tables for the projection optical unit 7 according to FIG. 2.

TABLE 1

Figure 33:
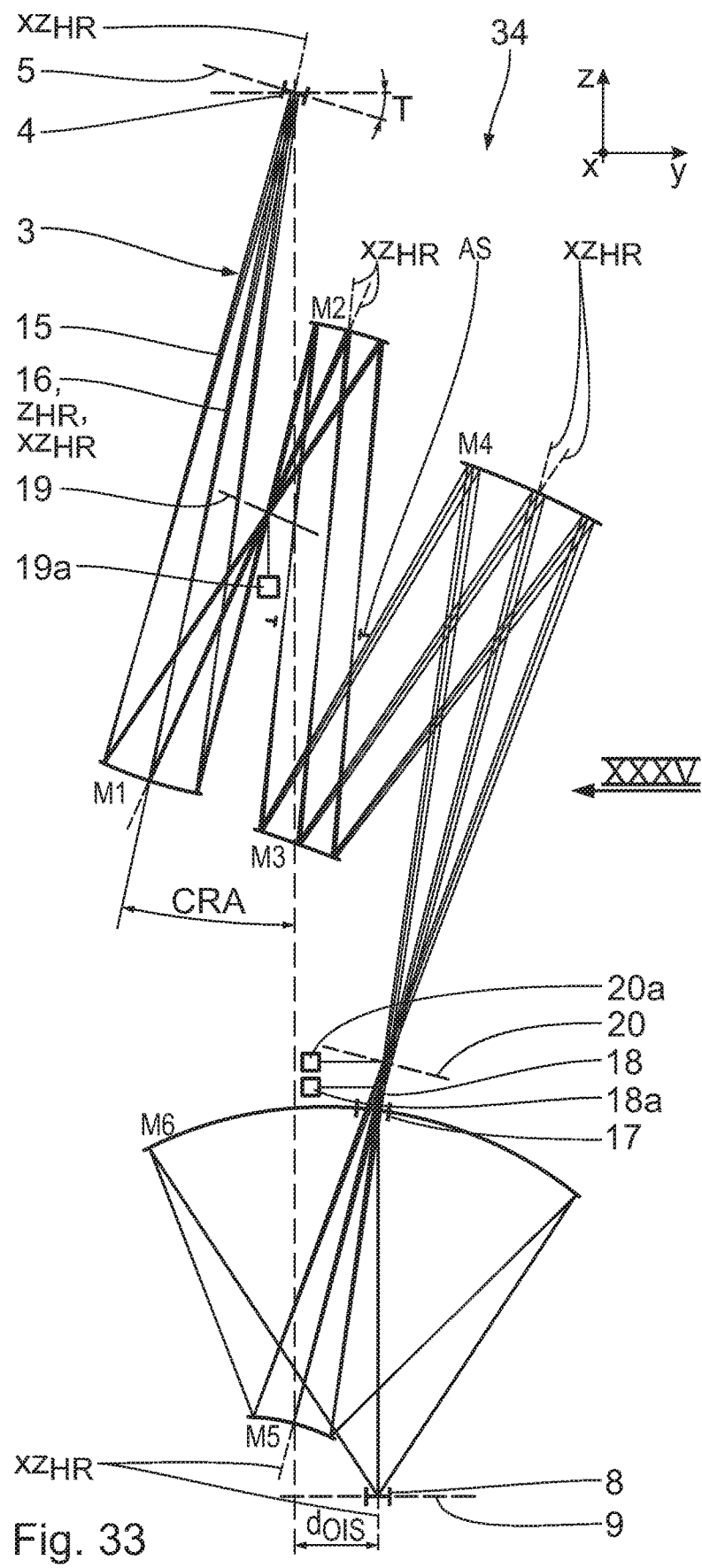
FIG. 33 shows, in an illustration similar to FIG. 32, a further embodiment of an imaging optical unit which can be used as a projection lens in the projection exposure apparatus according to FIG. 1.

| for FIG. 33 | |
| --- | --- |
| Exemplary embodiment | FIG. 33 |
| NA | 0.55 |
| Wavelength | 13.5 nm |
| beta_x | 4.0 |
| beta_y | −8.0 |
| Field dimension_x | 26.0 mm |
| Field dimension_y | 1.2 mm |
| Field curvature | 0.012345 1/mm |
| rms | 15.3 ml |
| Stop | AS |

TABLE 2 for FIG. 33

| Surface | Radius_x [mm] | Power_x [1/mm] | Radius_y [mm] | Power_y [1/mm] | Operating mode |
| --- | --- | --- | --- | --- | --- |
| M6 | −1006.7284257 | 0.0019693 | −842.2517827 | 0.0023954 | REFL |
| M5 | 5965.3172078 | −0.0003353 | 391.8243663 | −0.0051043 | REFL |
| M4 | −1561.8151501 | 0.0012619 | −1649.3044398 | 0.0012306 | REFL |
| M3 | 1880.6366574 | −0.0010299 | 3383.4646405 | −0.0006104 | REFL |
| M2 | −5843.2989604 | 0.0003379 | −914.8700717 | 0.0022144 | REFL |
| M1 | −4100.6049314 | 0.0004851 | −898.9161353 | 0.0022371 | REFL |

TABLE 3a for FIG. 33

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −1006.72842600 | 5965.31720800 | −1561.81515000 |
| C7 | −2.36080773e−08 | 1.28554798e−06 | 3.94514132e−09 |
| C9 | −4.2069464e−09 | 1.07681842e−06 | −1.62903175e−09 |
| C10 | −1.17644873e−11 | 4.17941495e−10 | −6.48276378e−12 |
| C12 | −3.59134517e−11 | 2.88742693e−09 | 1.76483997e−11 |
| C14 | −1.63305797e−11 | 6.95203918e−09 | 3.4186017e−13 |
| C16 | −3.32910335e−14 | 1.11774422e−12 | 7.60337079e−16 |
| C18 | −3.36483434e−14 | 1.32703447e−11 | 6.40178912e−15 |
| C20 | −7.90772381e−15 | 1.3867734e−11 | 2.20113512e−14 |
| C21 | −2.39696783e−17 | 7.7521509e−16 | −5.4865664e−18 |
| C23 | −7.21389701e−17 | 1.13884842e−14 | 4.97674411e−18 |
| C25 | −8.58520679e−17 | 5.1496675e−14 | 1.61922965e−17 |
| C27 | −2.49737385e−17 | 1.03640903e−13 | 5.2042106e−17 |
| C29 | −2.36771533e−20 | 6.69920634e−18 | −2.46740499e−21 |
| C31 | −7.23068755e−20 | 7.48829488e−17 | 2.94884664e−20 |
| C33 | −5.04364058e−20 | 3.19263293e−16 | 9.68386762e−20 |
| C35 | −8.81491788e−21 | 4.7637767e−17 | 1.61788245e−19 |
| C36 | −3.07931348e−23 | 1.88599363e−21 | −4.7228178e−25 |
| C38 | −1.2368233e−22 | 3.86262162e−20 | 1.5000994e−23 |
| C40 | −2.10717929e−22 | 3.74624343e−19 | −1.71575087e−22 |
| C42 | −1.55975256e−22 | 5.55280341e−19 | −2.29927658e−21 |
| C44 | −3.49712831e−23 | 2.54793079e−19 | −4.86801861e−21 |
| C46 | −2.66204224e−26 | 6.027065e−24 | 8.05564747e−27 |
| C48 | −1.06852252e−25 | 1.35565132e−22 | −2.12494726e−26 |
| C50 | −1.39905245e−25 | 1.28558155e−21 | 3.31373857e−25 |
| C52 | −7.38507052e−26 | 3.91068516e−21 | 5.70573409e−24 |
| C54 | −1.20370276e−26 | −7.71291126e−21 | 1.41345158e−24 |
| C55 | −2.69457175e−29 | −2.23174837e−27 | −2.1395474e−30 |
| C57 | −1.77986898e−28 | 3.32509965e−25 | −1.48447807e−28 |
| C59 | −3.66895205e−28 | 3.53118757e−24 | 3.27794124e−28 |
| C61 | −3.98218369e−28 | 2.6586045e−23 | 1.89615686e−26 |
| C63 | −2.03566054e−28 | 4.0294128e−23 | 1.00894697e−25 |
| C65 | −5.30268041e−29 | 3.23594134e−22 | 1.13309229e−25 |
| C67 | −3.0047318e−32 | 2.9829458e−28 | −1.83843732e−32 |
| C69 | −1.55074503e−31 | 7.06201039e−27 | −2.03057508e−31 |
| C71 | −4.70669939e−31 | 7.46696177e−26 | 1.53278455e−30 |
| C73 | −3.89482265e−31 | 1.82406791e−25 | −5.45541074e−29 |
| C75 | −8.18915595e−32 | 8.6022715e−25 | −3.66861957e−28 |
| C77 | −8.15530371e−33 | 6.57527779e−25 | −1.39584841e−28 |
| C78 | −3.3235481e−35 | 6.71728717e−32 | 1.15787845e−35 |
| C80 | −2.61100277e−34 | −1.18245822e−30 | 1.13061166e−33 |
| C82 | −1.07477883e−33 | 3.624861e−29 | 3.47838169e−33 |
| C84 | −1.84308773e−33 | −9.0142297e−29 | −5.12555002e−32 |
| C86 | −1.82743964e−33 | −1.42012455e−27 | 5.72799315e−31 |
| C88 | −9.28722157e−34 | −1.85608864e−27 | −1.62324547e−30 |
| C90 | −1.04744708e−34 | −2.7671563e−26 | −3.15634748e−31 |
| C92 | −1.28436626e−37 | −3.28236035e−33 | 4.59915186e−38 |
| C94 | −4.58925734e−37 | −6.13084953e−32 | 1.76190676e−36 |
| C96 | 1.46331065e−37 | −1.19479671e−30 | 1.11464545e−35 |
| C98 | 5.73381884e−37 | −1.06320106e−29 | 9.94287718e−36 |
| C100 | 2.03899668e−37 | −2.83336892e−29 | 1.19466153e−33 |
| C102 | −3.72313868e−37 | −1.09821473e−28 | 6.56891196e−33 |
| C104 | −1.33892457e−37 | 8.26930634e−29 | 6.75668551e−34 |
| C105 | 2.54605643e−42 | −2.91865459e−37 | −2.91255207e−41 |
| C107 | 4.2759669e−40 | 4.890029957e−36 | −3.18092396e−39 |
| C109 | 1.37326821e−39 | −5.61432253e−34 | −2.61564898e−38 |
| C111 | 2.26926013e−39 | −8.66021369e−33 | −3.59867394e−38 |
| C113 | 3.77714415e−39 | −1.88255881e−32 | 1.06600252e−36 |
| C115 | 3.89548381e−39 | −7.64730421e−32 | 6.80748387e−36 |
| C117 | 2.09996643e−39 | −3.16857153e−32 | 2.850179e−36 |
| C119 | 2.54320661e−40 | 3.19444666e−31 | −1.04473406e−35 |
| C121 | 1.21614444e−43 | 2.32998757e−38 | 0 |
| C123 | 6.49368051e−44 | 5.04254106e−37 | 0 |
| C125 | −2.89343618e−42 | 7.30943279e−36 | 0 |
| C127 | −6.07402874e−42 | 1.21067923e−34 | 0 |
| C129 | −6.32771343e−42 | 7.23619769e−34 | 0 |
| C131 | −3.36969492e−42 | 1.2428046e−33 | 0 |
| C133 | −2.104793e−43 | 3.52791806e−33 | 0 |
| C135 | 1.77306314e−43 | −1.02737596e−32 | 0 |
| C136 | −1.52575809e−46 | 2.12924071e−42 | 0 |
| C138 | −2.30237851e−45 | 2.07292225e−40 | 0 |
| C140 | −7.88788875e−45 | 4.36510753e−39 | 0 |
| C142 | −1.5800379e−44 | 9.4878367e−38 | 0 |
| C144 | −2.52175277e−44 | 9.4252e−37 | 0 |
| C146 | −2.658207e−44 | 3.21331684e−36 | 0 |
| C148 | −1.73727174e−44 | 1.06350303e−35 | 0 |
| C150 | −6.65813017e−45 | −1.05592399e−35 | 0 |
| C152 | −8.98636196e−46 | 3.26212163e−35 | 0 |

TABLE 3b for FIG. 33

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | 1880.63665700 | −5843.29896000 | −4100.60493100 |
| C7 | −4.94029343e−08 | 1.49179578e−07 | 7.73453613e−09 |
| C9 | 1.90649177e−07 | −1.56715489e−08 | 3.20483091e−08 |
| C10 | 8.97962559e−11 | 1.0444918e−10 | −2.45522201e−11 |
| C12 | −8.62966033e−10 | −3.739312e−12 | −1.01617201e−10 |
| C14 | 1.72078355e−10 | −1.31318293e−10 | −2.77000383e−10 |
| C16 | −2.00154532e−13 | −9.73768186e−14 | 2.03576356e−14 |
| C18 | −9.11364311e−13 | −1.58355358e−13 | 1.94910249e−13 |
| C20 | −2.01758014e−12 | 4.96235302e−13 | −6.81883948e−13 |
| C21 | 7.35882998e−16 | 8.20220031e−17 | −4.61681069e−18 |
| C23 | 4.83251272e−16 | 1.51701684e−16 | −7.82206035e−18 |
| C25 | 2.49131175e−15 | −7.21394993e−16 | 3.21596342e−16 |
| C27 | −4.5294101e−15 | −2.73671786e−15 | −1.27108558e−15 |
| C29 | 1.74504569e−18 | −1.9860959e−21 | −2.12228815e−20 |
| C31 | −2.18679872e−18 | 5.75861209e−19 | −2.22428091e−19 |
| C33 | −9.36508454e−18 | −1.31083424e−18 | −9.06535225e−20 |
| C35 | −4.96430229e−17 | −3.1330142e−17 | −3.51793744e−17 |
| C36 | 3.43328396e−22 | 8.20150186e−23 | 3.04376562e−23 |
| C38 | −1.35049644e−20 | 1.73800191e−21 | 1.58444309e−22 |
| C40 | 7.32106265e−21 | 2.64009548e−20 | 1.87047244e−21 |
| C42 | 4.07732261e−19 | 2.4290507e−19 | 1.91910499e−20 |
| C44 | 6.44543663e−19 | 9.92250873e−19 | −1.3098699e−19 |
| C46 | −1.1357514e−23 | −6.85737803e−25 | −6.72152116e−26 |
| C48 | 1.88750153e−23 | −8.28542257e−24 | 9.48692673e−25 |
| C50 | 2.43074745e−22 | 1.86471291e−22 | 2.91710329e−24 |
| C52 | 4.11977741e−22 | 2.03147349e−21 | −2.07056289e−23 |
| C54 | 4.49237652e−21 | 3.61364485e−23 | −2.45380768e−23 |
| C55 | −1.28868081e−27 | 1.40543445e−27 | −8.73981974e−28 |
| C57 | 3.3048524e−25 | −3.74175772e−26 | −2.95434759e−28 |
| C59 | 3.91588107e−25 | −5.74632156e−25 | 6.78617966e−27 |
| C61 | −1.12703785e−23 | −9.65404462e−24 | −5.41587074e−25 |
| C63 | −5.52941228e−23 | −6.43759572e−23 | −3.28650311e−24 |
| C65 | −1.17857183e−24 | −2.55557626e−22 | 1.29846463e−24 |
| C67 | 5.60276243e−30 | 1.246671e−29 | 2.14903234e−30 |
| C69 | −2.96093489e−28 | 1.81147151e−28 | 6.03676056e−30 |
| C71 | −1.53896678e−26 | 1.04355606e−27 | 6.52210129e−29 |
| C73 | −5.38762556e−27 | −6.35307839e−26 | 2.61271121e−28 |
| C75 | 7.03953591e−26 | −3.37289815e−25 | 3.72205453e−28 |
| C77 | −2.39732418e−25 | 4.3699226e−25 | 6.61454986e−26 |
| C78 | −7.38287739e−32 | −5.15111147e−33 | 7.78620254e−33 |
| C80 | −8.0679497e−30 | 5.93676557e−31 | −1.10593906e−32 |
| C82 | −1.86642027e−29 | 7.6402297e−30 | −7.5135761e−31 |
| C84 | 1.46666077e−28 | 1.53054394e−28 | 4.2156926e−30 |
| C86 | 1.16829579e−27 | 1.93800725e−27 | 7.20454782e−29 |
| C88 | 2.71039548e−27 | 9.64306599e−27 | 2.63101456e−28 |
| C90 | −5.57449245e−27 | 3.35251116e−26 | 1.62675507e−28 |
| C92 | 6.90715973e−35 | −7.74524297e−35 | −1.59436458e−35 |
| C94 | −3.53289956e−33 | −9.77085827e−34 | −6.04425154e−35 |
| C96 | 1.38988534e−31 | −2.7791015e−32 | −8.37212226e−34 |
| C98 | 1.05676201e−30 | 4.47091465e−32 | −4.218493e−33 |
| C100 | −2.8300685e−31 | 4.8671863e−30 | −9.32282295e−33 |
| C102 | −4.21395731e−30 | 1.61442883e−29 | −2.37304382e−32 |
| C104 | 4.27990879e−30 | −4.06284648e−29 | −3.24174527e−30 |
| C105 | 8.74018101e−37 | 9.1640292e−39 | −2.68034362e−38 |
| C107 | 7.20609305e−35 | −3.31672266e−36 | 6.17847878e−38 |
| C109 | 3.05138754e−34 | −4.71797412e−35 | 6.49183349e−36 |
| C111 | −1.16191956e−33 | −6.0757407e−34 | 1.55751393e−35 |

TABLE 3b-continued for FIG. 33

| Coefficient | M3 | M2 | M1 |
|---|---|---|---|
| C113 | −1.12796824e−32 | −1.48310841e−32 | −4.66813792e−34 |
| C115 | −4.60817817e−32 | −1.3034314e−31 | −2.94237332e−33 |
| C117 | −5.07248021e−32 | −5.0498434e−31 | −8.09943855e−33 |
| C119 | 3.25810602e−31 | −1.65054488e−30 | −1.34504174e−32 |

TABLE 4a for FIG. 33

| Surface | DCX | DCY | DCZ |
|---|---|---|---|
| Image | 0.00000000 | 0.00000000 | 0.00000000 |
| M6 | 0.00000000 | 0.00000000 | 823.56702252 |
| M5 | 0.00000000 | 180.17345446 | 156.98468248 |
| M4 | 0.00000000 | −344.49567167 | 2142.94126767 |
| M3 | 0.00000000 | 169.32702293 | 1392.39086385 |
| Stop | 0.00000000 | 124.47525498 | 1855.02797681 |
| M2 | 0.00000000 | 62.86723152 | 2490.50255031 |
| M1 | 0.00000000 | 488.47152498 | 1529.14826845 |
| Object | 0.00000000 | 177.89305993 | 3000.03510500 |

TABLE 4b for FIG. 33

| Surface | TLA [deg] | TLB [deg] | TLC [deg] |
|---|---|---|---|
| Image | −0.00000000 | 0.00000000 | −0.00000000 |
| M6 | 7.56264709 | 0.00000000 | −0.00000000 |
| M5 | 14.96206408 | 180.00000000 | 0.00000000 |
| M4 | 24.59708091 | 0.00000000 | −0.00000000 |
| M3 | 19.96636844 | 180.00000000 | 0.00000000 |
| Stop | 8.44368788 | 0.00000000 | −0.00000000 |
| M2 | 14.70850835 | 0.00000000 | −0.00000000 |
| M1 | 17.90125287 | 180.00000000 | 0.00000000 |
| Object | 16.92289808 | 0.00000000 | −0.00000000 |

TABLE 5 for FIG. 33

| Surface | Angle of incidence [deg] | Reflectivity |
|---|---|---|
| M6 | 7.56264709 | 0.65958150 |
| M5 | 0.16323010 | 0.66566562 |
| M4 | 9.79824693 | 0.65514770 |
| M3 | 14.42895939 | 0.64127863 |
| M2 | 9.17109930 | 0.65652593 |
| M1 | 5.97835478 | 0.66195441 |
| Overall transmis- | | 0.0802 |

TABLE 6 for FIG. 33

| X [mm] | Y [mm] | Z [mm] |
|---|---|---|
| −0.00000000 | −74.47687523 | 0.00000000 |
| −33.42303871 | −73.30016348 | 0.00000000 |
| −66.20895326 | −69.81789891 | 0.00000000 |
| −97.69836577 | −64.16914383 | 0.00000000 |
| −127.19700543 | −56.57212560 | 0.00000000 |
| −153.97830881 | −47.30798153 | 0.00000000 |
| −177.30271236 | −36.70256857 | 0.00000000 |
| −196.45254533 | −25.10940417 | 0.00000000 |
| −210.77915870 | −12.89656449 | 0.00000000 |
| −219.75712654 | −0.43675223 | 0.00000000 |
| −223.03684474 | 11.90374040 | 0.00000000 |
| −220.48252499 | 23.78006122 | 0.00000000 |
| −212.18414282 | 34.88544628 | 0.00000000 |
| −198.44034760 | 44.96581894 | 0.00000000 |
| −179.71982840 | 53.82983649 | 0.00000000 |
| −156.61422236 | 61.35361805 | 0.00000000 |
| −129.79477480 | 67.47742250 | 0.00000000 |
| −99.97891473 | 72.19240955 | 0.00000000 |
| −67.90733792 | 75.52146833 | 0.00000000 |
| −34.33014480 | 77.49927798 | 0.00000000 |
| −0.00000000 | 78.15483696 | 0.00000000 |
| 34.33014480 | 77.49927798 | 0.00000000 |
| 67.90733792 | 75.52146833 | 0.00000000 |
| 99.97891473 | 72.19240955 | 0.00000000 |
| 129.79477480 | 67.47742250 | 0.00000000 |
| 156.61422236 | 61.35361805 | 0.00000000 |
| 179.71982840 | 53.82983649 | 0.00000000 |
| 198.44034760 | 44.96581894 | 0.00000000 |
| 212.18414282 | 34.88544628 | 0.00000000 |
| 220.48252499 | 23.78006122 | 0.00000000 |
| 223.03684474 | 11.90374040 | 0.00000000 |
| 219.75712654 | −0.43675223 | 0.00000000 |
| 210.77915870 | −12.89656449 | 0.00000000 |
| 196.45254533 | −25.10940417 | 0.00000000 |
| 177.30271236 | −36.70256857 | 0.00000000 |
| 153.97830881 | −47.30798153 | 0.00000000 |
| 127.19700543 | −56.57212560 | 0.00000000 |
| 97.69836577 | −64.16914383 | 0.00000000 |
| 66.20895326 | −69.81789891 | 0.00000000 |
| 33.42303871 | −73.30016348 | 0.00000000 |

An overall reflectivity of the projection optical unit 34 is approximately 8.02%.

The projection optical unit 34 has an image-side numerical aperture of 0.55. In the first imaging light plane xz, the projection optical unit 34 has a reduction factor $\beta_x$ of 4.00. In the second imaging light plane yz, the projection optical unit 21 has a reduction factor $\beta_y$ of −8.00. An object-side chief ray angle is 5.2°. An installed length of the projection optical unit 34 is approximately 3000 mm. A pupil obscuration is 9%. An object-image offset $d_{OIS}$ is approximately 177.89 mm and is therefore significantly smaller than the object-image offset $d_{OIS}$ of the projection optical unit 7 according to FIG. 32.

The mirrors of the projection optical unit 34 can be housed in a cuboid with xyz-edge lengths of 951 mm×1047 mm×2380 mm.

The reticle 10 and hence the object plane 5 are tilted relative to the image plane 9 at an angle T of 10° about the x-axis. This tilt angle T is indicated in FIG. 33.

A working distance between the mirror M5 closest to the wafer and the image plane 9 is approximately 126 mm.

Some data of projection optical units described above are summarized again in tables I and II below. The respective first column serves to assign the data to the respective exemplary embodiment.

The following table I summarizes the optical parameters of numerical aperture (NA), image field extent in the x-direction (Fieldsize X), image field extent in the y-direction (Fieldsize Y), image field curvature (field curvature) and overall reflectivity or system transmission (transmission).

The following table II specifies the parameters "sequence of the mirror type" (mirror type order), "sequence of the mirror deflection effect" (mirror rotation order), "refractive power sequence in the xz-plane" (x power order) and "refractive power sequence in the yz-plane" (y power order).

These sequences respectively start with the last mirror in the beam path, i.e. follow the reverse beam direction. By way of example, the sequence "R0LLRRRL" relates to the deflection effect in the sequence M8 to M1 in the embodiment according to FIG. 2.

TABLE I

| FIG. | NA | FIELDSIZE X | FIELDSIZE Y | FIELD CURVATURE | TRANSMISSION % |
|---|---|---|---|---|---|
| 2 | 0.55 | 26 | 1 | 0.0123455 | 8.02 |
| 5 | 0.5 | 26 | 1.2 | 0 | 9.11 |
| 8 | 0.5 | 26 | 1 | −0.0123455 | 7.82 |
| 11 | 0.55 | 26 | 1 | 0.0123455 | 8.32 |
| 14 | 0.45 | 26 | 1.2 | 0 | 9.29 |
| 17 | 0.5 | 26 | 1 | 0.0123455 | 7.2 |
| 20 | 0.5 | 26 | 1.2 | 0 | 9.67 |
| 23 | 0.55 | 26 | 1 | −0.0123455 | 9.88 |
| 26 | 0.55 | 26 | 1 | −0.0123455 | 8.72 |

TABLE II

| FIG. | MIRROR TYPE ORDER | MIRROR ROTATION ORDER | xPOWER ORDER | yPOWER ORDER |
|---|---|---|---|---|
| 2 | NNGGNGGN | ROLLRRRL | +−−−+−−+ | +−++++++ |
| 5 | NNGGNGGN | RRLLRRRL | +−++++−+ | +−++++++ |
| 8 | NNNNNN | LOLRLR | +−+−+− | +−++++ |
| 11 | NNGGNGGN | ROLLRRRL | +−−−+−−+ | +−−−++++ |
| 14 | NNGGGGN | ROLLLLR | +++++++ | +−+++−+ |
| 17 | NNGGGNGGG | LORRRRRRR | +−++++−−+ | +−++−+−++ |
| 20 | NNGGGGGGN | ROLLLLLLR | +++++++++ | +−++++−−+ |
| 23 | NNGGGGGGGN | RORRRRRRRL | +−+++++−−+ | +−−+++++−+ |
| 26 | NNGGGGGGGN | RORRRRRRRL | +−+++++−−+ | +−−+++++−+ |

In the mirror type, the specification "N" relates to a normal incidence (NI) mirror and the designation "G" relates to a grazing incidence (GI) mirror. In the refractive power sequences, "+" represents a concave mirror surface and "−" represents a convex mirror surface. When comparing the refractive power sequences in x and y, it is possible to see that all exemplary embodiments, with the exception of e.g. the embodiment according to FIG. 5, have different refractive power sequences in x and y. These mirrors with different signs in the refractive power in x and y represent saddles or toric surfaces. To the extent that GI mirrors occur in one of the exemplary embodiments, these respectively occur at least in pairs, as can be gathered from the mirror type sequence in table II.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An imaging optical unit, comprising:
a plurality of mirrors configured to guide imaging light along a path from an object field in an object plane into an image field in an image plane,
wherein:
the object field is spanned by a first Cartesian object field coordinate and a second Cartesian object field coordinate;
a third Cartesian coordinate is perpendicular to both the first and second Cartesian object field coordinates;
the imaging optical unit is configured so that, during use of the imaging optical unit:
the imaging light propagates in a first imaging light plane in which an imaging light main propagation direction lies; and
the imaging light propagates in a second imaging light plane in which the imaging light main propagation direction lies and which is perpendicular to the first imaging light plane; and
a number of first plane intermediate images of the imaging light which propagates in the first imaging light plane is different from a number of second plane intermediate images of imaging light which propagates in the second imaging light plane.

2. The imaging optical unit of claim 1, wherein the plurality of mirrors comprises a first mirror having an angle of incidence with the imaging light that is greater than 45°.

3. The imaging optical unit of claim 2, wherein a used reflection surface of the first mirror has an aspect ratio of its surface dimensions of at most 3.

4. The imaging optical unit of claim 2, wherein:
the number of first plane intermediate images of the imaging light which propagate in the first imaging light plane is less than the number of second plane intermediate images of imaging light which propagate in the second imaging light plane; and
the second imaging light plane coincides with a folding plane of the first mirror.

5. The imaging optical unit of claim 2, wherein:
one of the intermediate images is in the imaging light plane coinciding with the folding plane in the path upstream of the first mirror between the first mirror and a mirror disposed directly upstream thereof in the path; and a further intermediate image is in the imaging light plane coinciding with the folding plane in the path downstream of the first mirror between the first mirror and a mirror disposed directly downstream thereof in the path.

6. The imaging optical unit of claim 2, wherein:
the plurality of mirrors comprises a second mirror;
the first and second mirrors follow one another in the path;
the second mirror has an angle of incidence with the imaging light that is greater than 45°;
the first and second mirrors have the same folding plane; and
an intermediate image in the imaging light plane coinciding with the folding plane is in the path between the first and second mirrors.

7. The imaging optical unit of claim 1, wherein:
the plurality of mirrors comprises a mirror having a passage opening configured to pass the imaging light;
the mirror is configured to reflect the imaging light around the passage opening; and
at least one intermediate image lies in the region of the passage opening.

8. The imaging optical unit of claim 1, wherein the plurality of mirrors comprises a mirror having an angle of incidence with the imaging light that is less than 45°.

9. The imaging optical unit of claim 1, wherein the imaging optical unit has an odd number of mirrors in the path between the object field and the image field.

10. The imaging optical unit of claim 1, wherein the plurality of mirrors comprises a mirror which comprises a reflection surface comprising an outer boundary contour having a curved basic form corresponding to a curved basic form of the object field, and at least two contour bulges are arranged along a side edge of the boundary contour.

11. An optical system, comprising:
an imaging optical unit according to claim 1; and
an auxiliary device arranged in an intermediate image plane of one of the intermediate images.

12. An optical system, comprising:
an imaging optical unit according to claim 1; and
an illumination optical unit configured to illuminate the object field with illumination light.

13. The optical system of claim 12, further comprising an auxiliary device arranged in an intermediate image plane of one of the intermediate images.

14. An apparatus, comprising:
an optical system, comprising:
an imaging optical unit according to claim 1; and
an auxiliary device arranged in an intermediate image plane of one of the intermediate images; and
a light source configured to produce the illumination light, wherein the apparatus is a projection exposure apparatus.

15. An apparatus, comprising:
an optical system, comprising:
an imaging optical unit according to claim 1; and
an illumination optical unit configured to illuminate the object field with illumination light; and
a light source configured to produce the illumination light, wherein the apparatus is a projection exposure apparatus.

16. A method of using a projection exposure apparatus comprising an illumination optical unit and an imaging optical unit, the method comprising:
using the illumination optical unit to illuminate a reticle comprising a structure; and
using the imaging optical unit to project the illuminated structure onto a light-sensitive material,
wherein the imaging optical unit is an imaging optical unit according to claim 1.

17. A mirror, comprising:
a reflection surface comprising an outer boundary contour having a curved basic form,
wherein:
the mirror is configured to be used in an imaging optical unit that has a plurality of mirrors configured to guide imaging light along an imaging light beam path from an object field in an object plane into an image field in an image plane along an imaging light beam path having at least one intermediate image between the object field and the image field;
the curved basic form corresponds to a curved basic form of the object field;
at least two contour bulges are arranged along a side edge of the boundary contour; and
at least one of the following holds:
two of the contour bulges are arranged along a long side of the basic form; and
at least two contour bulges are respectively arranged along two side edges of the boundary contour.

18. The mirror of claim 17, wherein two of the contour bulges are arranged along a long side of the basic form.

19. The mirror of claim 17, wherein at least two contour bulges are respectively arranged along two side edges of the boundary contour.

20. An imaging optical unit, comprising:
a plurality of mirrors configured to guide imaging light along an imaging light beam path from an object field in an object plane into an image field in an image plane,
wherein the plurality of mirrors comprises a mirror according to claim 17.

* * * * *

UNITED STATES PATENT AND TRADEMARK OFFICE
CERTIFICATE OF CORRECTION

PATENT NO. : 10,656,400 B2
APPLICATION NO. : 15/728812
DATED : May 19, 2020
INVENTOR(S) : Markus Schwab Page 1 of 1

It is certified that error appears in the above-identified patent and that said Letters Patent is hereby corrected as shown below:

In the Specification

Column 1, Line 11, delete "No." and insert -- Nos. --;

Column 7, Line 49, delete "FIGS." and insert -- FIG. --;

Column 99, Line 52, delete "Overall transmis-" and insert -- Overall transmission - --;

Column 101, Line 26 (approx.) in TABLE II, delete "ROLLRRRL" and insert -- R0LLRRRL --;

Column 101, Line 28 (approx.) in TABLE II, delete "LOLRLR" and insert -- L0LRLR --;

Column 101, Line 29 (approx.) in TABLE II, delete "ROLLRRRL" and insert -- R0LLRRRL --;

Column 101, Line 30 (approx.) in TABLE II, delete "ROLLLLR" and insert -- R0LLLLR --;

Column 101, Line 31 (approx.) in TABLE II, delete "LORRRRRRR" and insert -- L0RRRRRRR --;

Column 101, Line 32 (approx.) in TABLE II, delete "ROLLLLLLR" and insert -- R0LLLLLLR --;

Column 101, Line 33 (approx.) in TABLE II, delete "RORRRRRRRL" and insert -- R0RRRRRRRL --;

Column 101, Line 34 (approx.) in TABLE II, delete "RORRRRRRL" and insert -- L0RRRRRRL --.

Signed and Sealed this
Fourteenth Day of July, 2020

Andrei Iancu
*Director of the United States Patent and Trademark Office*